US011760769B2

(12) United States Patent
Lee et al.

(10) Patent No.: US 11,760,769 B2
(45) Date of Patent: Sep. 19, 2023

(54) COMPOSITION AND ORGANIC LIGHT-EMITTING DEVICE INCLUDING THE SAME

(71) Applicants: Samsung Electronics Co., Ltd., Suwon-si (KR); SAMSUNG SDI CO., LTD., Yongin-si (KR)

(72) Inventors: Banglin Lee, Suwon-si (KR); Dongmin Kang, Suwon-si (KR); Soyeon Kim, Seoul (KR); Jiyoun Lee, Anyang-si (KR); Yongsuk Cho, Hwaseong-si (KR); Jongwon Choi, Yongin-si (KR); Dmitry Kravchuk, Hwaseong-si (KR); Dongyeong Kim, Suwon-si (KR); Junseok Kim, Suwon-si (KR); Namheon Lee, Suwon-si (KR); Byeonggwan Lee, Suwon-si (KR); Sangshin Lee, Suwon-si (KR); Yasushi Koishikawa, Hwaseong-si (KR)

(73) Assignees: SAMSUNG ELECTRONICS CO., LTD., Gyeonggi-do (KR); SAMSUNG SDI CO., LTD., Gyeonggi-do (KR)

( * ) Notice: Subject to any disclaimer, the term of this patent is extended or adjusted under 35 U.S.C. 154(b) by 7 days.

(21) Appl. No.: 16/669,765

(22) Filed: Oct. 31, 2019

(65) Prior Publication Data

US 2020/0308201 A1 Oct. 1, 2020

(30) Foreign Application Priority Data

Mar. 29, 2019 (KR) ........................ 10-2019-0037215
Oct. 30, 2019 (KR) ........................ 10-2019-0136948

(51) Int. Cl.
*C07F 15/00* (2006.01)
*H10K 85/30* (2023.01)

(52) U.S. Cl.
CPC ....... *C07F 15/0033* (2013.01); *H10K 85/342* (2023.02)

(58) Field of Classification Search
CPC ......... H01L 51/0085; H01L 2251/5384; H01L 51/0052; H01L 51/0054; H01L 51/0058;
(Continued)

(56) References Cited

U.S. PATENT DOCUMENTS 6,465,115 B2 10/2002 Shi et al.
6,596,415 B2 7/2003 Shi et al.
(Continued)

FOREIGN PATENT DOCUMENTS

EP 3637489 A1 4/2020
JP 2000003782 A 6/1998
(Continued)

OTHER PUBLICATIONS

KR-20120036560-A, 2012, machine translation (Year: 2012).*
(Continued)

*Primary Examiner* — Dylan C Kershner
*Assistant Examiner* — Elizabeth M. Dahlburg
(74) *Attorney, Agent, or Firm* — CANTOR COLBURN LLP

(57) ABSTRACT

A composition including a first compound including a compound represented by Formula 1, a second compound including a compound represented by Formula 2, and a third compound including a compound represented by Formula 3, and an organic light-emitting device including the composition:
(Continued)

Formula 1

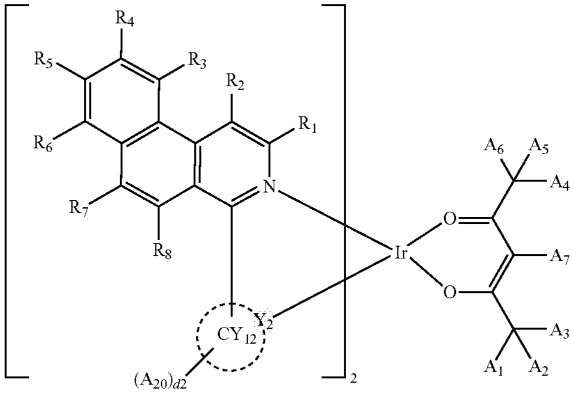

Formula 2

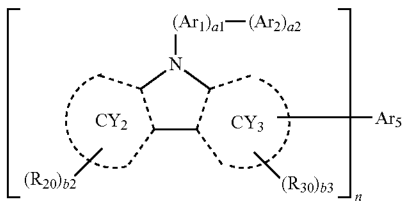

Formula 3

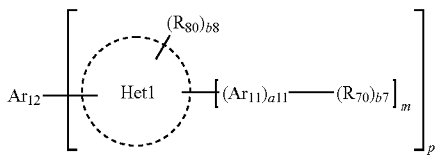

wherein the description of Formulae 1 to 3 are the same as described in the specification.

17 Claims, 1 Drawing Sheet

(58) Field of Classification Search
CPC ............. H01L 51/0059; H01L 51/0061; H01L 51/0067; H01L 51/0071; H01L 51/0072; H01L 51/0073; H01L 51/0074; H01L 51/5012; H01L 51/5016; H01L 51/5024; C07F 15/0033; C09K 2211/1029; C09K 2211/185; C09K 11/06; C09K 2211/1007; C09K 2211/1096; H05B 33/18; H05B 33/20; H10K 85/342; H10K 50/11; H10K 50/12; H10K 2101/10; H10K 2101/90
See application file for complete search history.

(56) References Cited

U.S. PATENT DOCUMENTS

| | | | |
|---|---|---|---|
| 9,960,370 B2 | 5/2018 | Kishino et al. | |
| 10,038,152 B2 | 7/2018 | Kosuge et al. | |
| 2001/0019782 A1 | 9/2001 | Igarashi et al. | |
| 2006/0103298 A1* | 5/2006 | Lee | H01L 51/5016 313/504 |
| 2010/0219407 A1 | 9/2010 | Kamatani et al. | |
| 2015/0295188 A1* | 10/2015 | Kosuge | C07F 15/0033 345/173 |
| 2016/0285007 A1* | 9/2016 | Swager | H01L 51/0061 |
| 2017/0092882 A1 | 3/2017 | Kamatani et al. | |
| 2017/0098778 A1* | 4/2017 | Oh | C07D 487/04 |
| 2018/0130956 A1 | 5/2018 | Boudreault et al. | |
| 2020/0099000 A1* | 3/2020 | Zhang | C07F 15/0033 |
| 2020/0212319 A1 | 7/2020 | Choi et al. | |
| 2020/0308202 A1 | 10/2020 | Cho et al. | |
| 2020/0308203 A1* | 10/2020 | Kim | H01L 51/0085 |
| 2020/0313095 A1 | 10/2020 | Aratani et al. | |

FOREIGN PATENT DOCUMENTS

| | | |
|---|---|---|
| KR | 20120036560 A * | 4/2012 |
| WO | 2014112450 A1 | 7/2014 |
| WO | 2014112657 A1 | 7/2014 |
| WO | 2014112658 A1 | 7/2014 |
| WO | 2014123239 A1 | 8/2014 |

OTHER PUBLICATIONS

M. A. Baldo, et al., Nature, Highly efficient phosphorescent emission fromorganic electroluminescent devices, v395, pp. 151-154 (1998).

M. A. Baldo, et al., Very high-efficiency green organic light-emitting devices based on electrophosphorescence, Appl. Phys. Lett. 75, 1-4 (1999).

Qin Wang, et al., Effects of charged self-assembled quantum dots on two-dimensional quantum transport, Appl. Phys. Lett. 76, 1704 (2000), 4 pp.

Raymond C. Kwong, et al., High operational stability of electrophosphorescent devices, Appl. Phys. Lett. 81, 162 (2002), 4 pp.

Sergey Lamansky, et al., Highly Phosphorescent Bis-Cyclometalated Iridium Complexes: Synthesis, Photophysical Characterization, and Use in Organic Light Emitting Diodes, J. Am. Chem. Soc. 2001, 123, 4304-4312.

Sergey Lamansky, et al., Synthesis and Characterization of Phosphorescent Cyclometalated Iridium Complexes, Inorg. Chem. 2001, 40, 1704-1711.

Extended European search report issued by the European Patent Office dated Jul. 6, 2020 in the examination of the European Patent Application No. 20165786.3, which corresponds to the U.S. Application above.

* cited by examiner

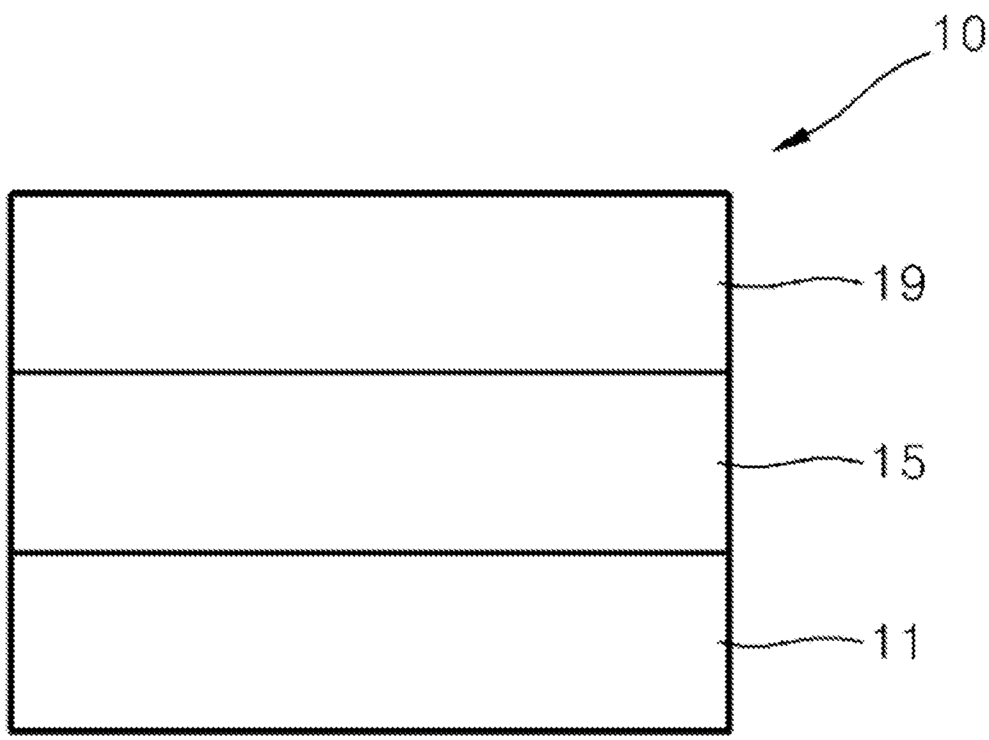
10
19
15
11

COMPOSITION AND ORGANIC LIGHT-EMITTING DEVICE INCLUDING THE SAME

CROSS-REFERENCE TO RELATED APPLICATION

This application claims priority to and the benefit of Korean Patent Applications Nos. 10-2019-0037215, filed on Mar. 29, 2019, and 10-2019-0136948, filed on Oct. 30, 2019, in the Korean Intellectual Property Office, and all the benefits accruing therefrom under 35 U.S.C. § 119 the content of which is incorporated herein in its entirety by reference.

BACKGROUND

1. Field

One or more embodiments relate to compositions and organic light-emitting devices including the same.

2. Description of the Related Art

Organic light-emitting devices are self-emission devices, which have improved characteristics in terms of a viewing angle, a response time, brightness, a driving voltage, and a response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

SUMMARY

One or more embodiments include a novel composition and an organic light-emitting device including the same.

Additional aspects will be set forth in part in the description which follows and, in part, will be apparent from the description, or may be learned by practice of the presented embodiments.

According to an aspect, provided is a composition including a first compound, a second compound, and a third compound, wherein the first compound may include a compound represented by Formula 1, the second compound may include a compound represented by Formula 2, and the third compound may include a compound represented by Formula 3:

Formula 1

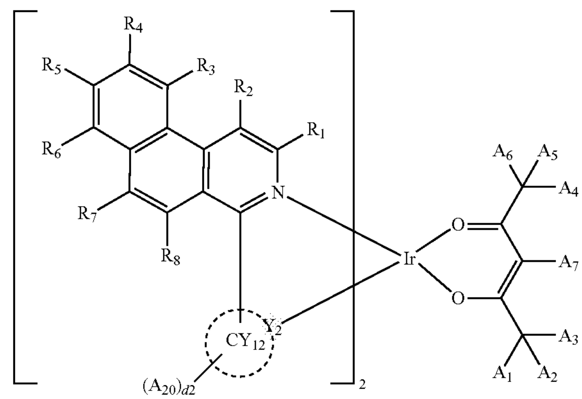

Formula 2

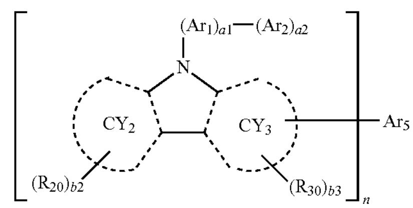

Formula 3

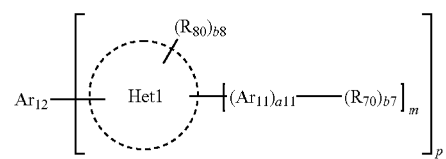

$Y_2$ in Formula 1 may be C, ring $CY_2$ in Formula 1 may be a $C_5$-$C_{60}$ carbocyclic group or a $C_1$-$C_{60}$ heterocyclic group, $Ar_1$, $Ar_2$, and $Ar_{11}$ in Formulae 2 and 3 may each independently be a $C_5$-$C_{60}$ carbocyclic group which is unsubstituted or substituted with at least one $R_{61}$ or a $C_1$-$C_{60}$ heterocyclic group which is unsubstituted or substituted with at least one $R_{61}$, $Ar_5$ and $Ar_{12}$ in Formulae 2 and 3 may each independently be a single bond, a $C_5$-$C_{60}$ carbocyclic group which is unsubstituted or substituted with at least one $R_{65}$, or a $C_1$-$C_{60}$ heterocyclic group which is unsubstituted or substituted with at least one $R_{65}$, or may not exist, n in Formula 2 may be 1, 2, or 3, and when n is 1, $Ar_5$ does not exist, p in Formula 3 may be 1, 2, or 3, and when p is 1, $Ar_{12}$ does not exist, a1 and a2 in Formula 2 may each independently be an integer from 0 to 5, and the sum of a1 and a2 may be 1 or more, ring $CY_2$ and ring $CY_3$ in Formula 2 may each independently be a $C_5$-$C_{60}$ carbocyclic group or a $C_1$-$C_{60}$ heterocyclic group, and ring $CY_2$ and ring $CY_3$ may be optionally linked to each other with a $C_5$-$C_{60}$ carbocyclic group which is unsubstituted or substituted with at least one $R_{66}$ or a $C_1$-$C_{60}$ heterocyclic group which is unsubstituted or substituted with at least one $R_{66}$ therebetween, Het1 in Formula 3 may be a $\pi$ electron-depleted nitrogen-containing $C_1$-$C_{60}$ cyclic group, a11 and m in Formula 3 may each independently be an integer from 1 to 10, $R_1$ to $R_8$, $A_{20}$, $A_1$ to $A_7$, $R_{20}$, $R_{30}$, $R_{61}$, $R_{65}$, $R_{66}$, $R_{70}$, and $R_{80}$ in Formulae 1 to 3 may each independently be hydrogen, deuterium, —F, —Cl, —Br, —I, —$SF_5$, a hydroxyl group, a cyano group, a nitro group, an amino group, an amidino group, a hydrazino group, a hydrazono group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), b2, b3, b7, and b8 in Formulae 2 and 3 may each independently be an integer from 0 to 20, when b2 is 2 or more, two or more $R_{20}$(s) may be identical to or different from each other, when b3 is 2 or more, two or more $R_{30}$(s) may be identical to or different from each other, when b7 is 2 or more, two or more $R_{70}$(s) may be identical to or different from each other, and when b8 is 2 or more, two or more $R_{80}$(s) may be identical to or different from each other, d2 may be an integer from 0 to 10, and when d2 is 2 or more, two or more $A_{20}$(s) may be identical to or different from each other, at least one of $R_1$ to $R_8$, $A_{20}$, or any combination thereof may comprise at least one fluoro group (—F), two or more of $R_1$ to $R_8$ and $A_{20}$ in Formula 1 may optionally be linked to form a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$, two or more of A, to $A_7$ in Formula 1 may optionally be linked to form a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$, two or more of ring $CY_2$, ring $CY_3$, $R_{20}$, and $R_{30}$ in Formula 2 in Formula 1 may optionally be linked to form a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$, $R_{1a}$ is the same as described in connection with $A_7$, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$) ($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, and wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Another aspect provides an organic light-emitting device including: a first electrode; a second electrode; and an organic layer disposed between the first electrode and the second electrode and including an emission layer, wherein the organic layer includes the composition including the first compound, the second compound and the third compound.

The composition may be included in the emission layer of the organic layer, and the first compound included in the emission layer may act as a dopant.

BRIEF DESCRIPTION OF THE DRAWING

The above and other aspects, features, and advantages of certain embodiments of the disclosure will be more apparent from the following description taken in conjunction with FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES. It will be understood that relative terms are intended to encompass different orientations of the device in addition to the orientation depicted in the FIGURES. For example, if the device in one of the FIGURES is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in one of the FIGURES is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A composition according to an embodiment may include a first compound, a second compound, and a third compound, and the first compound may include a compound represented by Formula 1, the second compound may include a compound represented by Formula 2, and the third compound may include a compound represented by Formula 3:

Formula 1

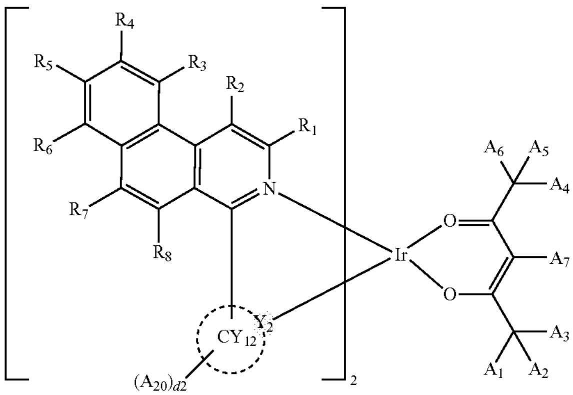

Formula 2

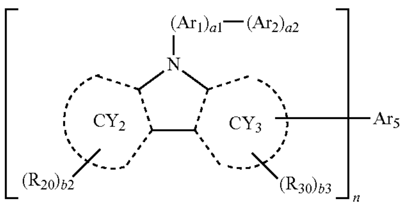

Formula 3

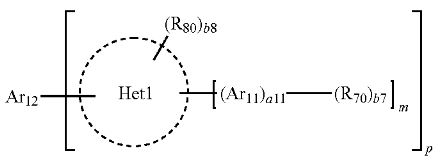

The first compound may include one compound encompassed in the first compound represented by Formula 1 only or at least two different compounds encompassed in the first compound represented by Formula 1.

The second compound may include one compound encompassed in the second compound represented by Formula 2 only or at least two different compounds encompassed in the second compound represented by Formula 2.

The third compound may include one compound encompassed in the third compound represented by Formula 3 only or at least two different compounds encompassed in the third compound represented by Formula 3.

The first compound, the second compound and the third compound may be different from each other.

Description of Formula 1

$Y_2$ in Formula 1 may be C.

A ring $CY_{12}$ in Formula 1 may be a $C_5$-$C_{60}$ carbocyclic group or a $C_1$-$C_{60}$ heterocyclic group.

For example, the ring $CY_{12}$ in Formula 1 may be i) a third ring, ii) a fourth ring, iii) a condensed cyclic group in which two or more third rings are condensed with each other, iv) a condensed cyclic group in which two or more fourth rings are condensed with each other, or v) a condensed cyclic group in which at least one third ring is condensed with at least one fourth ring, the third ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the fourth ring may be an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, the ring $CY_{12}$ in Formula 1 may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, the ring $CY_{12}$ may be a benzene group, a naphthalene group, a 1, 2, 3, 4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

$R_1$ to $R_8$, $A_{20}$ and $A_1$ to $A_7$ in Formula 1 may each independently be hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$). $Q_1$ to $Q_9$ are the same as described herein.

In embodiments, $A_{20}$ in Formula 1 may include neither a fluoro group (—F) nor a cyano group. For example, $A_{20}$ may be a group that includes neither a fluoro group (—F) nor a cyano group.

In one or more embodiments, $R_1$ to $R_8$, $A_{20}$ and $A_1$ to $A_7$ in Formula 1 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group (a norbornyl group), a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$ or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof. Herein, $A_{20}$ in Formula 1 may include neither a fluoro group (—F) nor a cyano group.

In one or more embodiments, $R_1$ to $R_8$, $A_{20}$ and $A_1$ to $A_7$ in Formula 1 may each independently be hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted phenyl group, —$Si(Q_3)(Q_4)(Q_5)$, or —$Ge(Q_3)(Q_4)(Q_5)$. Herein, $A_{20}$ may include neither a fluoro group nor a cyano group.

In one or more embodiments, $R_1$ to $R_8$ and $A_1$ to $A_7$ in Formula 1 may each independently be:

hydrogen, deuterium, or —F;

a $C_1$-$C_{20}$ alkyl group, a $C_3$-$C_{10}$ cycloalkyl group, a $C_2$-$C_{10}$ heterocycloalkyl group, or a phenyl group, each unsubstituted or substituted with deuterium, —F, $C_1$-$C_{20}$ alkyl group, a $C_3$-$C_{10}$ cycloalkyl group, a $C_2$-$C_{10}$ heterocycloalkyl group, a phenyl group, or any combination thereof; or —$Si(Q_3)(Q_4)(Q_5)$, or —$Ge(Q_3)(Q_4)(Q_5)$.

In one or more embodiments, $A_{20}$ in Formula 1 may be:

hydrogen or deuterium;

a $C_1$-$C_{20}$ alkyl group, a $C_3$-$C_{10}$ cycloalkyl group, a $C_2$-$C_{10}$ heterocycloalkyl group, or a phenyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, a phenyl group, or any combination thereof; or —$Si(Q_3)(Q_4)(Q_5)$, or —$Ge(Q_3)(Q_4)(Q_5)$.

The designation d2 in Formula 1 indicates the number of $A_{20}$(S), and may be an integer from 0 to 10. When d2 is 2 or more, two or more $A_{20}$(S) may be identical to or different from each other. For example, d2 may be an integer from 0 to 6.

For example, at least one of $R_1$ to $R_8$, $A_{20}$ or any combination thereof in Formula 1 may include at least one fluoro group (—F).

For example, at least one of $R_1$ to $R_8$ (for example, at least one of $R_2$ to $R_8$, or at least one of $R_3$ to $R_6$) of Formula 1 may include at least one fluoro group (—F).

For example, at least one of $R_1$ to $R_8$ (for example, at least one of $R_2$ to $R_8$, or at least one of $R_3$ to $R_6$) of Formula 1 may be a group including at least one fluoro group (—F).

In one or more embodiments, at least one of $R_1$ to $R_8$ in Formula 1 may each independently be:

a fluoro group (—F); or a fluorinated $C_1$-$C_{20}$ alkyl group, a fluorinated $C_3$-$C_{10}$ cycloalkyl group, a fluorinated $C_2$-$C_{10}$ heterocycloalkyl group, or a fluorinated phenyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, a phenyl group, or any combination thereof.

In one or more embodiments, at least one of $A_1$ to $A_6$ in Formula 1 may each independently be a substituted or unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, at least one of $A_1$ to $A_6$ in Formula 1 may each independently be a substituted or unsubstituted $C_2$-$C_{60}$ alkyl group, a substituted or unsubstituted $C_3$-$C_{10}$ cycloalkyl group, or a substituted or unsubstituted $C_2$-$C_{10}$ heterocycloalkyl group.

In one or more embodiments, at least one of $A_1$ to $A_3$ and at least one of $A_4$ to $A_6$ in Formula 1 may each independently be a substituted or unsubstituted $C_2$-$C_{60}$ alkyl group, a substituted or unsubstituted $C_3$-$C_{10}$ cycloalkyl group, or a substituted or unsubstituted $C_2$-$C_{10}$ heterocycloalkyl group.

In one or more embodiments, at least one of $A_1$ to $A_6$ in Formula 1 may each independently be a $C_2$-$C_{60}$ alkyl group, a $C_3$-$C_{10}$ cycloalkyl group, or a $C_2$-$C_{10}$ heterocycloalkyl group, each unsubstituted or substituted with deuterium, —F, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, $A_1$ to $A_6$ in Formula 1 may each independently be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, $A_1$ to $A_6$ in Formula 1 may each independently be a substituted or unsubstituted $C_1$-$C_{60}$ alkyl group, a substituted or unsubstituted $C_3$-$C_{10}$ cycloalkyl group, or a substituted or unsubstituted $C_2$-$C_{10}$ heterocycloalkyl group.

In one or more embodiments, $A_1$ to $A_6$ in Formula 1 may each independently be a $C_1$-$C_{60}$ alkyl group, a $C_3$-$C_{10}$ cycloalkyl group, or a $C_2$-$C_{10}$ heterocycloalkyl group, each unsubstituted or substituted with deuterium, —F, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, $A_7$ in Formula 1 may be hydrogen or deuterium.

In one or more embodiments, $A_7$ in Formula 1 may not be hydrogen.

In one or more embodiments, $A_7$ in Formula 1 may be a substituted or unsubstituted $C_1$-$C_{60}$ alkyl group, a substituted or unsubstituted $C_3$-$C_{10}$ cycloalkyl group, or a substituted or unsubstituted $C_2$-$C_{10}$ heterocycloalkyl group.

In one or more embodiments, $A_7$ in Formula 1 may be a $C_1$-$C_{60}$ alkyl group, a $C_3$-$C_{10}$ cycloalkyl group, or a $C_2$-$C_{10}$ heterocycloalkyl group, each unsubstituted or substituted with deuterium, —F, a $C_1$-$C_{20}$ alkyl group, a $C_3$-$C_{10}$ cycloalkyl group, a $C_2$-$C_{10}$ heterocycloalkyl group, or any combination thereof.

For example, $R_1$ to $R_8$, $A_{20}$ and Ai to $A_7$ in Formula 1 may each independently be hydrogen, deuterium, —F, —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-201 to 10-343, a group represented by one of Formulae 10-201 to 10-343 in which at least one hydrogen is substituted with deuterium, a group represented by one of Formulae 10-201 to 10-343 in which at least one hydrogen is substituted with —F, —$Si(Q_3)(Q_4)(Q_5)$, or —$Ge(Q_3)(Q_4)(Q_5)$ (herein $Q_3$ to $Q_5$ are the same as described in the present specification), and at least one of $R_1$ to $R_8$ (for example, at least one of $R_2$ to $R_8$, or at least one of $R_3$ to $R_6$) may be —F, —$CF_3$, —$CF_2H$, —$CFH_2$, a group represented by one of Formulae 9-1 to 9-39 in which at least one hydrogen is substituted with —F, a group represented by one of Formulae 9-201 to 9-233 in which at least one hydrogen is substituted with —F, a group represented by one of Formulae 10-1 to 10-126 in which at least one hydrogen is substituted with —F, or a group represented by one of Formulae 10-201 to 10-343 in which at least one hydrogen is substituted with —F.

In one or more embodiments, $A_{20}$ in Formula 1 may be hydrogen, deuterium, —$CH_3$, —$CD_3$, —$CD_2H$, —$CDH_2$, a group represented by one of Formulae 9-1 to 9-39, a group represented by one of Formulae 9-1 to 9-39 in which at least one hydrogen is substituted with deuterium, a group represented by one of Formulae 9-201 to 9-233, a group represented by one of Formulae 9-201 to 9-233 in which at least one hydrogen is substituted with deuterium, a group represented by one of Formulae 10-1 to 10-126, a group represented by one of Formulae 10-1 to 10-126 in which at least one hydrogen is substituted with deuterium, a group represented by one of Formulae 10-201 to 10-343, a group represented by one of Formulae 10-201 to 10-343 in which at least one hydrogen is substituted with deuterium, —$Si(Q_3)(Q_4)(Q_5)$, or —$Ge(Q_3)(Q_4)(Q_5)$ (herein $Q_3$ to $Q_5$ are the same as described in the present specification).

In one or more embodiments, at least one of $A_1$ to $A_6$ in Formula 1 may each independently be a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-201 to 10-343, a group represented by one of Formulae 10-201 to 10-343 in which at least one hydrogen is substituted with deuterium, or a group represented by one of Formulae 10-201 to 10-343 in which at least one hydrogen is substituted with —F.

In one or more embodiments, $A_1$ to $A_6$ in Formula 1 may each independently be —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-201 to 10-343, a group represented by one of Formulae 10-201 to 10-343 in which at least one hydrogen is substituted with deuterium, or a group represented by one of Formulae 10-201 to 10-343 in which at least one hydrogen is substituted with —F:

9-1

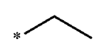

9-2

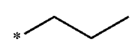

9-3

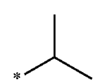

9-4

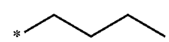

9-5

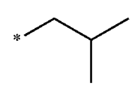

9-6

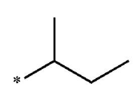

9-7

9-8

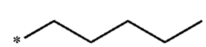

9-9

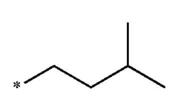

9-10

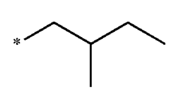

-continued
9-11
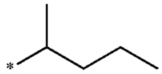
9-12
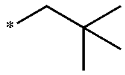
9-13
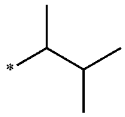
9-14
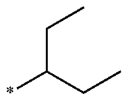
9-15
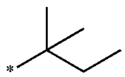
9-16
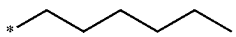
9-17
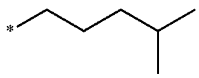
9-18
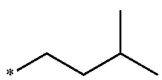
9-19
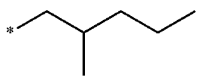
9-20
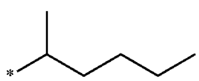
9-21
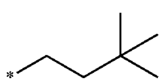
9-22
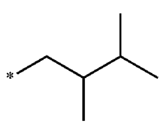
9-23
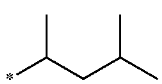
9-24
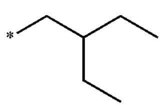
9-25
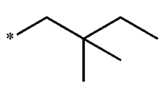
9-26
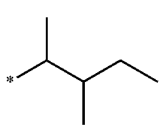
-continued
9-27
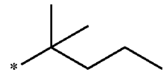
9-28
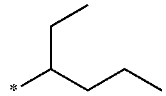
9-29
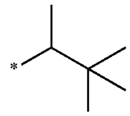
9-30
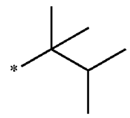
9-31
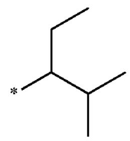
9-32
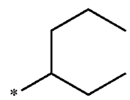
9-33
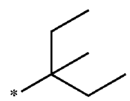
9-34
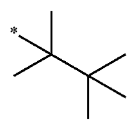
9-35
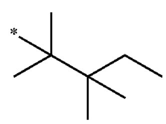
9-36
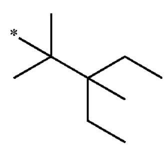
9-37
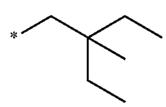
9-38
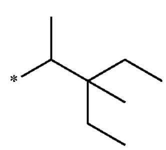
9-39
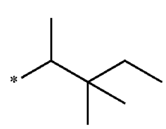

-continued
9-201
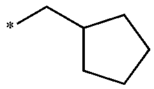
9-202
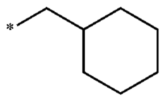
9-203
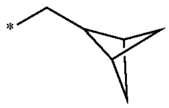
9-204
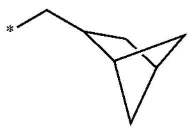
9-205
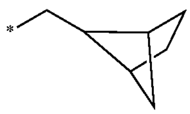
9-206
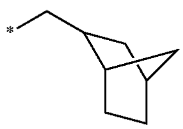
9-207
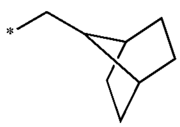
9-208
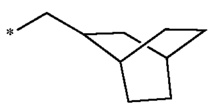
9-209
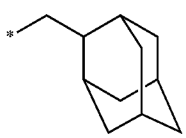
9-210
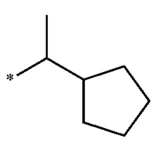
9-211
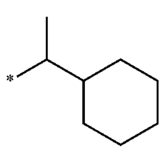
9-212
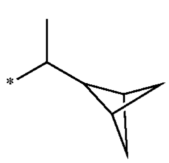
-continued
9-213
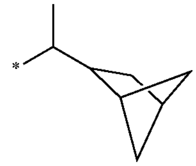
9-214
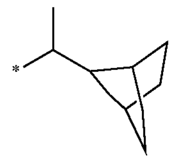
9-215
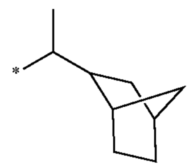
9-216
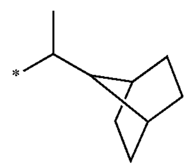
9-217
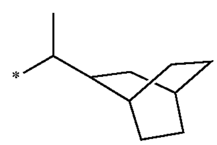
9-218
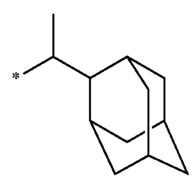
9-219
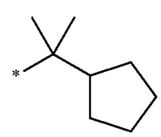
9-220
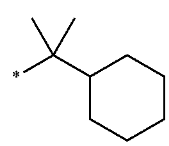
9-221
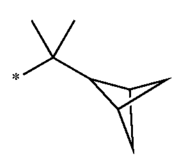

-continued
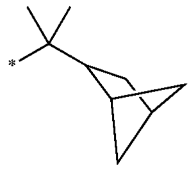
9-222
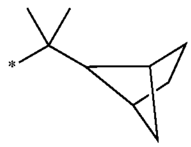
9-223
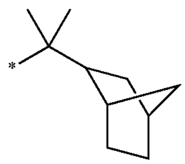
9-224
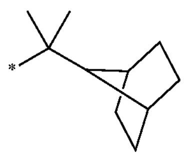
9-225
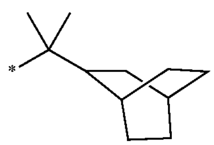
9-226
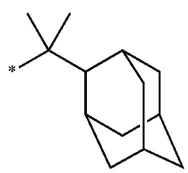
9-227
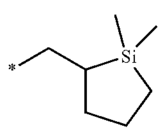
9-228
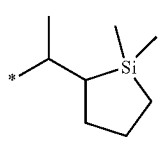
9-229
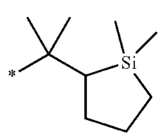
9-230
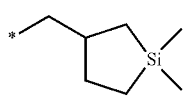
9-231
-continued
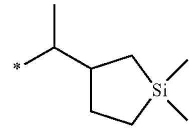
9-232
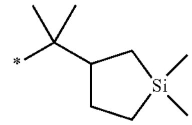
9-233
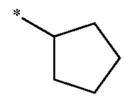
10-1
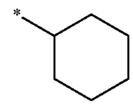
10-2
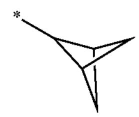
10-3
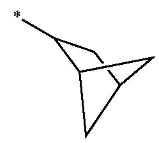
10-4
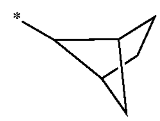
10-5
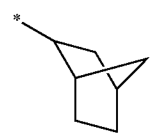
10-6
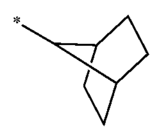
10-7
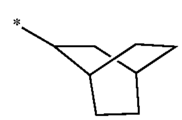
10-8
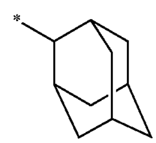
10-9
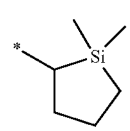
10-10

-continued
10-11
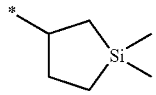
10-12
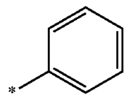
10-13
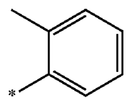
10-14
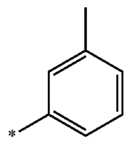
10-15
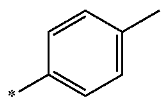
10-16
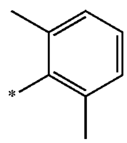
10-17
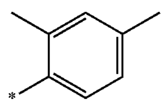
10-18
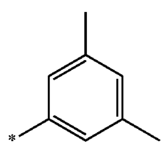
10-19
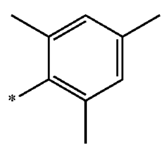
10-20
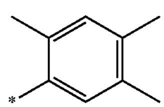
10-21
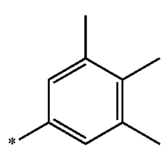
10-22
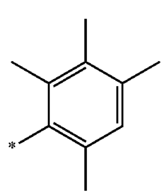
-continued
10-23
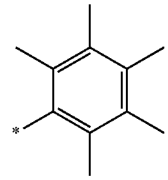
10-24
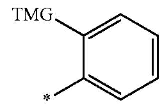
10-25
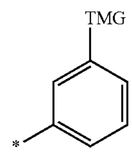
10-26
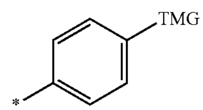
10-27
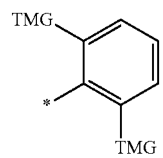
10-28
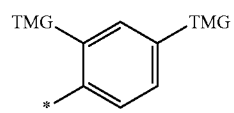
10-29
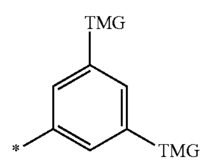
10-30
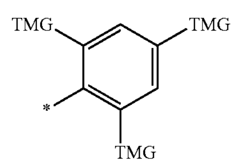
10-31
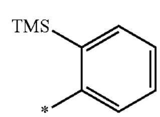
10-32
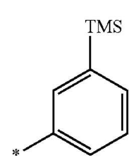
10-33
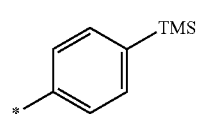

-continued
10-34
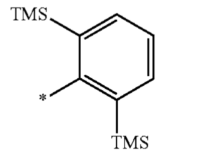
10-35
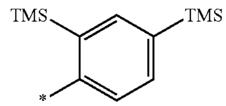
10-36
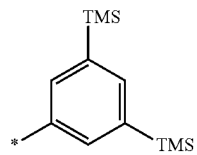
10-37
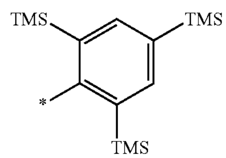
10-38
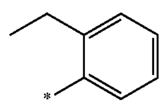
10-39
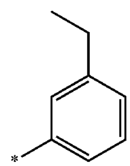
10-40
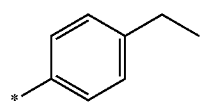
10-41
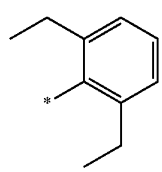
10-42
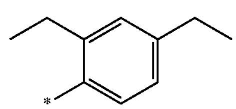
10-43
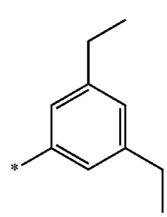
-continued
10-44
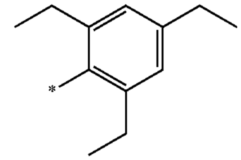
10-45
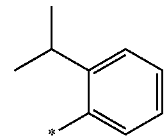
10-46
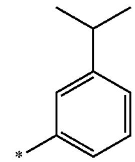
10-47
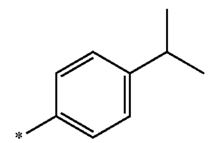
10-48
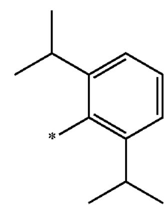
10-49
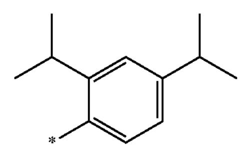
10-50
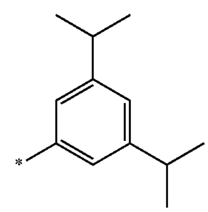
10-51
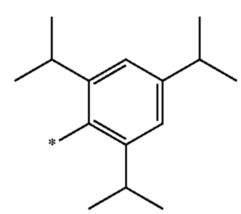
10-52
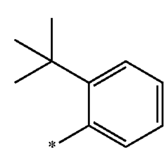

10-53
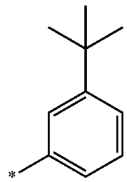
10-54
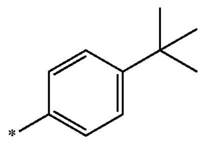
10-55
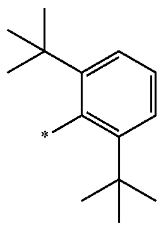
10-56
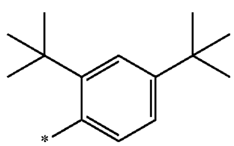
10-57
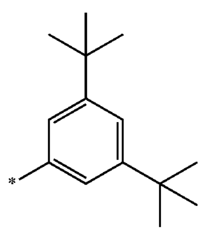
10-58
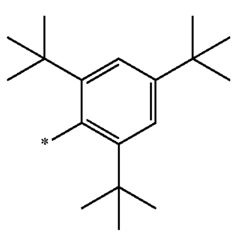
10-59
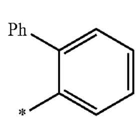
10-60
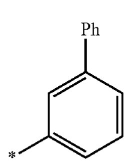
10-61
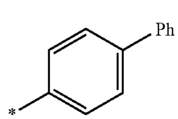
10-62
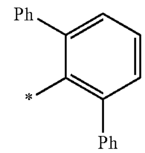
10-63
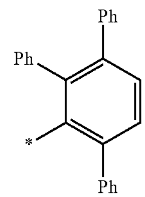
10-64
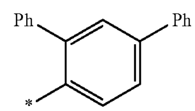
10-65
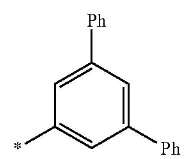
10-66
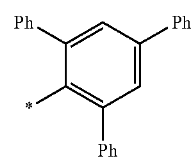
10-67
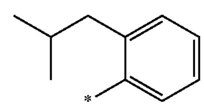
10-68
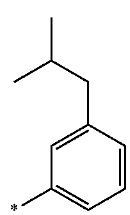
10-69
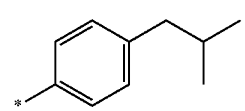
10-70
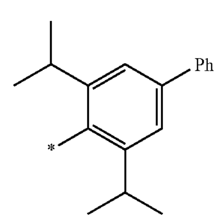

-continued
10-71
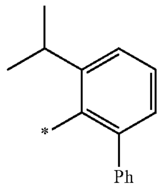
10-72
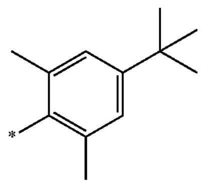
10-73
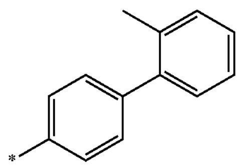
10-74
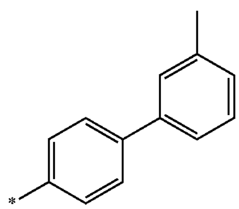
10-75
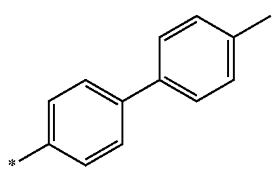
10-76
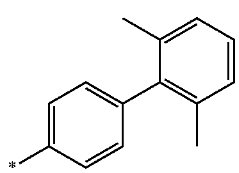
10-77
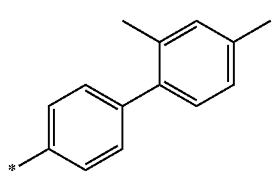
10-78
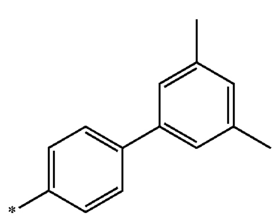
-continued
10-79
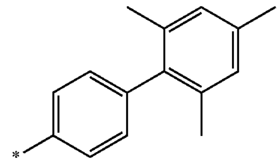
10-80
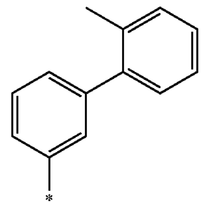
10-81
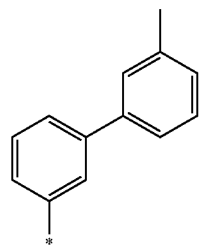
10-82
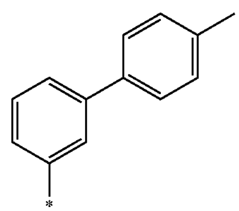
10-83
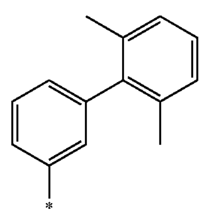
10-84
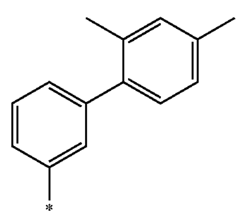
10-85
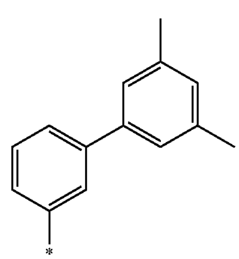

-continued
10-86
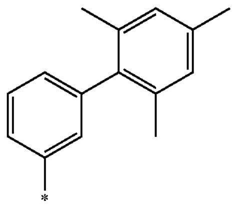
10-87
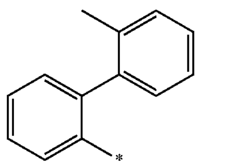
10-88
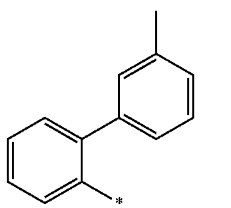
10-89
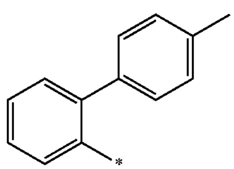
10-90
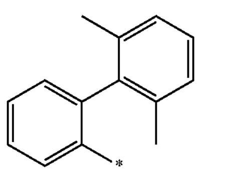
10-91
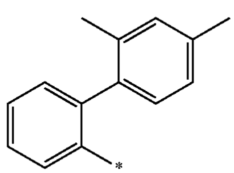
10-92
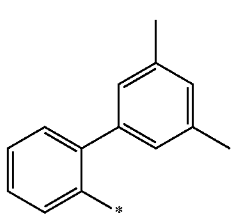
10-93
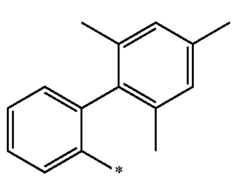
-continued
10-94
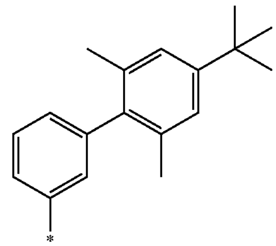
10-95
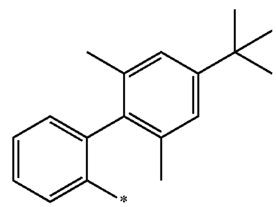
10-96
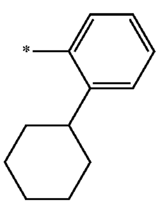
10-97
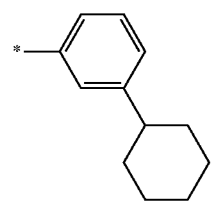
10-98
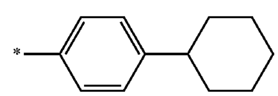
10-99
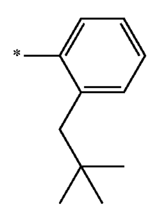
10-100
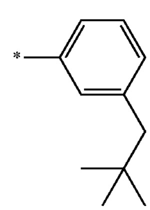
10-101
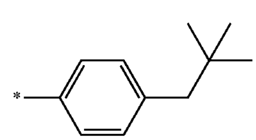

-continued
10-102
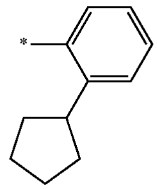
10-103
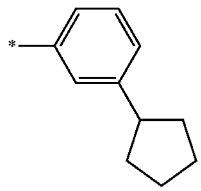
10-104
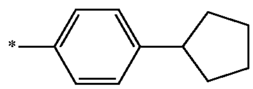
10-105
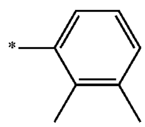
10-106
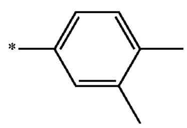
10-107
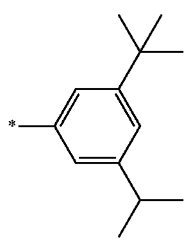
10-108
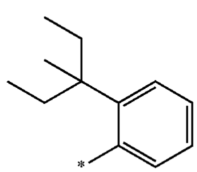
10-109
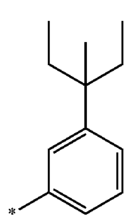
10-110
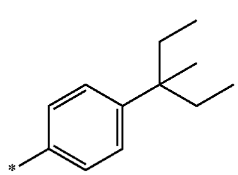
-continued
10-111
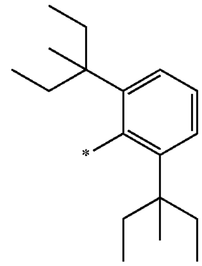
10-112
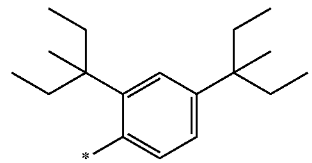
10-113
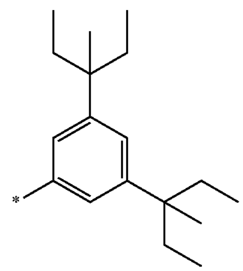
10-114
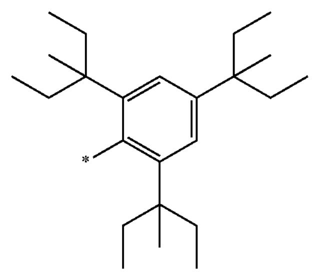
10-115
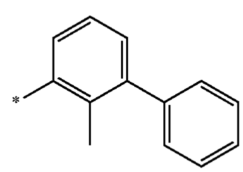
10-116
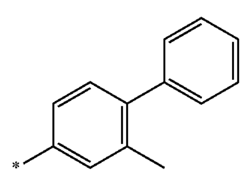
10-117
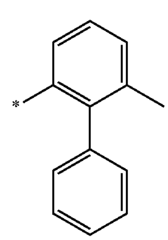

-continued
10--118
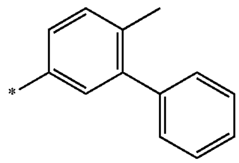
10-119
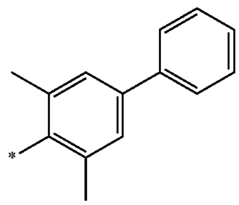
10-120
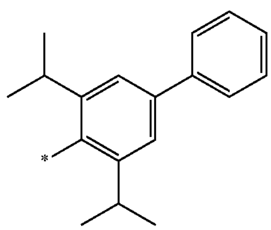
10-121
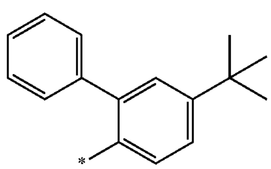
10-122
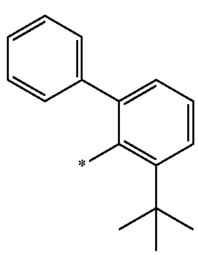
10-123
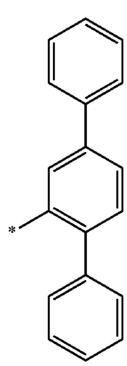
-continued
10-124
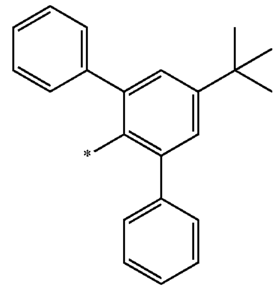
10-125
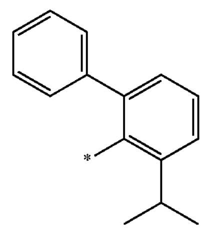
10-126
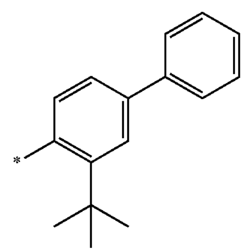
10-201
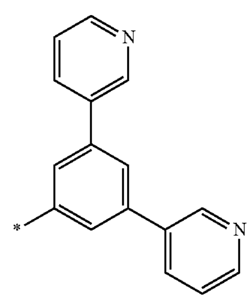
10-202
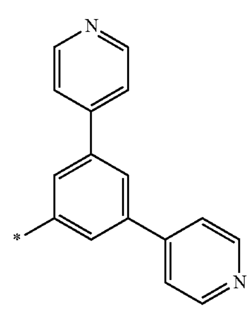

-continued
10-203
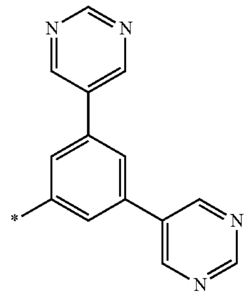
10-204
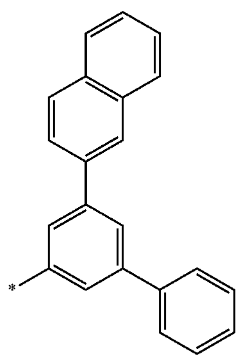
10-205
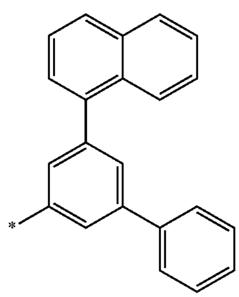
10-206
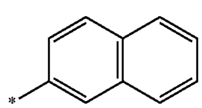
10-207
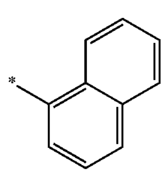
10-208
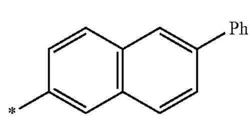
10-209
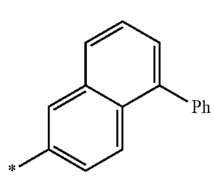
-continued
10-210
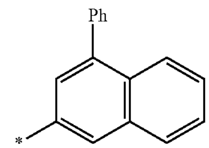
10-211
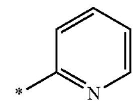
10-212
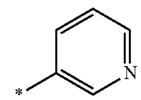
10-213
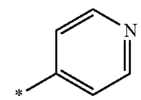
10-214
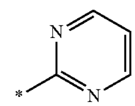
10-215
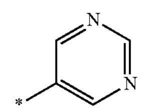
10-216
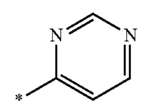
10-217
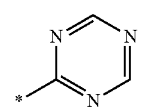
10-218
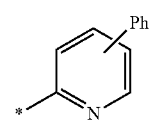
10-219
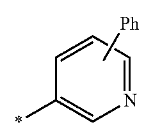
10-220
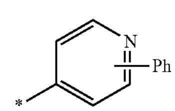
10-221
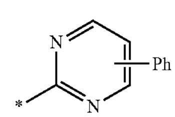
10-222
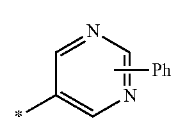

10-223
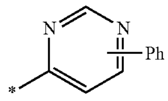
10-224
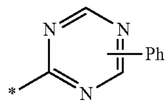
10-225
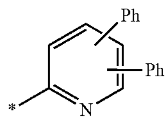
10-226
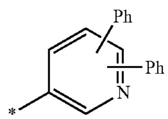
10-227
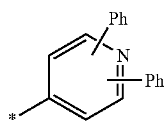
10-228
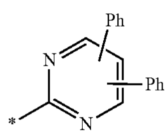
10-229
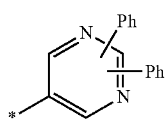
10-230
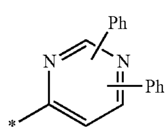
10-231
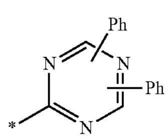
10-232
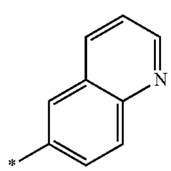
10-233
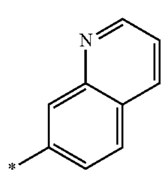
10-234
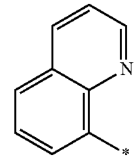
10-235
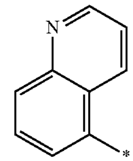
10-236
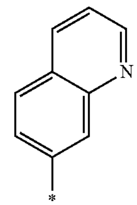
10-237
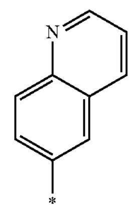
10-238
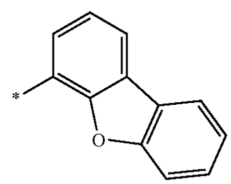
10-239
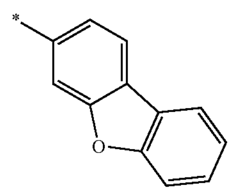
10-240
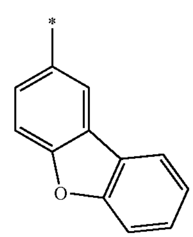
10-241
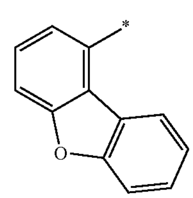

-continued
10-242
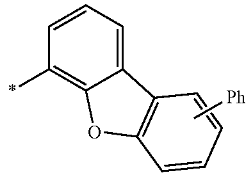
10-243
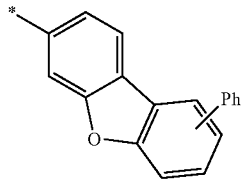
10-244
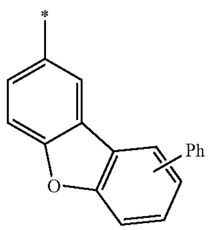
10-245
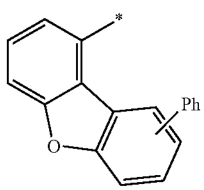
10-246
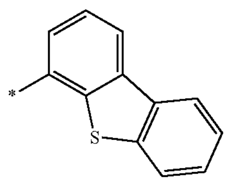
10-247
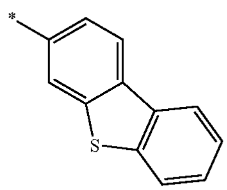
10-248
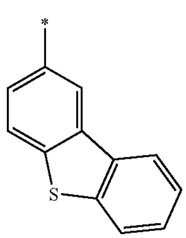
10-249
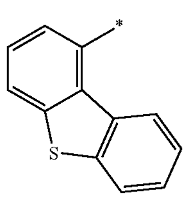
-continued
10-250
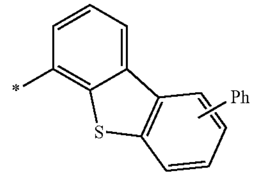
10-251
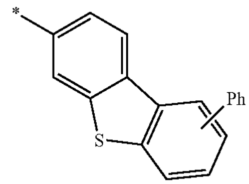
10-252
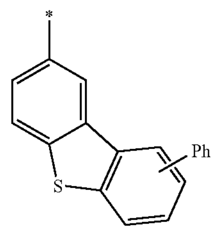
10-253
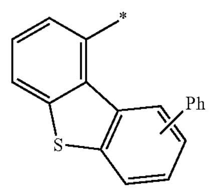
10-254
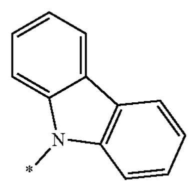
10-255
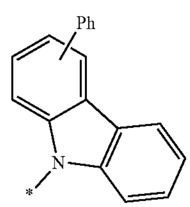
10-256
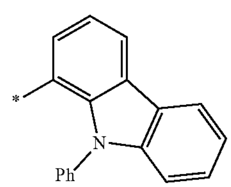
10-257
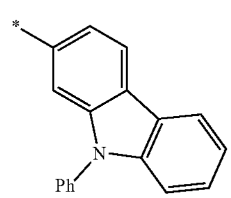

-continued
10-258
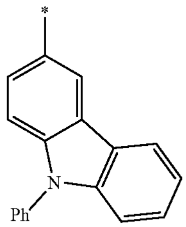
10-259
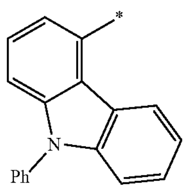
10-260
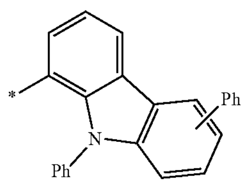
10-261
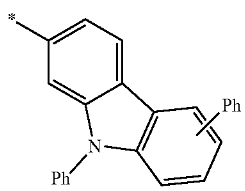
10-262
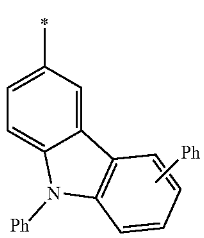
10-263
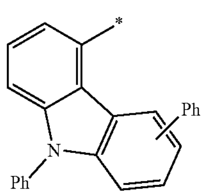
10-264
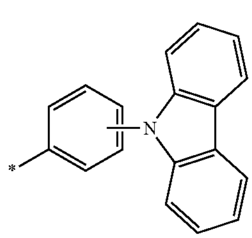
-continued
10-265
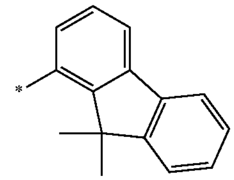
10-266
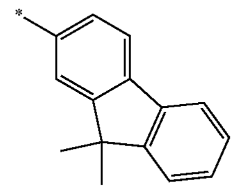
10-267
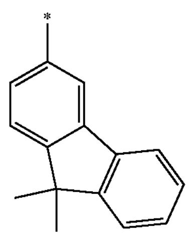
10-268
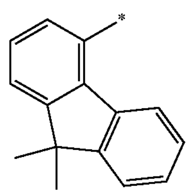
10-269
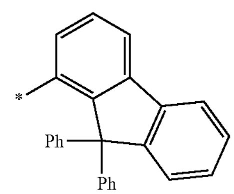
10-270
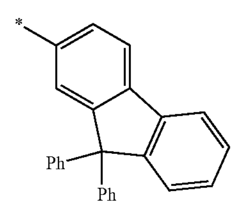
10-271
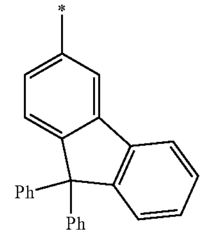

-continued
10-272
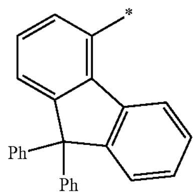
10-273
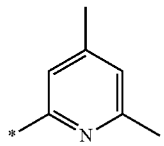
10-274
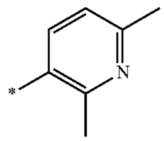
10-275
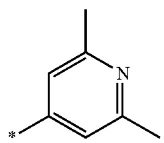
10-276
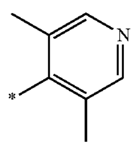
10-277
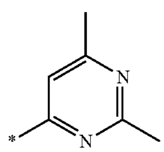
10-278
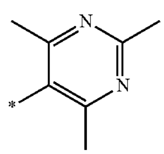
10-279
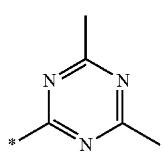
10-280
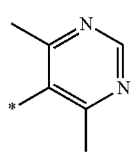
10-281
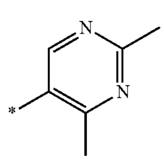
-continued
10-282
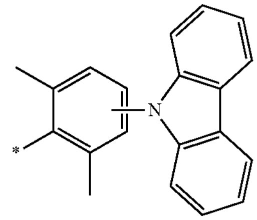
10-283
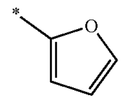
10-284
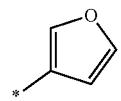
10-285
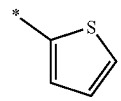
10-286
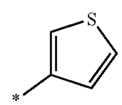
10-287
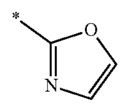
10-288
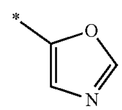
10-289
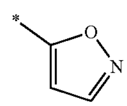
10-290
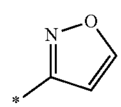
10-291
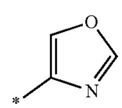
10-292
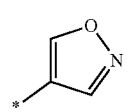
10-293
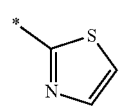
10-294
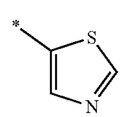

-continued
10-295
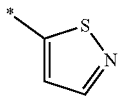
10-296
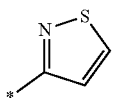
10-297
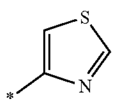
10-298
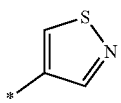
10-299
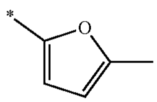
10-300
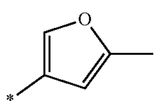
10-301
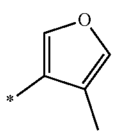
10-302
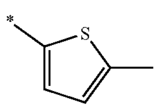
10-303
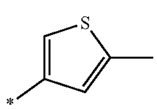
10-304
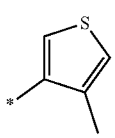
10-305
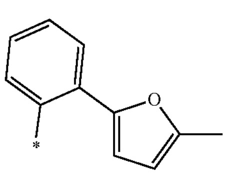
10-306
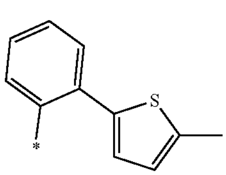
-continued
10-307
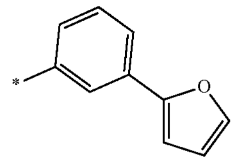
10-308
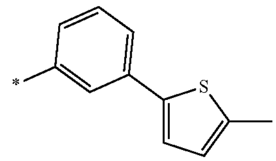
10-309
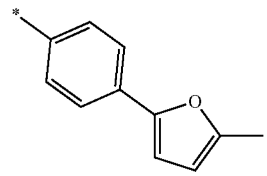
10-310
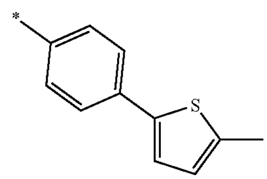
10-311
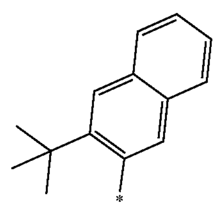
10-312
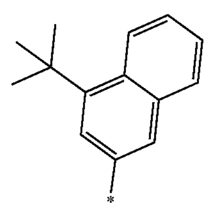
10-313
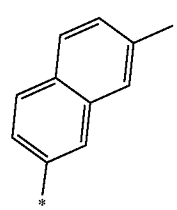
10-314
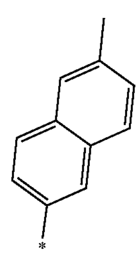

-continued
10-315
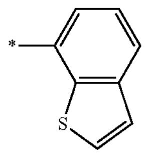
10-316
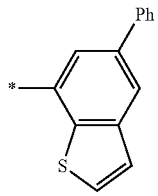
10-317
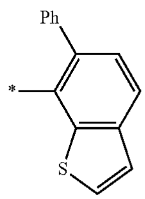
10-318
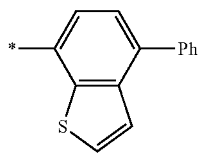
10-319
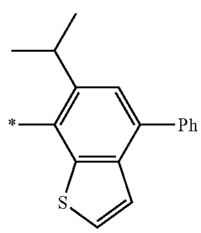
10-320
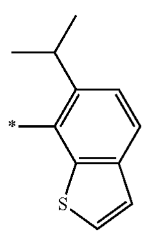
10-321
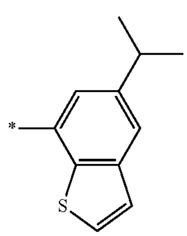
10-322
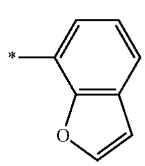
-continued
10-323
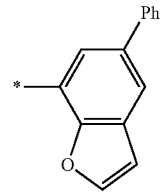
10-324
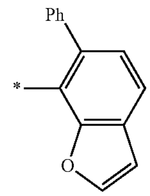
10-325
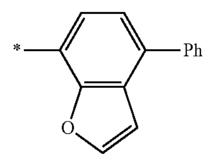
10-326
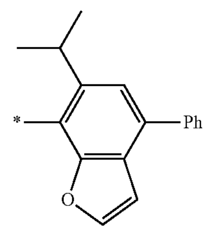
10-327
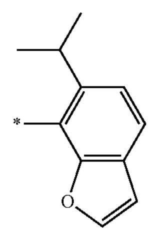
10-328
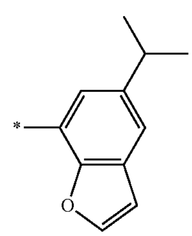
10-329
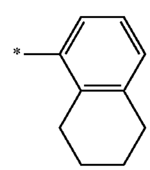
10-330
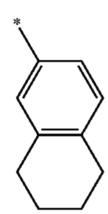

-continued 10-331

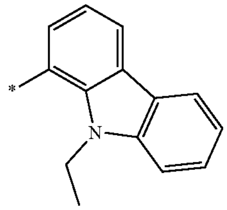

10-332

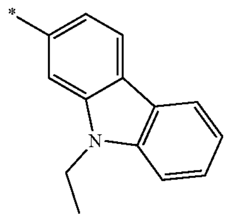

10-333

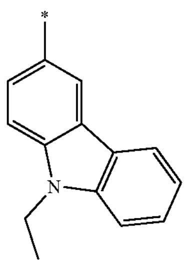

10-334

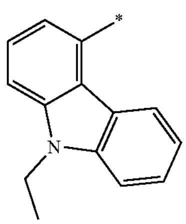

10-335

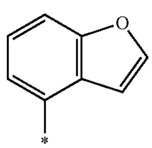

10-336

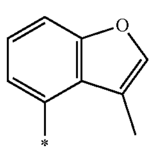

10-337

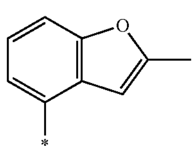

10-338

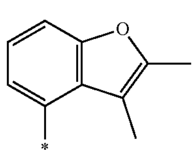

-continued 10-339

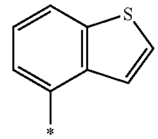

10-340

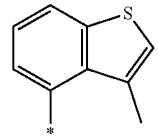

10-341

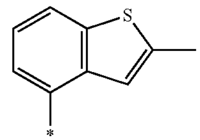

10-342

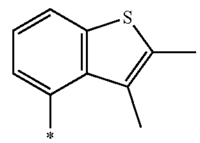

10-343

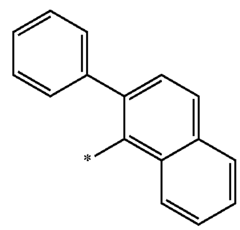

* in Formulae 9-1 to 9-39, 9-201 to 9-233, 10-1 to 10-126, and 10-201 to 10-343 indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-233 in which at least one hydrogen is substituted with deuterium" may each be, for example, a group represented by one of Formulae 9-501 to 9-514 and 9-601 to 9-635:

9-501

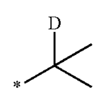

9-502

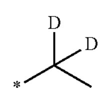

9-503

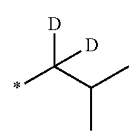

9-504

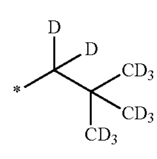

-continued
9-505
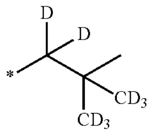
9-506
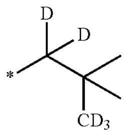
9-507
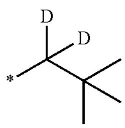
9-508
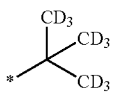
9-509
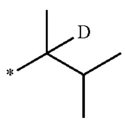
9-510
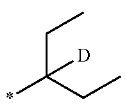
9-511
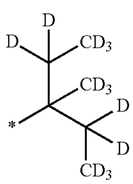
9-512
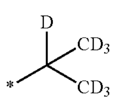
9-513
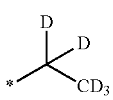
9-514
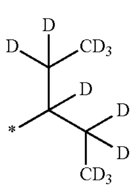
9-601
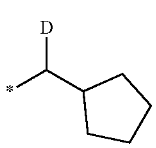
-continued
9-602
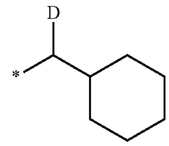
9-603
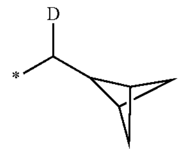
9-604
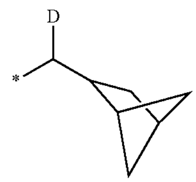
9-605
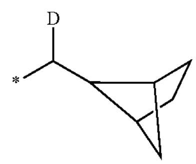
9-606
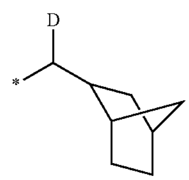
9-607
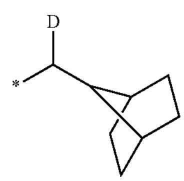
9-608
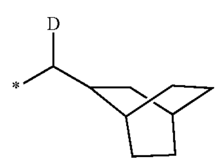
9-609
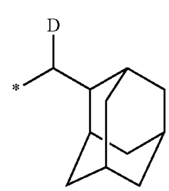
9-610
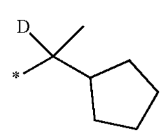

-continued
9-611
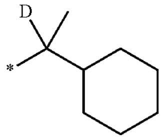
9-612
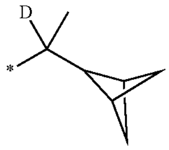
9-613
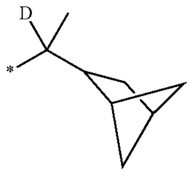
9-614
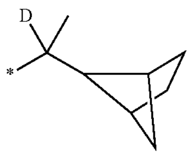
9-615
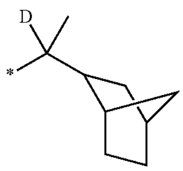
9-616
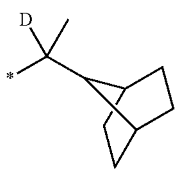
9-617
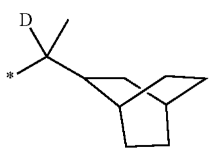
9-618
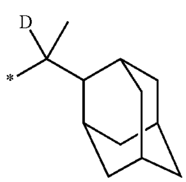
9-619
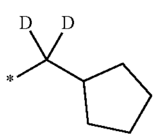
9-620
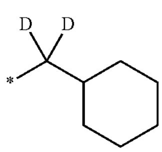
-continued
9-621
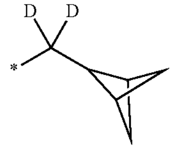
9-622
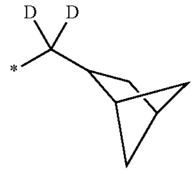
9-623
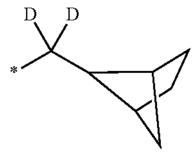
9-624
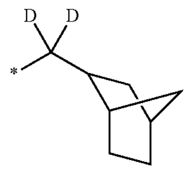
9-625
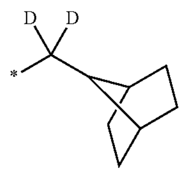
9-626
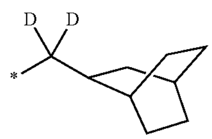
9-627
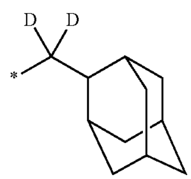
9-628
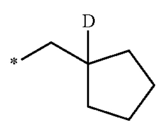
9-629
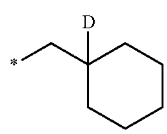
6-630
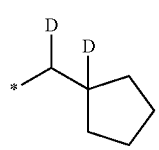

6-631

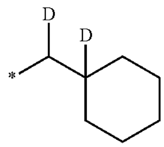

6-632

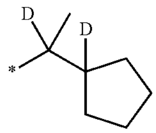

9-633

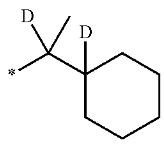

9-634

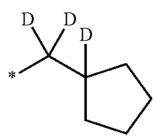

9-635

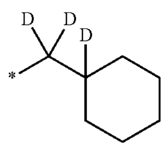

The “group represented by one of Formulae 9-1 to 9-39 in which at least one hydrogen is substituted with —F” and the “group represented by one of Formulae 9-201 to 9-233 in which at least one hydrogen is substituted with —F” may each be, for example, a group represented by one of Formulae 9-701 to 9-710:

9-701

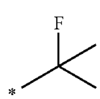

9-702

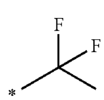

9-703

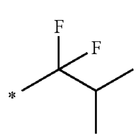

9-704

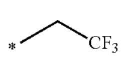

9-705

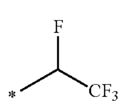

9-706

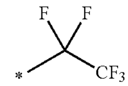

9-707

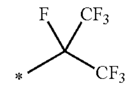

9-708

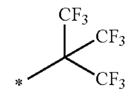

9-709

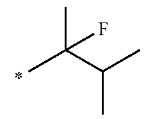

9-710

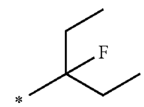

The “group represented by one of Formulae 10-1 to 10-126 in which at least one hydrogen is substituted with deuterium” and the “group represented by one of Formulae 10-201 to 10-343 in which at least one hydrogen is substituted with deuterium” may each be, for example, a group represented by one of Formulae 10-501 to 10-553:

10-501

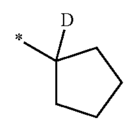

10-502

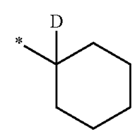

10-503

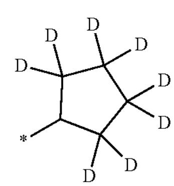

10-504

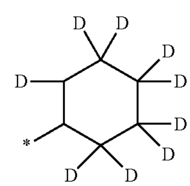

10-505

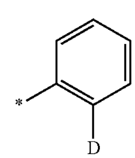

-continued
10-506
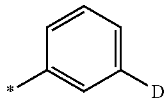
10-507
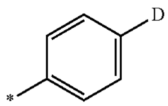
10-508
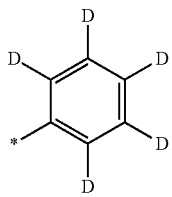
10-509
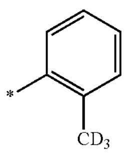
10-510
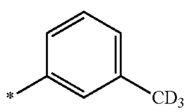
10-511
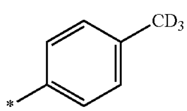
10-512
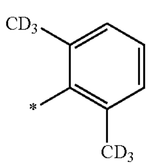
10-513
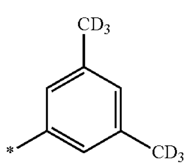
10-514
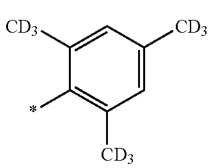
10-515
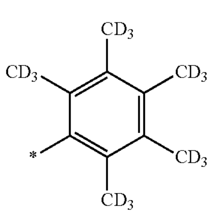
-continued
10-516
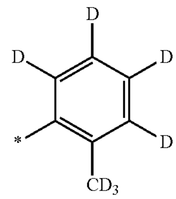
10-517
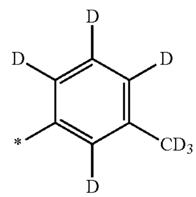
10-518
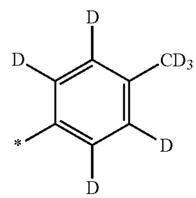
10-519
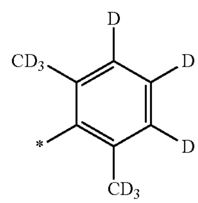
10-520
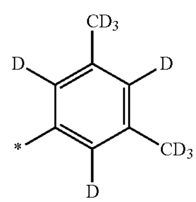
10-521
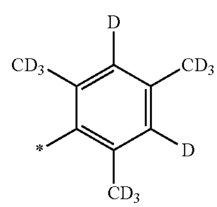
10-522
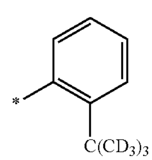
10-523
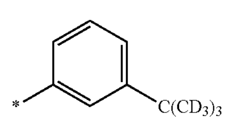
10-524
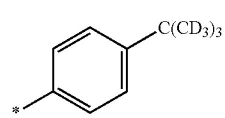

10-525
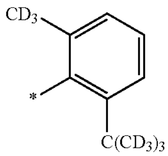
10-526
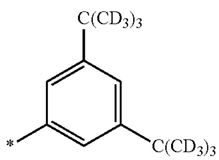
10-527
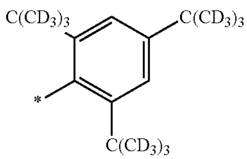
10-528
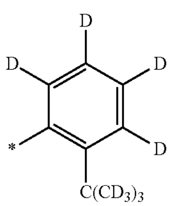
10-529
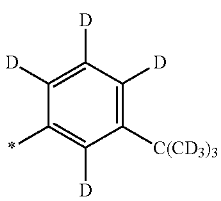
10-530
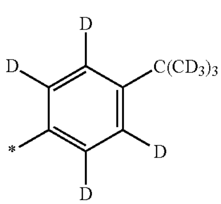
10-531
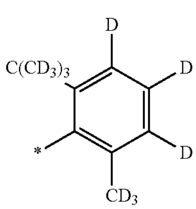
10-532
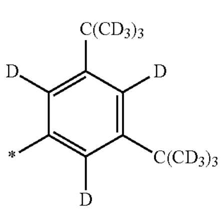
10-533
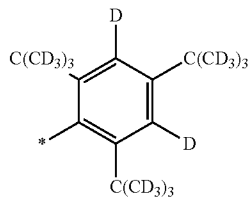
10-534
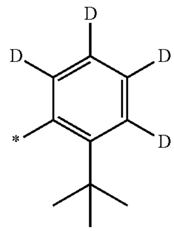
10-535
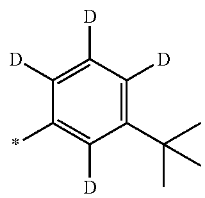
10-536
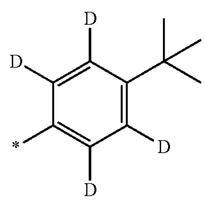
10-537
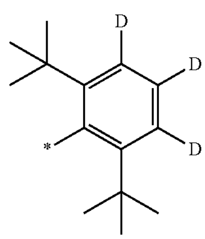
10-538
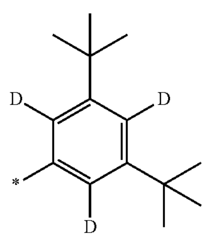
10-540
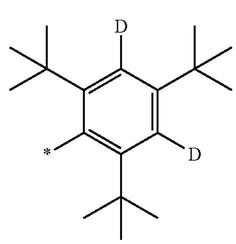

-continued
10-541
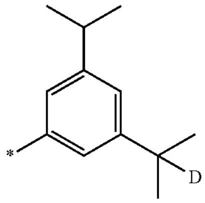
10-542
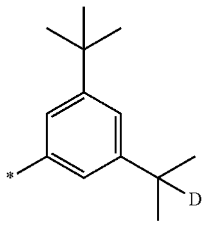
10-543
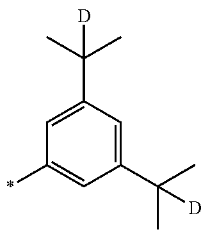
10-544
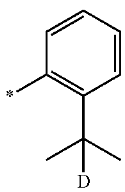
10-545
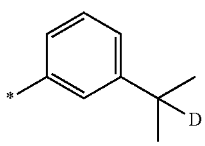
10-546
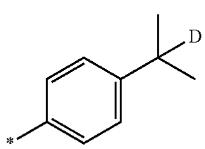
10-547
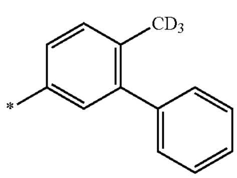
10-548
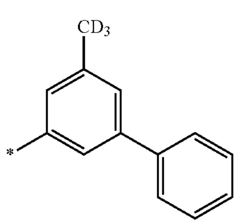
-continued
10-549
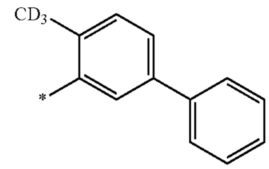
10-550
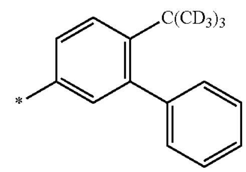
10-551
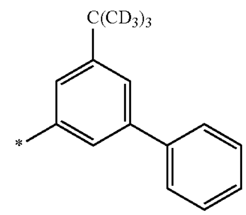
10-552
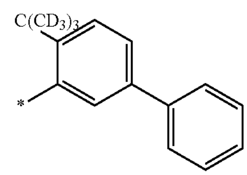
10-553
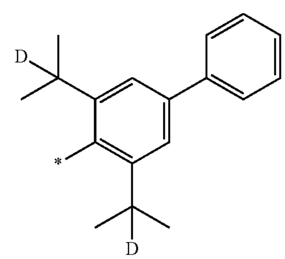
The "group represented by one of Formulae 10-1 to 10-126 in which at least one hydrogen is substituted with —F" and the "group represented by one of Formulae 10-201 to 10-343 in which at least one hydrogen is substituted with —F" may each be, for example, a group represented by one of Formulae 10-601 to 10-617:
10-601
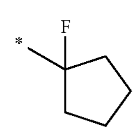
10-602
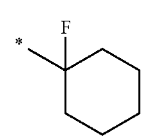

-continued 10-603

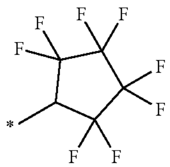

10-604

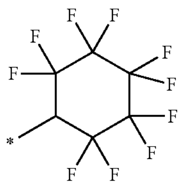

10-605

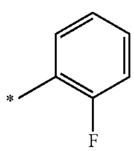

10-606

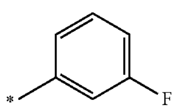

10-607

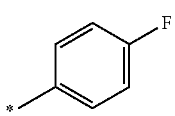

10-608

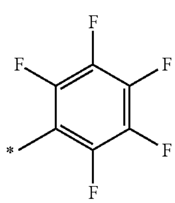

10-609

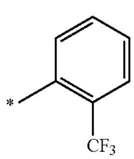

10-610

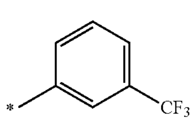

10-611

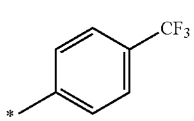

10-612

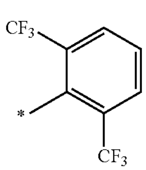

-continued 10-613

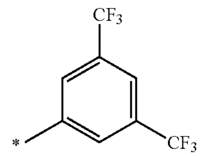

10-614

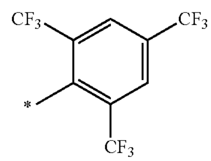

10-615

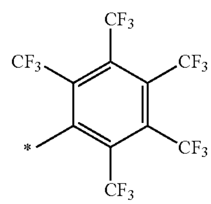

10-616

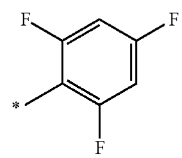

10-617

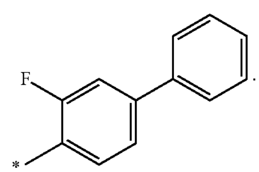

In one or more embodiments, in Formula 1,

1) $R_2$ may include at least one fluoro group (—F);

2) $R_3$ may include at least one fluoro group (—F);

3) $R_4$ may include at least one fluoro group (—F);

4) $R_5$ may include at least one fluoro group (—F);

5) $R_6$ may include at least one fluoro group (—F);

6) $R_7$ may include at least one fluoro group (—F);

7) $R_8$ may include at least one fluoro group (—F);

8) $R_4$ and $R_5$ may each include at least one fluoro group (—F);

9) $R_4$ and $R_6$ may each include at least one fluoro group (—F);

10) $R_5$ and $R_6$ may each include at least one fluoro group (—F);

11) $R_3$ and $R_4$ may each include at least one fluoro group (—F); or

12) $R_3$ and $R_6$ may each include at least one fluoro group (—F).

In one or more embodiments, regarding Formula 1, one or two of $R_1$ to $R_8$ may each independently include at least one fluoro group (—F), and at least one of $R_1$ to $R_8$ i) may not include a fluoro group (—F), and ii) may not be hydrogen.

In one or more embodiments, $A_{20}$ in Formula 1 may be a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, $A_{20}$ in Formula 1 may be a $C_1$-$C_{20}$ alkyl group, unsubstituted or substituted with deuterium, a $C_1$-$C_{20}$ alkyl group, or any combination thereof.

In one or more embodiments, d2 in Formula 1 may be 2.

In one or more embodiments, $A_{20}$ in Formula 1 may be a $C_1$-$C_{20}$ alkyl group, unsubstituted or substituted with deuterium, a $C_1$-$C_{20}$ alkyl group, or any combination thereof, and d2 may be 2.

In one or more embodiments, the organometallic compound represented by Formula 1 may have at least one deuterium.

In one or more embodiments, at least one of $R_1$ to $R_8$ of Formula 1 may have at least one deuterium.

In one or more embodiments, at least one of $R_{20}$ in number of d2 may have at least one deuterium.

In one or more embodiments, at least one of $R_{20}$ in number of d2 may be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In one or more embodiments, a group represented by

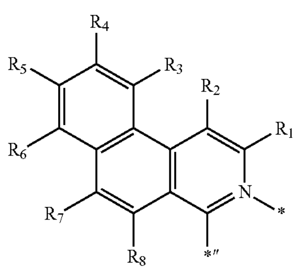

in Formula 1 may be a group represented by one of Formulae CY1 to CY108:

CY1

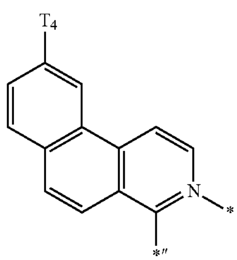

CY2

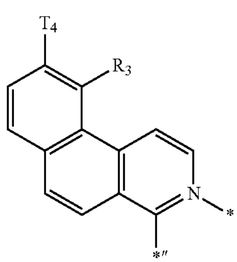

-continued

CY3

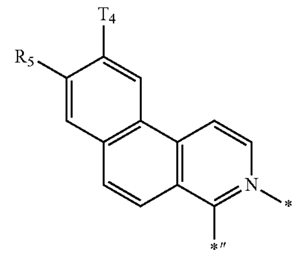

CY4

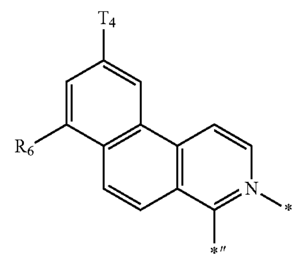

CY5

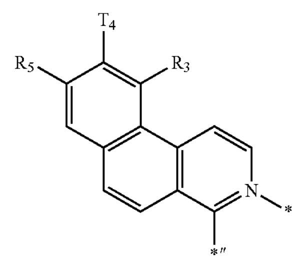

CY6

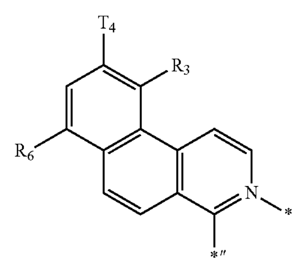

CY7

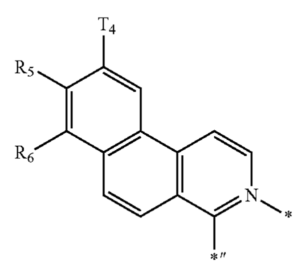

CY8

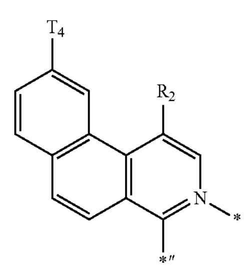

-continued
CY9
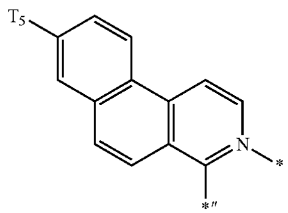
CY10
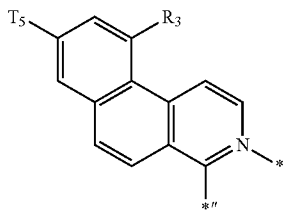
CY11
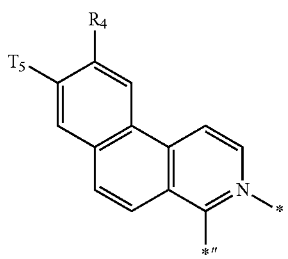
CY12
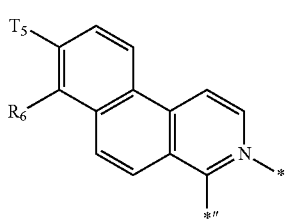
CY13
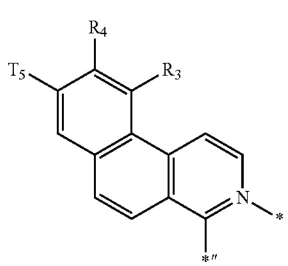
CY14
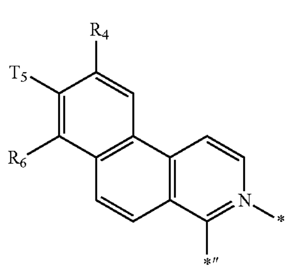
-continued
CY15
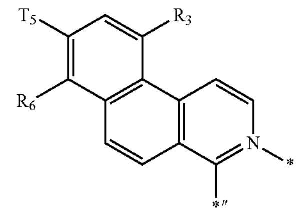
CY16
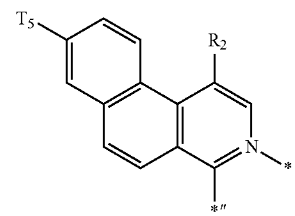
CY17
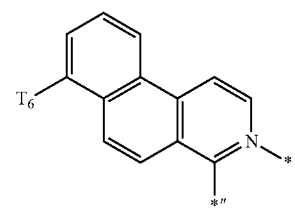
CY18
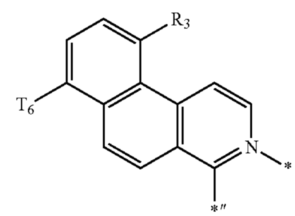
CY19
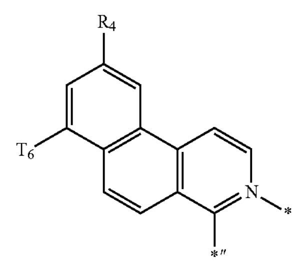
CY20
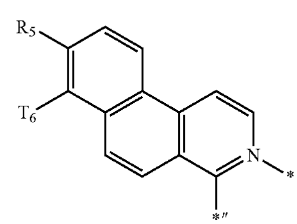
CY21
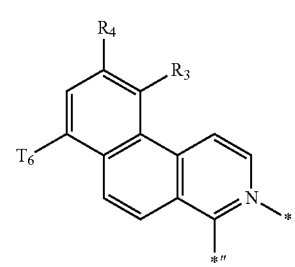

-continued
CY22
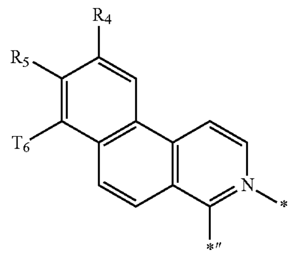
CY23
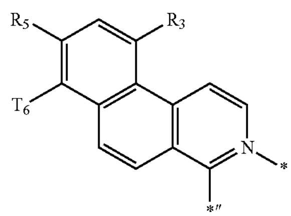
CY24
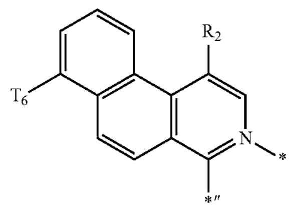
CY25
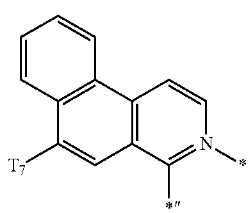
CY26
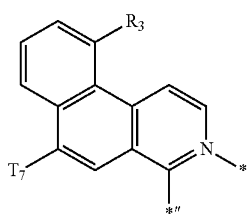
CY27
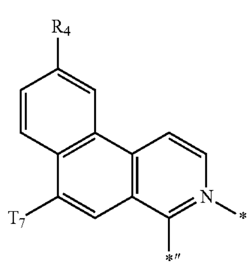
CY28
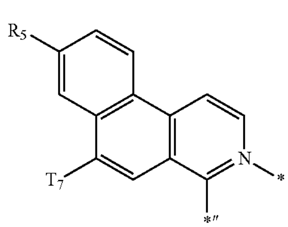
-continued
CY29
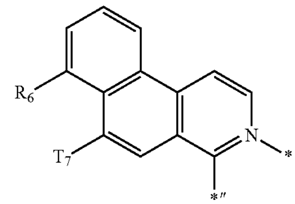
CY30
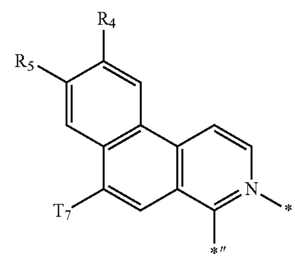
CY31
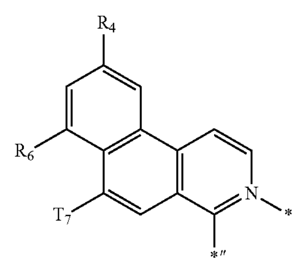
CY32
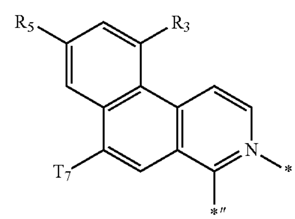
CY33
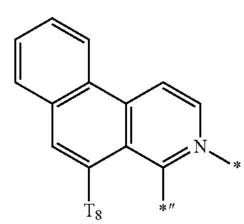
CY34
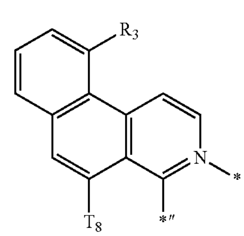

CY35
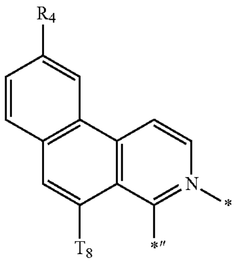
CY36
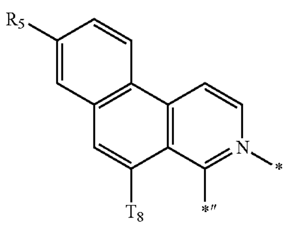
CY37
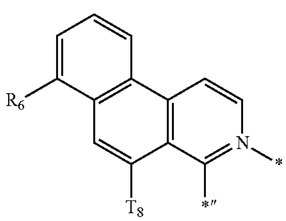
CY38
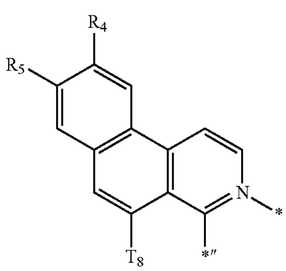
CY39
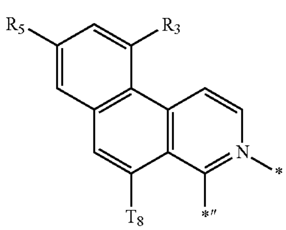
CY40
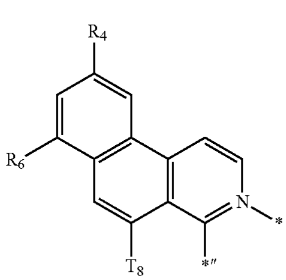
CY41
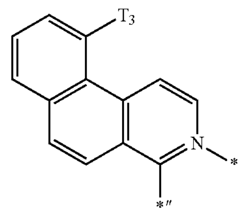
CY42
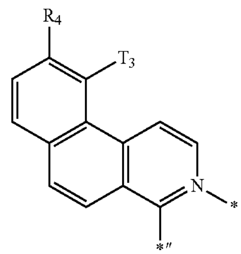
CY43
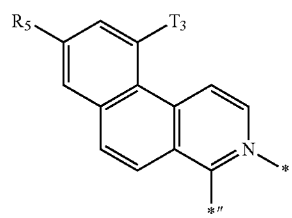
CY44
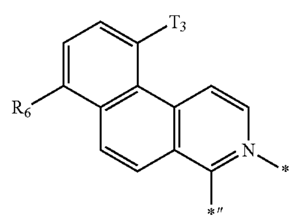
CY45
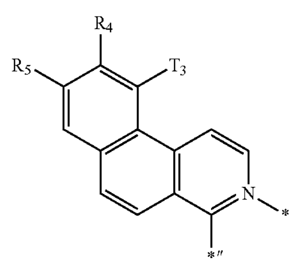
CY46
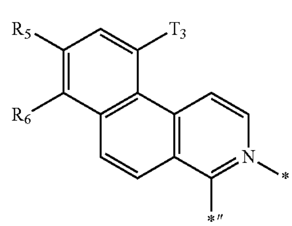

-continued
CY47
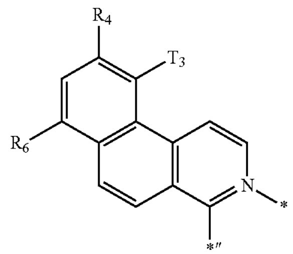
CY48
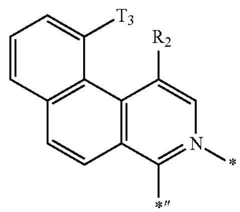
CY49
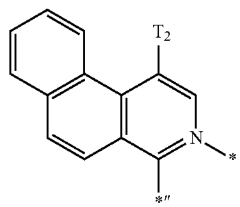
CY50
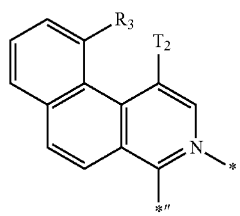
CY51
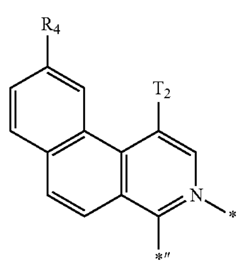
CY52
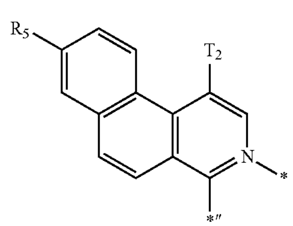
CY53
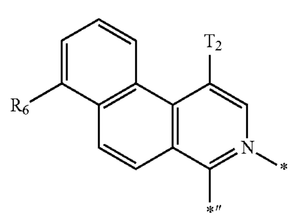
-continued
CY54
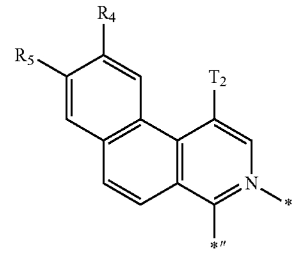
CY55
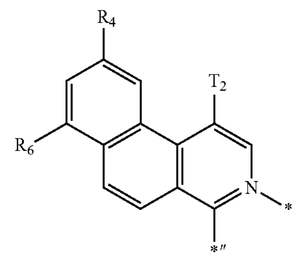
CY56
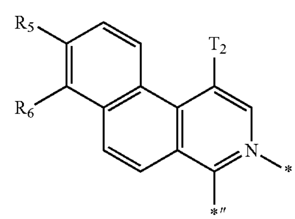
CY57
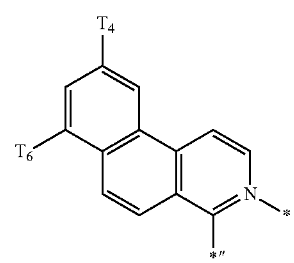
CY58
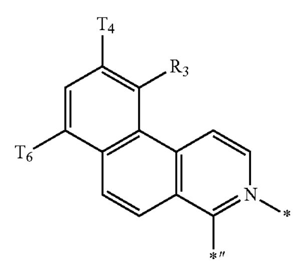
CY59
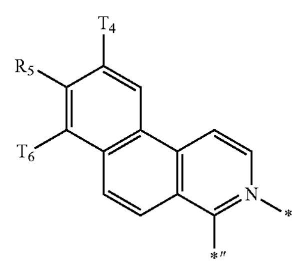

-continued
CY60
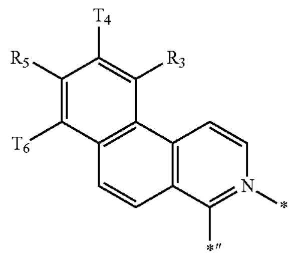
CY61
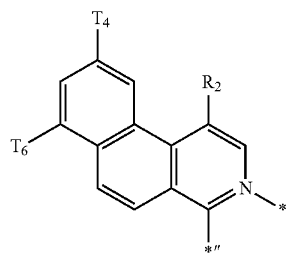
CY62
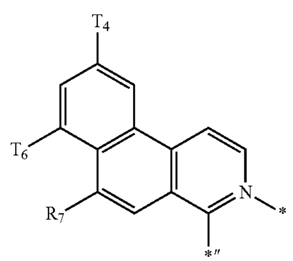
CY63
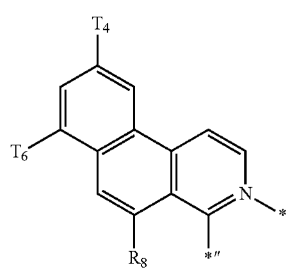
CY64
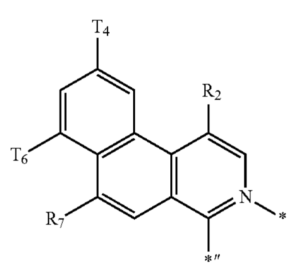
CY65
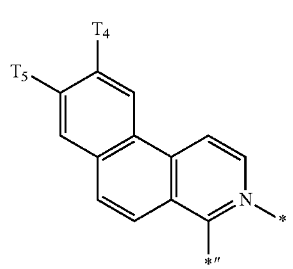
-continued
CY66
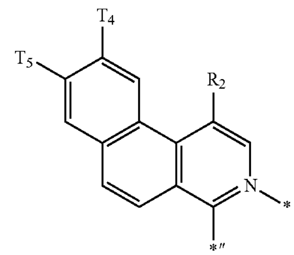
CY67
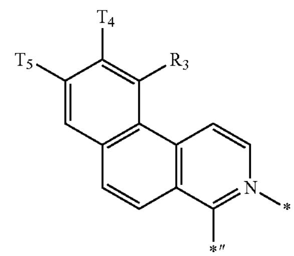
CY68
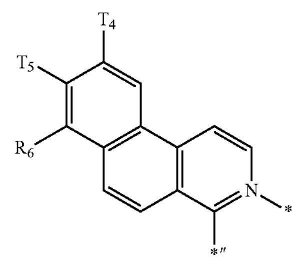
CY69
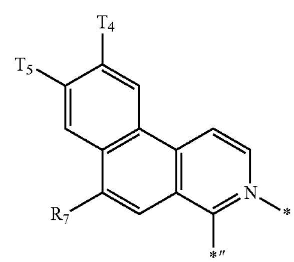
CY70
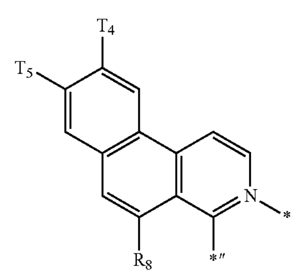
CY71
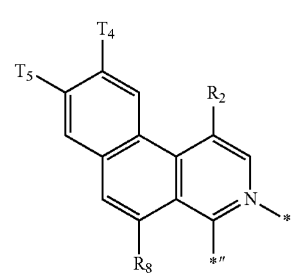

-continued
CY72
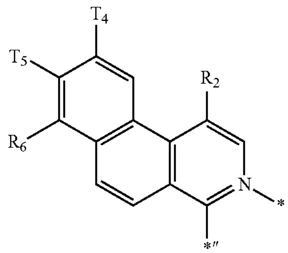
CY73
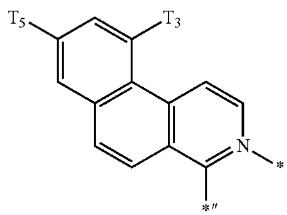
CY74
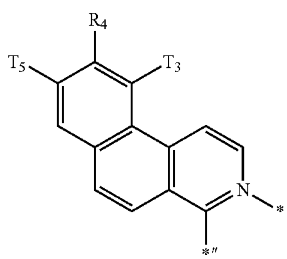
CY75
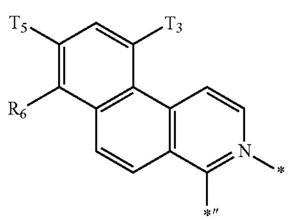
CY76
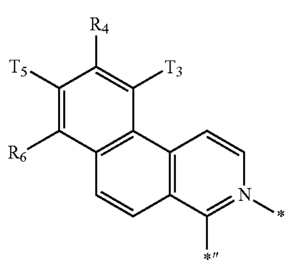
CY77
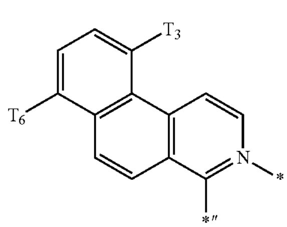
-continued
CY78
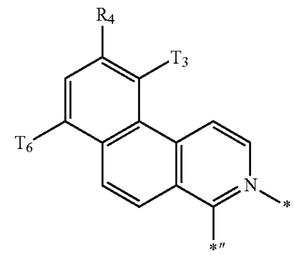
CY79
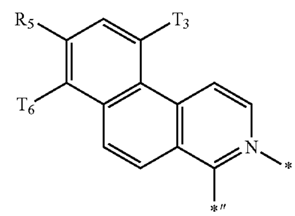
CY80
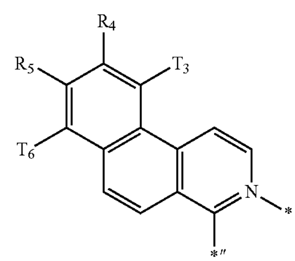
CY81
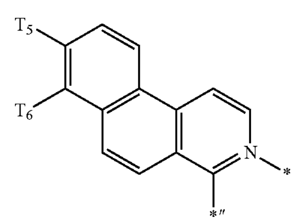
CY82
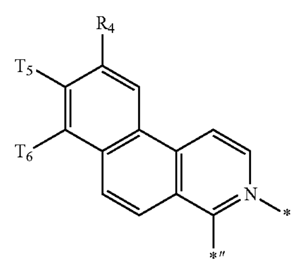
CY83
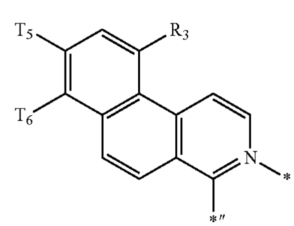

-continued
CY84
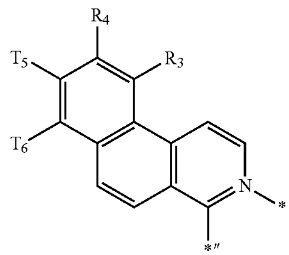
CY85
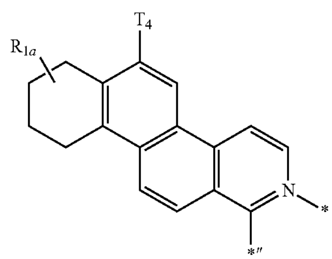
CY86
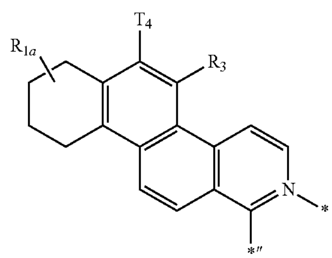
CY87
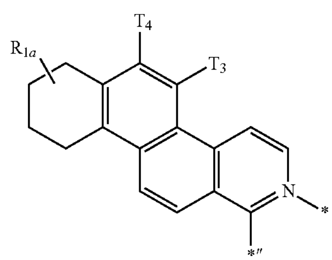
CY88
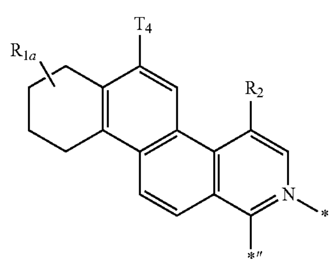
CY89
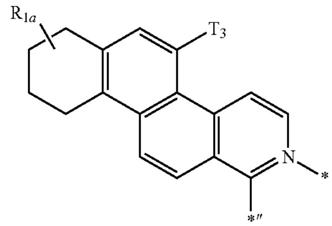
-continued
CY90
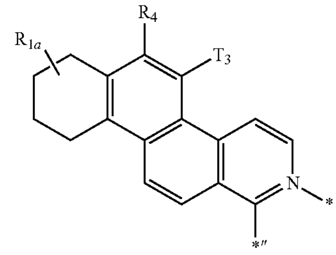
CY91
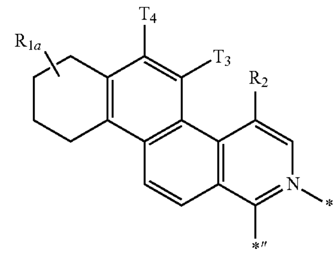
CY92
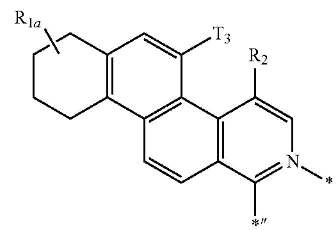
CY93
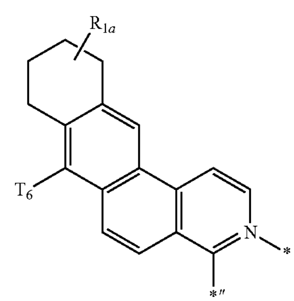
CY94
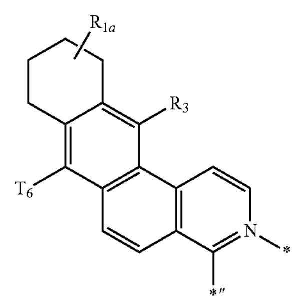
CY95
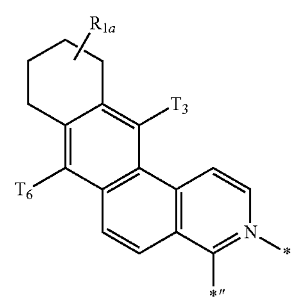

-continued
CY96
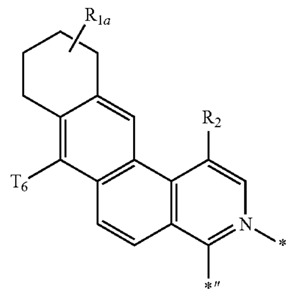
CY97
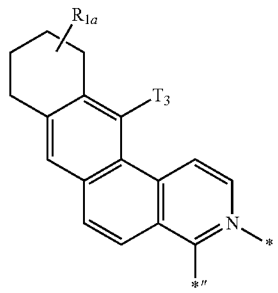
CY98
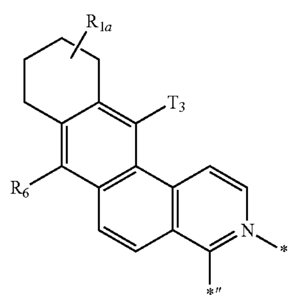
CY99
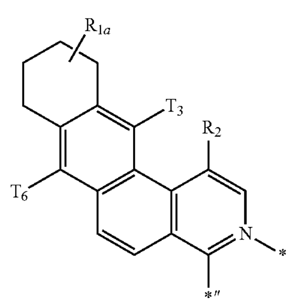
CY100
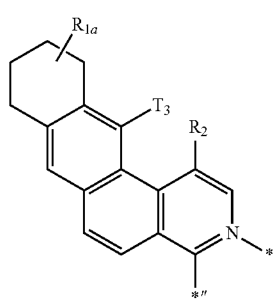
-continued
CY101
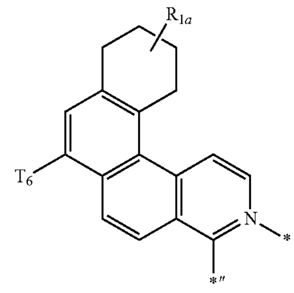
CY102
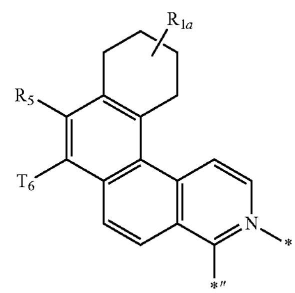
CY103
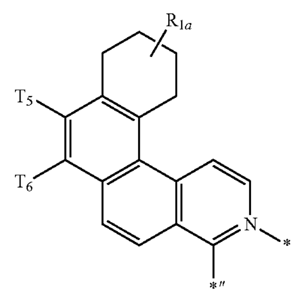
CY104
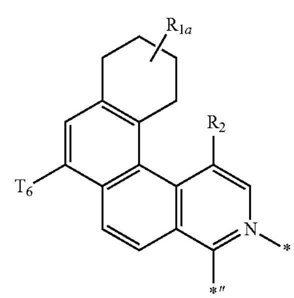
CY105
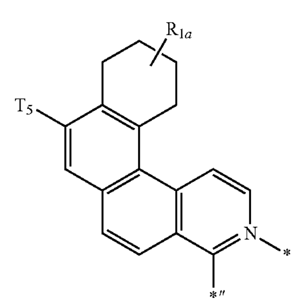

-continued

CY106

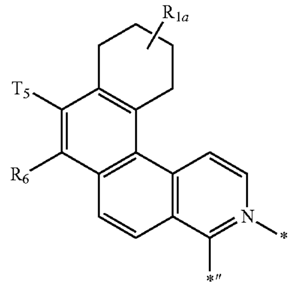

CY107

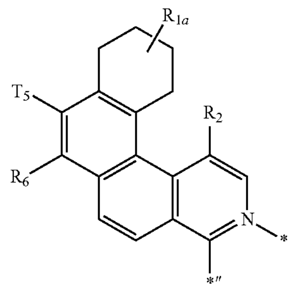

CY108

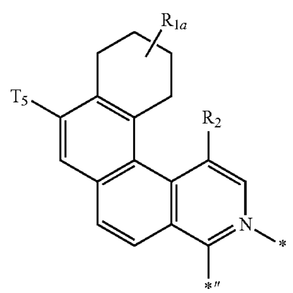

In Formulae CY1 to CY108, $T_2$ to $T_8$ may each independently be:

a fluoro group (—F); or a fluorinated $C_1$-$C_{20}$ alkyl group, a fluorinated $C_3$-$C_{10}$ cycloalkyl group, a fluorinated $C_2$-$C_{10}$ heterocycloalkyl group, or a fluorinated phenyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, a phenyl group, or any combination thereof;

each of $R_2$ to $R_8$ and $R_{1a}$ are the same as described above, and $R_2$ to $R_8$ may not be hydrogen,

* indicates a binding site to Ir in Formula 1,

*" indicates a binding site to a neighboring atom in Formula 1.

For example, $R_2$ to $R_8$ in Formulae CY1 to CY108 may each independently be:

deuterium; or a $C_1$-$C_{20}$ alkyl group, a $C_3$-$C_{10}$ cycloalkyl group, a $C_2$-$C_{10}$ heterocycloalkyl group, or a phenyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, a phenyl group, or any combination thereof.

In one or more embodiments, the group represented by

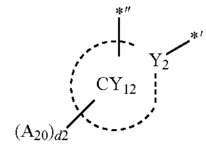

in Formula 1 may be a group represented by one of Formulae A(1) to A(7):

A(1)

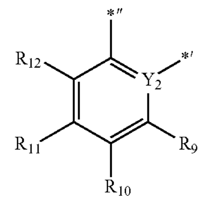

A(2)

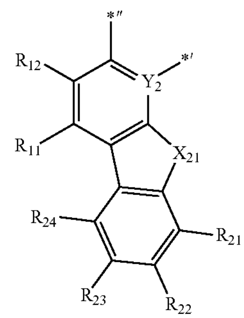

A(3)

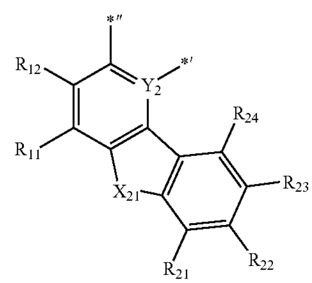

A(4)

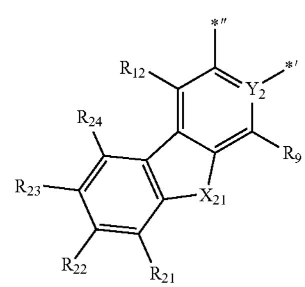

-continued

A(5)

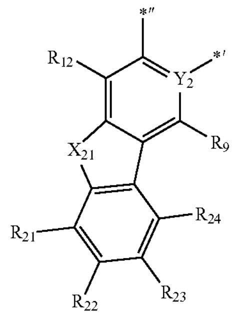

A(6)

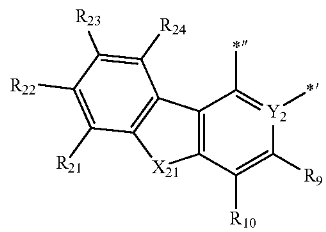

A(7)

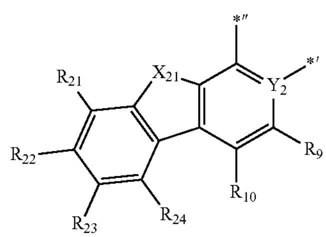

In Formulae A(1) to A(7), $Y_2$ may be C, $X_{21}$ may be O, S, $N(R_{25})$, $(R_{25})(R_{26})$, or $Si(R_{25})(R_{26})$, each of $R_9$ to $R_{12}$ and $R_{21}$ to $R_{26}$ may be the same as described in connection with $A_{20}$,

*' may indicate a binding site to Ir in Formula 1, and

*" may indicate a binding site to a neighboring atom in Formula 1.

For example, $R_9$ and $R_{11}$ in Formula A(1) may each independently be a $C_1$-$C_{20}$ alkyl group, a $C_3$-$C_{10}$ cycloalkyl group, a $C_2$-$C_{10}$ heterocycloalkyl group, or a phenyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, a phenyl group, or any combination thereof.

In one or more embodiments, $R_9$ and $R_{11}$ in Formula A(1) may each independently be a $C_1$-$C_{20}$ alkyl group, unsubstituted or substituted with deuterium, a $C_1$-$C_{20}$ alkyl group, or any combination thereof.

In one or more embodiments, $R_{10}$ and $R_{12}$ in Formula A(1) may each independently be hydrogen or deuterium.

In one or more embodiments, $R_9$ and $R_{11}$ in Formula A(1) may be identical to each other.

In one or more embodiments, $R_9$ and $R_{11}$ in Formula A(1) may be different from each other.

In one or more embodiments, $R_9$ and $R_{11}$ in Formula A(1) may be different from each other, and the number of carbons included in $R_{11}$ may be greater than the number of carbon included in $R_9$.

In one or more embodiments, i) at least one of $R_9$ to $R_{12}$ in Formula A(1), ii) $R_{11}$, $R_{12}$, one of $R_{21}$ to $R_{26}$, or any combination thereof in Formulae A(2) and A(3), iii) $R_9$, $R_{12}$, one of $R_{21}$ to $R_{26}$, or any combination thereof in Formulae A(4) and A(5), and iv) $R_9$, $R_{10}$, one of $R_{21}$ to $R_{26}$, or any combination thereof in Formulae A(6) and A(7), may each independently be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In one or more embodiments, at least one of $R_9$ and $R_1$ in Formula A(1) (for example, $R_9$ and $R_{11}$ in Formula A(1)) may each independently be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In one or more embodiments, the group represented by

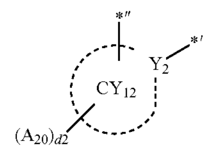

in Formula 1 may be a group represented by Formula A(1) or A(5).

In one or more embodiments, the number of carbons included in the group represented by *—C(A)($A_2$)($A_3$) in Formula 1 may be 5 or more, and/or the number of carbons included in the group represented by *—C($A_4$)($A_5$)($A_6$) in Formula 1 may be 5 or more.

In one or more embodiments, $A_1$, $A_2$, and $A_3$ of the group represented by *—C($A_1$)($A_2$)($A_3$) in Formula 1 may be linked to each other to form a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$. That is, the group represented by *—C(Ai)($A_2$)($A_3$) in Formula 1 may be a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$ (for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, or a cyclohexene group, each unsubstituted or substituted with at least one $R_{1a}$).

In one or more embodiments, $A_4$, As, and $A_6$ of the group represented by *—C($A_4$)($A_5$)($A_6$) in Formula 1 may be linked to each other to form a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$. That is, the group represented by *—C($A_4$)($A_5$)($A_6$) in Formula 1 may be a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$ (for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, or a cyclohexene group, each unsubstituted or substituted with at least one $R_{1a}$).

In one or more embodiments, in Formula 1, a group represented by *—C(Ai)($A_2$)($A_3$) may be identical to a group represented by *—C($A_4$)($A_5$)($A_6$).

In one or more embodiments, in Formula 1, a group represented by *—C(Ai)($A_2$)($A_3$) may be different from a group represented by *—C($A_4$)($A_5$)($A_6$).
In one or more embodiments, the first compound may include at least one of Compounds 1 to 53:
1
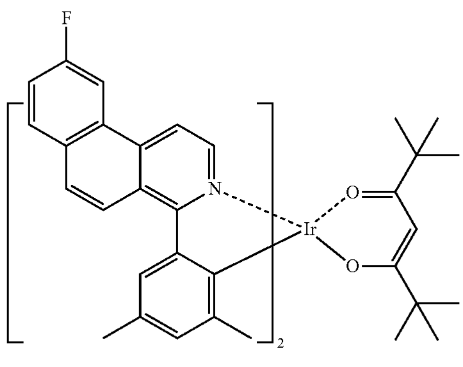
2
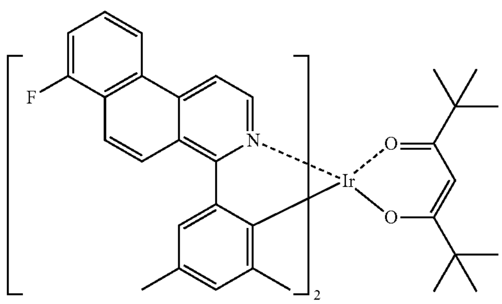
3
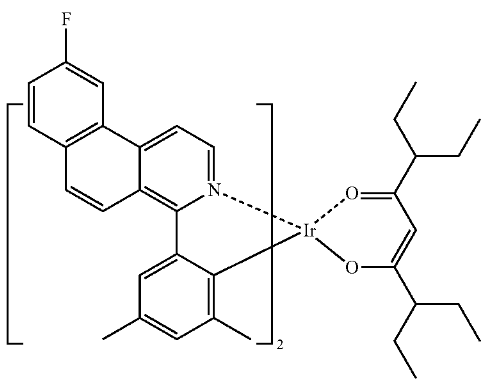
4
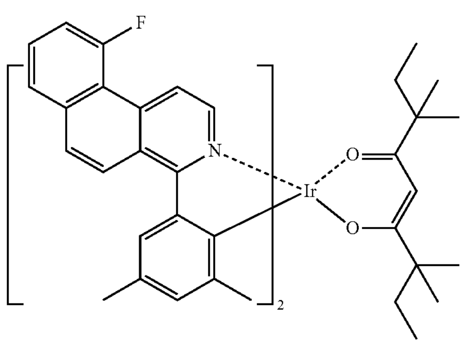
-continued
5
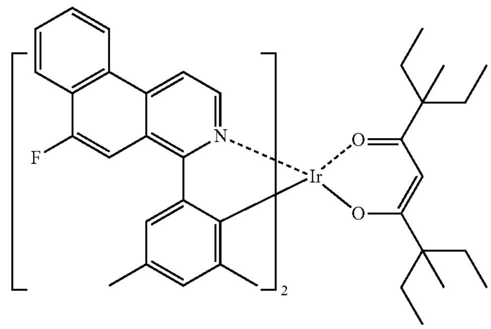
6
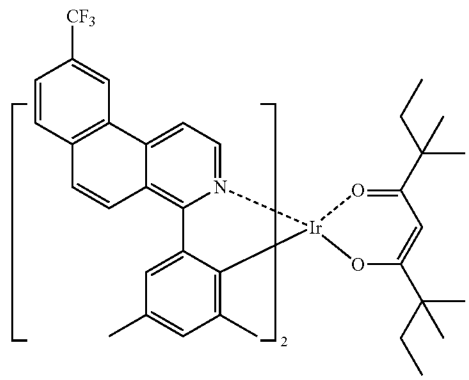
7
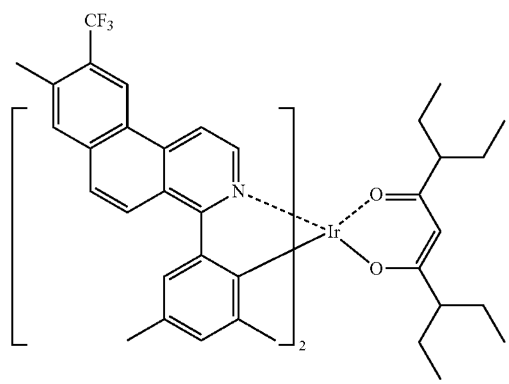
8
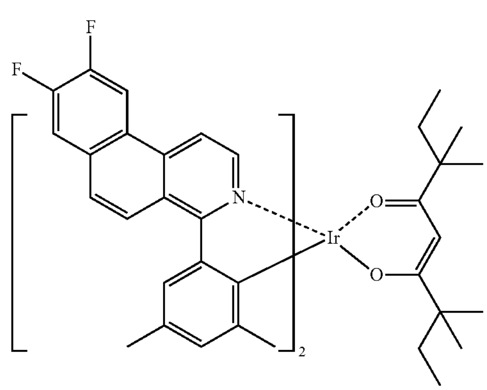

-continued
9
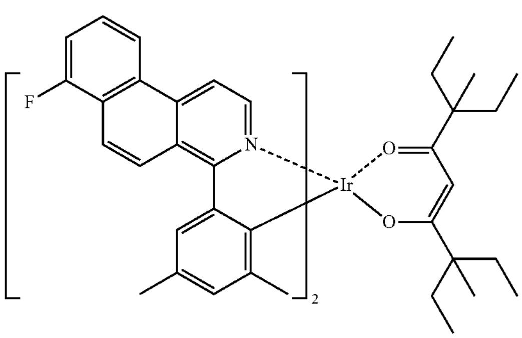
10
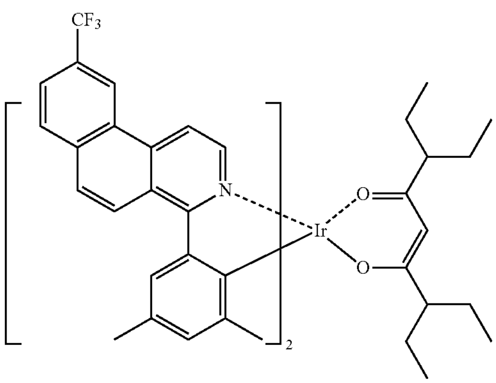
11
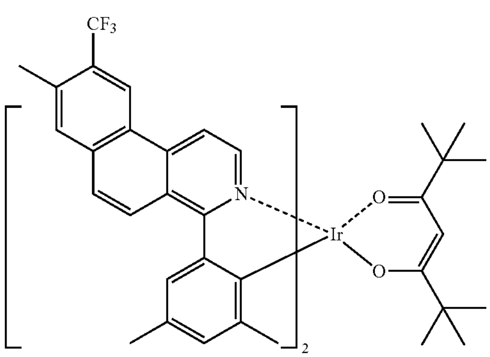
12
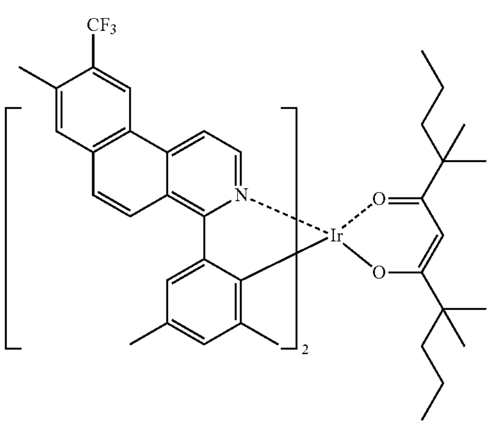
-continued
13
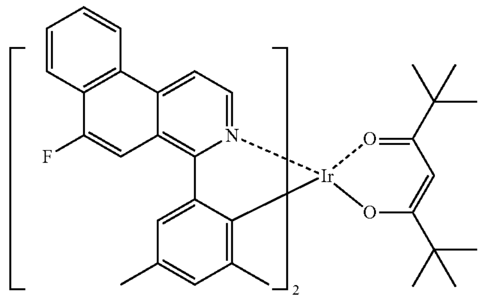
14
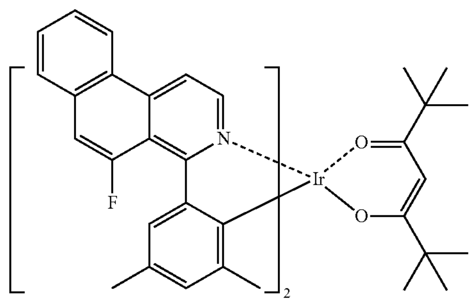
15
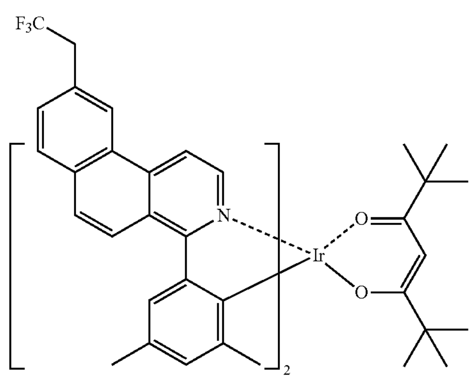
16
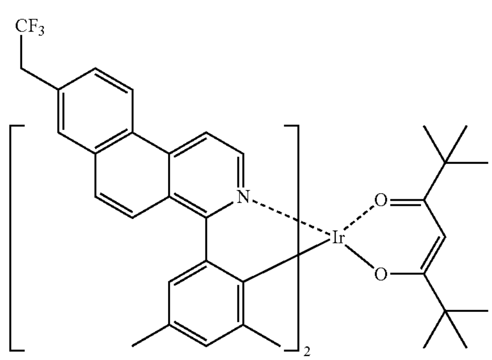

-continued
17
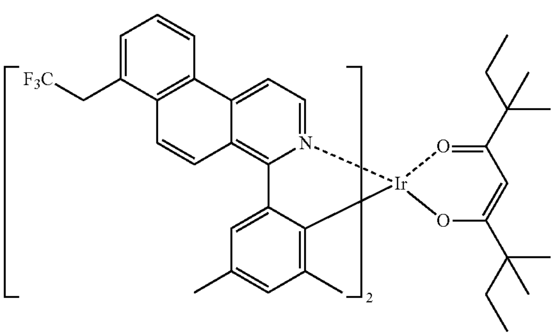
18
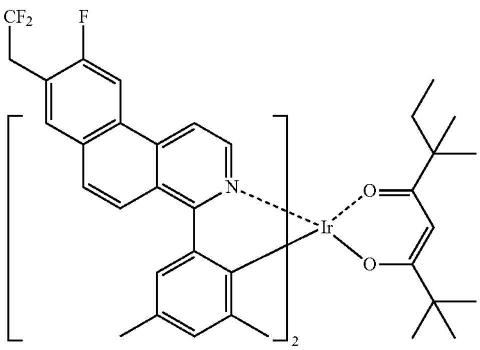
19
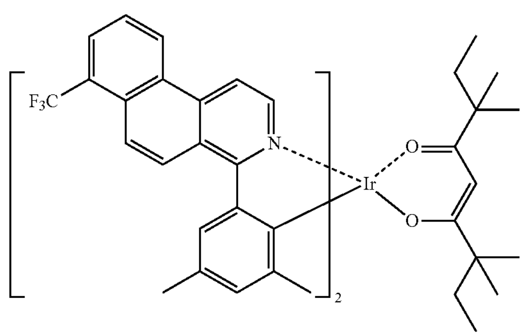
20
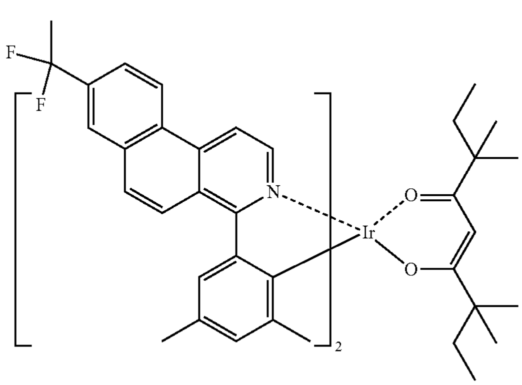
-continued
21
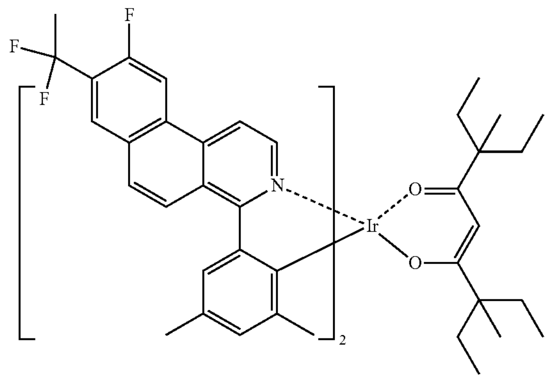
22
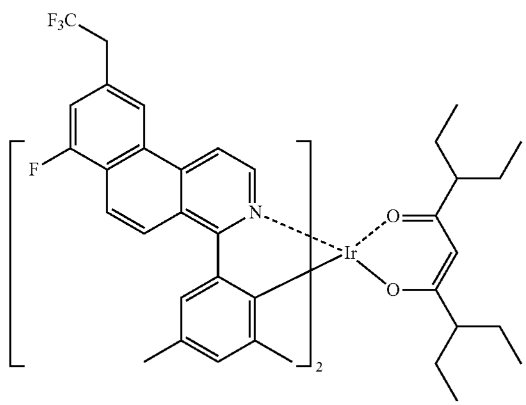
23
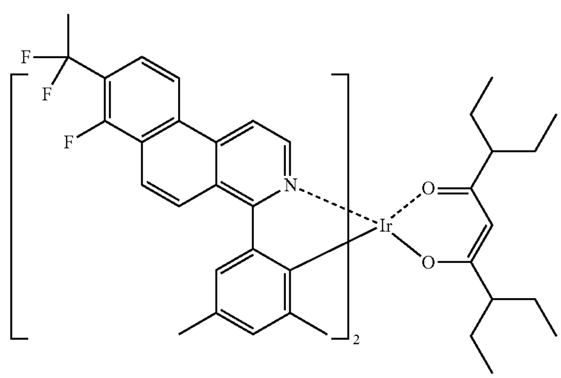
24
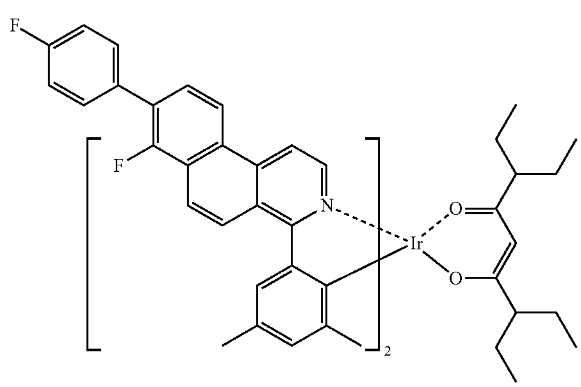

-continued
25
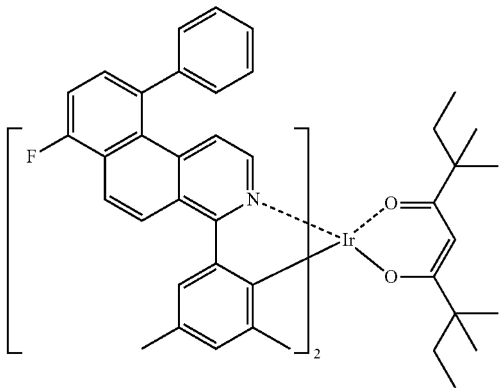
26
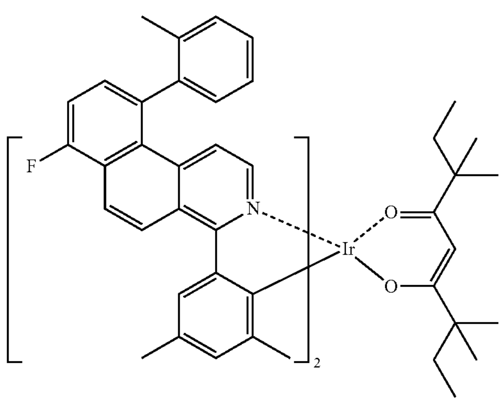
27
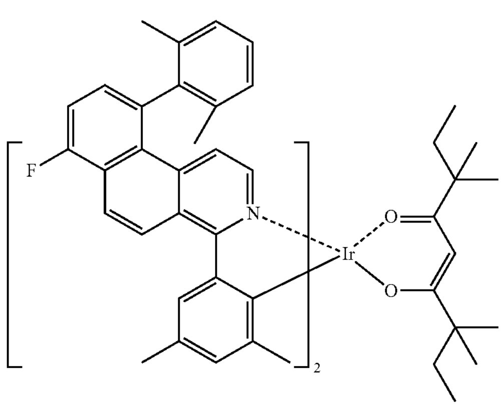
-continued
28
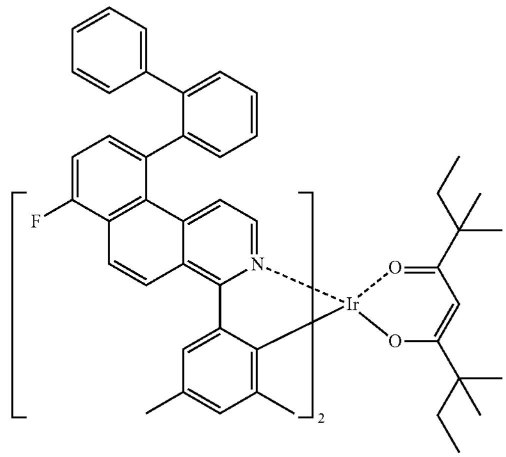
29
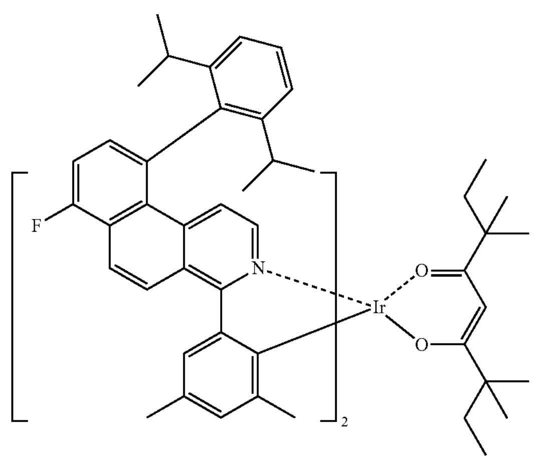
30
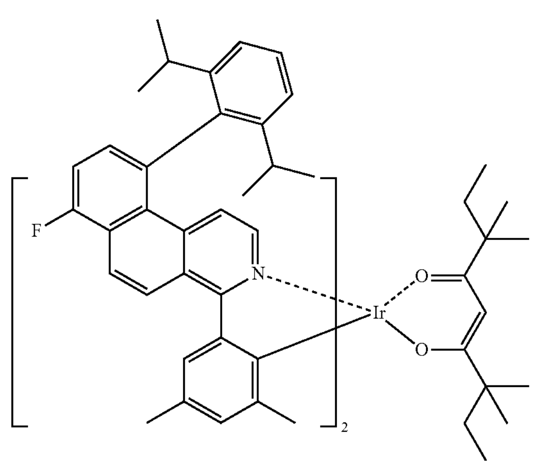

31
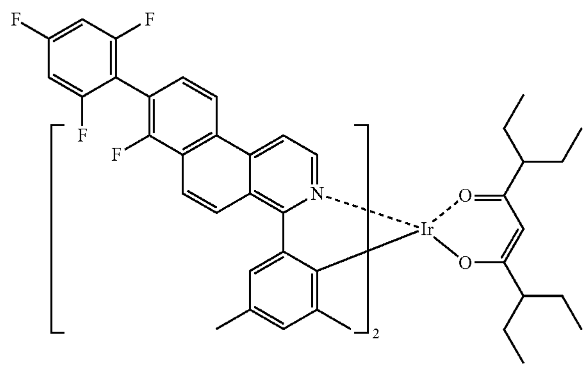
32
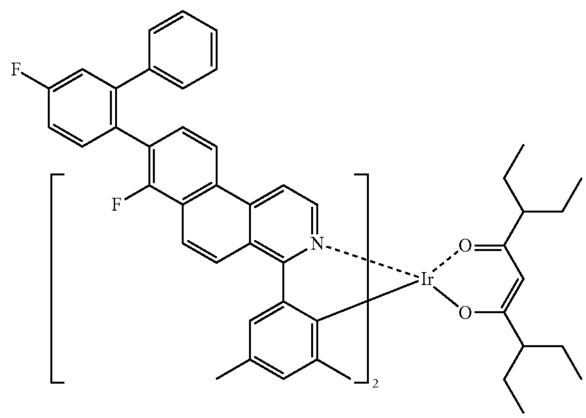
33
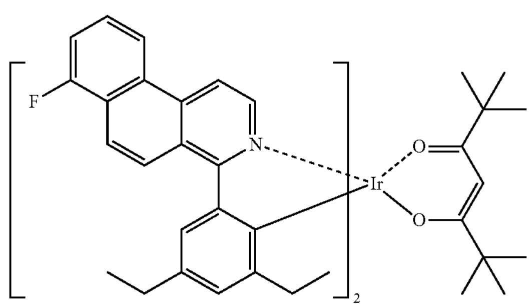
33
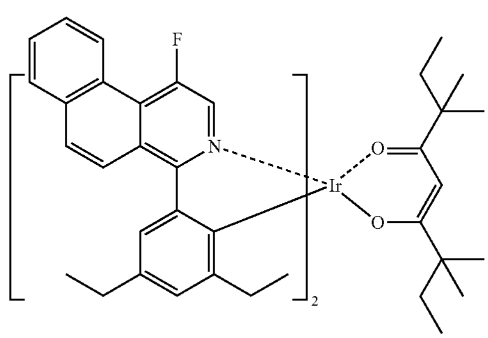
35
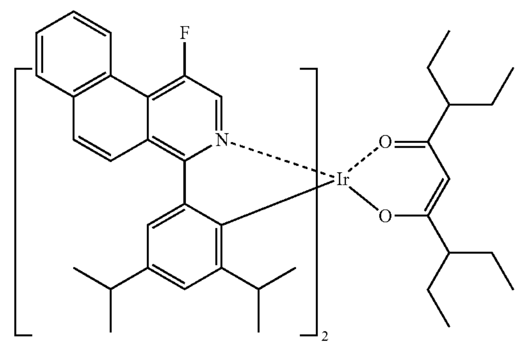
36
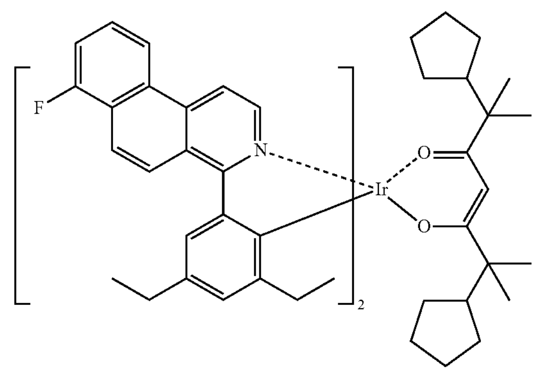
37
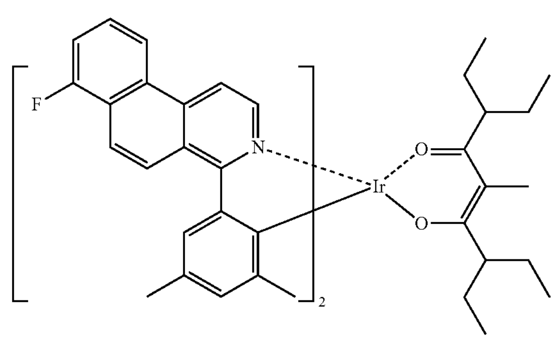
38
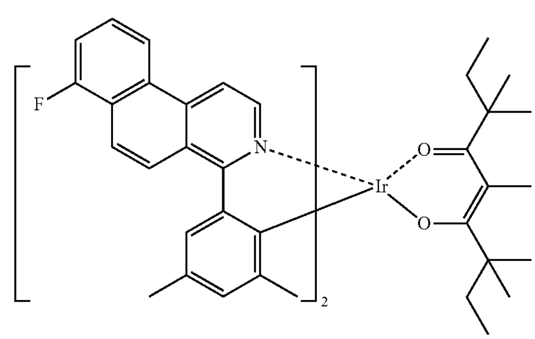

-continued
39
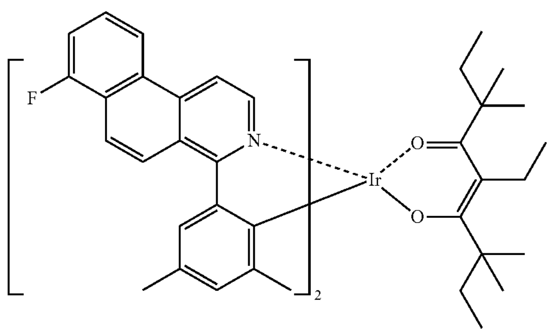
40
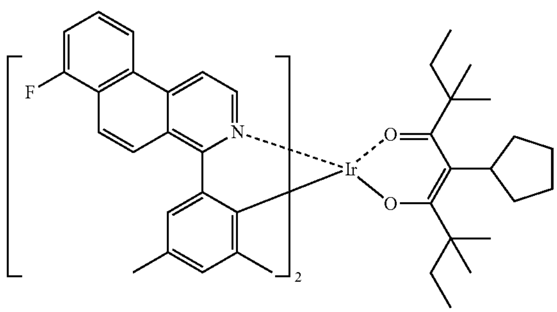
41
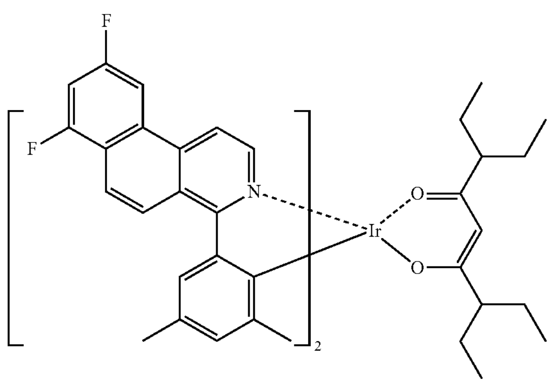
42
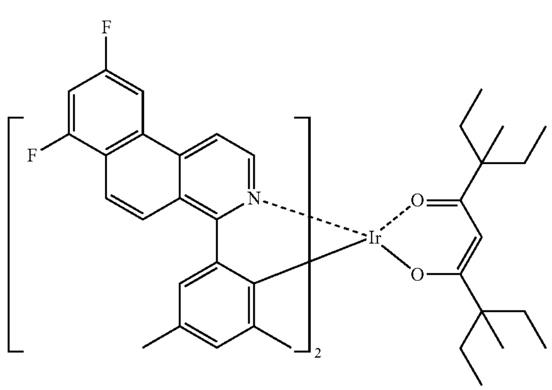
-continued
43
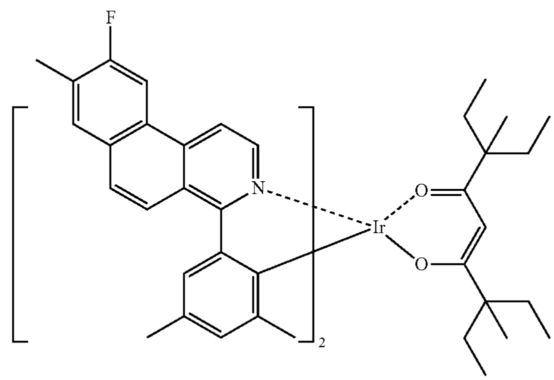
44
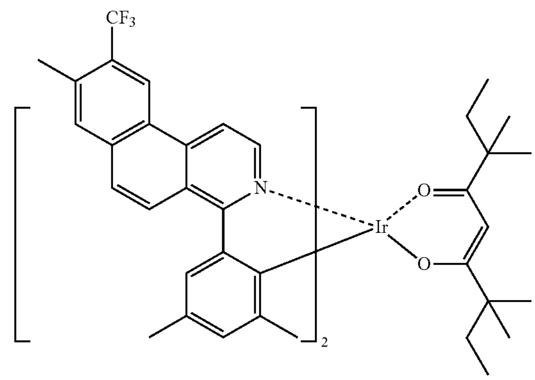
45
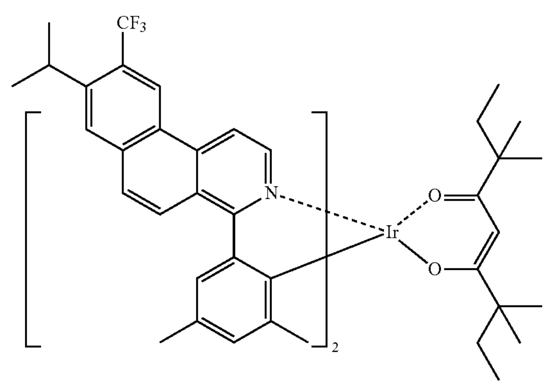
46
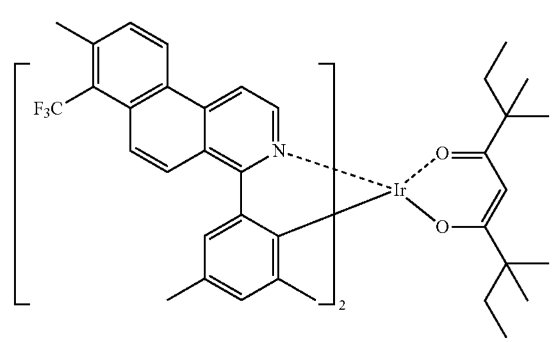

-continued

47

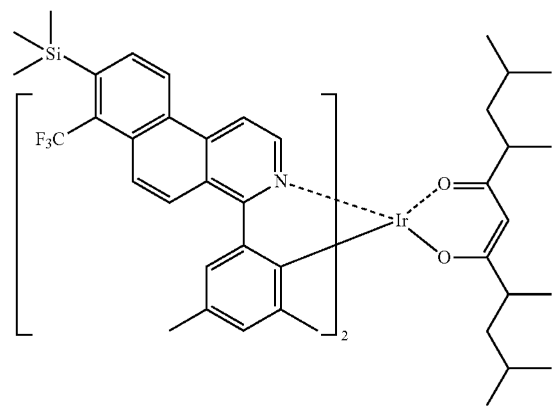

48

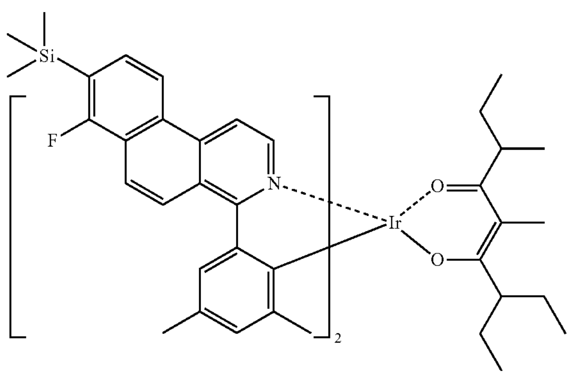

49

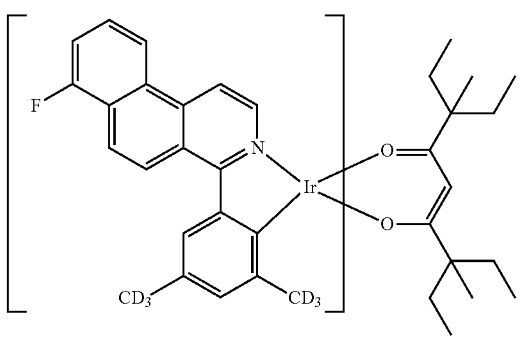

50

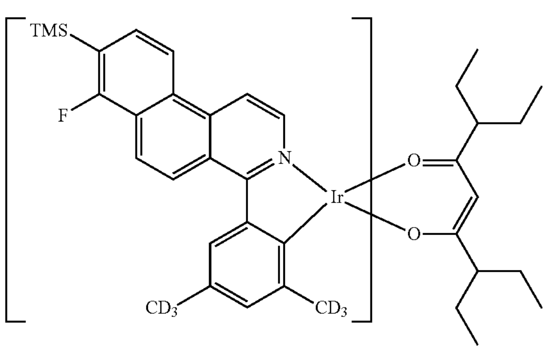

-continued

51

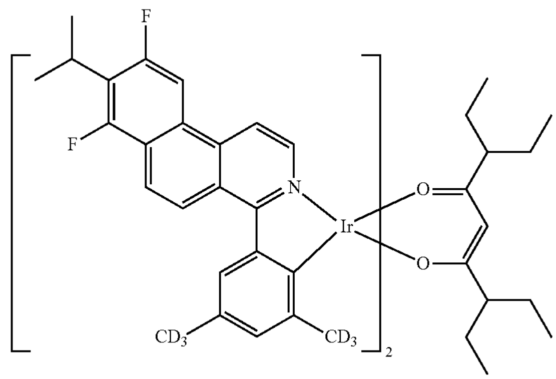

52

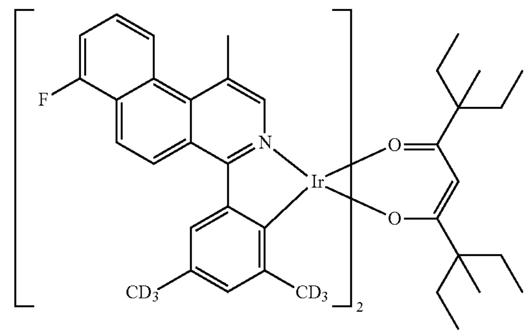

53

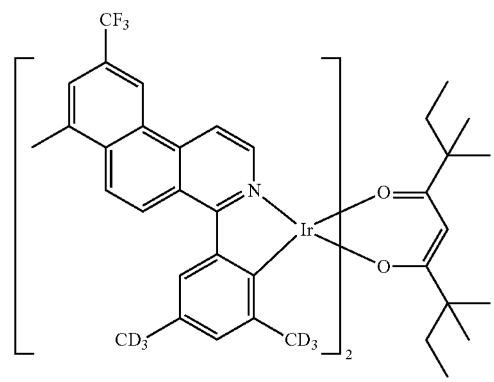

The first compound may include an organometallic compound represented by Formula 1. In an organometallic compound represented by Formula 1, 1) ring $CY_{11}$ (see Formula 1') is, as illustrated in Formula 1, a condensed cyclic group in which two benzene groups are condensed with one pyridine group, and 2) at least one of $R_1$ to $R_8$, $A_{20}$, or any combination thereof includes at least one a fluoro group (—F). Accordingly, the transition dipole moment of the organometallic compounds may be increased, and the conjugation length of the organometallic compounds may be relatively increased and structural rigidity thereof may be increased, leading to a decrease in non-radiative transition. Thus, an electronic device, for example, an organic light-emitting device, including the organometallic compound represented by Formula 1 may have high external quantum efficiency (EQE), and thus, may have high luminescence efficiency.

Formula 1'

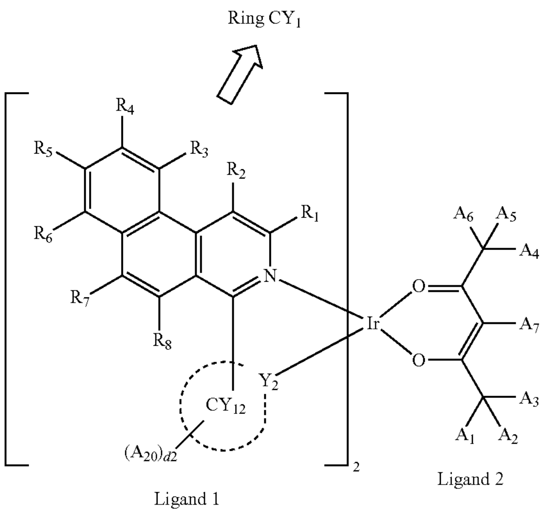

In one or more embodiments, when at least one of $A_1$ to $A_6$ in Formula 1 is each independently be a substituted or unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group (that is, when at least one of $A_1$ to $A_6$ in Formula 1 has two or more carbons), an electron donating capability of Ligand 2 (see Formula 1') in Formula 1 may be improved, and thus, an interaction between Ligand 1 and Ligand 2 in Formula 1 may be enhanced. Thus, the organometallic compound represented by Formula 1 may have improved luminescent transition characteristics, improved optical orientation characteristics, and improved structural rigidity. Accordingly, an electronic device, for example, an organic light-emitting device, including the organometallic compound represented by Formula 1 may have high luminescence efficiency and a long lifespan.

In one or more embodiments, when $A_1$ to $A_6$ in Formula 1 are each independently a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group (that is, when $A_1$ to $A_6$ in Formula 1 each have one or more carbons), carbons bound to each $A_1$ to $A_6$ in Formula 1 as described above may not include an α-proton, and in this regard, the organometallic compound represented by Formula 1 may have a stable chemical structure with minimal occurrence of a side reaction before/after synthesis, and at the same time, an intermolecular interaction of the organometallic compound represented by Formula 1 may be minimized during the operation of an electronic device (for example, an organic light-emitting device) including the organometallic compound represented by Formula 1. Furthermore, an interaction between Ligand 1 and Ligand 2 in Formula 1 may be enhanced and thus, the organometallic compound represented by Formula 1 may have improved structural rigidity, a full width at half maximum (FWHM) in the photoluminescent spectrum or electroluminescent spectrum of the organometallic compound represented by Formula 1 may be reduced, and a vibronic state of the organometallic compound represented by Formula 1 may be reduced. Accordingly a non-radiative decay of the organometallic compound represented by Formula 1 can be reduced and thus an electronic device, for example, an organic light-emitting device, including the organometallic compound represented by Formula 1 may have high luminescence efficiency and long lifespan.

Synthesis methods of the first compound may be recognizable by one of ordinary skill in the art by referring to Synthesis Examples provided below.

Description of Formulae 2 and 3

$Ar_1$, $Ar_2$, and $Ar_{11}$ in Formulae 2 and 3 may each independently be a $C_5$-$C_{60}$ carbocyclic group which is unsubstituted or substituted with at least one $R_{61}$ or a $C_1$-$C_{60}$ heterocyclic group which is unsubstituted or substituted with at least one $R_{61}$, $Ar_5$ and $Ar_{12}$ in Formulae 2 and 3 may each independently be a single bond, a $C_5$-$C_{60}$ carbocyclic group which is unsubstituted or substituted with at least one $R_{65}$, or a $C_1$-$C_{60}$ heterocyclic group which is unsubstituted or substituted with at least one $R_{65}$, or may not exist, n in Formula 2 may be 1, 2, or 3, and when n is 1, $Ar_5$ does not exist, p in Formula 3 may be 1, 2, or 3, and when p is 1, $Ar_{12}$ does not exist, a1 and a2 in Formula 2 may each independently be an integer from 0 to 5, and the sum of a1 and a2 is 1 or more, ring $CY_2$ and ring $CY_3$ in Formula 2 may each independently be a $C_5$-$C_{60}$ carbocyclic group or a $C_1$-$C_{60}$ heterocyclic group, and ring $CY_2$ and ring $CY_3$ may be optionally linked to each other with a $C_5$-$C_{60}$ carbocyclic group which is unsubstituted or substituted with at least one $R_{66}$ or a $C_1$-$C_{60}$ heterocyclic group which is unsubstituted or substituted with at least one $R_{66}$ therebetween, Het1 in Formula 3 may be a π electron-depleted nitrogen-containing $C_1$-$C_{60}$ cyclic group, and a11 and m in Formula 3 may each independently be an integer from 1 to 10.

The term "a π electron-depleted nitrogen-containing $C_1$-$C_{60}$ cyclic group" may be a cyclic group having 1 to 60 carbon atoms and at least one *—N═*' as a ring-forming moiety. The examples of π electron-depleted nitrogen-containing $C_1$-$C_{60}$ cyclic group may include a) a first ring, b) a condensed ring in which at least first rings or c) a condensed ring in which at least one first ring and at least one second ring are condensed. The examples of the first ring and the second ring may be understood by referring the descriptions herein.

For example, the π electron-depleted nitrogen-containing $C_1$-$C_{60}$ cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonaphthothiophene group, an indolophenanthrene group, a benzofuranophenanthrene group, a benzothienophenanthrene group, or a pyridopyrazine group.

The term "a π electron-rich $C_3$-$C_{60}$ cyclic group" may be a cyclic group having 3 to 60 carbon atoms and not having *—N=*' as a ring-forming moiety. The examples of π electron-rich $C_3$-$C_{60}$ cyclic group may include a) a second ring, or b) a condensed ring in which at least second rings. The examples of the second ring may be understood by referring the descriptions herein.

For example, the π electron-rich $C_3$-$C_{60}$ cyclic group may be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, a pyrrolophenanthrene group, a furanophenanthrene group, or a thienophenanthrene group.

In one or more embodiments, $Ar_1$, $Ar_2$, and $Ar_{11}$ in Formulae 2 and 3 may each independently be a group derived from i) a first ring unsubstituted or substituted with at least one $R_{61}$, ii) a second ring unsubstituted or substituted with at least one $R_{61}$, iii) a condensed cyclic group in which two or more first rings are condensed with each other, unsubstituted or substituted with at least one $R_{61}$, iv) a condensed cyclic group in which two or more second rings are condensed with each other, unsubstituted or substituted with at least one $R_{61}$, or v) a condensed cyclic group in which at least one first ring and at least one second ring are condensed with each other, unsubstituted or substituted with at least one $R_{61}$, $Ar_5$ and $Ar_{12}$ in Formulae 2 and 3 may each independently be a single bond, or a group derived from i) a first ring unsubstituted or substituted with at least one $R_{65}$, ii) a second ring unsubstituted or substituted with at least one $R_{65}$, iii) a condensed cyclic group in which two or more first rings are condensed with each other, unsubstituted or substituted with at least one $R_{65}$, iv) a condensed cyclic group in which two or more second rings are condensed with each other, unsubstituted or substituted with at least one $R_{65}$, or v) a condensed cyclic group in which at least one first ring and at least one second ring are condensed with each other, unsubstituted or substituted with at least one $R_{65}$, or may not exist, ring $CY_2$ and ring $CY_3$ in Formula 2 may each independently be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring and at least one second ring are condensed with each other, Het1 in Formula 3 may be a group derived from i) a first ring, ii) a condensed cyclic group in which two or more first rings are condensed with each other or iii) a condensed cyclic group in which at least one first ring and at least one second ring are condensed with each other, the first ring may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group, and the second ring may be a benzene group, a cyclopentadiene group, a pyrrole group, a furan group, a thiophene group, or a silole group.

In one or more embodiments, $Ar_1$, $Ar_2$, and $Ar_{11}$ in Formulae 2 and 3 may each independently be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonaphthothiophene group, an indolophenanthrene group, a benzofuranophenanthrene group, or a benzothienophenanthrene group, each unsubstituted or substituted with at least one $R_{61}$.

In one or more embodiments, $Ar_5$ and $Ar_{12}$ in Formulae 2 and 3 may each independently be a single bond, a benzene group, a naphthalene group, or a carbazole group, each unsubstituted or substituted with at least one $R_{61}$, or may not exist.

In one or more embodiments, ring $CY_2$ and ring $CY_3$ in Formula 2 may each independently be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a pyrrolophenanthrene group, a furanophenanthrene group, or a thienophenanthrene group.

In one or more embodiments, Het1 in Formula 3 may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, or a pyridopyrazine group.

In one or more embodiments, $Ar_1$, $Ar_2$, and $Ar_{11}$ in Formulae 2 and 3 may each independently be a π electron-rich $C_3$-$C_{60}$ cyclic group unsubstituted or substituted with at least one $R_{61}$.

In one or more embodiments, $Ar_5$ and $Ar_{12}$ in Formulae 2 and 3 may each independently be a single bond or a π electron-rich $C_3$-$C_{60}$ cyclic group unsubstituted or substituted with at least one $R_{65}$, or may not exist.

In one or more embodiments, ring $CY_2$ and ring $CY_3$ in Formula 2 may each independently be a π electron-rich $C_3$-$C_{60}$ cyclic group.

In one or more embodiments, n and p in Formulae 2 and 3 may each independently be 1 or 2.

In one or more embodiments, in Formula 2, when n is 1, at least one of the ring $CY_2$ and the ring $CY_3$ may not be a benzene group.

In one or more embodiments, in Formula 2, when n is 1, at least one of the ring $CY_2$ and the ring $CY_3$ may be a) a condensed ring in which at least two first rings are condensed, b) a condensed ring in which at least two second rings are condensed, or c) a condensed ring in which at least one first ring and at least one second ring are condensed. The examples of the first ring and the second ring may be understood by referring the descriptions herein.

In one or more embodiments, the second compound may include a compound represented by Formula 2(1):

Formula 2(1)

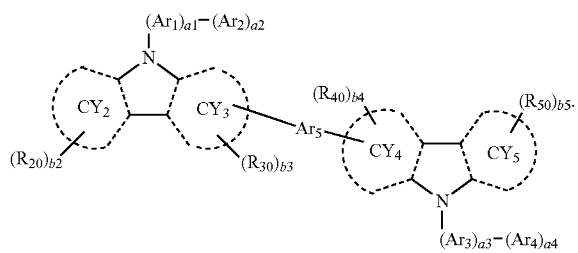

In Formula 2(1), $Ar_5$ may be a single bond, a $C_5$-$C_{60}$ carbocyclic group unsubstituted or substituted with at least one $R_{65}$, or a $C_1$-$C_{60}$ heterocyclic group unsubstituted or substituted with at least one $R_{65}$, $Ar_1$, $Ar_2$, $Ar_5$, a1, a2, ring $CY_2$, ring $CY_3$, $R_{20}$, $R_{30}$, b2, and b3 may be the same as described above, $Ar_3$ and $Ar_4$ may be the same as described in connection with $Ar_1$, and a3, a4, ring $CY_4$, ring $CY_5$, $R_{40}$, $R_{50}$, b4, and b5 may be the same as described in connection with a1, a2, ring $CY_2$, ring $CY_3$, $R_{20}$, $R_{30}$, b2, and b3.

For example, $Ar_5$ in Formula 2(1) may be a single bond.

In one or more embodiments, the third compound may include a compound represented by Formula 3(1):

Formula 3(1)

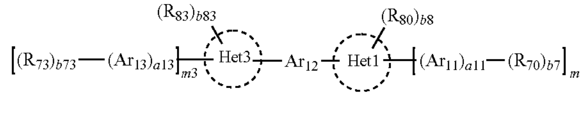

In Formula 3(1), $Ar_{12}$ may be a single bond, a $C_5$-$C_{60}$ carbocyclic group unsubstituted or substituted with at least one $R_{65}$, or a $C_1$-$C_{60}$ heterocyclic group unsubstituted or substituted with at least one $R_{65}$, Het1, $Ar_{11}$, $R_{70}$, $R_{80}$, a11, b7, b8 and m may be the same as described above, $Ar_3$ and $Ar_4$ may be the same as described in connection with $Ar_1$, and Het3, $Ar_{13}$, $R_{73}$, $R_{83}$, a13, b73, b83 and m3 may be the same as described in connection with Het1, $Ar_{11}$, $R_{70}$, $R_{80}$, a11, b7, b8 and m.

In one or more embodiments, a group represented by

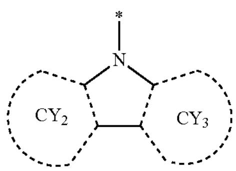

in Formula 2 and a group represented by

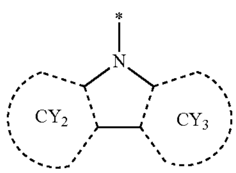

and a group represented

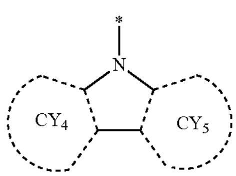

in Formula 2(1) may each independently be a group represented by one of Formulae 2-1 to 2-93:

2-1

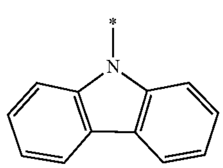

2-2

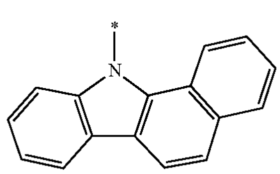

-continued 2-3

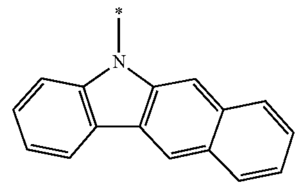

2-4

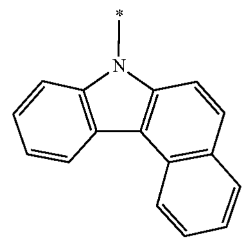

2-5

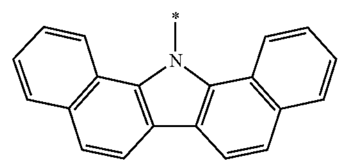

2-6

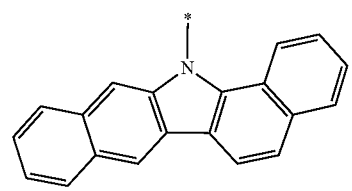

2-7

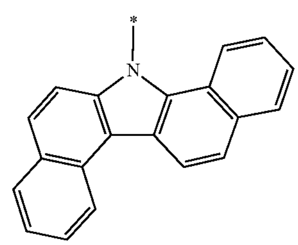

2-8

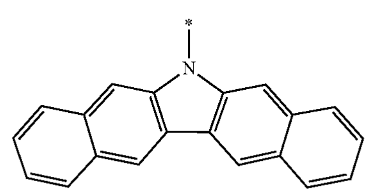

2-9

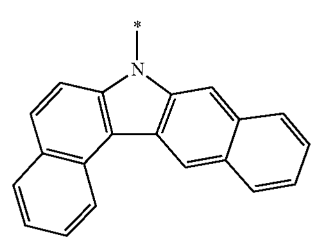

-continued
2-10
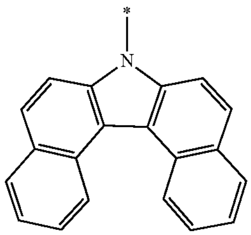
2-11
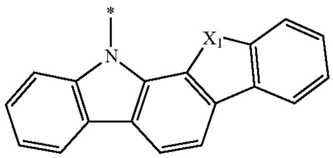
2-12
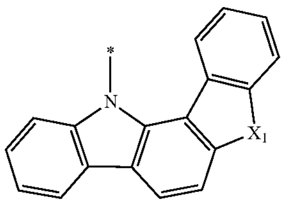
2-13
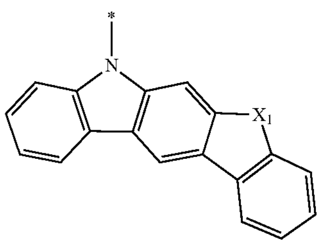
2-14
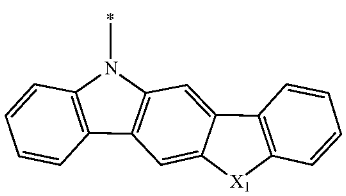
2-15
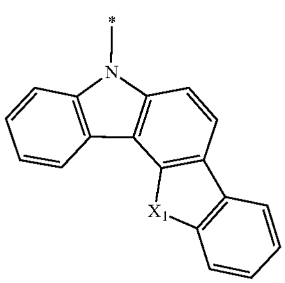
2-16
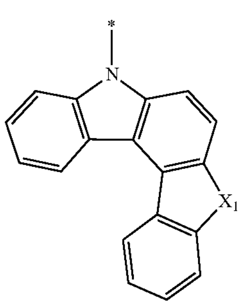
-continued
2-17
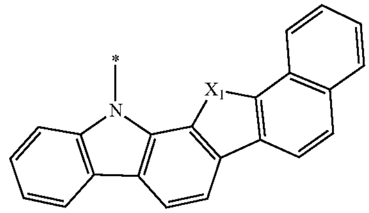
2-18
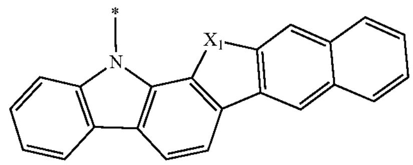
2-19
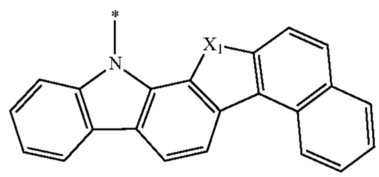
2-20
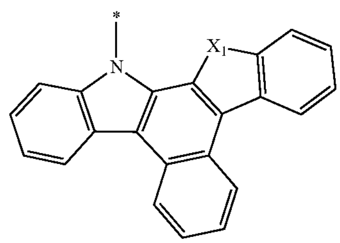
2-21
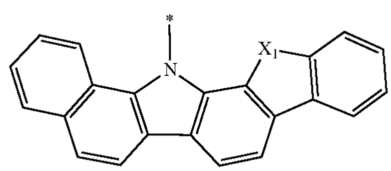
2-22
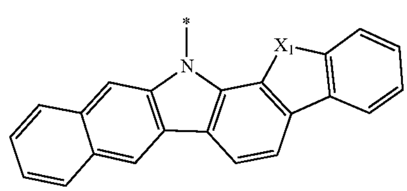
2-23
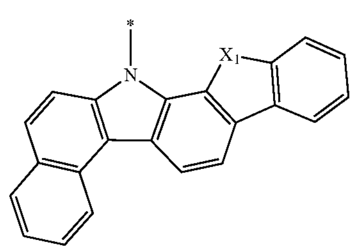

-continued
2-24
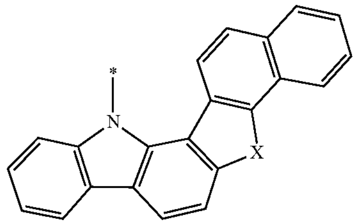
2-25
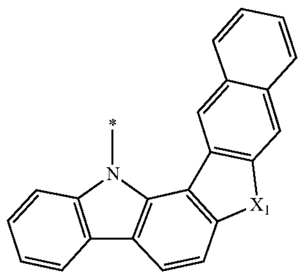
2-26
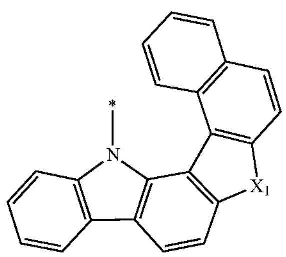
2-27
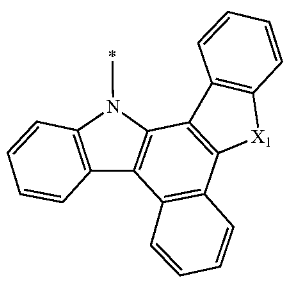
2-27
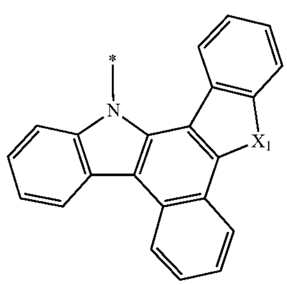
2-28
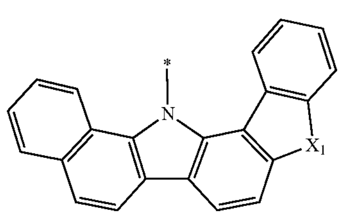
-continued
2-29
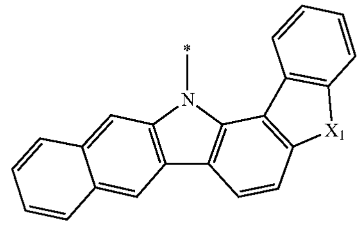
2-30
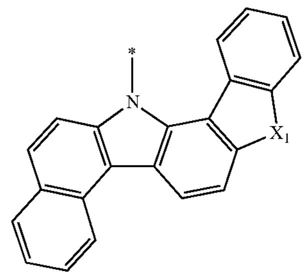
2-31
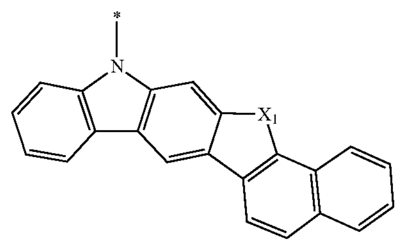
2-32
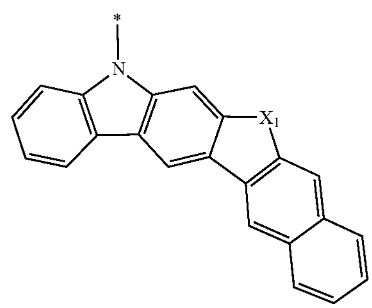
2-33
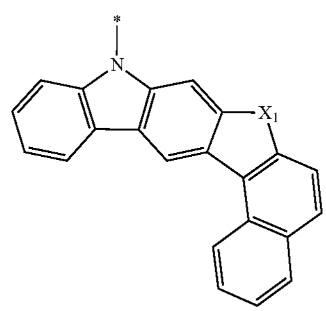
2-34
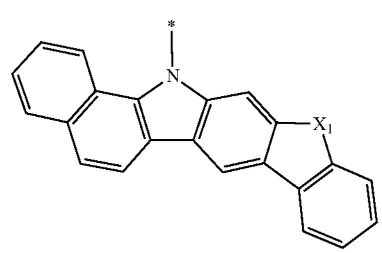

-continued
2-35
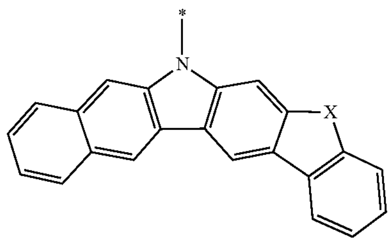
2-36
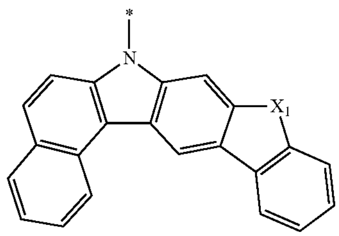
2-37
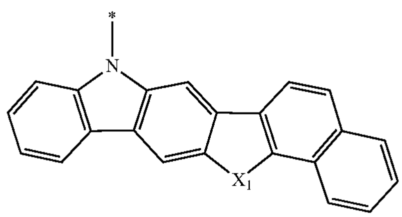
2-38
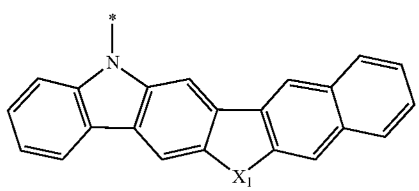
2-39
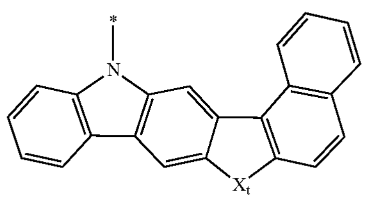
2-40
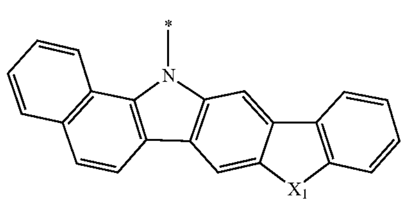
2-41
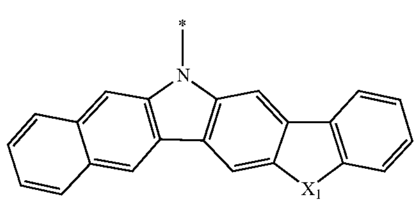
-continued
2-42
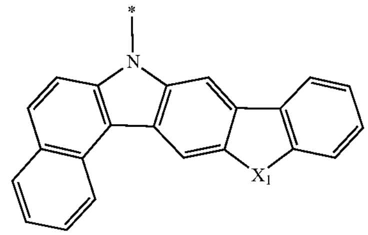
2-43
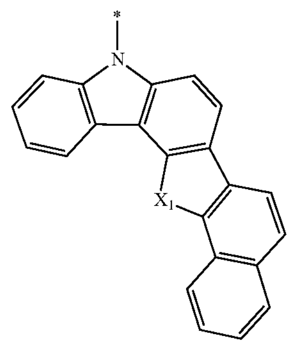
2-44
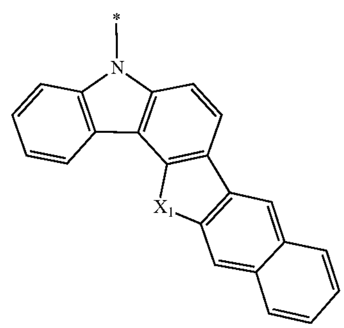
2-45
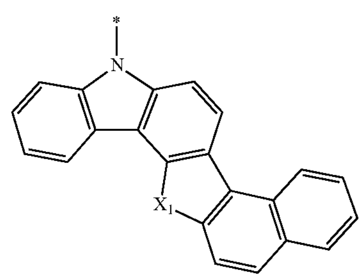
2-46
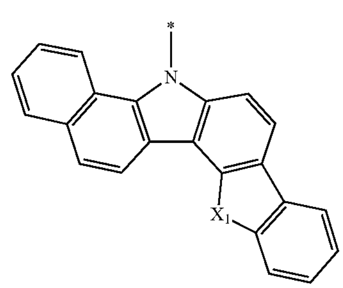

-continued
2-47
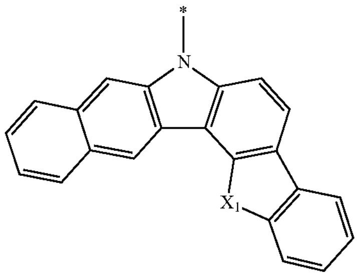
2-48
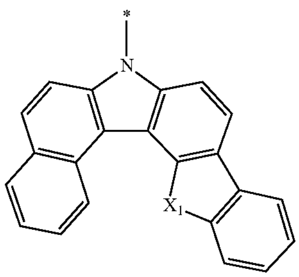
2-49
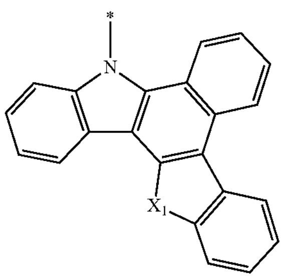
2-50
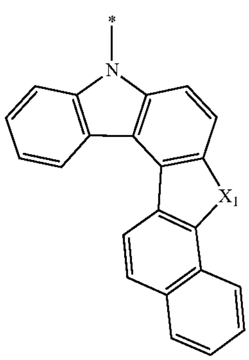
2-51
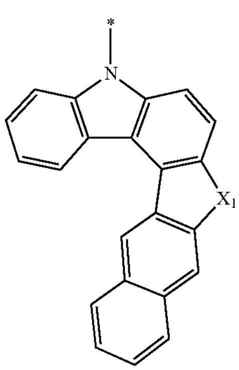
-continued
2-52
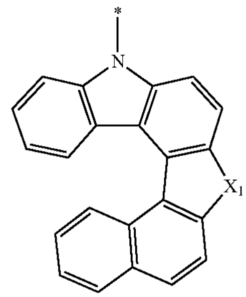
2-53
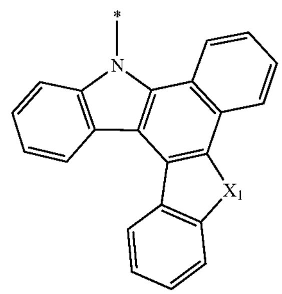
2-54
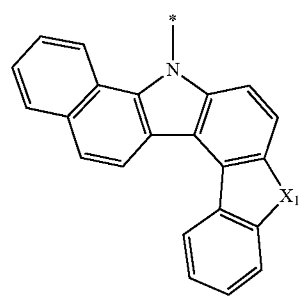
2-55
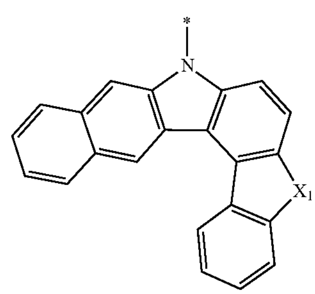
2-56
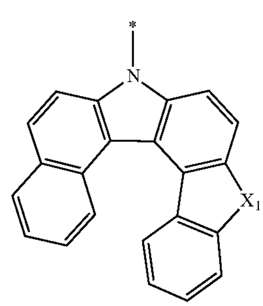

-continued
2-57
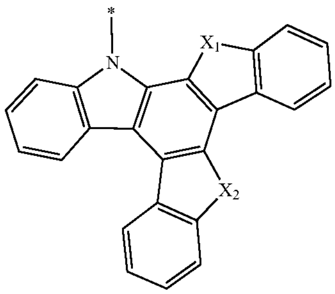
2-58
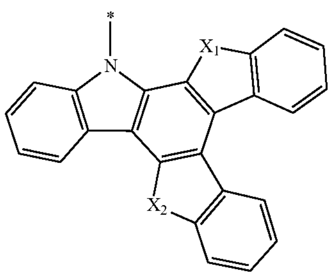
2-59
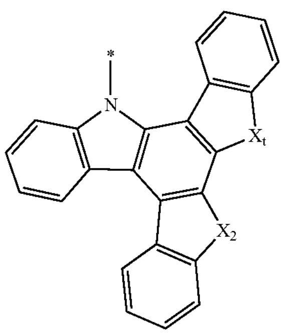
2-60
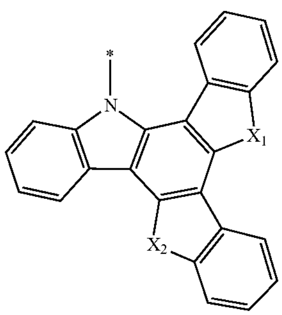
2-61
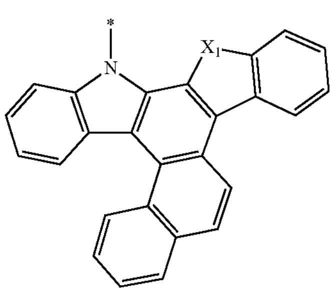
-continued
2-62
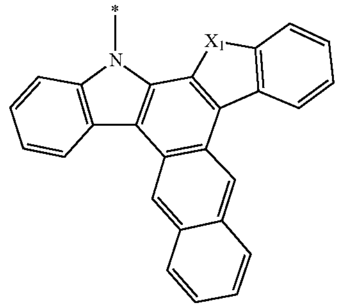
2-63
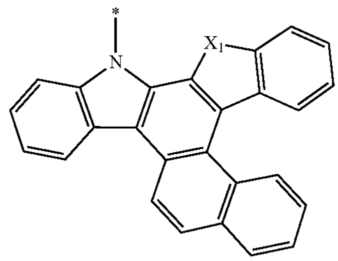
2-64
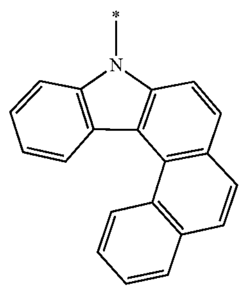
2-65
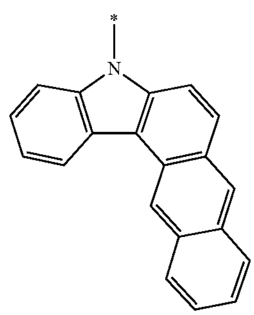
2-66
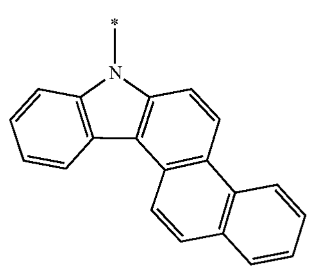

-continued
2-67
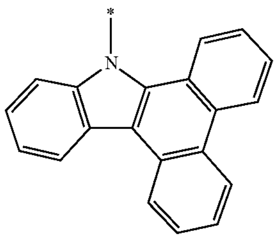
2-68
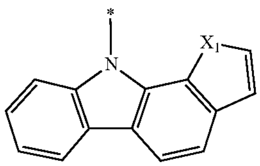
2-69
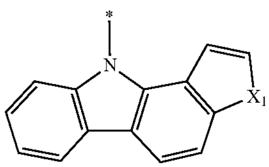
2-70
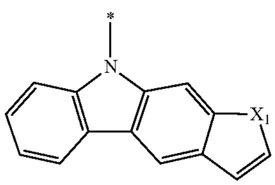
2-71
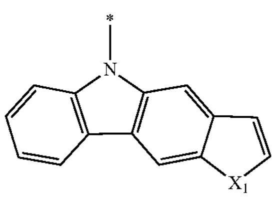
2-72
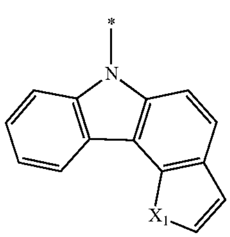
2-73
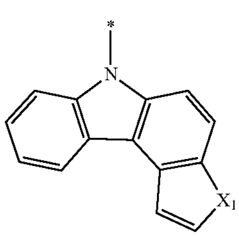
-continued
2-74
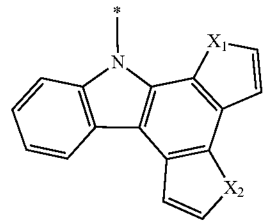
2-75
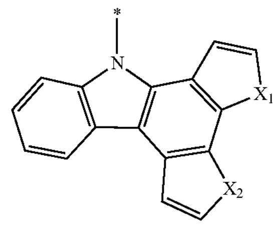
2-76
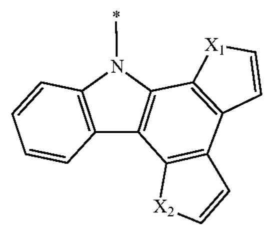
2-77
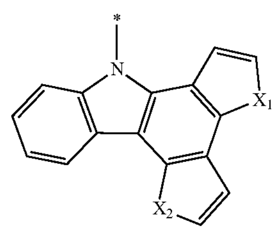
2-78
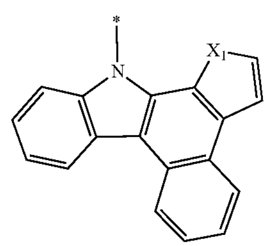
2-79
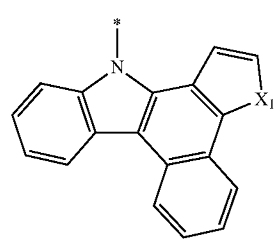
2-80
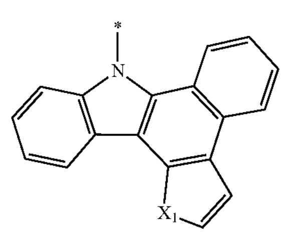

-continued
2-81
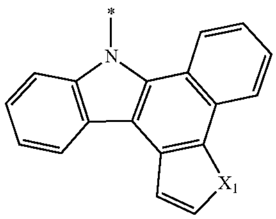
2-82
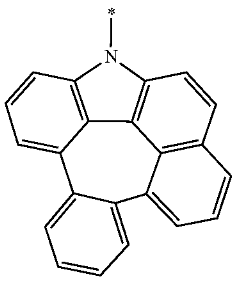
2-83
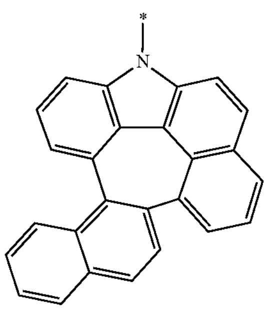
2-84
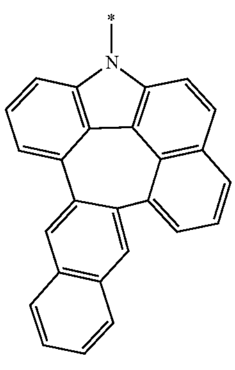
2-85
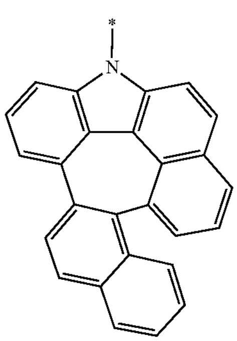
-continued
2-86
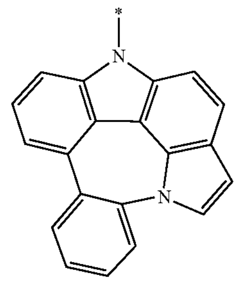
2-87
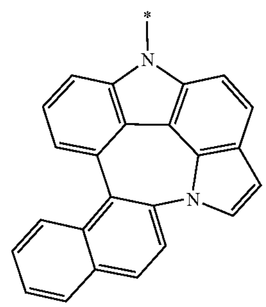
2-88
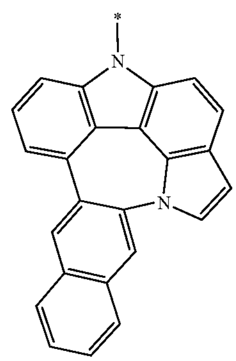
2-89
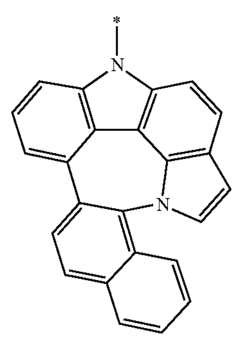
2-90
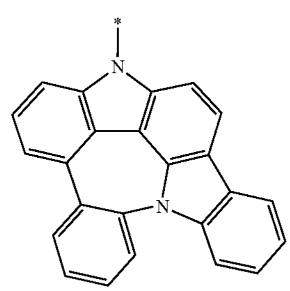

-continued
2-91
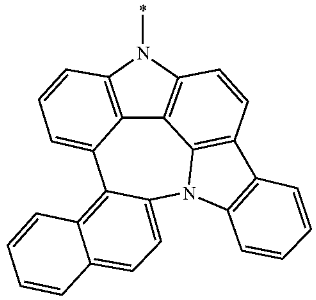
2-92
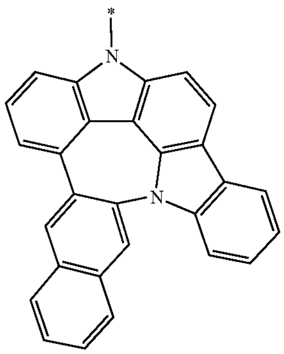
2-93
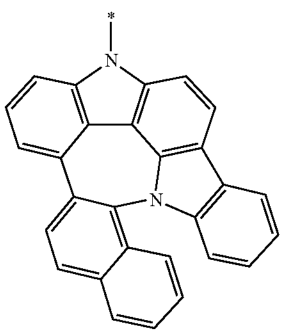
In Formulae 2-1 to 2-93,
$X_1$ may be O, S, $N(R_{31})$, $C(R_{31})(R_{32})$, or $Si(R_{31})(R_{32})$,
$X_2$ may be O, S, $N(R_{33})$, $C(R_{33})(R_{34})$, or $Si(R_{33})(R_{34})$,
$R_{31}$ to $R_{34}$ are the same as described in connection with $R_{30}$, and
* indicates a binding site to $Ar_1$ or $Ar_2$ in Formula 2.
In one or more embodiments, Het1 in Formula 3 and Het1 and Het3 in Formula 3(1) may each independently be a group derived from one of Formulae 3-1 to 3-40:
3-1
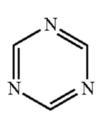
3-2
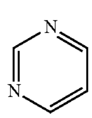
3-3
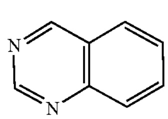
-continued
3-4
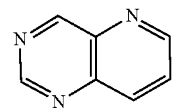
3-5
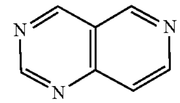
3-6
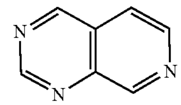
3-7
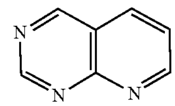
3-8
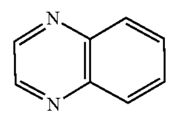
3-9
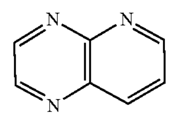
3-10
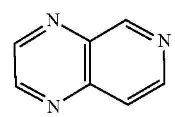
3-11
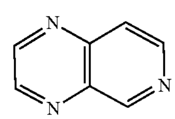
3-12
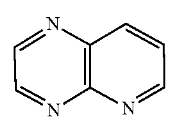
3-13
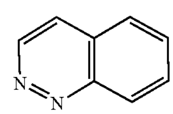
3-14
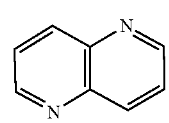
3-15
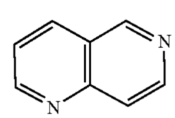
3-16
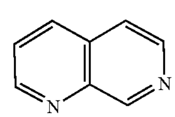

-continued
3-17
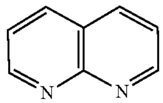
3-18
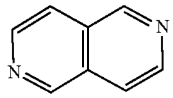
3-19
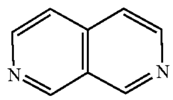
3-20
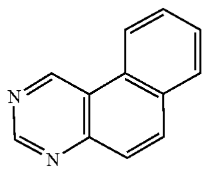
3-21
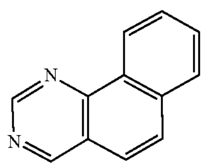
3-22
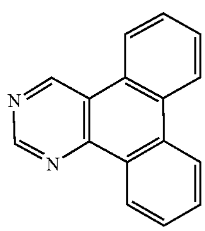
3-23
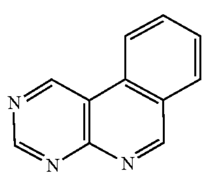
3-24
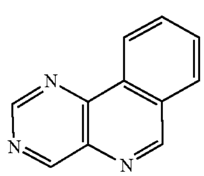
3-25
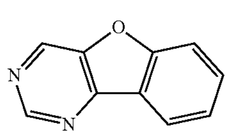
3-26
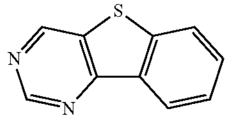
-continued
3-27
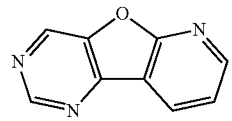
3-28
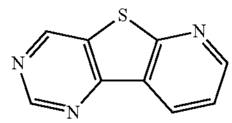
3-29
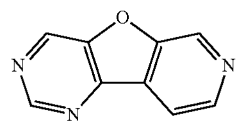
3-30
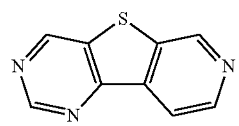
3-31
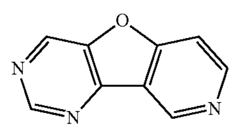
3-32
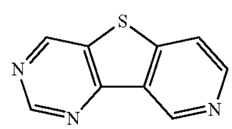
3-33
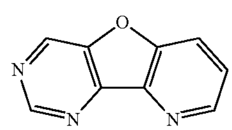
3-34
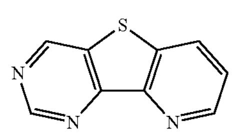
3-35
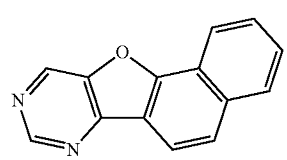
3-36
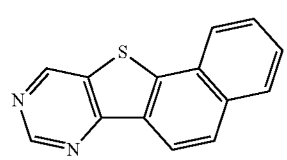
3-37
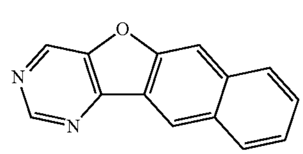

-continued 3-38

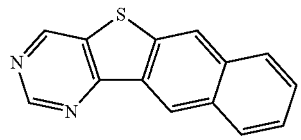

3-39

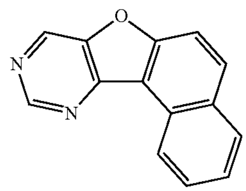

3-40

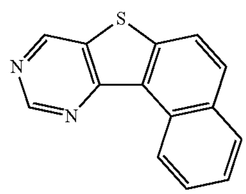

The designations a1 and a2 in Formulae 2 and 2(1) respectively indicate the number of $Ar_1$ and the number of $Ar_2$, and may each independently be an integer from 0 to 5 (for example, 0, 1 or 2), and the sum of a1 and a2 may be 1 or more. When a1 is 2 or more, two or more $Ar_1$(s) may be identical to or different from each other, and when a2 is 2 or more two or more $Ar_2$(s) may be identical to or different from each other. When a1 is 0, $*—(Ar_1)_{a1}—*'$ in Formula 2 may be a single bond.

The designations all and m in Formulae 3 and 3(1) respectively indicate the number of $Ar_{11}$ and the number of $*—(Ar_{11})_{a11}—(R_{70})_{a70}$, and may each independently be an integer from 1 to 10. When all is 2 or more, two or more $Ar_{11}$(s) may be identical to or different from each other, and when m is 2 or more, two or more $*—(Ar_{11})a1\text{-}(R_{70})_{a70}$ (s) may be identical to or different from each other.

In one or more embodiments, all and m in Formula 3 and 3(1) may each independently be an integer from 1 to 3.

$R_{20}$, $R_{30}$, $R_{61}$, $R_{65}$, $R_{66}$, $R_{70}$, and $R_{80}$ in Formulae 2 and 3 may each independently be hydrogen, deuterium, —F, —Cl, —Br, —I, $—SF_5$, a hydroxyl group, a cyano group, a nitro group, an amino group, an amidino group, a hydrazino group, a hydrazono group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$. $Q_1$ to $Q_9$ are the same as described herein.

For example, $R_{20}$, $R_{30}$, $R_{61}$, $R_{65}$, $R_{66}$, $R_{70}$, and $R_{80}$ in Formulae 2 and 3 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group (a norbornyl group), a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl) cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl) cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl) bicyclo[2.1.1]hexyl group, a ($C_1$-$C_{20}$ alkyl)bicyclo[2.2.1] heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$ or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

The designations b2, b3, b7, and b8 in Formulae 2 and 3 indicate the numbers of $R_{20}$, $R_{30}$, $R_{70}$, and $R_{80}$, respectively, and may each independently be an integer from 0 to 20. For example, b2, b3, b7, and b8 may each independently be an integer from 0 to 10. When b2 is 2 or more, two or more $R_{20}$(S) may be identical to or different from each other, when b3 is 2 or more, two or more $R_{30}$ (s) may be identical to or different from each other, when b7 is 2 or more, two or more $R_{70}$(s) may be identical to or different from each other, and when b8 is 2 or more, two or more $R_{80}$(s) may be identical to or different from each other.

In one or more embodiments, $R_{20}$, $R_{30}$, $R_{61}$, $R_{65}$, $R_{66}$, $R_{70}$ and $R_{80}$ in Formulae 2 and 3 may each independently be:

hydrogen or deuterium;

a $C_1$-$C_{20}$ alkyl group or a $C_1$-$C_{20}$ alkoxy group, each unsubstituted or substituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl) carbazolyl group, a dibenzofuranyl group, a dibenzothiophenyl group, a biphenyl group, a terphenyl group, —$N(Q_{31})(Q_{32})$, or any combination thereof;

a π electron-rich $C_3$-$C_{60}$ cyclic group, unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl) dibenzosilolyl group, a carbazolyl group, a ($C_1$-$C_{10}$ alkyl) carbazolyl group, a ($C_6$-$C_{60}$ aryl)carbazolyl group, a dibenzofuranyl group, a dibenzothiophenyl group, a biphenyl group, a terphenyl group, —$N(Q_{31})(Q_{32})$, or any combination thereof; or —$N(Q_1)(Q_2)$.

Herein, $Q_1$, $Q_2$, $Q_{31}$ and $Q_{32}$ are each independently the same as described herein.

In one or more embodiments, $R_{20}$, $R_{30}$, $R_{61}$, $R_{65}$, $R_{66}$, $R_{70}$ and $R_{80}$ in Formulae 2 and 3 may each independently be:

hydrogen or deuterium;

a $C_1$-$C_{20}$ alkyl group unsubstituted or substituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, —$N(Q_{31})(Q_{32})$, or any combination thereof; or a phenyl group, a naphthyl group, an anthracenyl group, a phenanthrenyl group, a triphenylenyl group, a fluorenyl group, a dibenzosilolyl group, a carbazolyl group, a dibenzofuranyl group, or a dibenzothiophenyl group, unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl) dibenzosilolyl group, a carbazolyl group, a ($C_1$-$C_{10}$ alkyl) carbazolyl group, a ($C_6$-$C_{60}$ aryl)carbazolyl group, a dibenzofuranyl group, a dibenzothiophenyl group, a biphenyl group, a terphenyl group, —$N(Q_{31})(Q_{32})$, or any combination thereof. Herein, $Q_{31}$ and $Q_{32}$ are each independently the same as described herein.

In one or more embodiments, the second compound may include at least one of Compounds H1-1 to H1-72:

-continued
H1-1
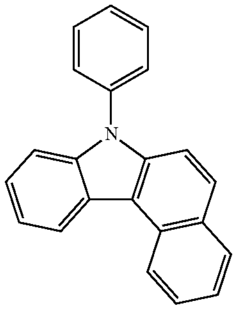
H1-2
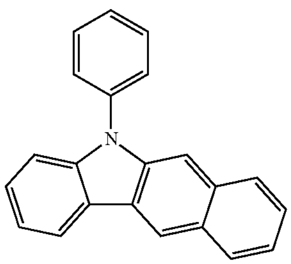
H1-3
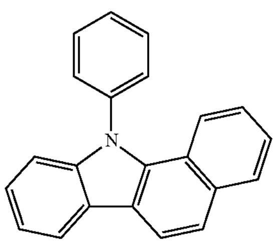
H1-4
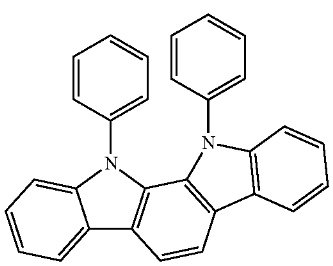
H1-5
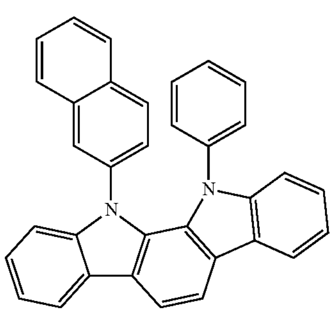
H1-6
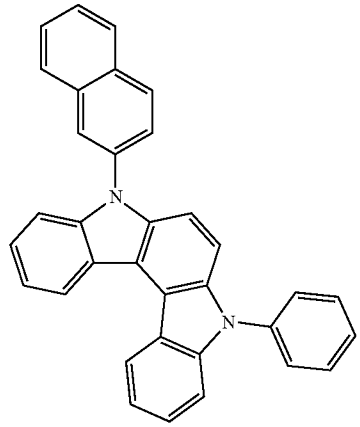
H1-7
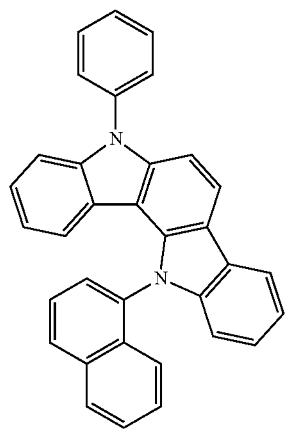
H1-8
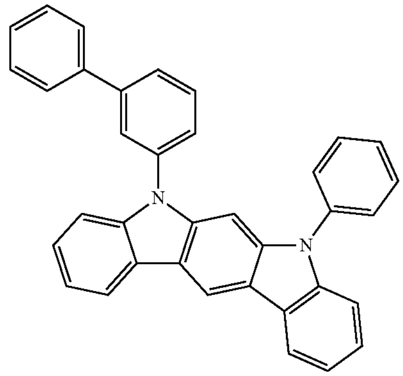

-continued
H1-9
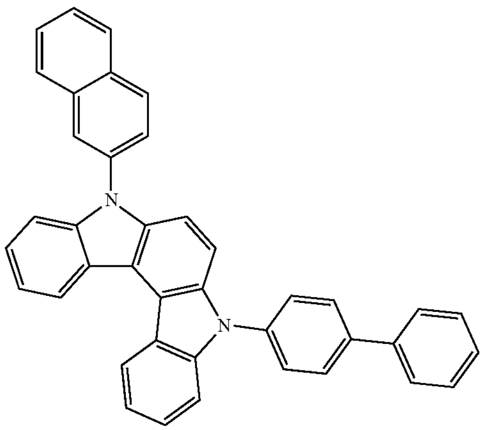
H1-10
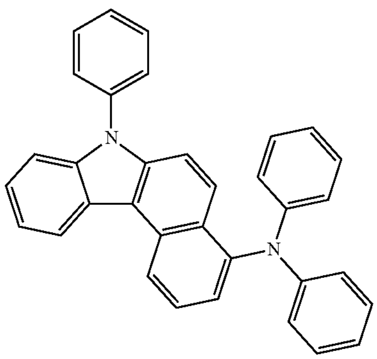
H1-11
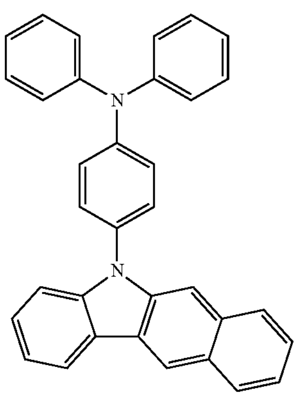
H1-12
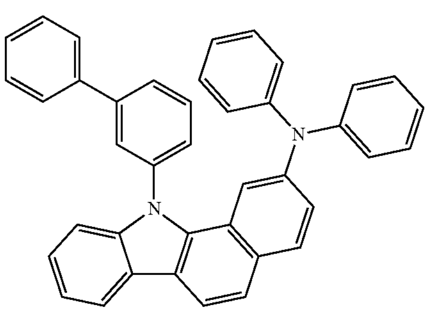
-continued
H1-13
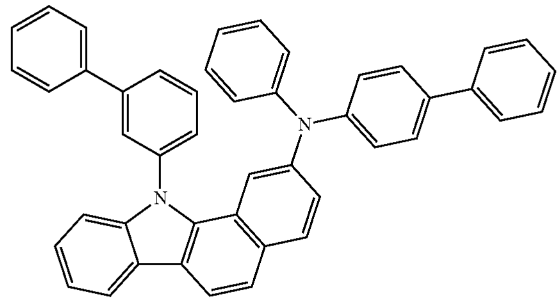
H1-14
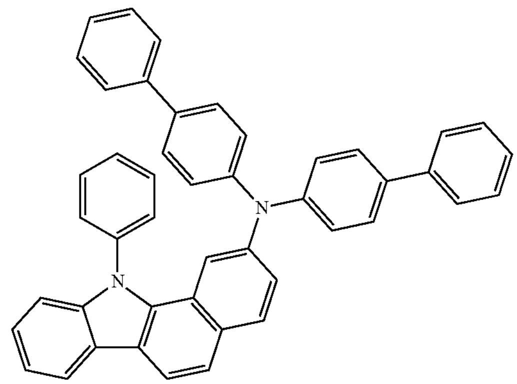
H1-15
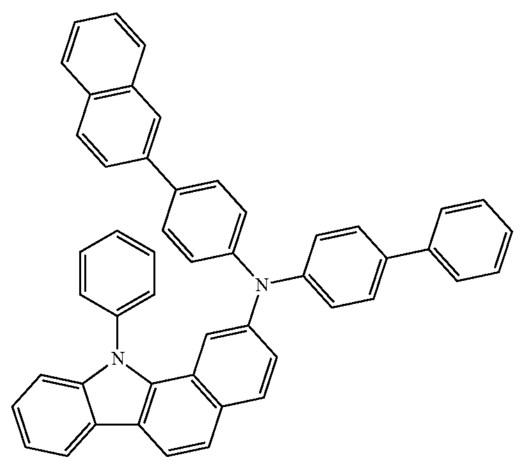
H1-16
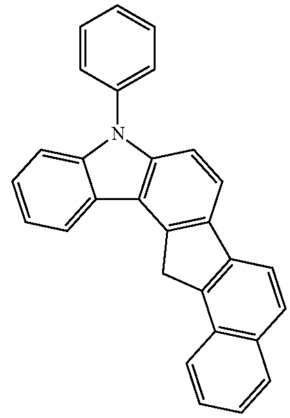

-continued
H1-17
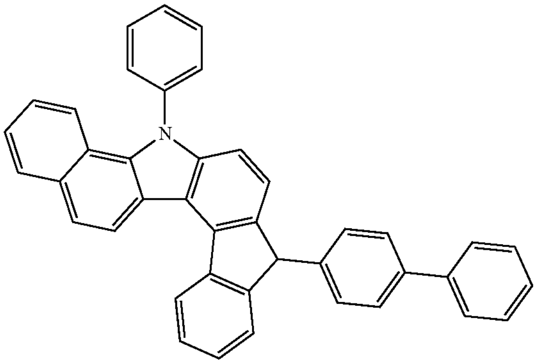
H1-18
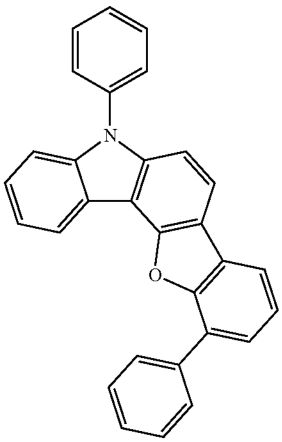
H1-19
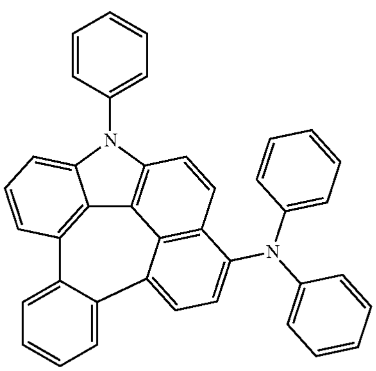
H1-20
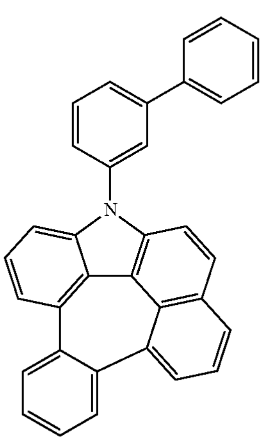
-continued
H1-21
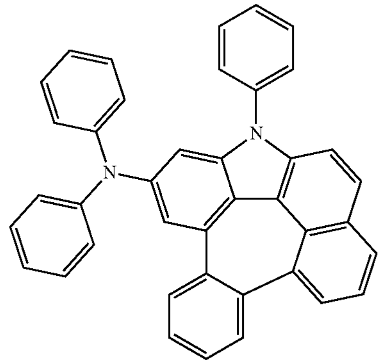
H1-22
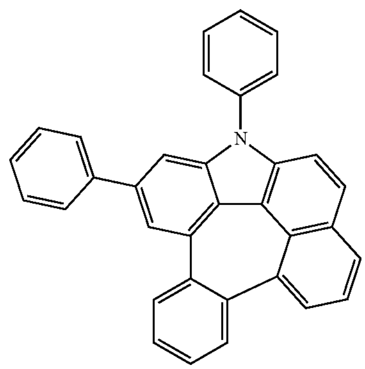
H1-23
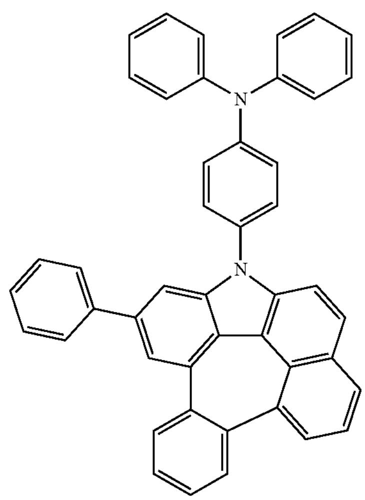
H1-24
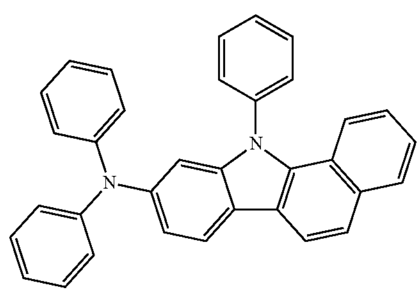

-continued
H1-25
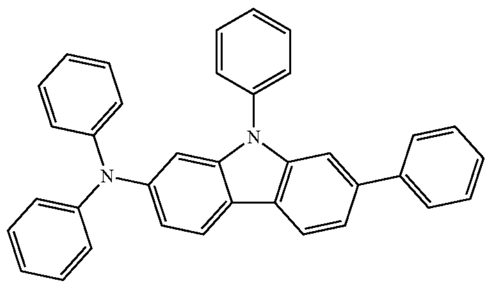
H1-26
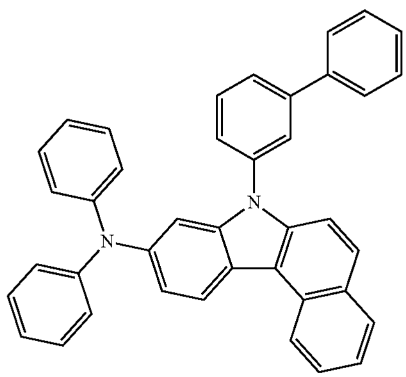
H1-27
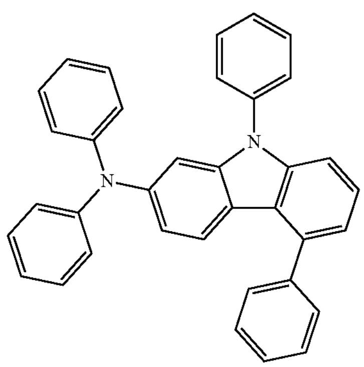
H1-28
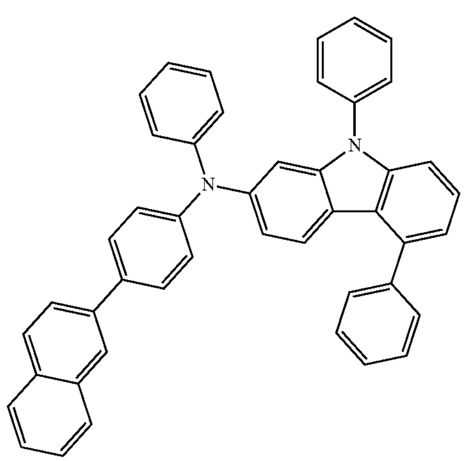
-continued
H1-29
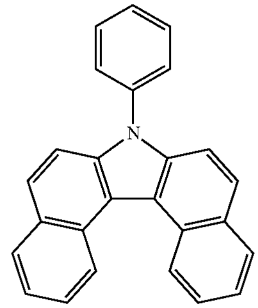
H1-30
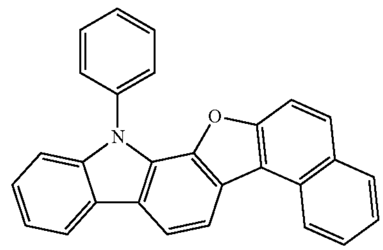
H1-31
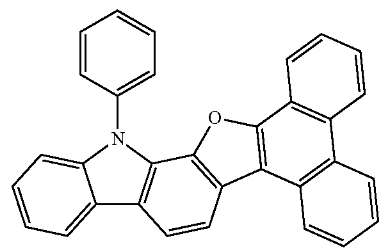
H1-32
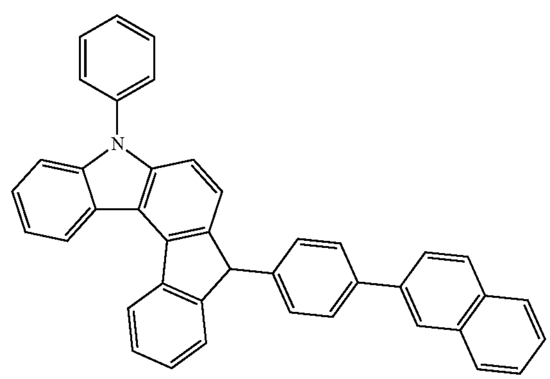
H1-33
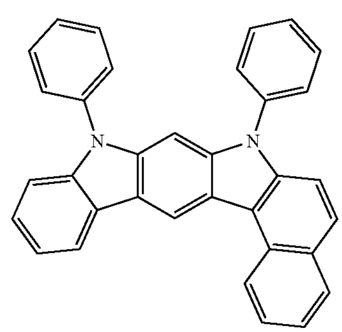

-continued
H1-34
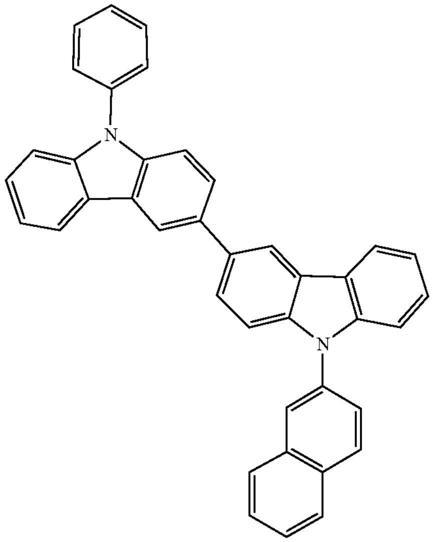
H1-35
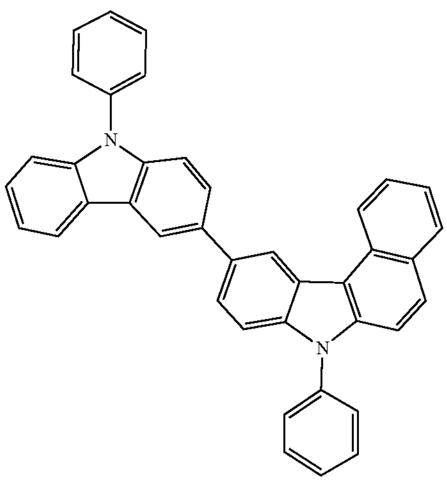
H1-36
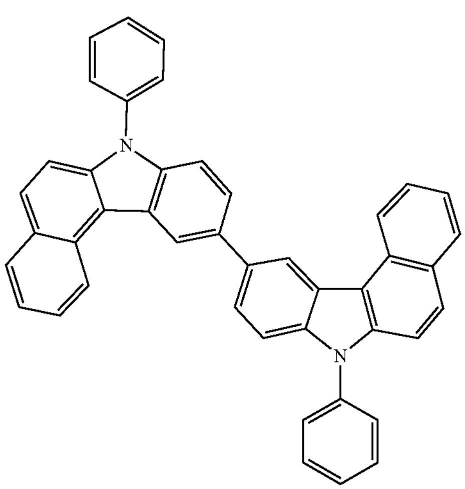
-continued
H1-37
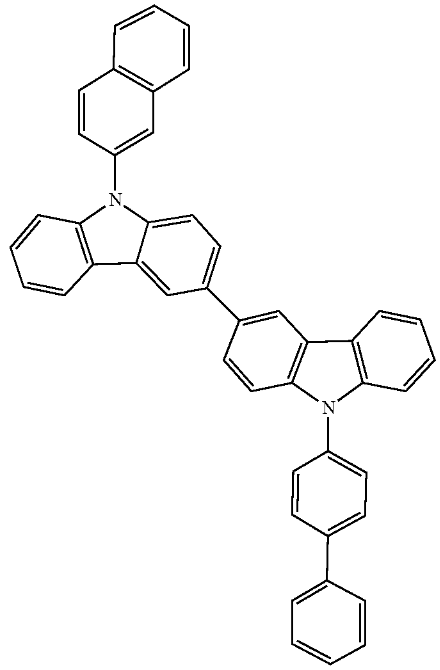
H1-38
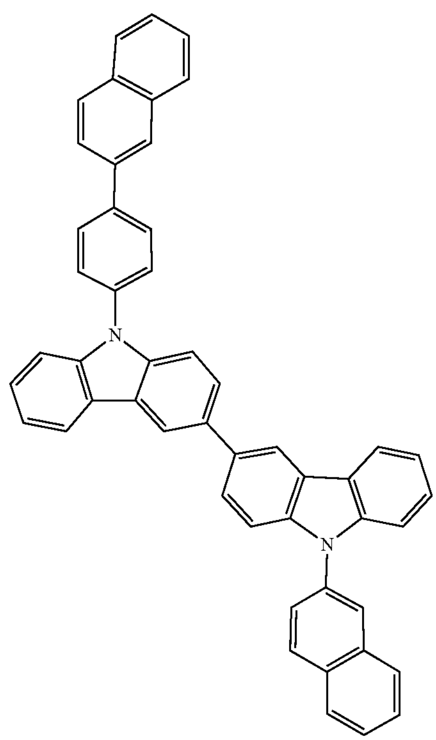

-continued
H1-39
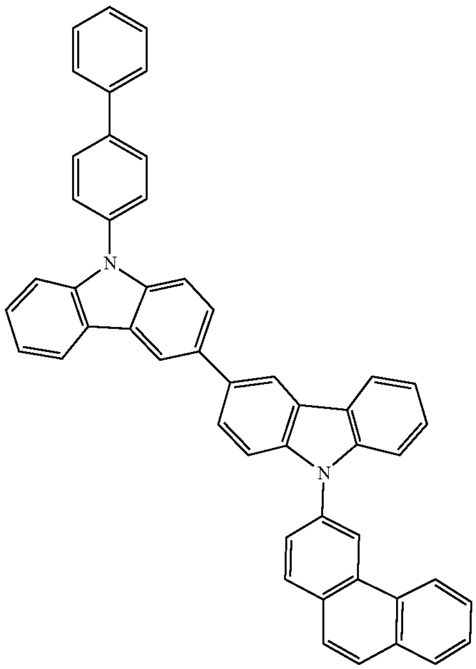
H1-40
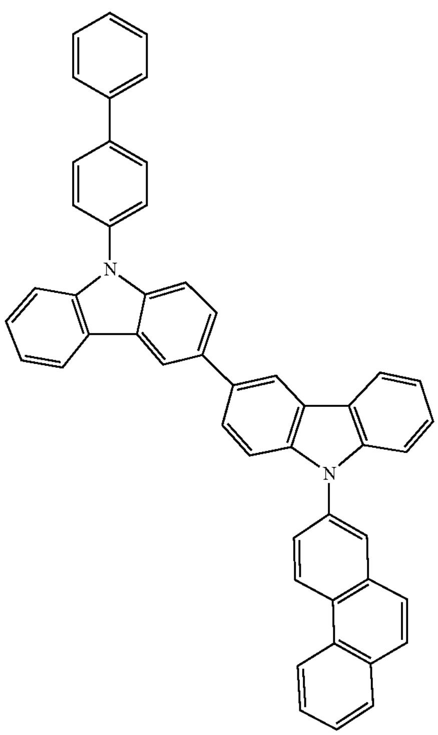
-continued
H1-41
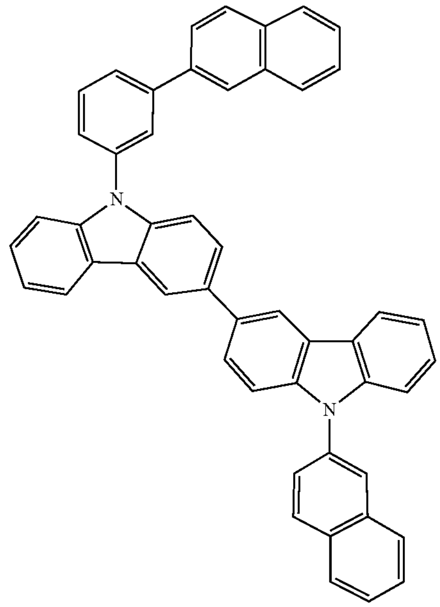
H1-42
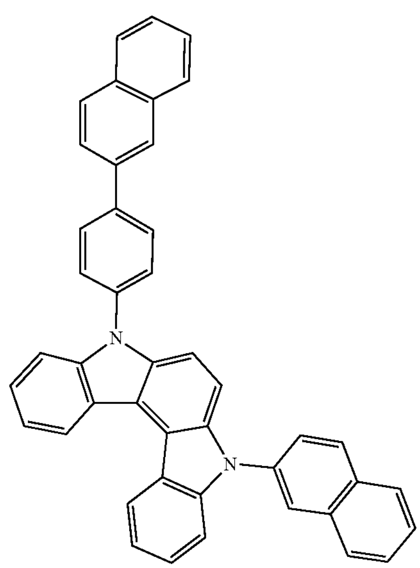

-continued
H1-43
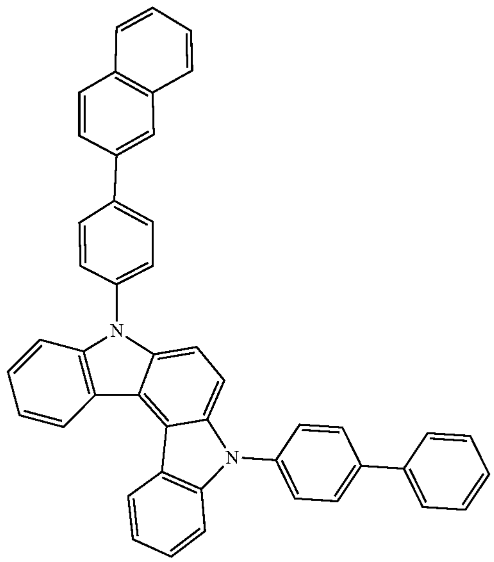
H1-44
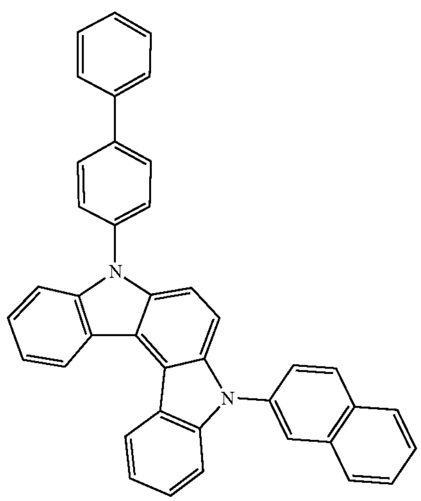
H1-45
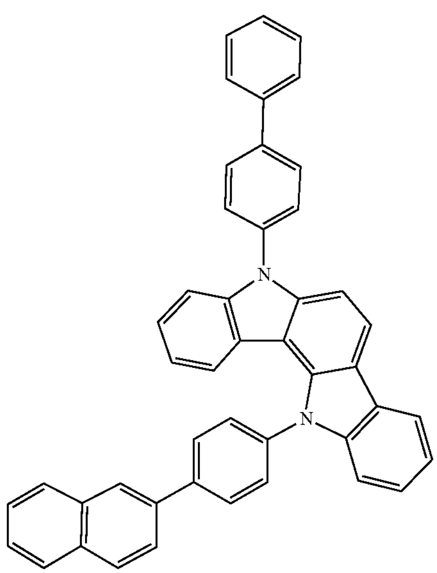
-continued
H1-46
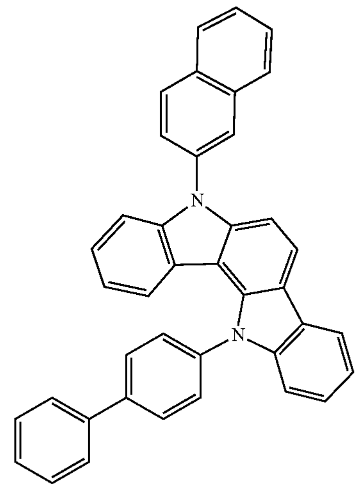
H1-47
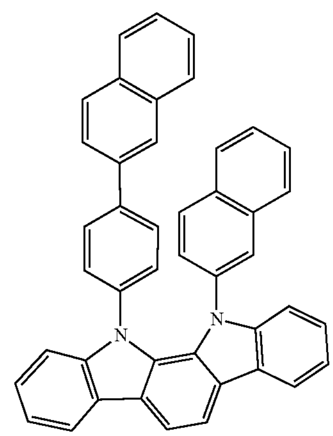
H1-48
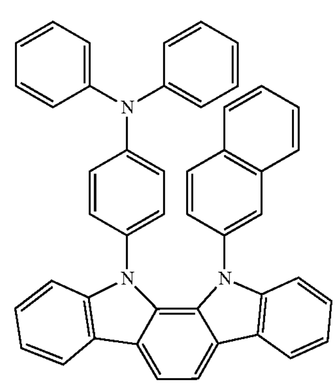

H1-49
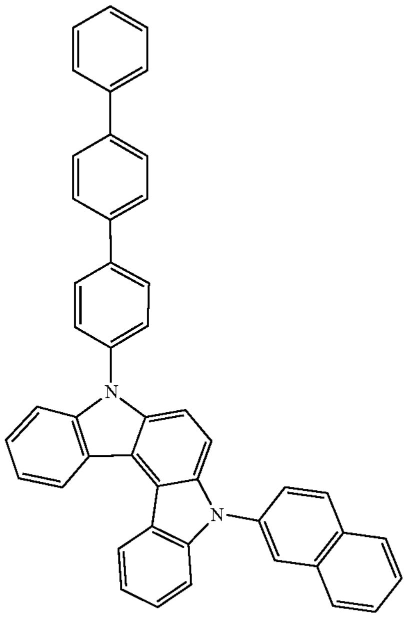
H1-50
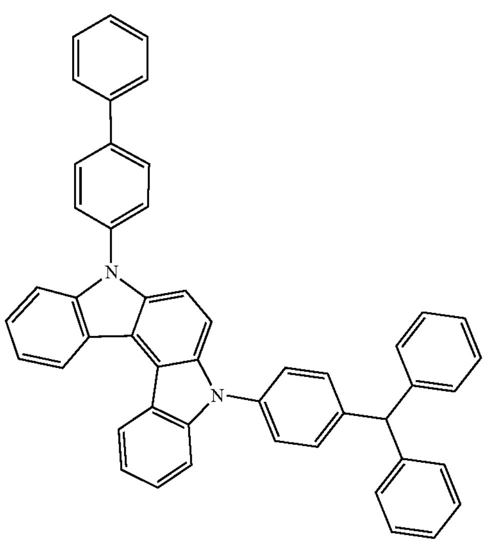
H1-51
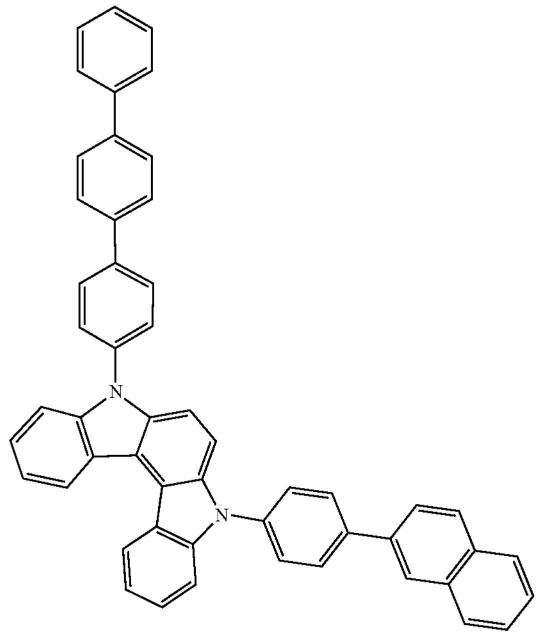
H1-52
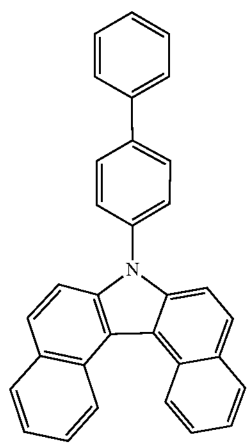
H1-53
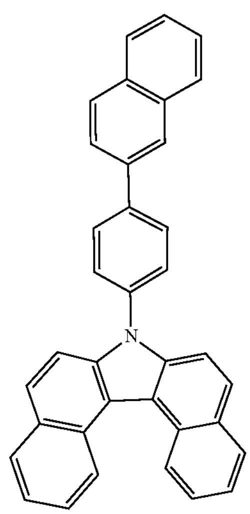

-continued
H1-54
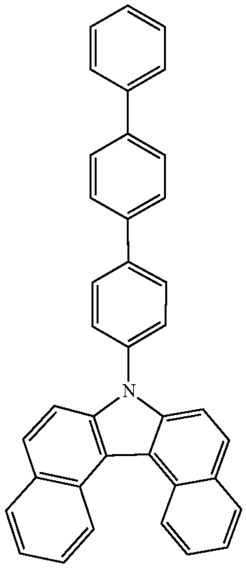
H1-55
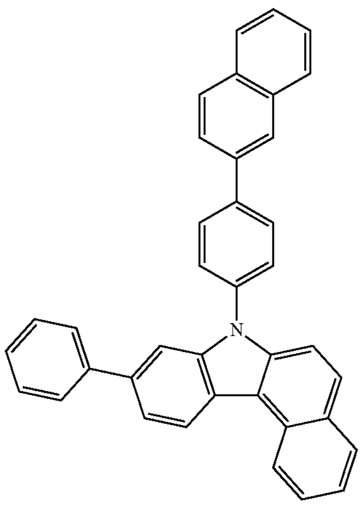
H1-56
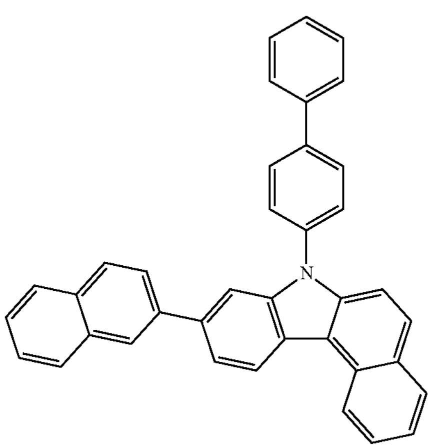
-continued
H1-57
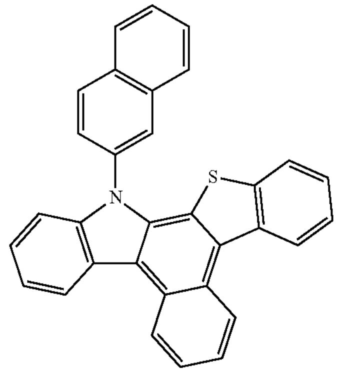
H1-58
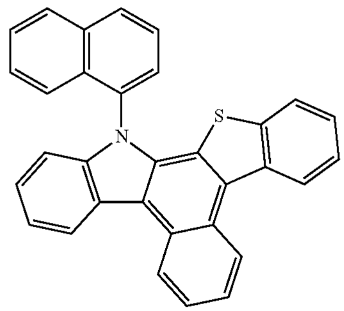
H1-59
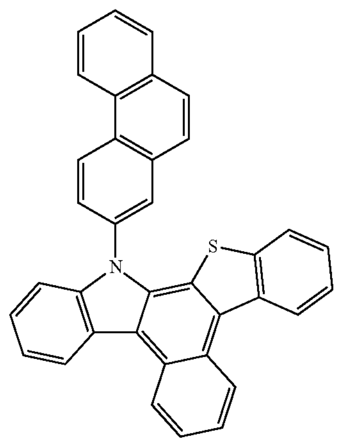
H1-60
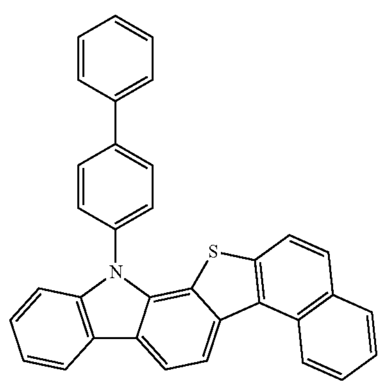

-continued
H1-61
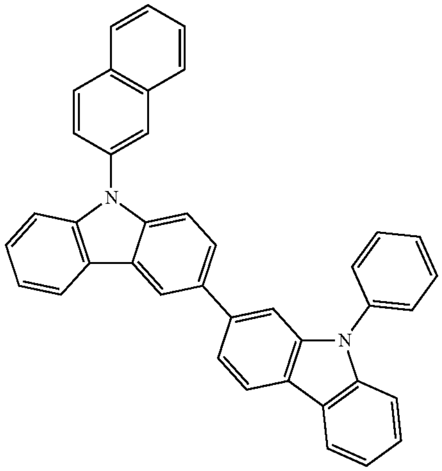
H1-62
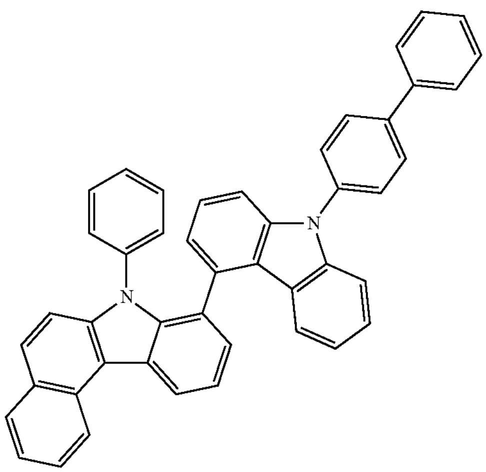
H1-63
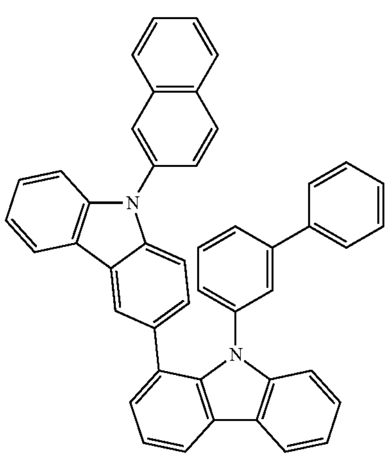
-continued
H1-64
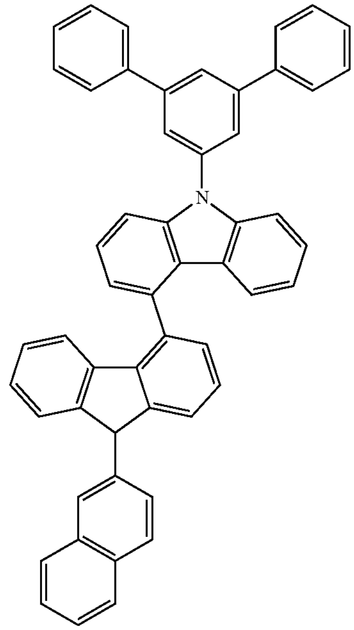
H1-65
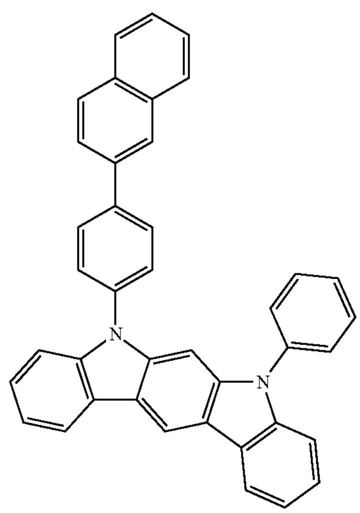
H1-66
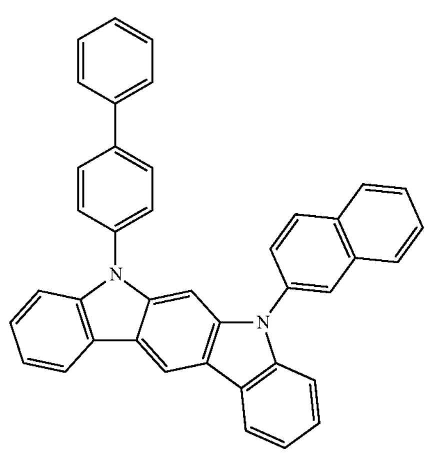

-continued
H1-67
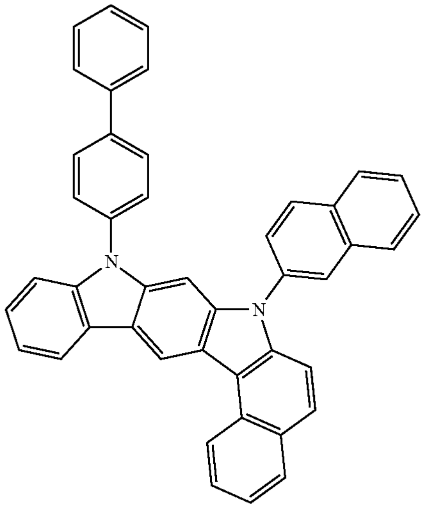
H1-68
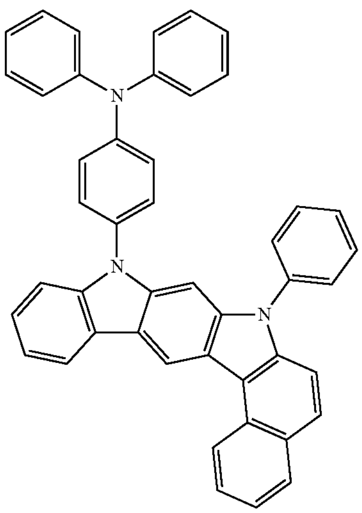
H1-69
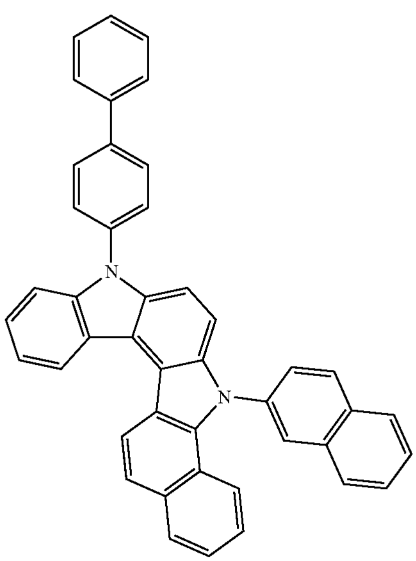
-continued
H1-70
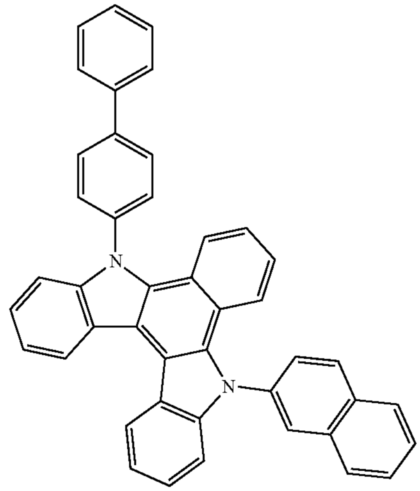
H1-71
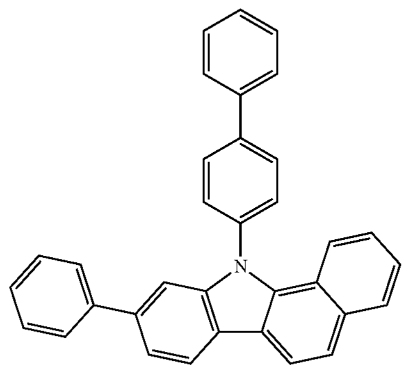
H1-72
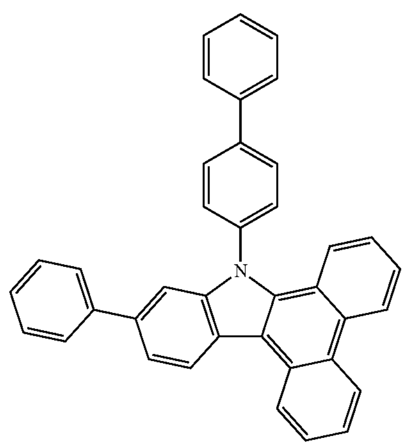
In one or more embodiments, the third compound may include at least one of Compounds H2-1 to H2-61:

-continued
H2-1
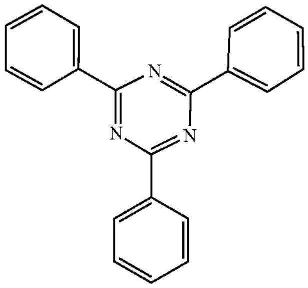
H2-2
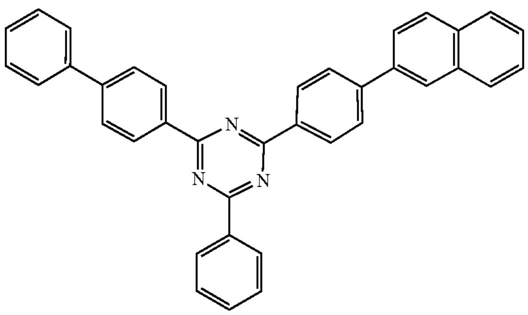
H2-3
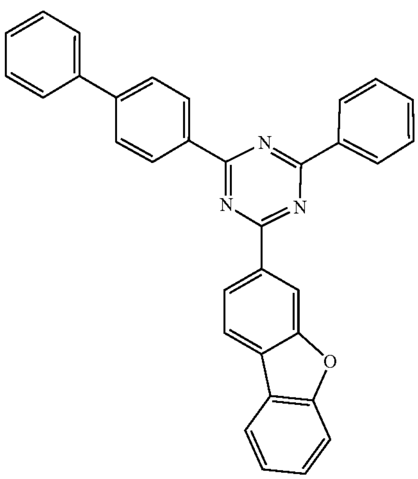
H2-4
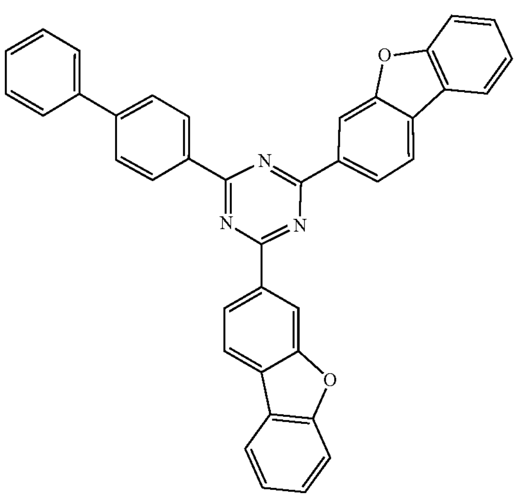
H2-5
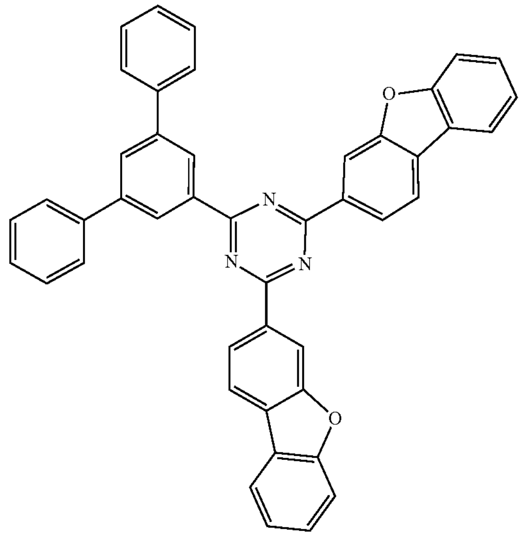
H2-6
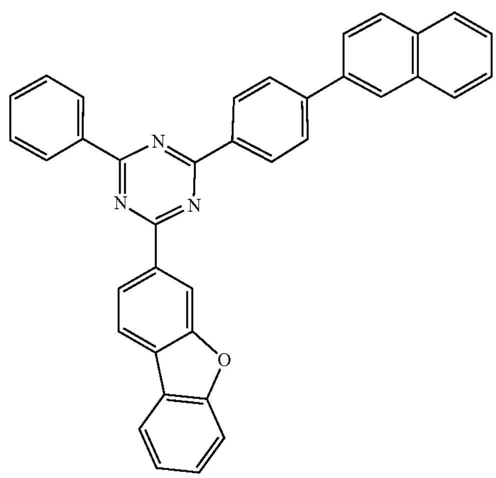
H2-7
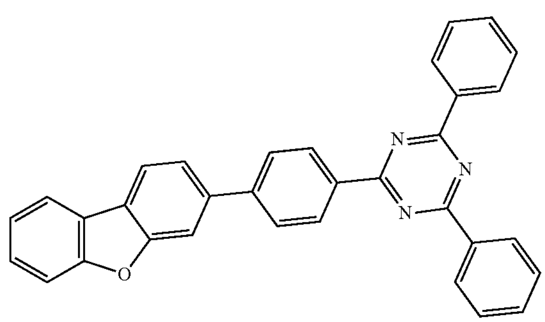

-continued
H2-8
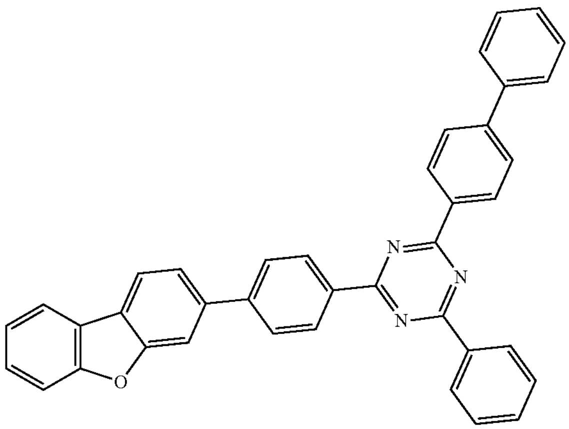
H2-9
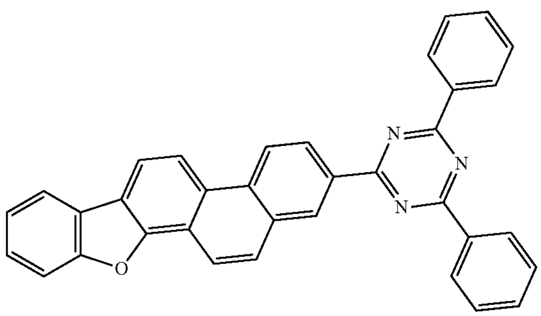
H2-10
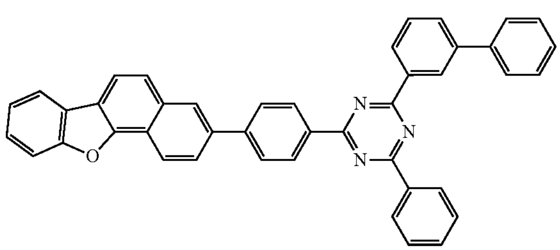
H2-11
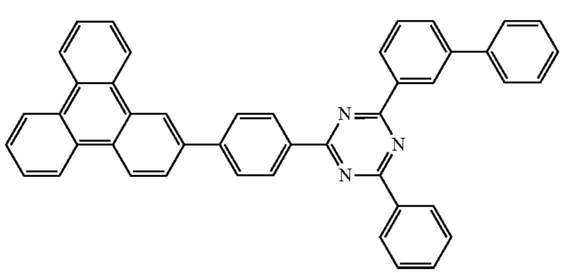
-continued
H2-12
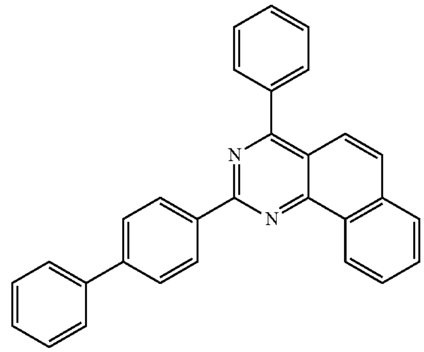
H2-13
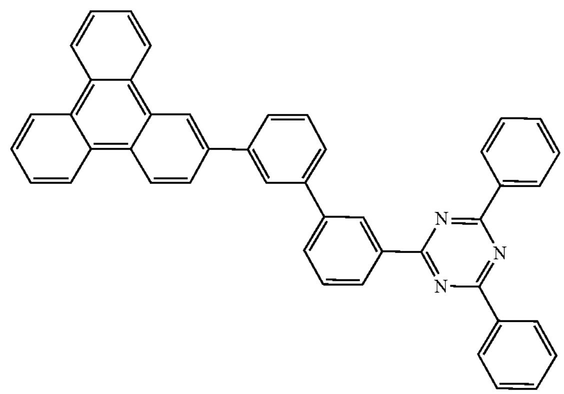
H2-14
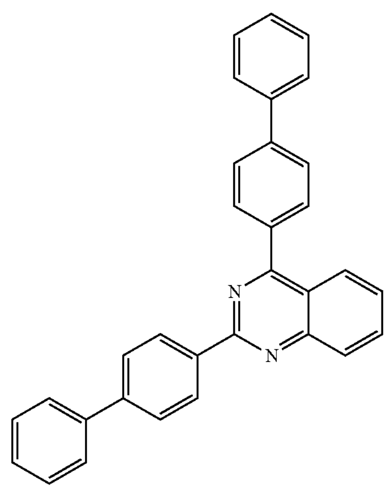
H2-15
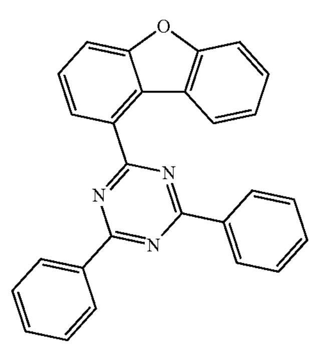

-continued
H2-16
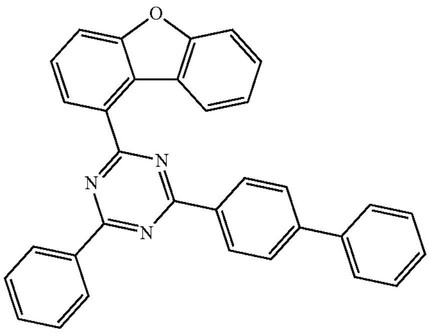
H2-17
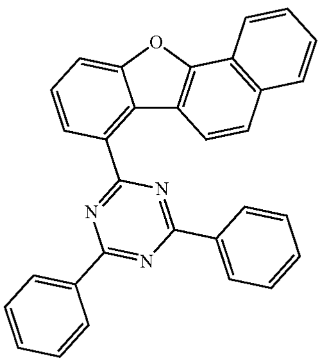
H2-18
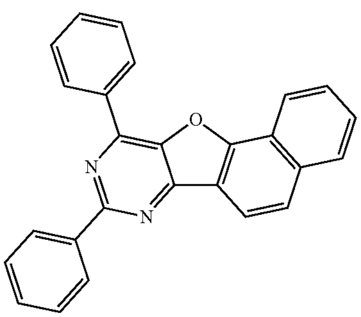
H2-19
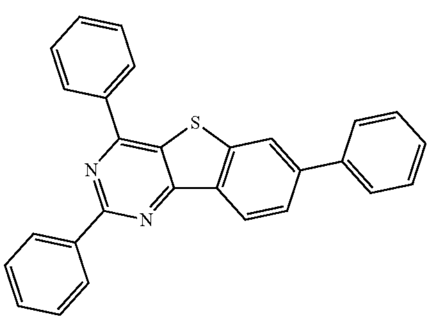
-continued
H2-20
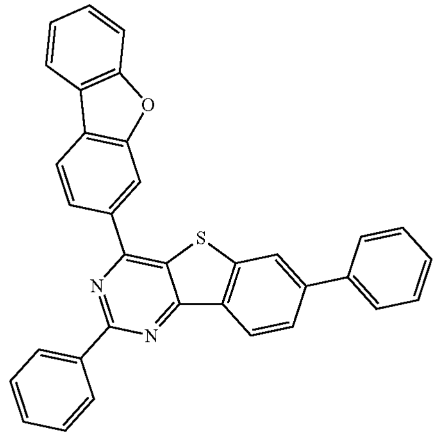
H2-21
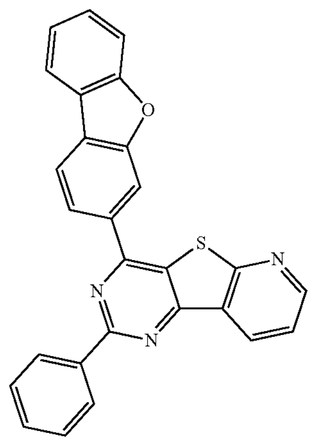
H2-22
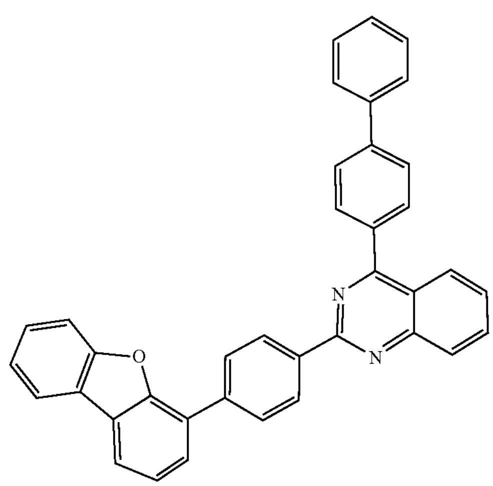

-continued
H2-23
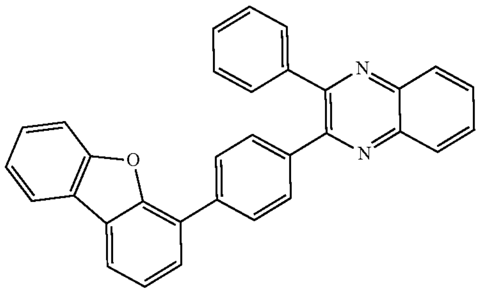
H2-24
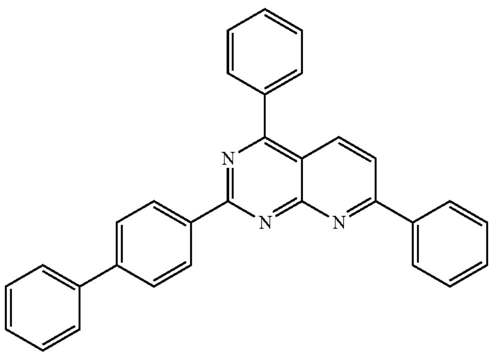
H2-25
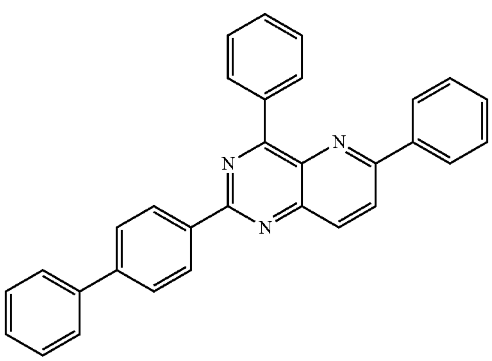
H2-26
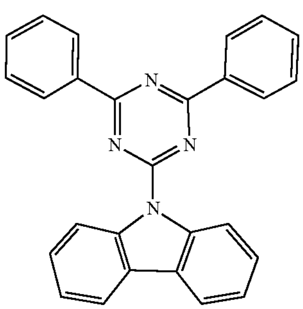
-continued
H2-27
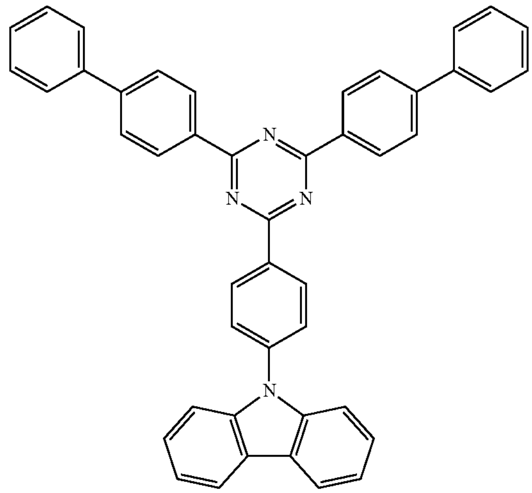
H2-28
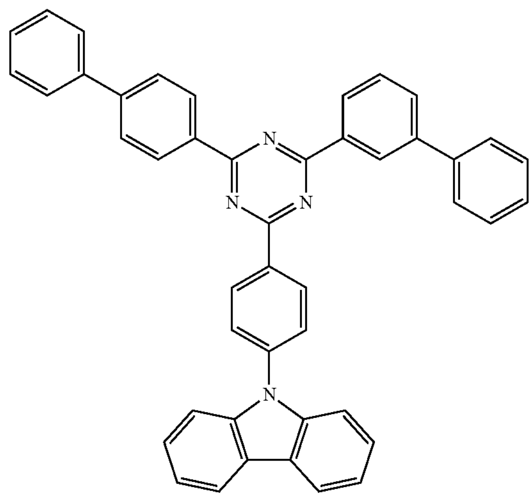
H2-29
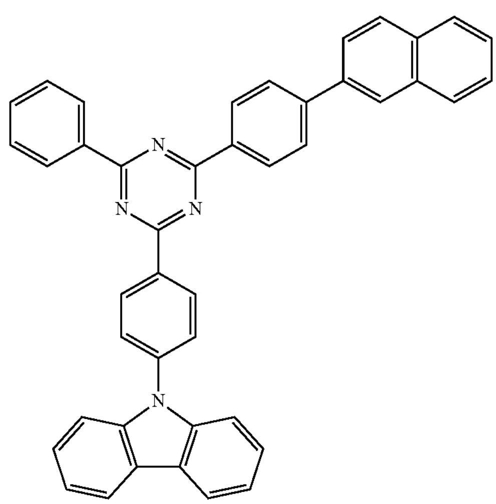

-continued
H2-30
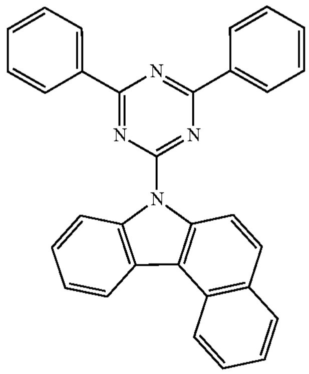
H2-31
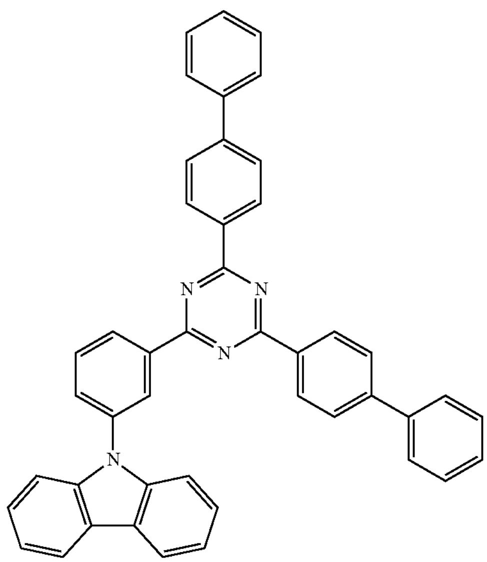
H2-32
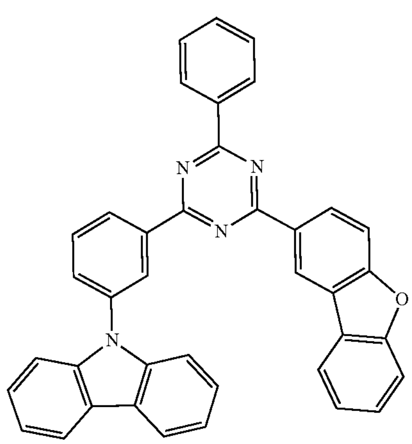
-continued
H2-33
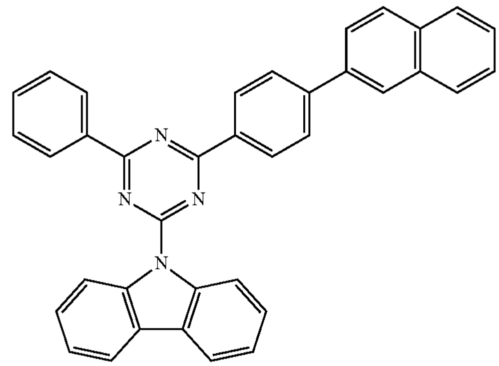
H2-34
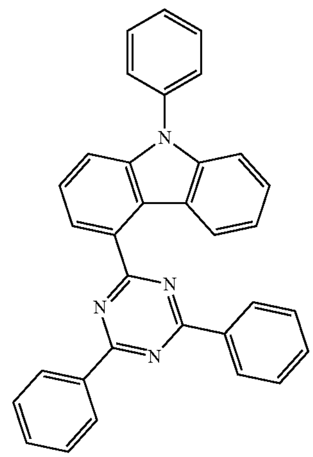
H2-35
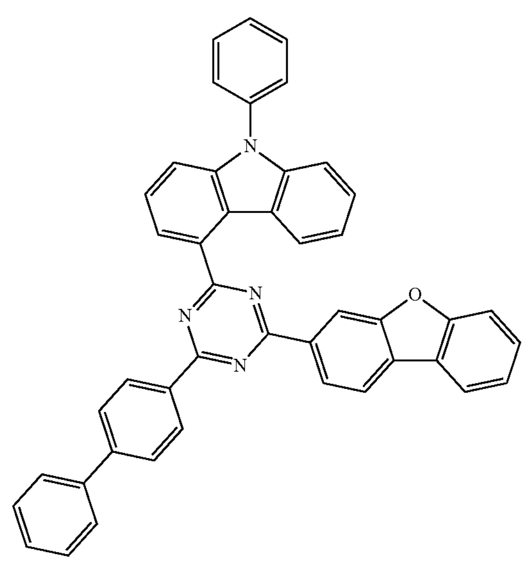

-continued
H2-36
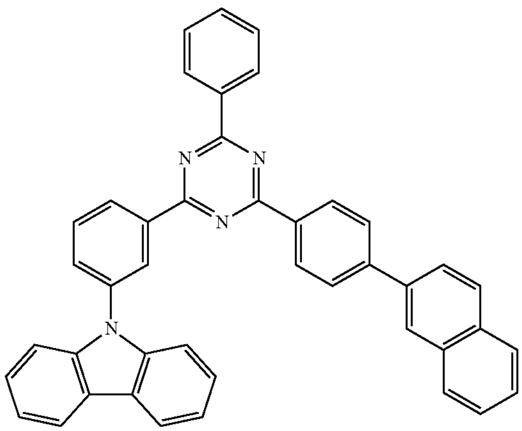
H2-37
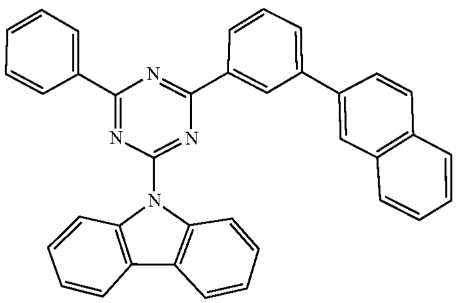
H2-38
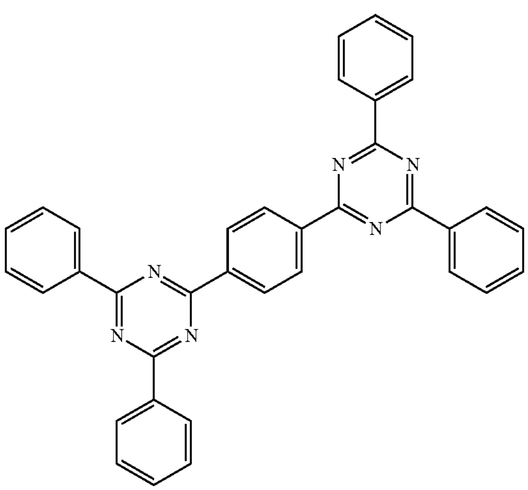
H2-39
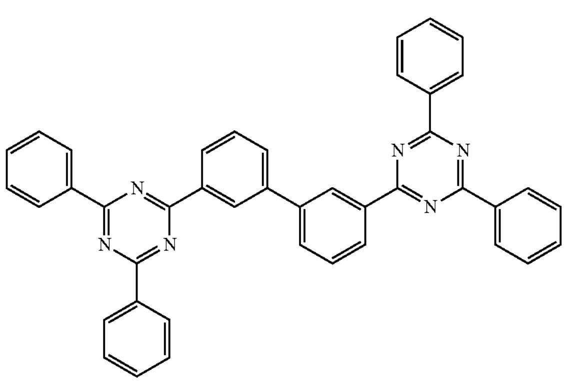
-continued
H2-40
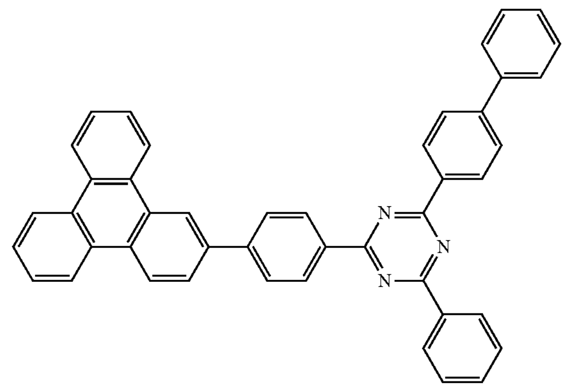
H2-41
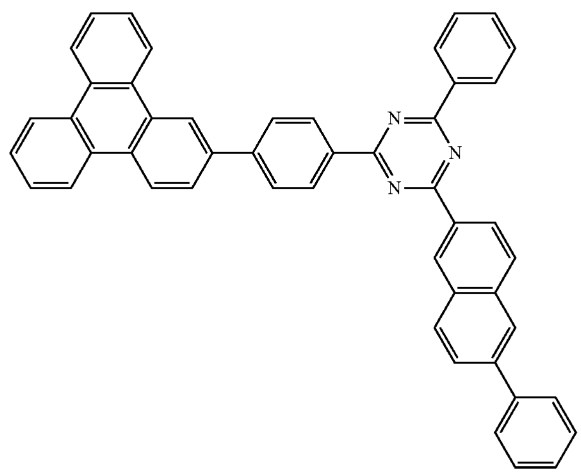
H2-42
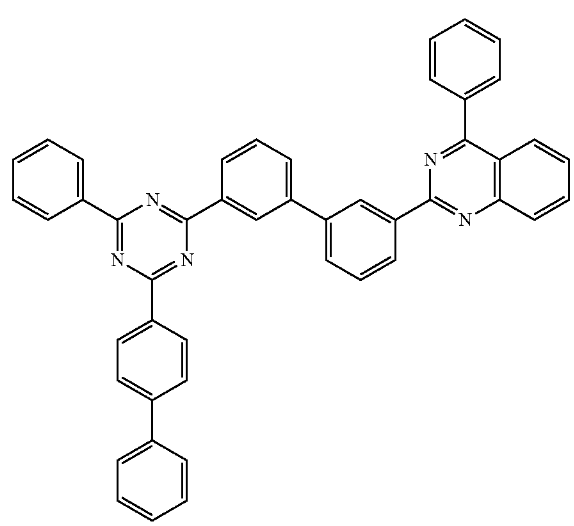

-continued
H2-43
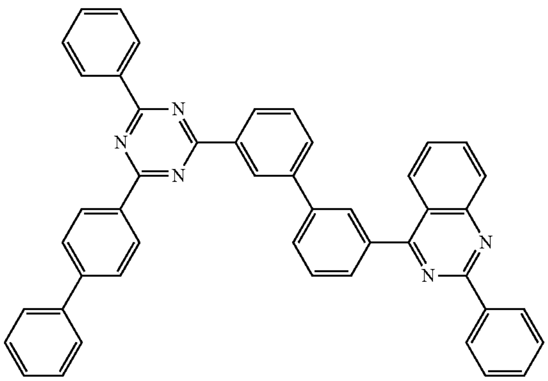
H2-44
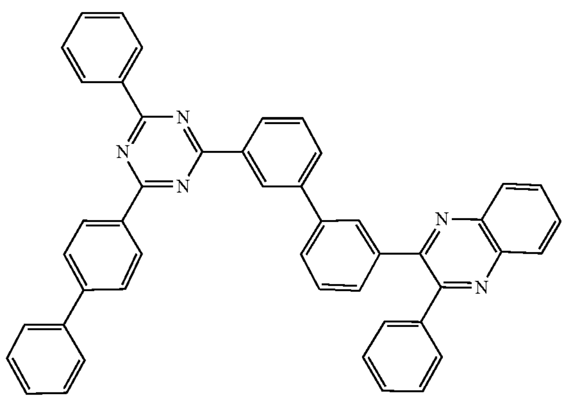
H2-45
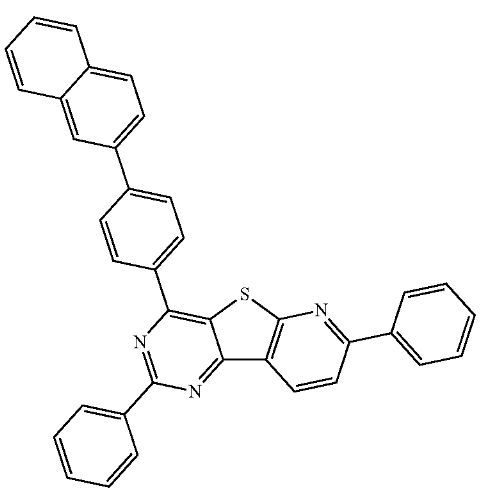
H2-46
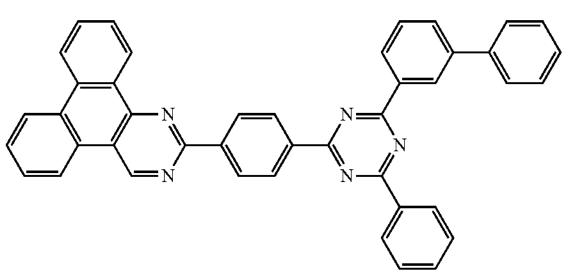
-continued
H2-47
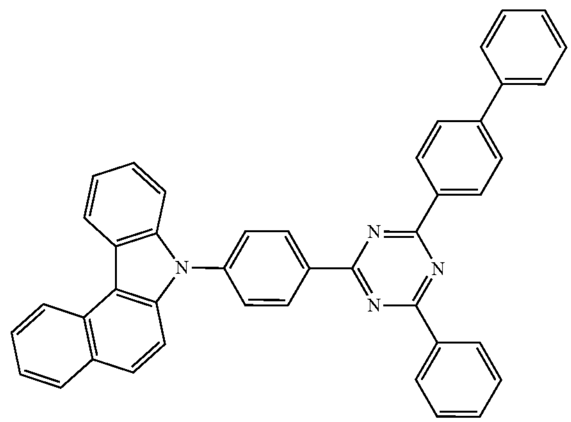
H2-48
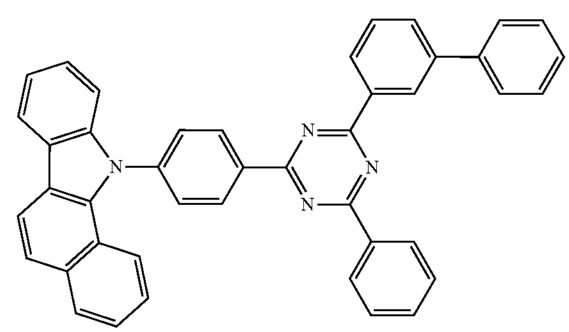
H2-49
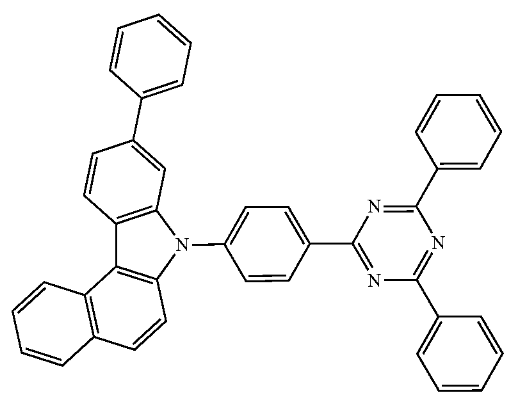
H2-50
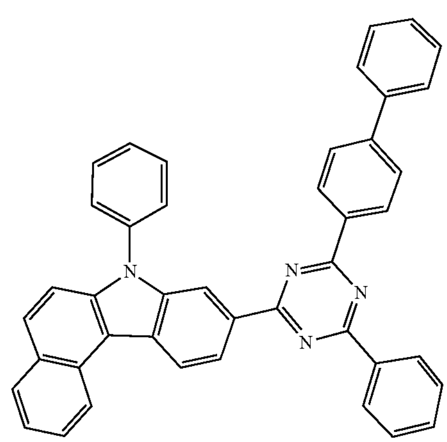

-continued
H2-51
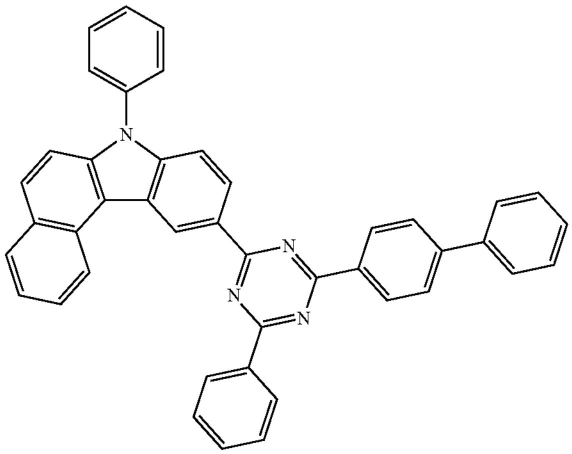
H2-52
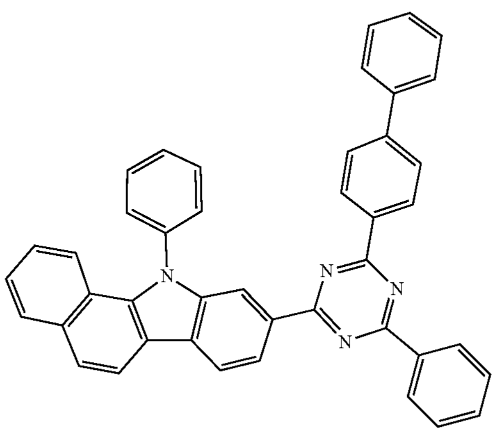
H2-53
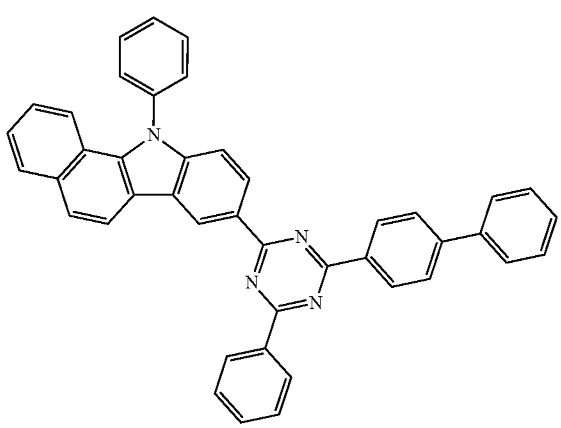
-continued
H2-54
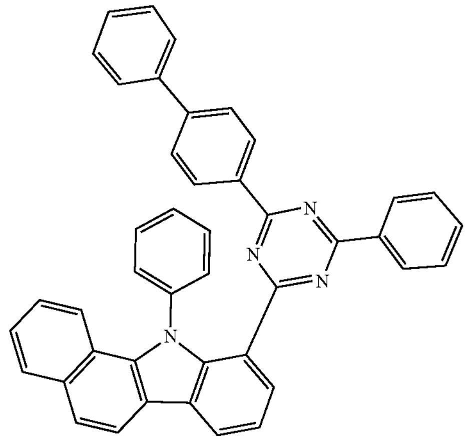
H2-55
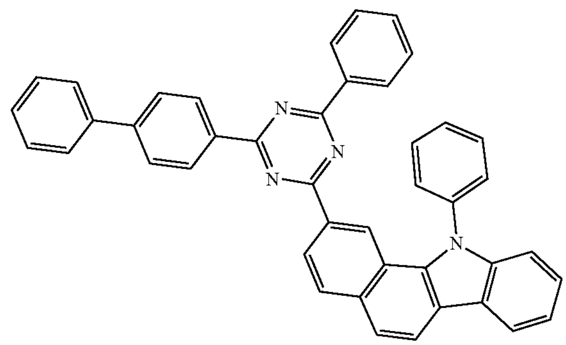
H2-56
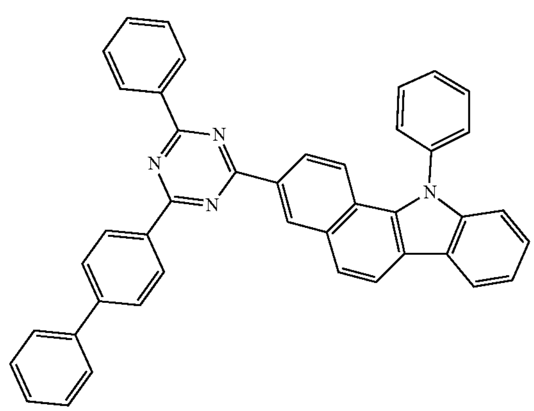

-continued

H2-57

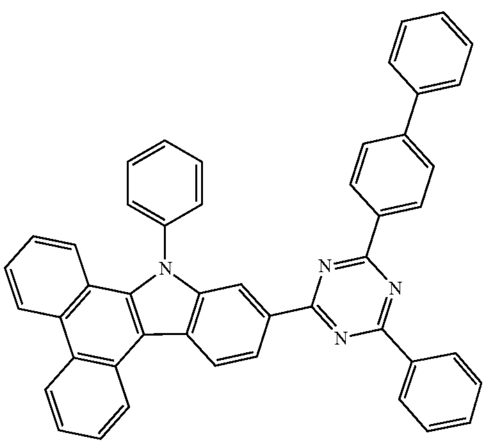

H2-58

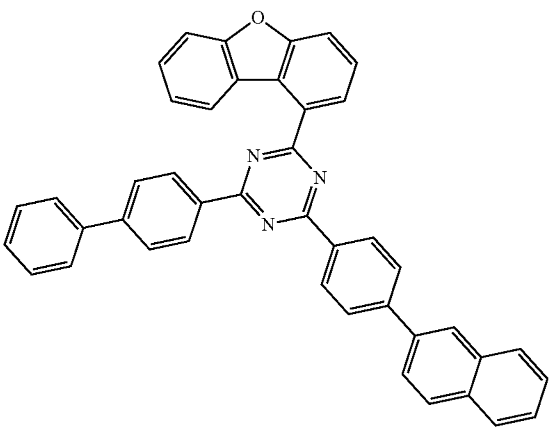

H2-59

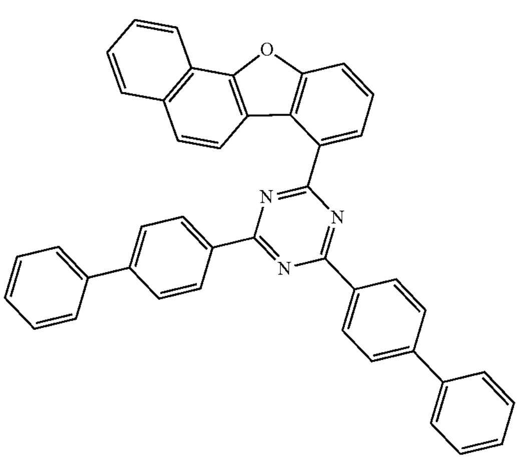

-continued

H2-60

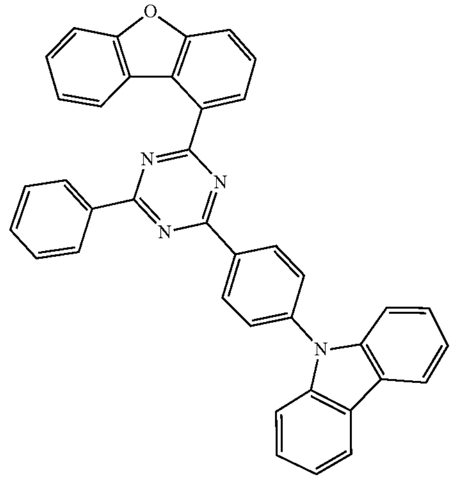

H2-61

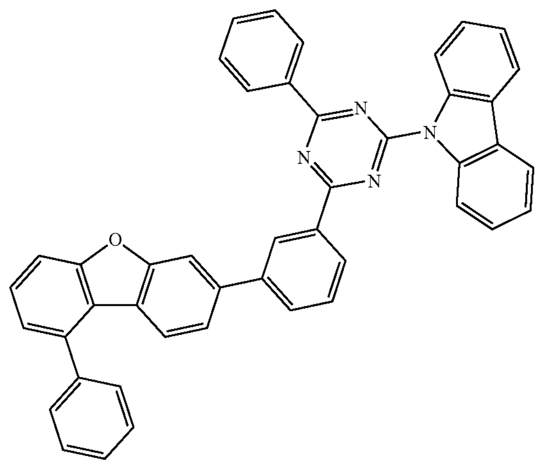

In one or more embodiments, the highest occupied molecular orbital (HOMO) energy level of the second compound may be −5.5 eV or more.

In one or more embodiments, the lowest unoccupied molecular orbital (LUMO) energy level of the third compound may be −2.8 eV or less.

An electronic device, for example, an organic light-emitting device, including the second compound and the third compound may have high external quantum efficiency (EQE) and long lifespan.

In Formulae 1 to 3, 1) two or more of $R_1$ to $R_8$ and $A_{20}$ may be optionally linked to each other to form a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$, 2) two or more of $A_1$ to $A_7$ may be optionally linked to each other to form a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$ and 3) two or more of ring $CY_2$, ring $CY_3$, $R_{20}$ and $R_{30}$ may be optionally linked to each other to form a $C_5$-$C_{60}$ carbocyclic group which is unsubstituted or substituted with at least one $R_{1a}$ or a $C_1$-$C_{60}$ heterocyclic group which is unsubstituted or substituted with at least one $R_{1a}$. Herein, $R_{1a}$ may be understood by referring to the description of $A_7$.

The term "$C_5$-$C_{60}$ carbocyclic group" as used herein refers to a saturated or unsaturated cyclic group having, as a ring-forming atom, 5 to 60 carbon atoms only. The $C_5$-$C_{60}$ carbocyclic group may be a monocyclic group or a polycyclic group.

The term "a $C_5$-$C_{60}$ carbocyclic group (which is unsubstituted or substituted with at least one $R_{1a}$)" may include, for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, cyclopentadiene group, a fluorene group, and a 1,2,3,4-tetrahydronaphthalene group each being unsubstituted or substituted with at least one $R_{1a}$.

The term "$C_1$-$C_{60}$ heterocyclic group" as used herein refers to a saturated or unsaturated cyclic group having, as a ring-forming atom, at least one heteroatom of N, O, Si, P, Se, Si, B, Ge, or S other than 1 to 60 carbon atoms. The $C_1$-$C_{60}$ heterocyclic group may be a monocyclic group or a polycyclic group.

The term "a $C_1$-$C_{60}$ heterocyclic group (which is unsubstituted or substituted with at least one $R_{1a}$)" may include a thiophene group, a furan group, a pyrrole group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each being unsubstituted or substituted with at least one $R_{1a}$.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" used herein refers to a divalent group having the same structure as that of the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. For example, Formula 9-33 may be a branched $C_6$ alkyl group, and may be a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group. Examples of the $C_1$-$C_{60}$ alkoxy group, the $C_1$-$C_{20}$ alkoxy group, or the $C_1$-$C_{10}$ alkoxy group are a methoxy group, an ethoxy group, a propoxy group, a butoxy group, or a pentoxy group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as that of the $C_3$-$C_{10}$ cycloalkyl group.

Examples of the $C_3$-$C_{10}$ cycloalkyl group are a cyclopropyl group, a cyclobutyl group, a cyclopentyl group, a cyclohexyl group, a cycloheptyl group, a cyclooctyl group, an adamantyl group, a bicyclo[1.1.1]pentyl group (bicyclo[1.1.1]pentyl), a bicyclo[2.1.1]hexyl group (bicyclo[2.1.1]hexyl), a bicyclo[2.2.1]heptyl group (bicyclo[2.2.1]heptyl)(a norbornyl group), and a bicyclo[2.2.2]octyl group.

The term "$C_2$-$C_{10}$ heterocycloalkyl group" as used herein refers to a monovalent saturated monocyclic group having at least one heteroatom of N, O, P, Se, Si, B, Ge, or S as a ring-forming atom and 2 to 10 carbon atoms, and non-limiting examples thereof include a tetrahydrofuranyl group, and a tetrahydrothiophenyl group. The term "$C_2$-$C_{10}$ heterocycloalkylene group" as used herein refers to a divalent group having the same structure as the $C_2$-$C_{10}$ heterocycloalkyl group. Examples of the $C_2$-$C_{10}$ heterocycloalkyl group are a silolanyl group, a silinanyl group, a tetrahydrofuranyl group, a tetrahydro-2H-pyranyl group, and a tetrahydrothiophenyl group.

The term "deuterium-containing $C_1$-$C_{60}$ alkyl group (or, deuterium-containing $C_1$-$C_{20}$ alkyl group, a deuterium-containing $C_2$-$C_{20}$ alkyl group, or the like)" as used herein refers to a $C_1$-$C_{60}$ alkyl group substituted with at least one deuterium (or a $C_1$-$C_{20}$ alkyl group substituted with at least one deuterium, a $C_2$-$C_{20}$ alkyl substituted with at least one deuterium, or the like). For example, the term "the deuterium-containing $C_1$ alkyl group (that is, a deuterium-containing methyl group)" as used herein includes —$CD_3$, —$CD_2H$, and -$CDH_2$.

The term "deuterium-containing $C_3$-$C_{10}$ cycloalkyl group" as used herein refers to a $C_3$-$C_{10}$ cycloalkyl group substituted with at least one deuterium. Examples of the "deuterium-containing $C_3$-$C_{10}$ cycloalkyl group" are provided in connection with, for example, Formula 10-501.

The terms "fluorinated $C_1$-$C_{60}$ alkyl group (or a fluorinated $C_1$-$C_{20}$ alkyl group, or the like)", "fluorinated $C_3$-$C_{10}$ cycloalkyl group", "fluorinated $C_2$-$C_{10}$ heterocycloalkyl group" or "fluorinated phenyl group" as used herein refer to a $C_1$-$C_{60}$ alkyl group (or, $C_1$-$C_{20}$ alkyl group, or the like) substituted with at least one a fluoro group (—F), a $C_3$-$C_{10}$ cycloalkyl group substituted with at least one a fluoro group (—F), a $C_2$-$C_{10}$ heterocycloalkyl group substituted with at least one a fluoro group (—F), and a phenyl group substituted with at least one a fluoro group (—F), respectively. For example, the term "the fluorinated $C_1$ alkyl group (that is, the fluorinated methyl group)" includes —$CF_3$, —$CF_2H$, and —$CFH_2$. The "fluorinated $C_1$-$C_{60}$ alkyl group (or the fluorinated $C_1$-$C_{20}$ alkyl group, or the like)", "the fluorinated $C_3$-$C_{10}$ cycloalkyl group", or "the fluorinated $C_2$-$C_{10}$ heterocycloalkyl group" may be i) a fully fluorinated $C_1$-$C_{60}$ alkyl group (or, fully fluorinated $C_1$-$C_{20}$ alkyl group, or the like), a fully fluorinated $C_3$-$C_{10}$ cycloalkyl group, or a fully fluorinated $C_2$-$C_{10}$ heterocycloalkyl group, each group in which all hydrogen are substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, or a partially fluorinated $C_2$-$C_{10}$ heterocycloalkyl group, each group in which some hydrogen are substituted with a fluoro group.

The term "($C_1$-$C_{20}$ alkyl)'X' group" as used herein refers to a 'X' group substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group and the term "($C_1$-$C_{20}$ alkyl)phenyl group" as used herein refers to a phenyl group substituted with at least one $C_1$-$C_{20}$ alkyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" respectively refer to a heterocyclic group having the same backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, and a dibenzothiophene 5,5-dioxide group" in which at least one carbon atoms constituting the cyclic groups is substituted with a nitrogen.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" used herein refers to a divalent group having the same structure as that of the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as that of the $C_2$-$C_{60}$ alkynyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom of N, O, P, Si, Se, B, Ge, or S as a ring-forming atom, 2 to 10 carbon atoms, and at least one double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a cyclic aromatic system that has at least one heteroatom of N, O, P, Si, Se, B, Ge, or S as a ring-forming atom, and 1 to 60 carbon atoms. The term "$C_1$-$C_{60}$ heteroarylene group" as used herein refers to a divalent group having a cyclic aromatic system that has at least one heteroatom of N, O, P, Si, Se, B, Ge, or S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom of N, O, P, Si, Se, B, Ge, or S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_1$-$C_{60}$ cyclic group" includes the $C_5$-$C_{60}$ carbocyclic group and the $C_1$-$C_{60}$ heterocyclic group.

A substituent of the substituted $C_5$-$C_{60}$ carbocyclic group, the substituted $C_2$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, in the present specification, $Q_1$ to $Q_9$, $Q_{11}$ to $Q_{19}$, $Q_{21}$ to $Q_{29}$, and $Q_{31}$ to $Q_{39}$ may each independently be $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Accordingly, since the composition including the first compound, the second compound, and the third compound is suitable for use in an organic layer of an organic light-emitting device, for example, for use as a material for an emission layer in the organic layer, another aspect provides an organic light-emitting device including: a first electrode; a second electrode; and an organic layer disposed between the first electrode and the second electrode and including an emission layer, wherein the organic layer includes the composition.

Due to the inclusion of the first compound, the second compound, and the third compound, the organic light-emitting device may have, a low driving voltage, high external quantum efficiency, and a long lifespan.

The composition may be used between a pair of electrodes of an organic light-emitting device. For example, the composition may be included in the emission layer of the organic light-emitting device. At this time, the first compound may act as a dopant, and the second compound and third compound may each act as a host (for example, a co-host). For example, the total amount of the second compound and third compound may be greater than the amount of the first compound. The emission layer may emit red light, for example, red light having a maximum emission wavelength of 550 nm or more (for example, from 550 nm or more and 900 nm or less).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIGURE is a schematic view of an organic light-emitting device 10 according to one embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be of materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 5000C, a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

-continued
m-MTDATA
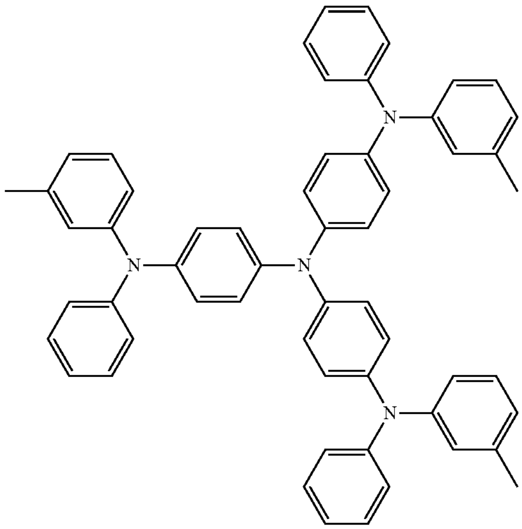
TDATA
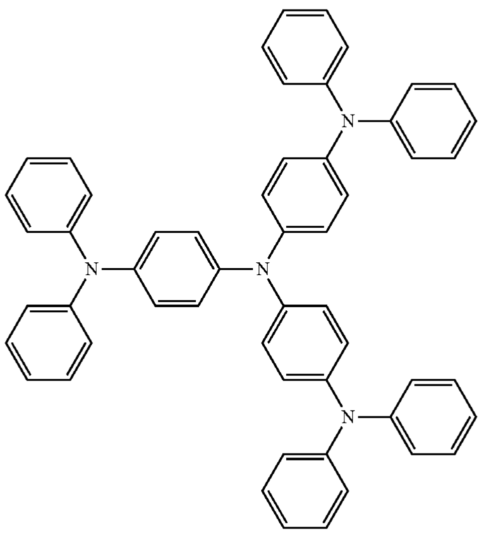
2-TNATA
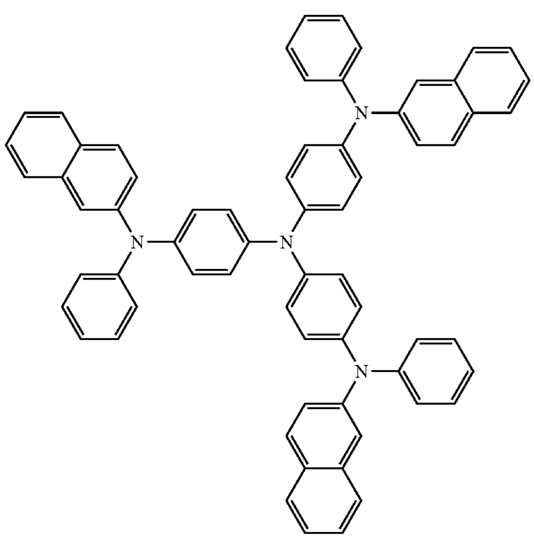
NPB
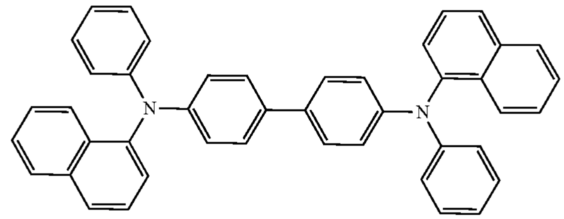
β-NPB
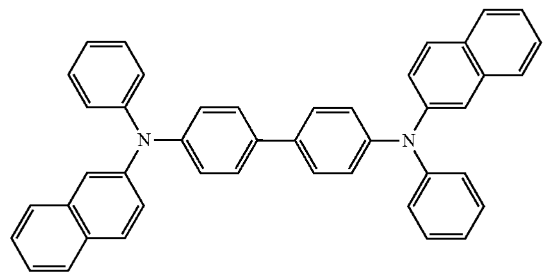
TPD
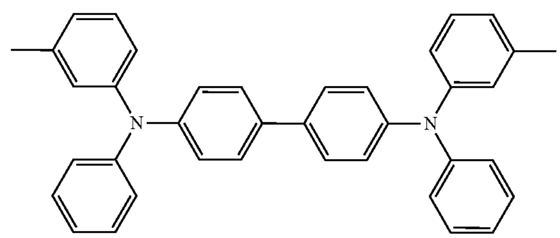
Spiro-TPD
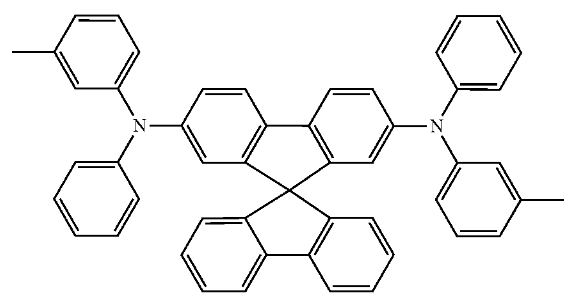
Spiro-NPB
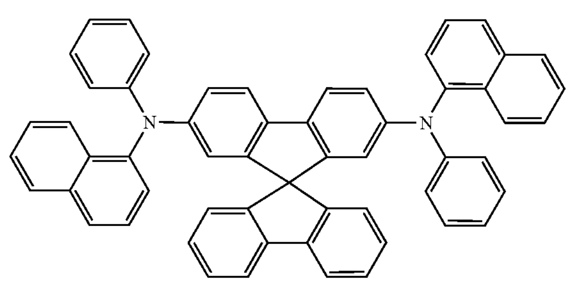

-continued methylated NPB

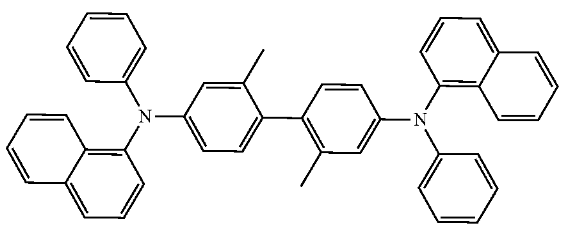

TAPC

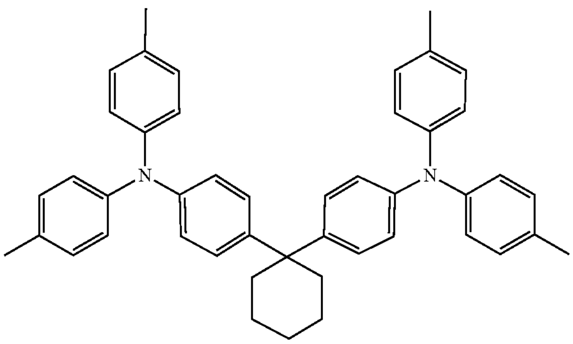

HMTPD

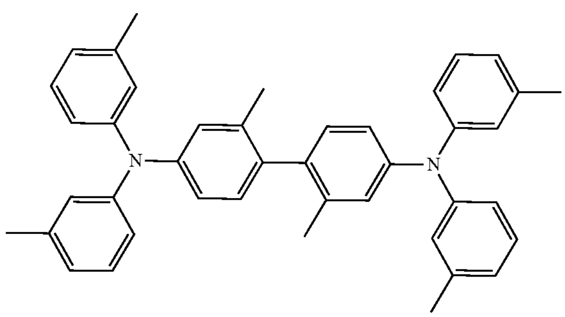

Formula 201

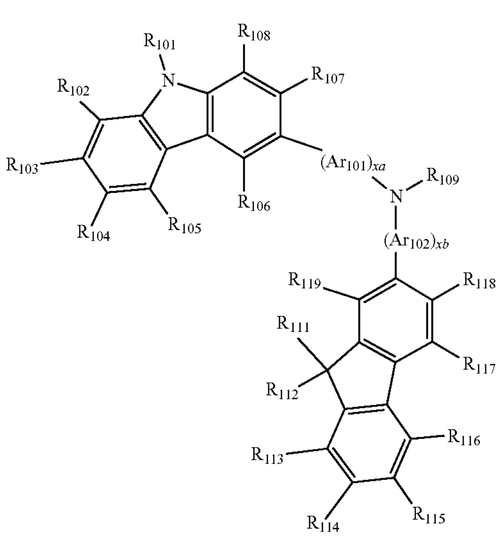

-continued

Formula 202

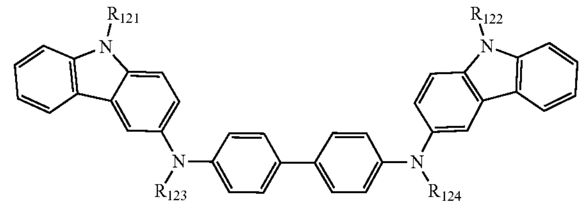

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The designations xa and xb in Formula 201 may each independently be an integer from 0 to 5, or 0, 1 or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, a pentyl group, or a hexyl group), or a $C_1$-$C_{10}$ alkoxy group (for example, a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, or any combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A below:

Formula 201A

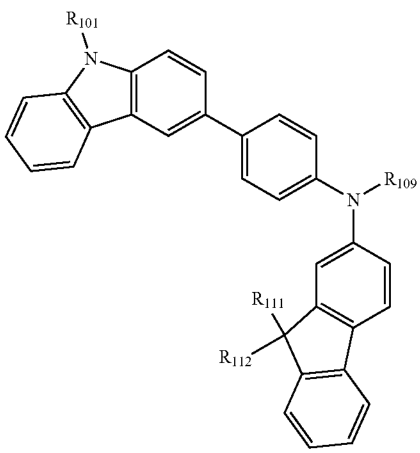

$R_{101}$, $R_{111}$, $R_{112}$, and $R_{109}$ in Formula 201A may be understood by referring to the description provided herein.

For example, the hole transport region may include at least one of compounds HT1 to HT20 illustrated below, but are not limited thereto:

HT1

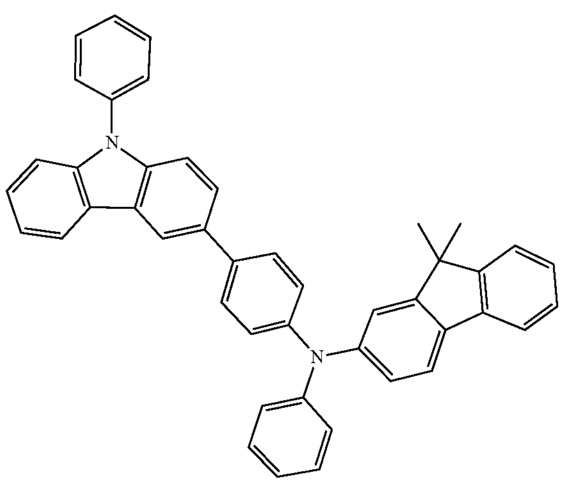

-continued

HT2

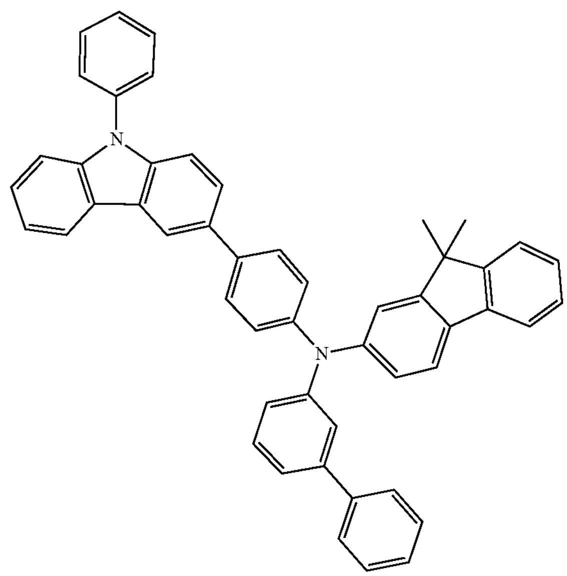

HT3

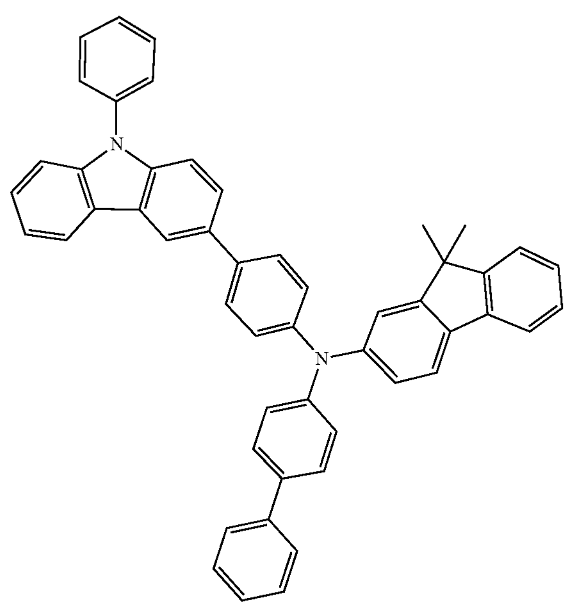

-continued
HT4
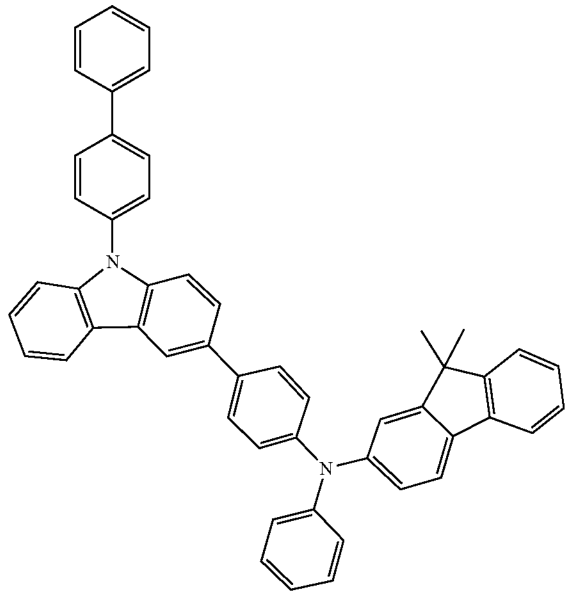
HT5
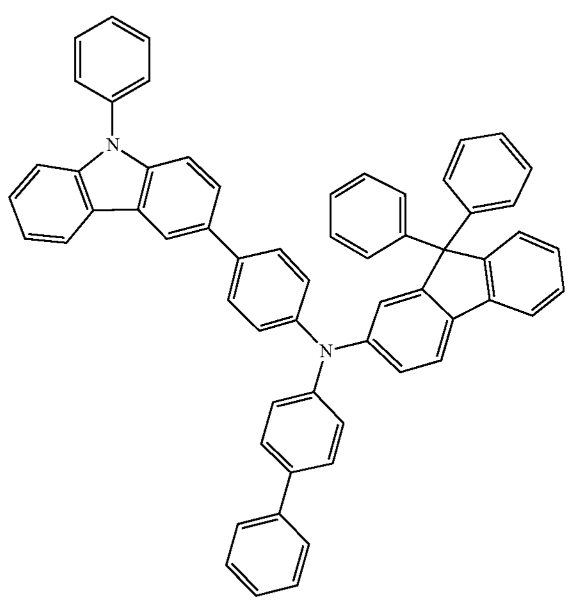
-continued
HT6
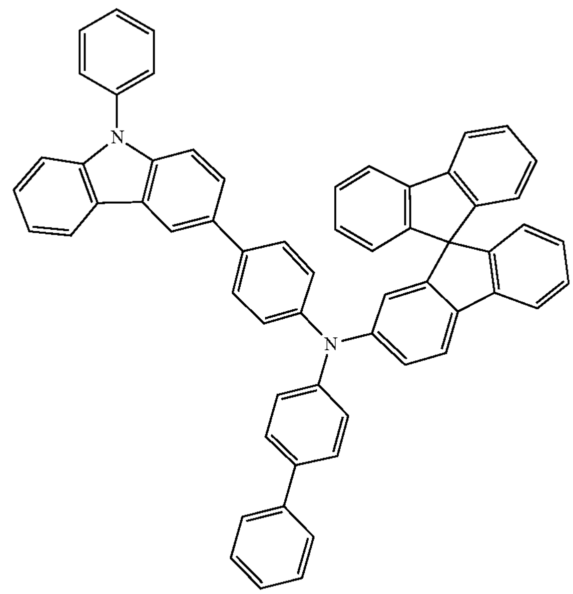
HT7
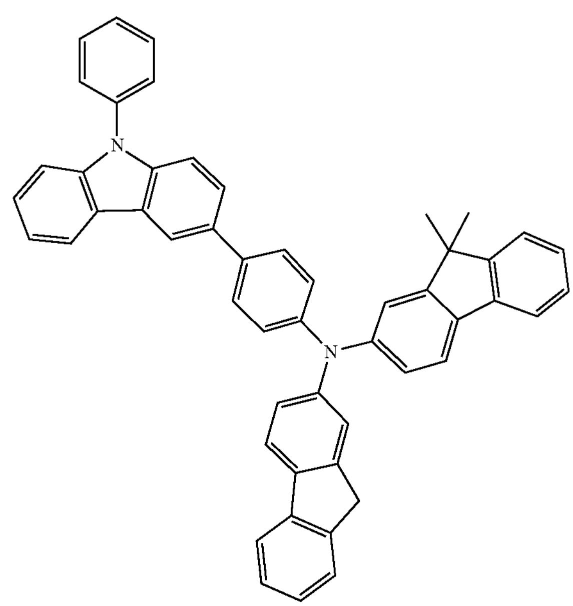

-continued
HT8
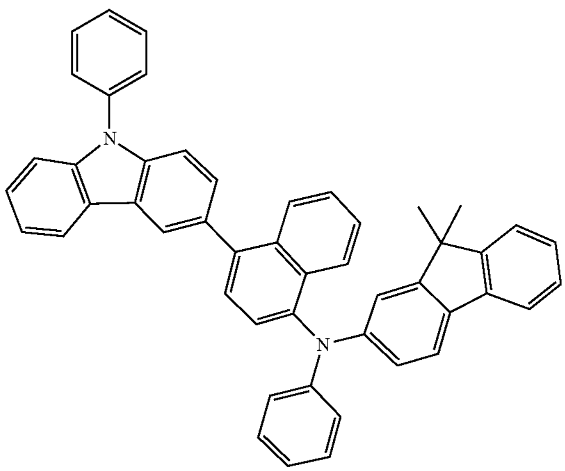
HT9
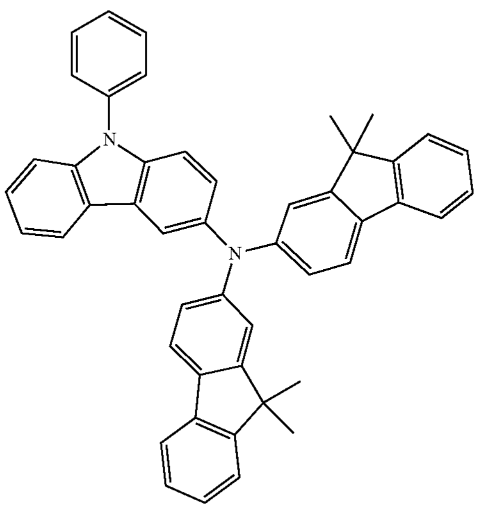
HT10
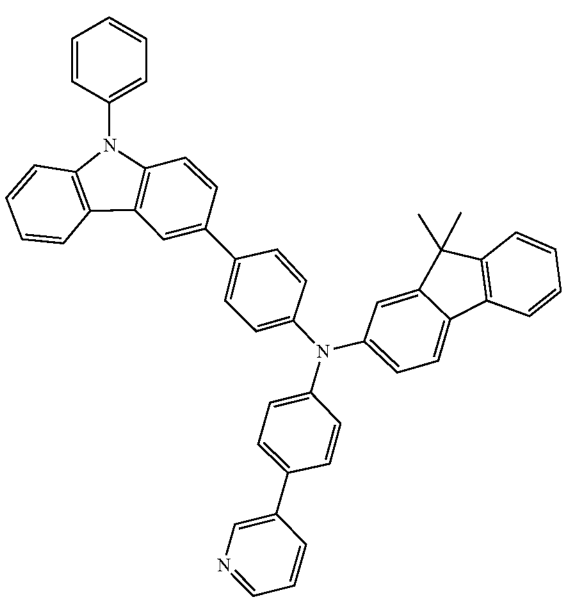
-continued
HT11
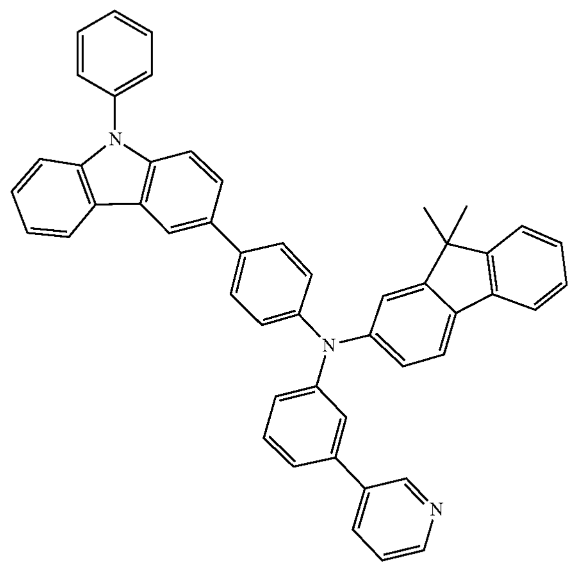
HT12
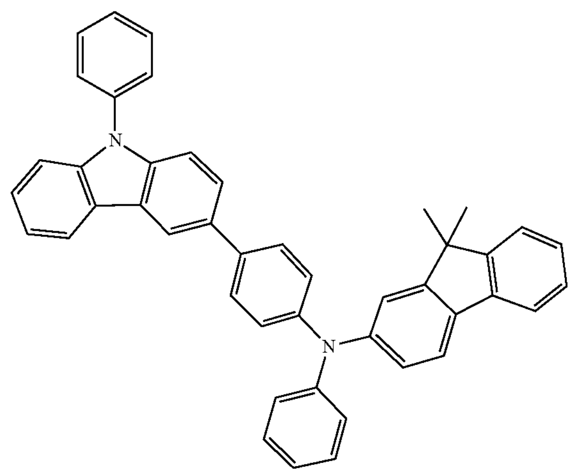
HT13
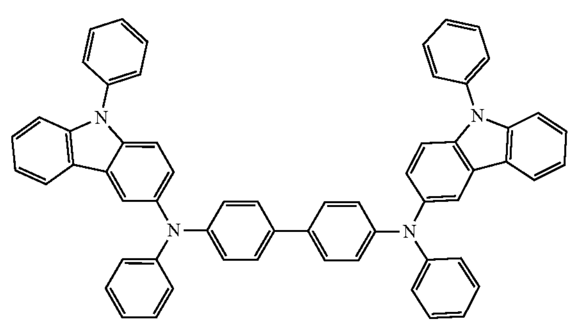

-continued

HT14

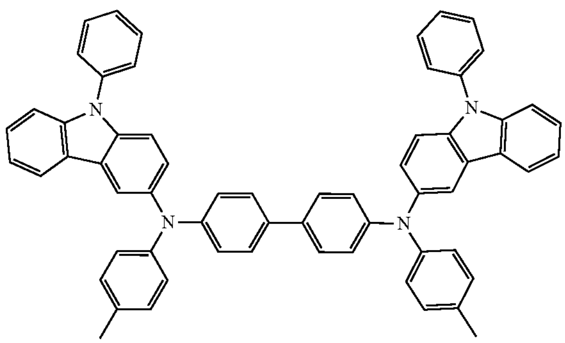

HT15

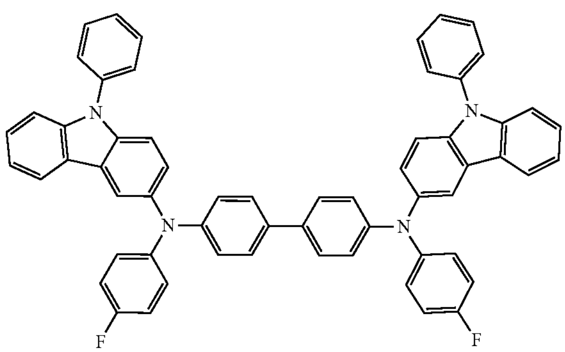

HT16

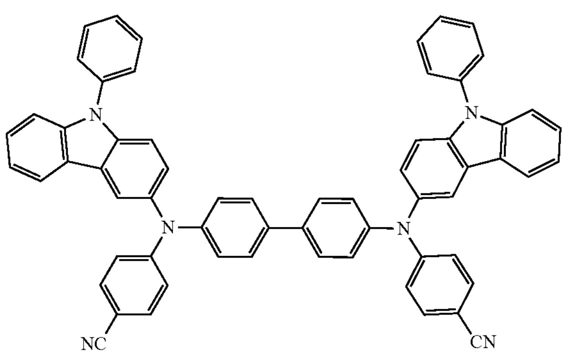

HT17

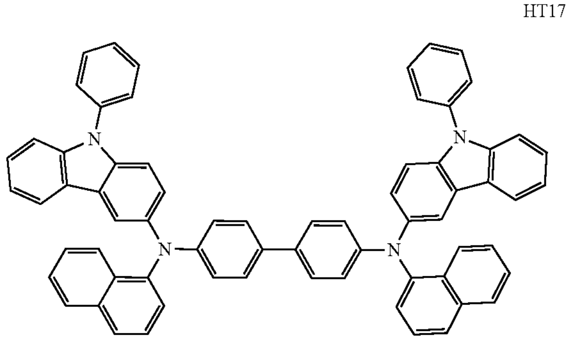

-continued

HT18

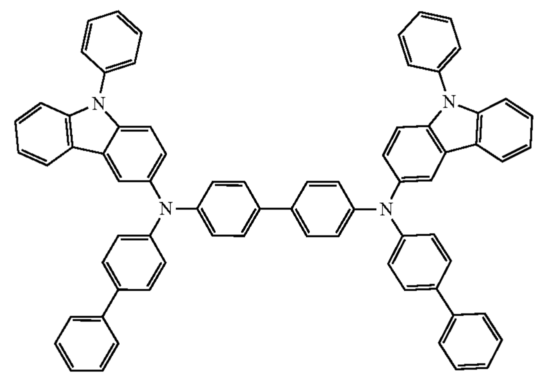

HT19

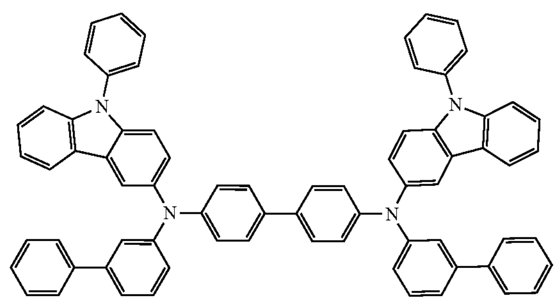

HT20

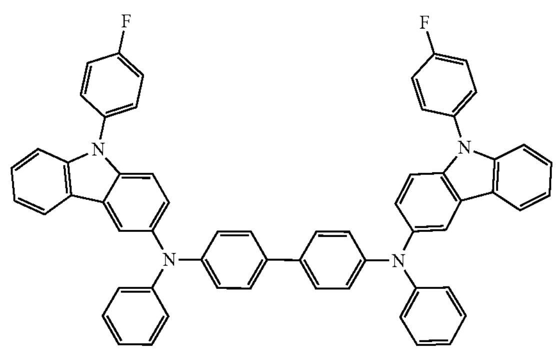

The thickness of the hole transport region may be in a range of about 100 Å to about 10,000 Å, for example, about 100 Å to about 1,000 Å. When the hole transport region includes a hole injection layer, a hole transport layer, or any combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof, but embodiments of the present disclosure are not limited thereto. Examples of the p-dopant are a quinone derivative, such as tetracyanoquinodimethane (TCNQ), 2,3,5,6-tetrafluoro-tetracyano-1,4-benzoquinone dimethane (F4-TCNQ), or F6-TCNNQ; a metal oxide, such as a tungsten oxide or a molybdenum oxide; a cyano group-containing compound, such as Compound HT-D1 below; or any combination thereof.

HT-D1

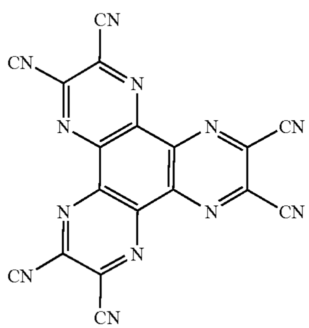

F4-TCNQ

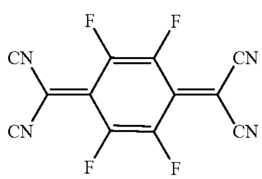

F6-TCNNQ

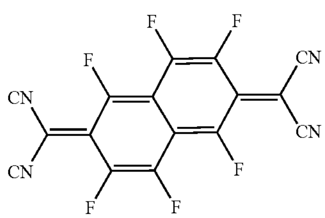

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may be a material for the hole transport region described above, a material for a host to be explained later, or any combination thereof. For example, when the hole transport region includes an electron blocking layer, a material for the electron blocking layer may be mCP.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include the composition including the first compound through the third compound as described herein.

In one or more embodiments, the emission layer may include a host and a dopant, the dopant may include the first compound, and the host may include the second compound and the third compound.

The weight ratio of the second compound to the third compound may be from 1:9 to 9:1, from 2:8 to 8:2, from 3:7 to 7:3, or from 4:6 to from 6:4. In one or more embodiments, the weight ratio of the second compound and the third compound may be 5:5, but embodiments are not limited.

Meanwhile, the emission layer may further include any dopant and/or host in addition to the composition described herein.

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq.

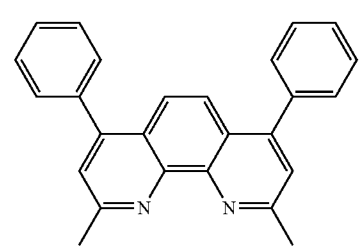

BCP

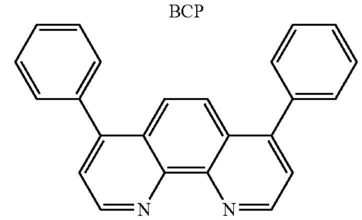

Bphen

The thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may include BCP, Bphen, TPBi, $Alq_3$, Balq, TAZ, NTAZ, or any combination thereof.

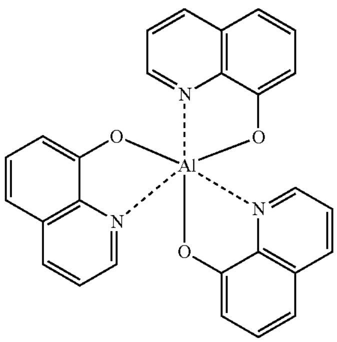

$Alq_3$

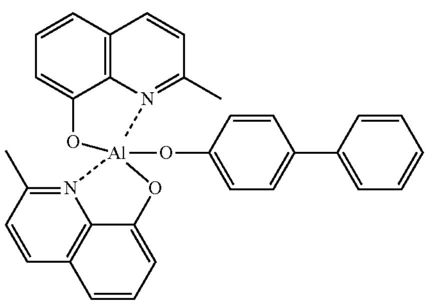

BAlq

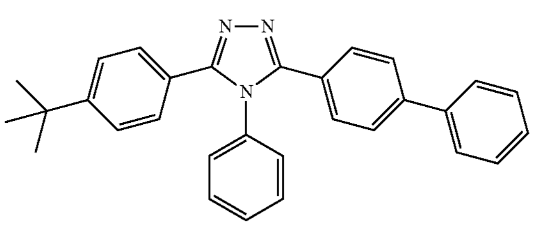

TAZ

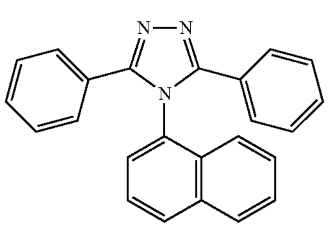

NTAZ

In one or more embodiments, the electron transport layer may include at least one of ET1 to ET25:

ET1

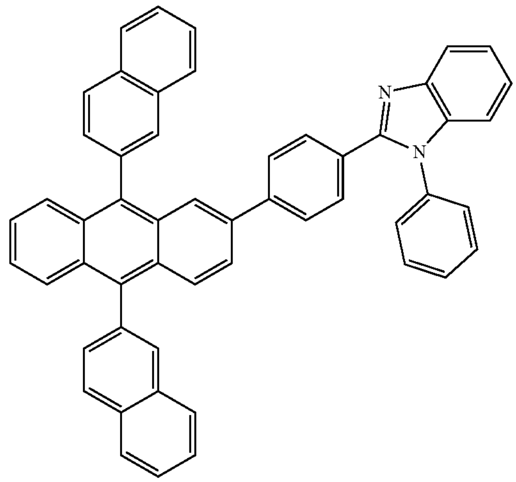

ET2

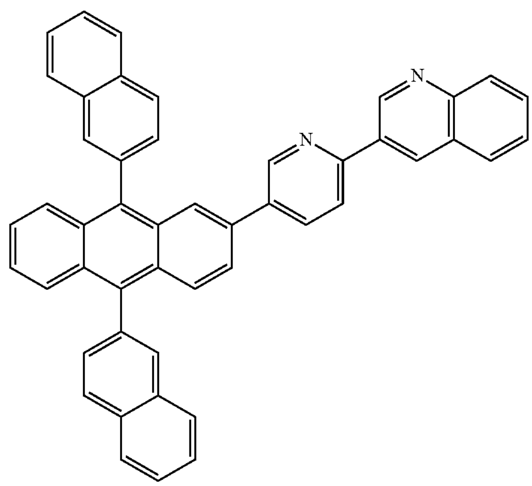

ET3

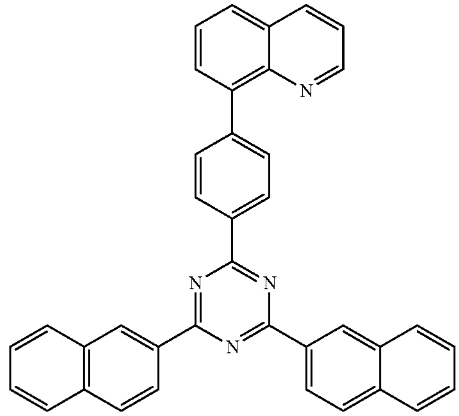

-continued
ET4
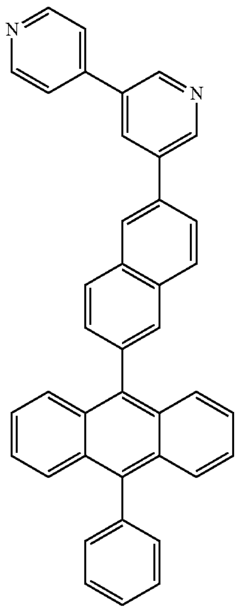
ET5
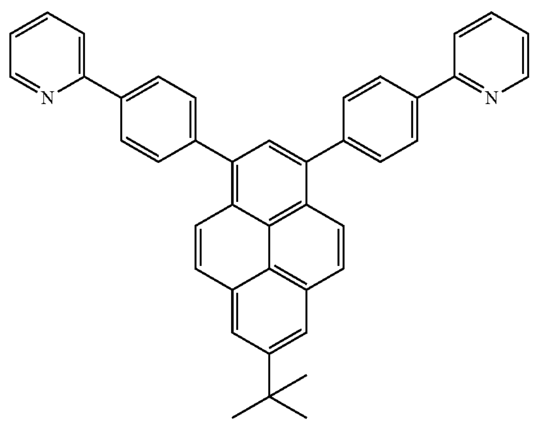
ET6
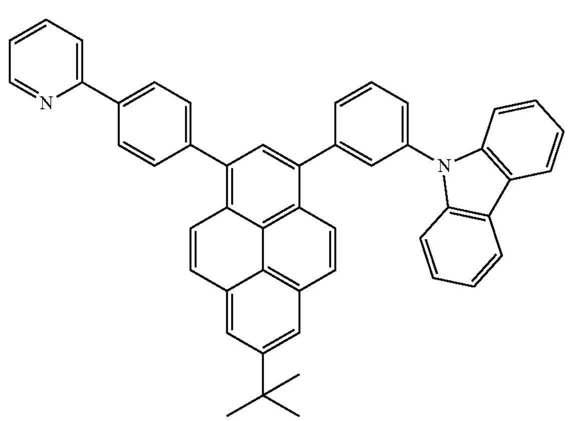
-continued
ET7
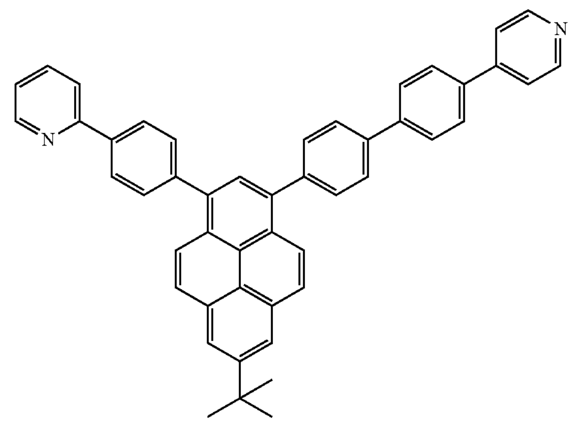
ET8
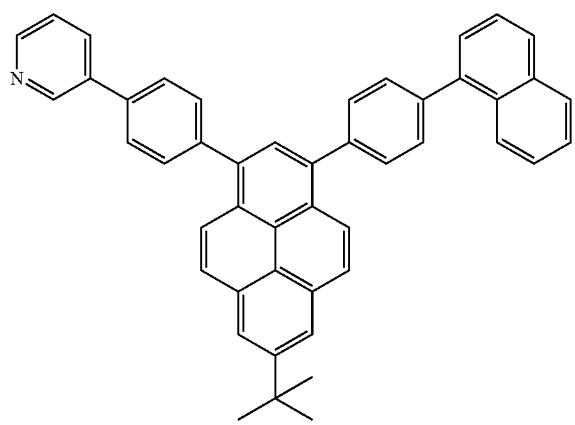
ET9
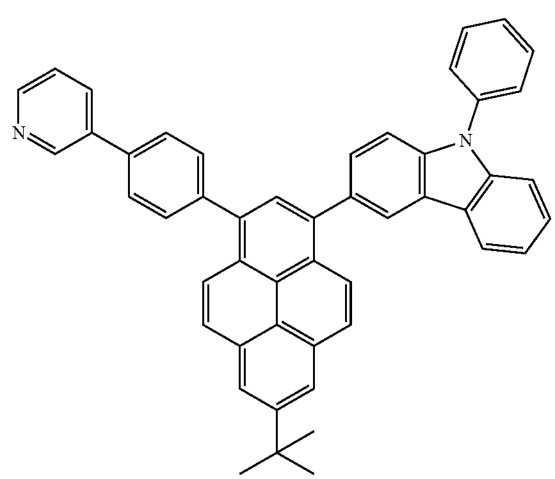

-continued
ET10
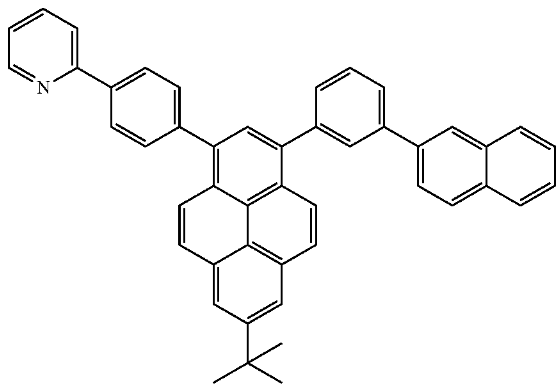
ET11
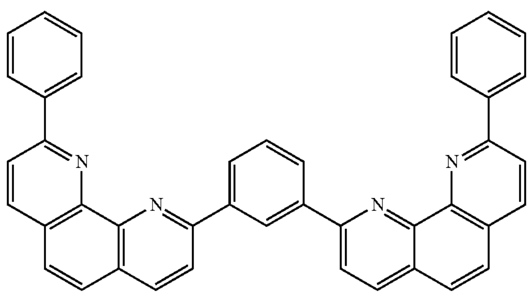
ET12
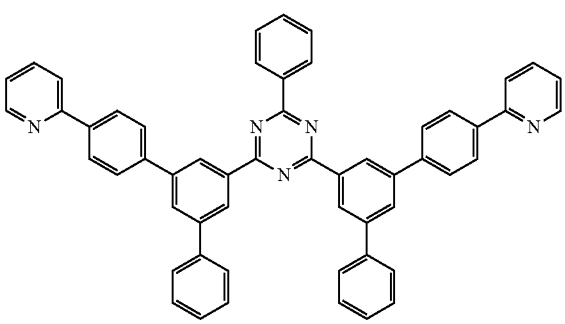
ET13
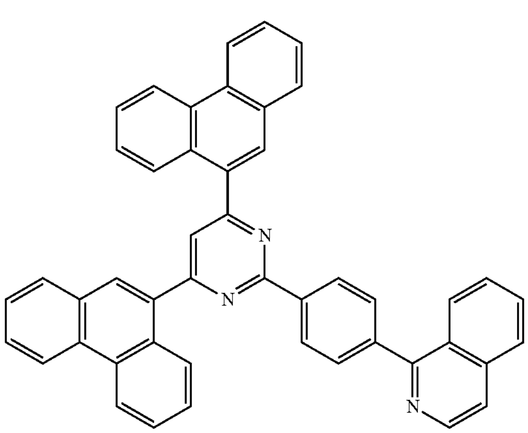
-continued
ET14
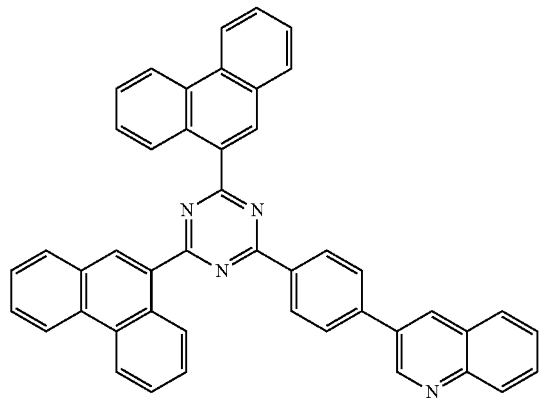
ET15
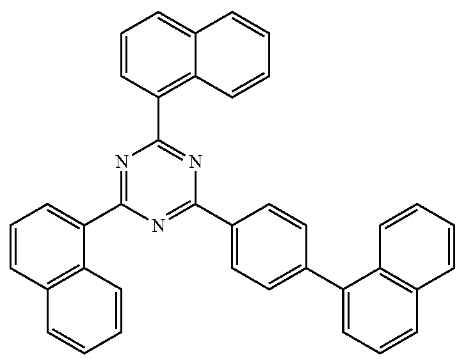
ET16
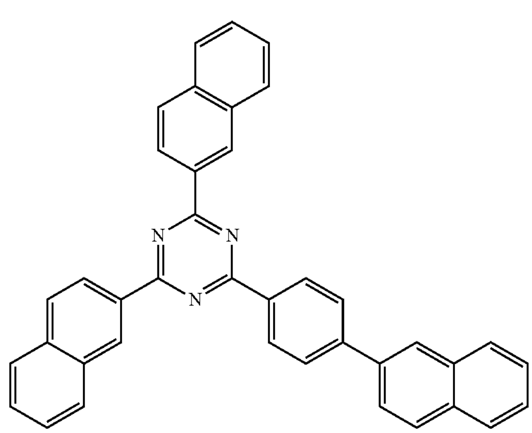

ET17
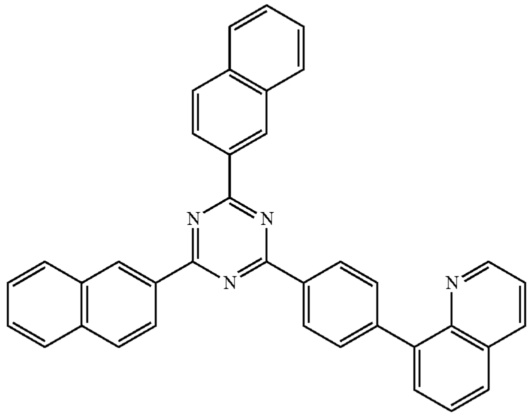
ET18
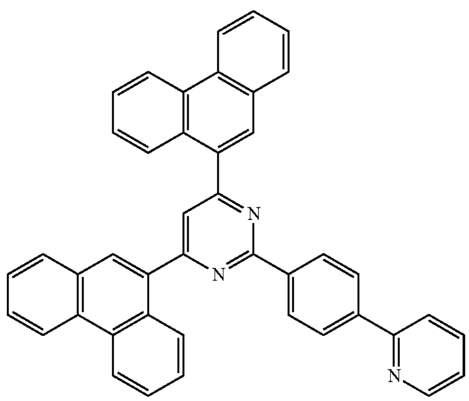
ET19
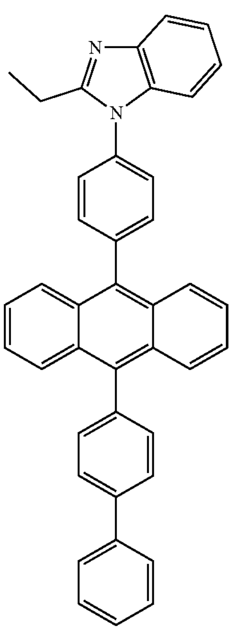
ET20
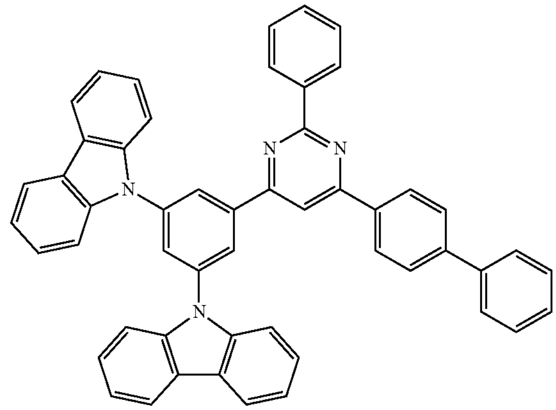
ET21
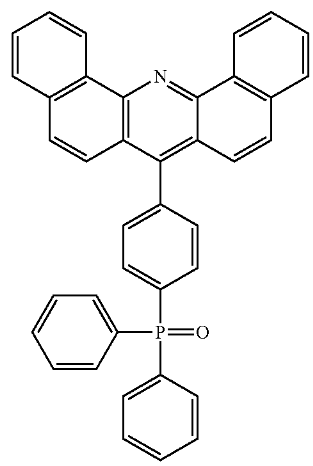
ET22
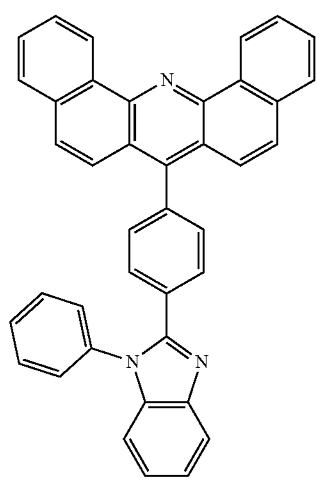

-continued

ET23

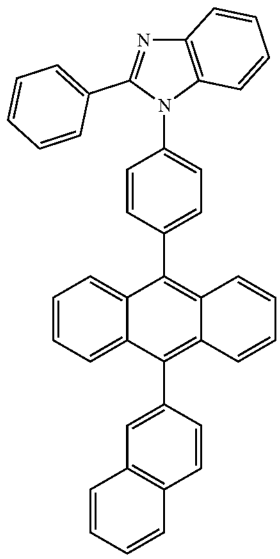

ET24

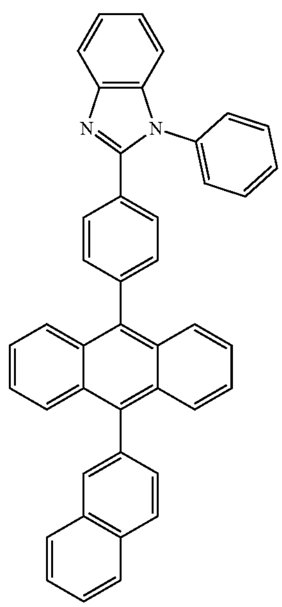

ET25

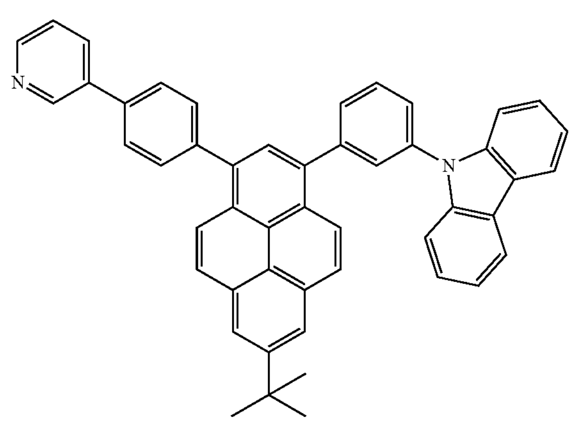

The thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1, ET-D2, or a combination thereof.

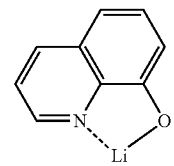

ET-D1

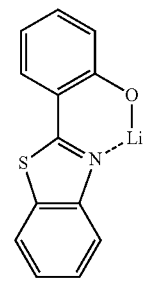

ET-D2

The electron transport region may include an electron injection layer (EIL) that promotes flow of electrons from the second electrode 19 thereinto.

The electron injection layer may include LiF, NaCl, CsF, $Li_2O$, BaO, or any combination thereof.

The thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 is located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 3)

formed thereon to obtain an organic layer. The organic layer was dried by using magnesium sulfate, distilled under reduced pressure, and purified by column chromatography to obtain 1.1 g of Intermediate L3-2 (yield of 51%).

LCMS: m/z calcd for $C_{12}H_7ClFNO$ 235.02; Found 236.06.

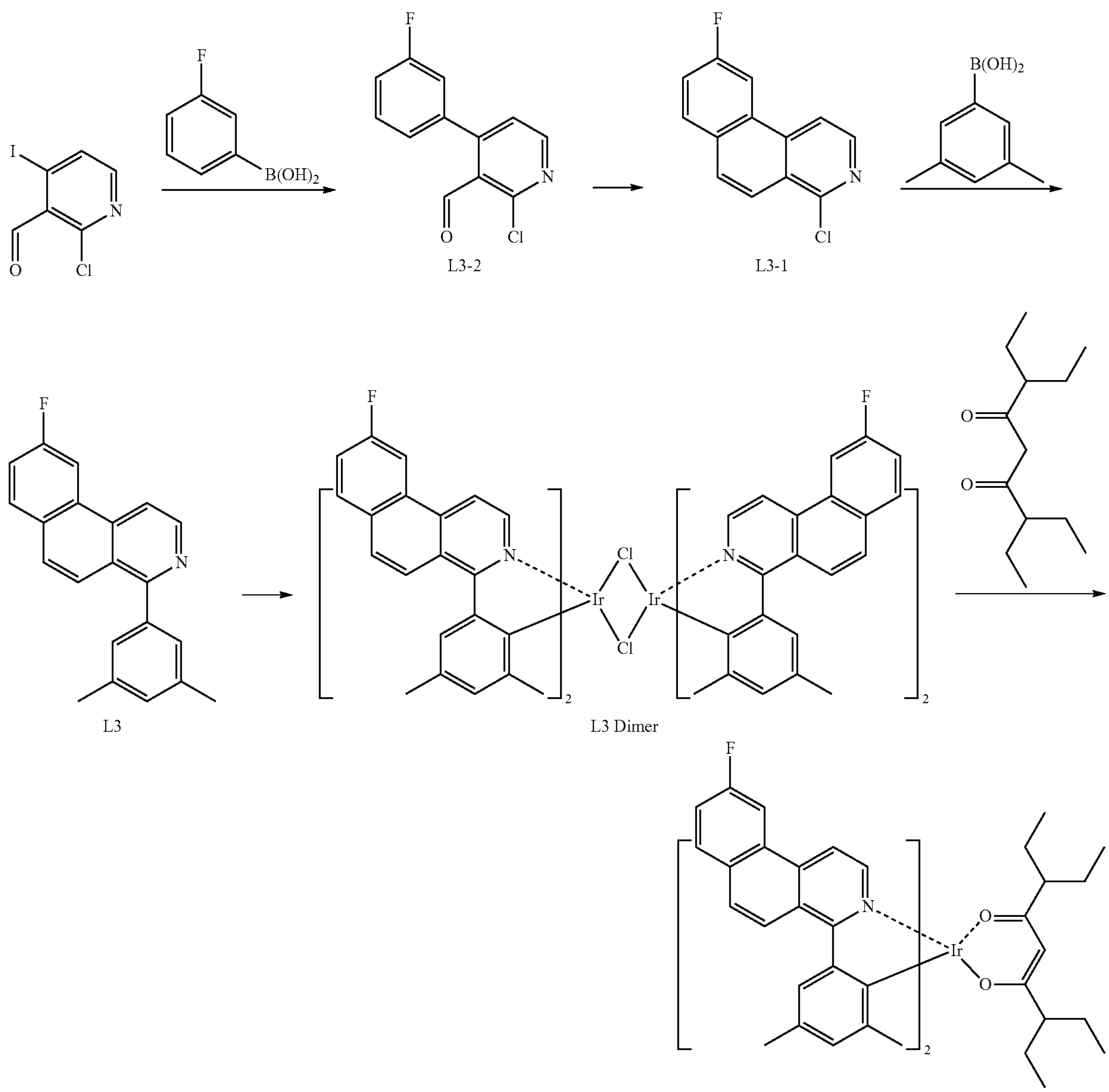

3

Synthesis of Intermediate L3-2

2.5 g (9.3 mmol) of 2-chloro-4-iodo-nicotinaldehyde was mixed with 100 ml of tetrahydrofuran and 30 ml of water, and 0.53 g (0.46 mmol) of $Pd(PPh_3)_4$, 1.3 g (9.3 mmol) of 3-fluorophenylboronic acid, and 3.2 g (23.0 mmol) of $K_2CO_3$ were added to the mixture, followed by heating at a temperature of 80° C. for 24 hours while refluxing. When the reaction was completed, the reaction mixture was concentrated under reduced pressure, dichloromethane and water were added thereto, and an extraction process was per-

Synthesis of Intermediate L3-1

5.8 g (17.0 mmol) of (methoxymethyl)triphenylphosphonium chloride and 1.6 g (6.8 mmol) of Intermediate L3-2 were added to 50 ml of tetrahydrofuran and mixed together, and then, 17 ml of 1.0 M potassium tert-butoxide solution (in THF) was slowly added dropwise thereto at room temperature and mixed for 24 hours. When the reaction was completed, the organic layer, obtained by adding water and ethyl acetate to the reaction mixture and performing an extraction process thereon, was dried by using magnesium sulfate and distilled under reduced pressure. The resulting product was dried under reduced pressure, and then, mixed with 40 ml of dichloromethane, and then, 1.5 ml of methanesulfonic acid was slowly added dropwise thereto at room temperature, followed by stirring at room temperature for about 12 hours. When the reaction was completed, an organic layer, obtained by adding saturated aqueous sodium hydrogen carbonate solution and performing an extraction process thereon, was dried by using magnesium sulfate, distilled under reduced pressure, and purified by column chromatography to obtain 1.1 g of Intermediate L3-1 (yield of 72%).

LCMS: m/z calcd for $C_{12}H_7ClFNO$ 235.02; Found 236.06.

Synthesis of Intermediate L3

0.7 g (3.0 mmol) of Intermediate L3-1 was mixed with 30 ml of THF and 10 ml of water, and 0.5 g (3.6 mmol) of 3,5-dimethylphenylboronic acid, 0.24 g (0.2 mmol) of $Pd(PPh_3)_4$, and 1.0 g (7.5 mmol) of $K_2CO_3$ were added thereto, and the mixture was heated while refluxing for 24 hours. When the reaction was completed, an organic layer, obtained by adding ethyl acetate and water and performing an extraction process thereon, was dried by using magnesium sulfate, distilled under reduced pressure, and purified by column chromatography to obtain 0.72 g of Intermediate L3 (yield 80%).

LCMS: m/z calcd for $C_{21}H_{16}FN$ 301.13; Found 302.05.

Synthesis of Intermediate L3 Dimer 40 mL of ethoxyethanol and 15 mL of distilled water were mixed with 1.05 g (3.4 mmol) of Intermediate L3 and 0.6 g (1.6 mmol) of iridium chloride, and then, the mixture was heated while refluxing for 24 hours. When the reaction was completed, the temperature was lowered to room temperature, and the solid produced therefrom was filtered and washed sufficiently in the order of water/methanol/hexane. The solid obtained was dried in a vacuum oven to obtain 1.0 g of Intermediate L3 Dimer.

Synthesis of Compound 3

1.0 g (0.63 mmol) of Intermediate L3 Dimer, 0.96 g (4.5 mmol) of 3,7-diethylnonane-4,6-dione, and 0.48 g (4.5 mmol) of $Na_2CO_3$ were mixed with 40 mL of ethoxyethanol, and then, the mixture was stirred for 24 hours at a temperature of 90° C. When the reaction was completed, the temperature was lowered to room temperature, and the solid produced therefrom was filtered and purified by liquid chromatography to obtain 0.8 g of Compound 3 (yield of 65%).

LCMS: m/z calcd for $C_{55}H_{53}F_2IrN_2O_2$, 1004.37; Found 1005.25.

Synthesis Example 2 (Compound 9)

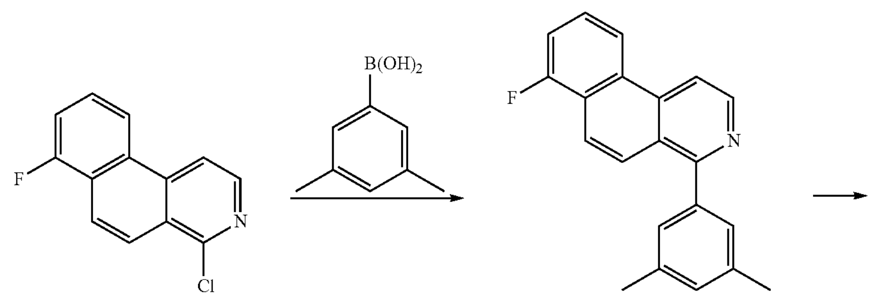

L9-1 L9

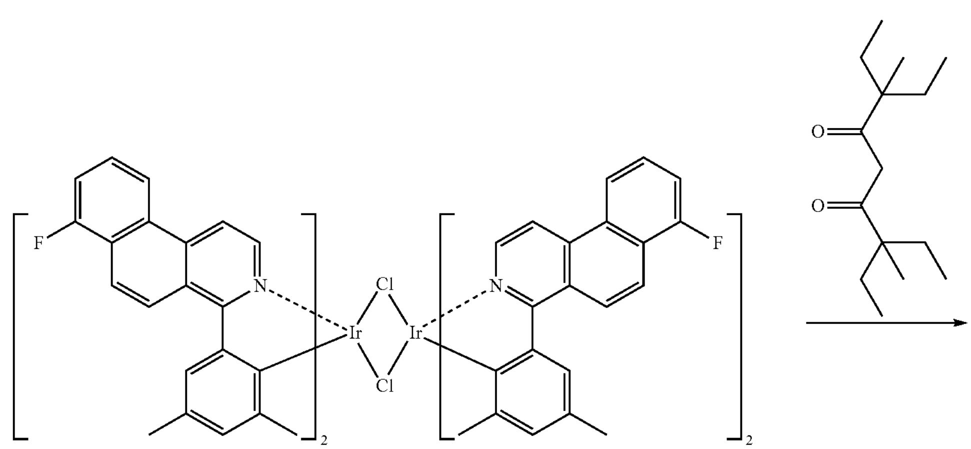

L9 Dimer

-continued

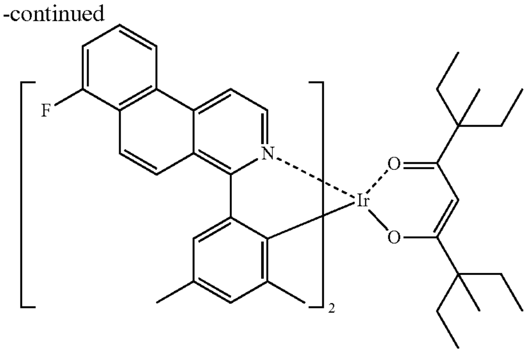

9

Synthesis of Intermediate L9

Intermediate L9 was synthesized in the same manner as used in synthesizing Intermediate L3 in Synthesis Example 1, except that Intermediate L9-1 was used instead of Intermediate L3-1.

LC-MS m/z=303(M+H)$^+$

Synthesis of Intermediate L9 Dimer

Intermediate L9 Dimer was synthesized in the same manner as used in synthesizing Intermediate L3 Dimer in Synthesis Example 1, except that Intermediate L9 was used instead of Intermediate L3.

Synthesis of Compound 9

Compound 9 was synthesized in the same manner as used to synthesize Compound 3 of Synthesis Example 1, except that Intermediate L9 Dimer and 3,7-diethyl-3,7-dimethylnonane-4,6-dione were used instead of Intermediate L3 Dimer and 3,7-diethylnonane-4,6-dione.

LC-MS m/z=1035(M+H)$^+$

Synthesis Example 3 (Compound 10)

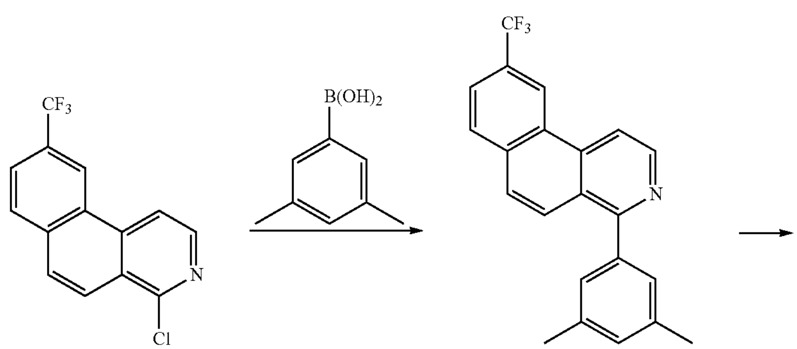

L10-1 L10

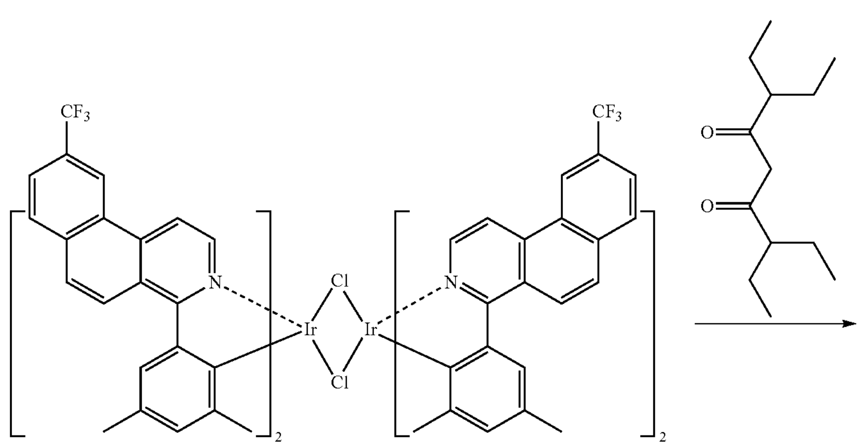

L10 Dimer

-continued

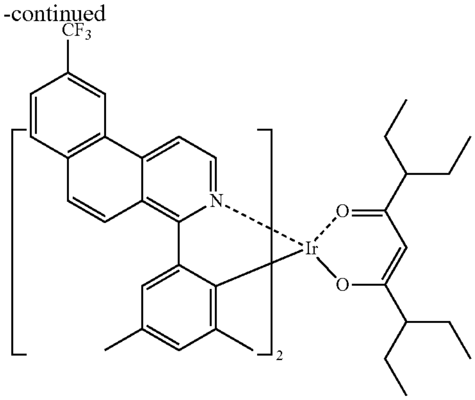

10

Synthesis of Intermediate L10

Intermediate L10 was synthesized in the same manner as used in synthesizing Intermediate L3 in Synthesis Example 1, except that Intermediate L10-1 was used instead of Intermediate L3-1.

LCMS: m/z calcd for $C_{22}H_{16}F_3N$ 351.36; Found 352.21.

Synthesis of Intermediate L10 Dimer

Intermediate L10 Dimer was synthesized in the same manner as used in synthesizing Intermediate L3 Dimer in Synthesis Example 1, except that Intermediate L10 was used instead of Intermediate L3.

Synthesis of Compound 10

Compound 10 was synthesized in the same manner as used to synthesize Compound 3 of Synthesis Example 1, except that Intermediate L10 Dimer was used instead of Intermediate L3 Dimer.

LCMS: m/z calcd for $C_{57}H_{53}F_6IrN_2O_2$ 1104.35; Found 1105.40.

Example 1

A glass substrate with ITO/Ag/ITO deposited thereon as an anode with a thickness of 70/1000/70 Å thereon, which was manufactured by Corning Inc., was cut to a size of 50 mm×50 mm×0.5 mm, and the glass substrate was sonicated by using isopropyl alcohol and pure water for 5 minutes each, and then ultraviolet (UV) light was irradiated for 30 minutes thereto and ozone was exposed thereto for cleaning. Then, the resultant glass substrate was loaded onto a vacuum deposition apparatus.

On the anode, 2-TNATA was vacuum deposited to form a hole injection layer having a thickness of 600 Å, and 4,4'-bis[N-(1-naphthyl)-N-phenylamino] biphenyl (hereinafter referred to as NPB) was vacuum-deposited on the hole injection layer to form a hole transport layer having a thickness of 1350 Å.

Then, a host (the mixture of Compound H1-14 and Compound H2-6 (the weight ratio of 5:5)) and a dopant (Compound 3) were co-deposited on the hole transport layer at a weight ratio of 98:2 to form an emission layer having a thickness of 400 Å.

Then, BCP was vacuum-deposited on the emission layer to form a hole blocking layer having a thickness of 50 Å and then, $Alq_3$ was vacuum-deposited on the hole blocking layer to form an electron transport layer having a thickness of 350 Å, and then, LiF was vacuum-deposited on the electron transport layer to form an electron injection layer having a thickness of 10 Å, and Mg and Ag were co-deposited on the electron injection layer at the weight ratio of 90:10 to form a cathode having a thickness of 120 Å, thereby completing the manufacture of an organic light-emitting device (emission of red light).

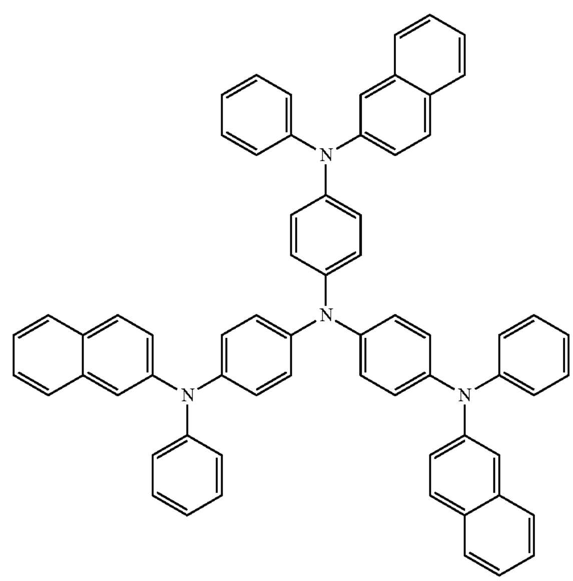

2-TNATA

-continued

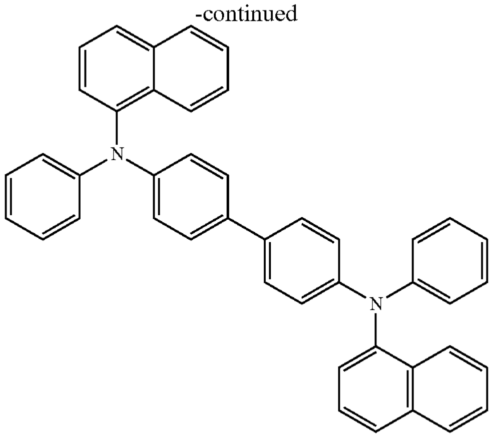

NPB

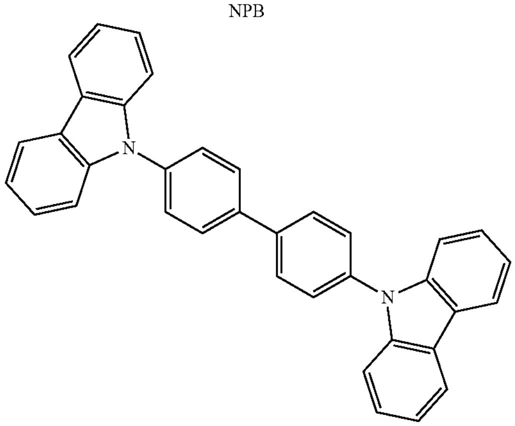

CBP

-continued

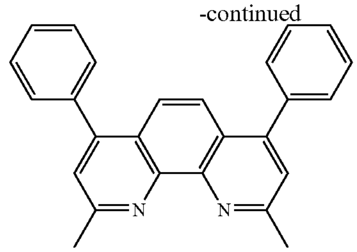

BCP

Examples 2 to 3 and Comparative Example 1

Organic light-emitting devices were manufactured in the same manner as in Example 1, except that in forming an emission layer, for use as a dopant, corresponding compounds shown in Table 1 were used instead of Compound 3.

Evaluation Example 1: Evaluation on characteristics of organic light-emitting device With respect to each of the organic light-emitting devices manufactured according to Examples 1 to 3 and Comparative Example 1, the driving voltage, current density, maximum of external quantum efficiency (Max EQE), FWHM of EL spectrum, emission color, color coordinate, and lifespan ($LT_{97}$) were evaluated. Results thereof are shown in Table 1. This evaluation was performed using a current-voltage meter (Keithley 2400) and a luminescence meter (Minolta Cs-1,000A), and the lifespan ($LT_{97}$)(at 3500 nit) was evaluated by measuring the amount of time that elapsed until luminance was reduced to 97% of the initial brightness of 100%. Lifespan ($LT_{97}$) is expressed as a relative value (%) to the lifespan of Comparative Example 1.

TABLE 1

| | Host compound No. | Dopant compound No. | Driving Voltage Voltage (V) | Current density ($mA/cm^2$) | Max EQE (%) | FWHM (nm) | Emission color | Color coordinates (CIEx) | $LT_{97}$ (Relative value, %) |
|---|---|---|---|---|---|---|---|---|---|
| Example 1 | H1-14 H2-6 Weight ratio of 5:5 | 3 | 3.61 | 11.1 | 31.1 | 46.34 | red | 0.675, 0.324 | 113 |
| Example 2 | H1-14 H2-6 Weight ratio of 5:5 | 9 | 3.6 | 12.1 | 31 | 46.2 | red | 0.678, 0.321 | 125 |
| Example 3 | H1-14 H2-6 Weight ratio of 5:5 | 10 | 4.06 | 12.9 | 30.5 | 47.16 | red | 0.678, 0.321 | 102 |
| Comparative Example 1 | H1-14 H2-6 Weight ratio of 5:5 | A | 4.12 | 15.5 | 28.8 | 47.07 | red | 0.680, 0.318 | 100 |

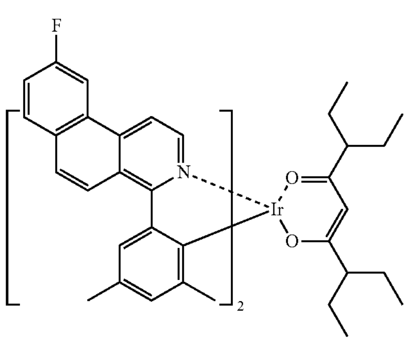

3

TABLE 1-continued
| | Host compound No. | Dopant compound No. | Driving Voltage Voltage (V) | Current density (mA/cm$^2$) | Max EQE (%) | FWHM (nm) | Emission color | Color coordinates (CIEx) | $LT_{97}$ (Relative value, %) |
|---|---|---|---|---|---|---|---|---|---|
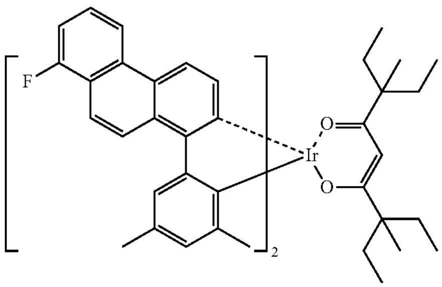
9
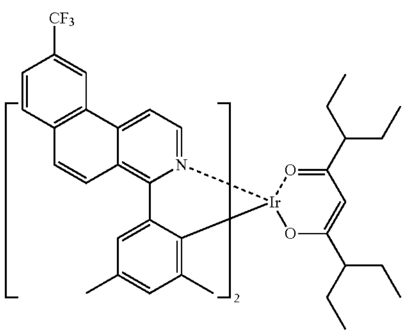
10
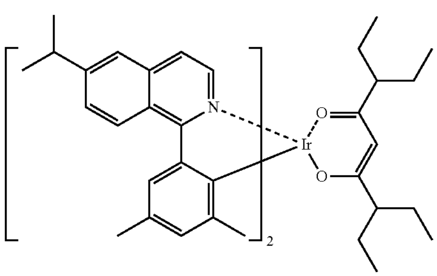
A
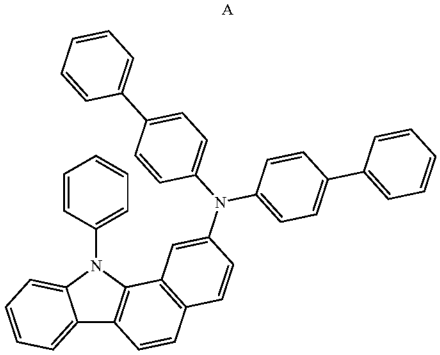
H1-14

TABLE 1-continued

| Host compound No. | Dopant compound No. | Driving Voltage Voltage (V) | Current density ($mA/cm^2$) | Max EQE (%) | FWHM (nm) | Emission color | Color coordinates (CIEx) | $LT_{97}$ (Relative value, %) |
|---|---|---|---|---|---|---|---|---|

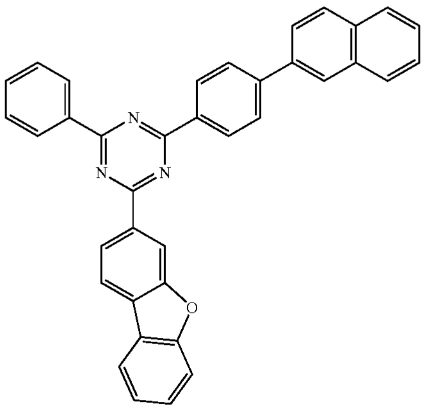

H2-6

From Table 1, it was confirmed that the organic light-emitting devices of Example 1 to 3 have improved characteristics compared to the organic light-emitting device of Comparative Example 1 in terms of the driving voltage, external quantum efficiency, and lifespan.

The composition has excellent electrical properties and stability. Accordingly, an electronic device, for example, an organic light-emitting device using the composition may have improved characteristics in terms of the driving voltage, external quantum efficiency, and lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the FIGURES, it will be understood by those of ordinary skill in the art that various changes in form and details may be made therein without departing from the spirit and scope as defined by the following claims.

What is claimed is:

1. A composition comprising:

a first compound, a second compound, and a third compound, wherein the first compound comprises a compound represented by Formula 1, the second compound comprises a compound represented by Formula 2, and the third compound comprises a compound represented by Formula 3:

Formula 1

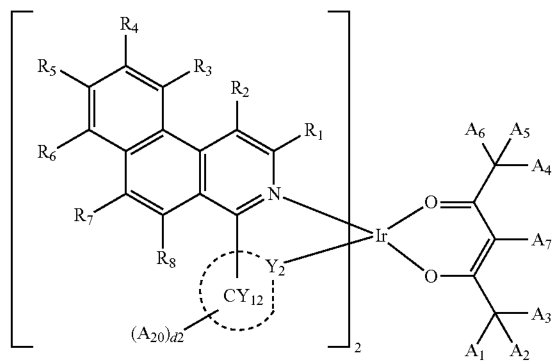

Formula 2

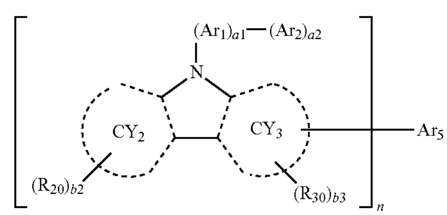

Formula 3

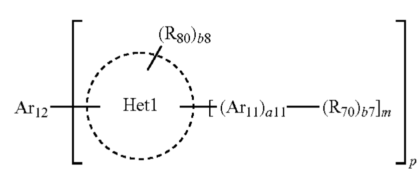

wherein $Y_2$ in Formula 1 is C, a group represented by

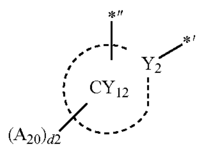

in Formula 1 is a group represented by Formula A(1):

A(1)

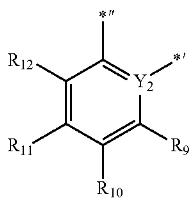

wherein, in Formula A(1), $R_9$ and $R_{11}$ are each independently a $C_1$-$C_{20}$ alkyl group, a $C_3$-$C_{10}$ cycloalkyl group, a $C_2$-$C_{10}$ heterocycloalkyl group, or a phenyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, a phenyl group, or any combination thereof, and $R_{10}$ and $R_{12}$ are each independently hydrogen or deuterium, *'indicates a binding site to Ir in Formula 1, and *" indicates a binding site to a neighboring atom in Formula 1, $Ar_1$, $Ar_2$, and $Ar_{n}$ in Formulae 2 and 3 are each independently a $C_5$-$C_{60}$ carbocyclic group which is unsubstituted or substituted with at least one $R_{61}$ or a $C_1$-$C_{60}$ heterocyclic group which is unsubstituted or substituted with at least one $R_{61}$, $Ar_5$ and $A_{12}$ in Formulae 2 and 3 are each independently a single bond, a $C_5$-$C_{60}$ carbocyclic group which is unsubstituted or substituted with at least one $R_{65}$, or a $C_1$-$C_{60}$ heterocyclic group which is unsubstituted or substituted with at least one $R_{65}$, or does not exist, n in Formula 2 is 1, 2, or 3, and when n is 1, $Ar_5$ does not exist, p in Formula 3 is 1, 2, or 3, and when p is 1, $Ar_{12}$ does not exist, a1 and a2 in Formula 2 are each independently an integer from 0 to 5, and the sum of a1 and a2 is 1 or more, ring $CY_2$ and ring $CY_3$ in Formula 2 are each independently a $C_5$-$C_{60}$ carbocyclic group or a $C_1$-$C_{60}$ heterocyclic group, and ring $CY_2$ and ring $CY_3$ are optionally linked to each other with a $C_5$-$C_{60}$ carbocyclic group which is unsubstituted or substituted with at least one $R_{66}$ or a $C_1$-$C_{60}$ heterocyclic group which is unsubstituted or substituted with at least one $R_{66}$ therebetween, Het1 in Formula 3 is a π electron-depleted nitrogen-containing $C_1$-$C_{60}$ cyclic group, a11 and m in Formula 3 are each independently an integer from 1 to 10, $R_1$ to $R_8$, $A_1$ to $A_7$, $R_{20}$, $R_{30}$, $R_{61}$, $R_{65}$, $R_{66}$, $R_{70}$, and $R_{80}$ in Formulae 1 to 3 are each independently hydrogen, deuterium, —F, —Cl, —Br, —I, —$SF_5$, a hydroxyl group, a cyano group, a nitro group, an amino group, an amidino group, a hydrazino group, a hydrazono group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)$(Qs), —$Ge(Q_3)(Q_4)$(Qs), —$B(Q_6)(Q_7)$, —P(═O)(Qs)($Q_9$), or —P(Qs)($Q_9$), provided that at least one of $R_1$ to Rs is a fluoro group (—F), b2, b3, b7, and b8 in Formulae 2 and 3 are each independently an integer from 0 to 20, when b2 is 2 or more, two or more $R_{20}$(s) are identical to or different from each other, when b3 is 2 or more, two or more $R_{30}$(s) are identical to or different from each other, when b7 is 2 or more, two or more $R_{70}$(s) are identical to or different from each other, and when b8 is 2 or more, two or more $R_{80}$(s) are identical to or different from each other, two or more of $R_1$ to Rs in Formula 1 are optionally linked to form a $C_5$-$C_{60}$ carbocyclic group which is unsubstituted or substituted with at least one Ria or a $C_1$-$C_0$ heterocyclic group which is unsubstituted or substituted with at least one $R_1$a, two or more of $A_1$ to $A_7$ in Formula 1 are optionally linked to form a $C_5$-$C_{60}$ carbocyclic group which is unsubstituted or substituted with at least one Ria or a $C_1$-$C_0$ heterocyclic group which is unsubstituted or substituted with at least one $R_1$a, two or more of ring $CY_2$, ring $CY_3$, $R_{20}$, and $R_{30}$ in Formula 2 are optionally linked to form a $C_5$-$C_{60}$ carbocyclic group which is unsubstituted or substituted with at least one Ria or a $C_1$-$C_{60}$ heterocyclic group which is unsubstituted or substituted with at least one $R_{1a}$, $R_{1a}$ is understood by referring to the description of $A_7$ provided above, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$,or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen;

deuterium; —F; —$C_1$; —Br; —I; a hydroxyl group; a cyano group; a nitro group; an amidino group; a hydrazine group; a hydrazone group; a carboxylic acid group or a salt thereof, a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_0$ alkyl group, a $C_6$-$C_{60}$ aryl group, or any combination thereof, a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The composition of claim 1, wherein $R_1$ to $R_8$ and $A_1$ to $A_7$ are each independently:

hydrogen, deuterium, or —F;

a $C_1$-$C_{20}$ alkyl group, a $C_3$-$C_{10}$ cycloalkyl group, a $C_2$-$C_{10}$ heterocycloalkyl group, or a phenyl group, each unsubstituted or substituted with deuterium, —F, a $C_1$-$C_{20}$ alkyl group, a $C_3$-$C_{10}$ cycloalkyl group, a $C_2$-$C_{10}$ heterocycloalkyl group, a phenyl group, or any combination thereof.

3. The composition of claim 1, wherein at least one of $A_1$ to $A_6$ in Formula 1 is an unsubstituted or substituted $C_2$-$C_{60}$ alkyl group, an unsubstituted or substituted $C_3$-$C_{10}$ cycloalkyl group, or an unsubstituted or substituted $C_2$-$C_{10}$ heterocycloalkyl group.

4. The composition of claim 1, wherein $A_1$ to $A_6$ are each independently an unsubstituted or substituted $C_1$-$C_{60}$ alkyl group, an unsubstituted or substituted $C_3$-$C_{10}$ cycloalkyl group, or an unsubstituted or substituted $C_2$-$C_{10}$ heterocycloalkyl group.

5. The composition of claim 1, wherein a group represented by

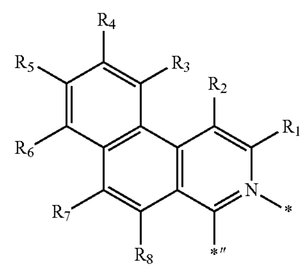

in Formula 1 is a group represented by one of Formulae CY1 to CY108:

CY1

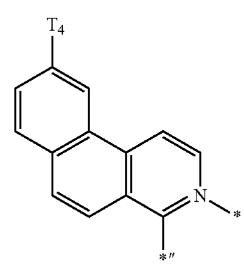

CY2

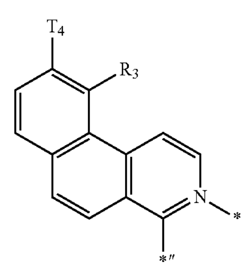

-continued
CY3
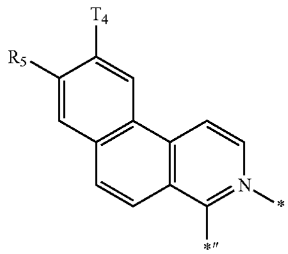
CY4
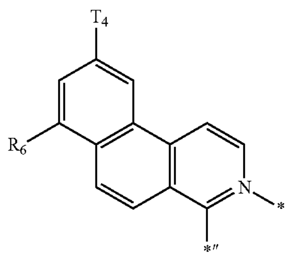
CY5
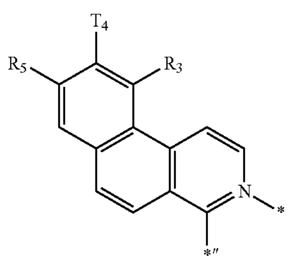
CY6
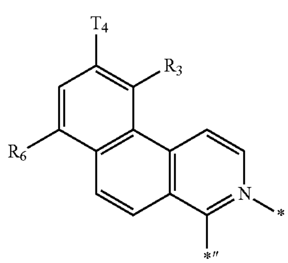
CY7
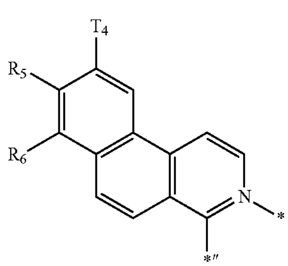
CY8
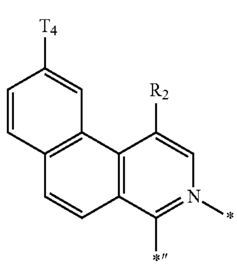
-continued
CY9
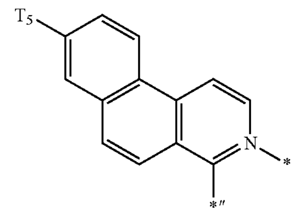
CY10
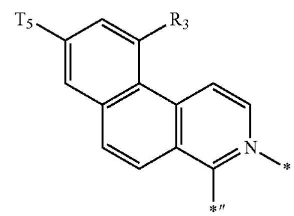
CY11
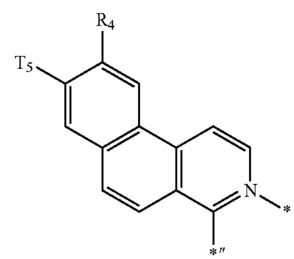
CY12
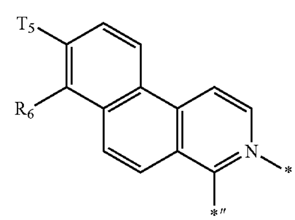
CY13
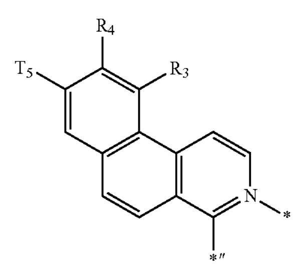
CY14
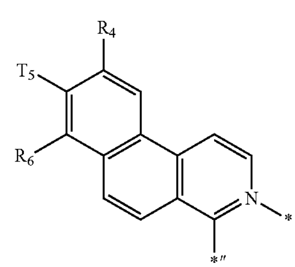

-continued
CY15
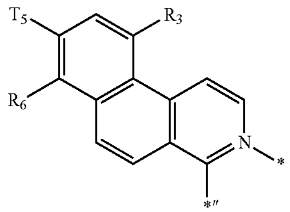
CY16
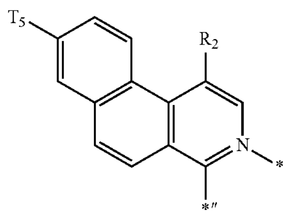
CY17
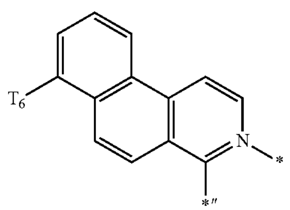
CY18
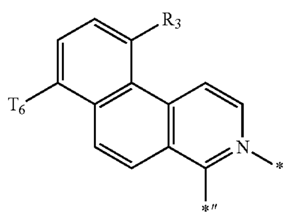
CY19
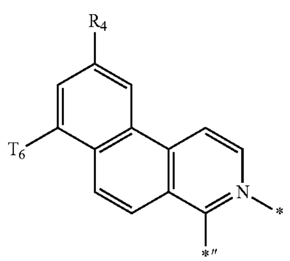
CY20
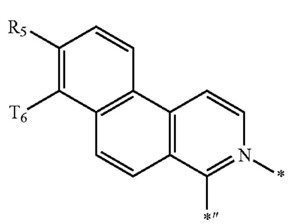
CY21
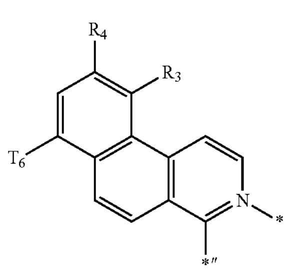
-continued
CY22
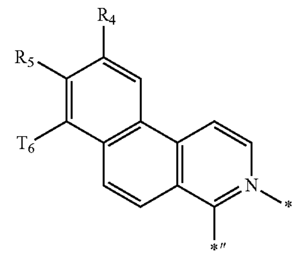
CY23
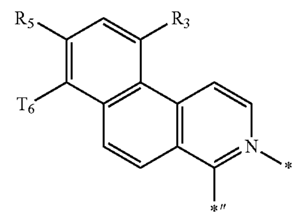
CY24
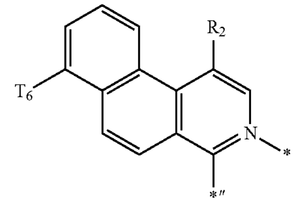
CY25
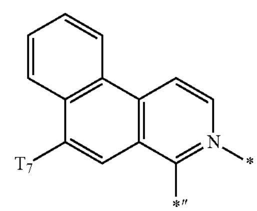
CY26
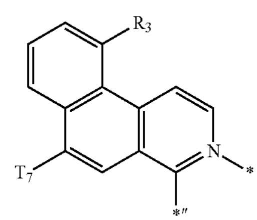
CY27
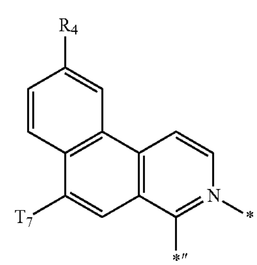
CY28
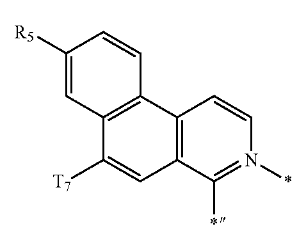

-continued
CY29
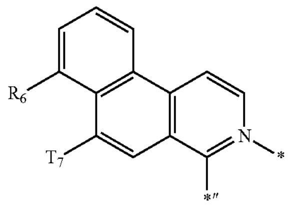
CY30
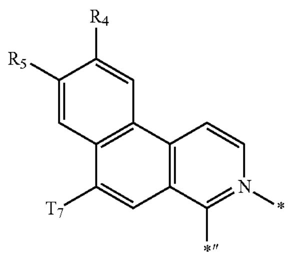
CY31
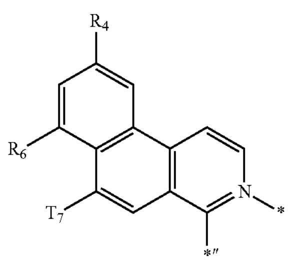
CY32
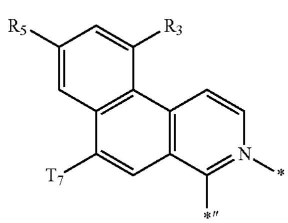
CY33
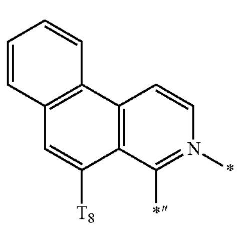
CY34
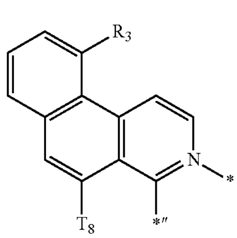
-continued
CY35
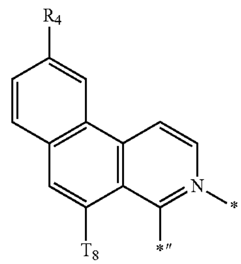
CY36
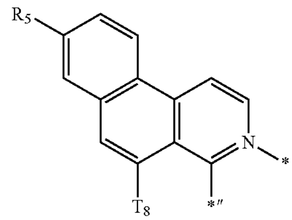
CY37
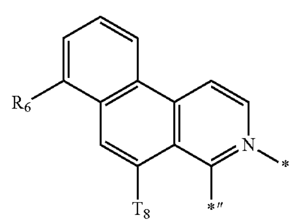
CY38
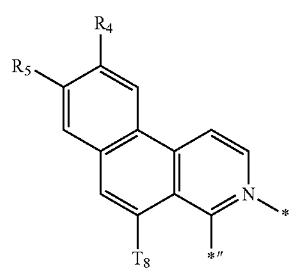
CY39
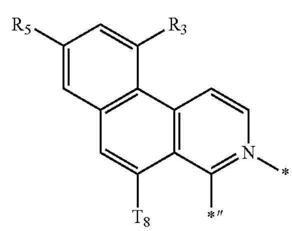
CY40
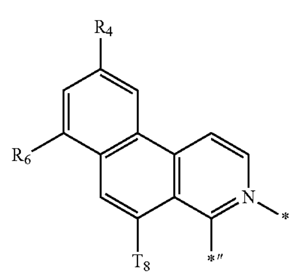

-continued
CY41
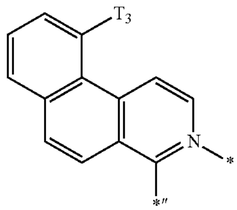
CY42
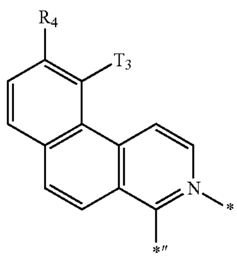
CY43
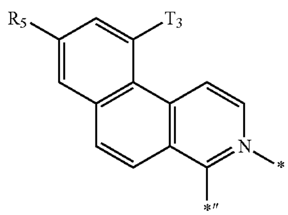
CY44
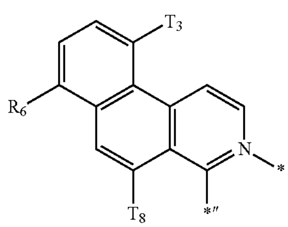
CY45
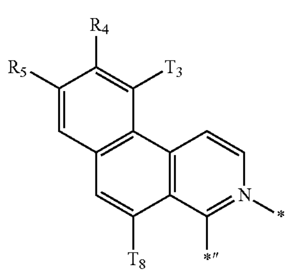
CY46
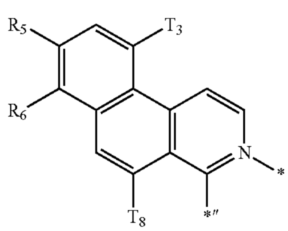
-continued
CY47
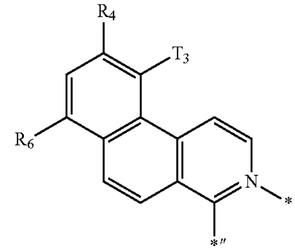
CY48
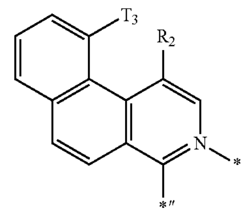
CY49
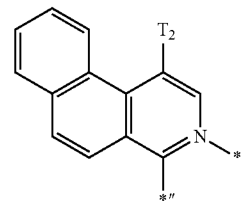
CY50
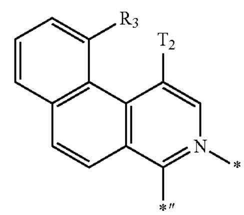
CY51
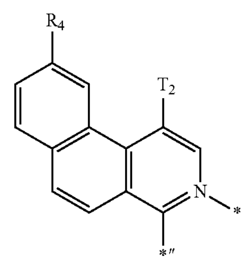
CY52
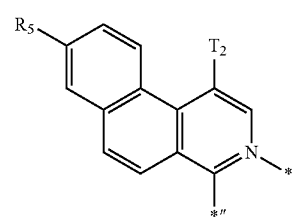
CY53
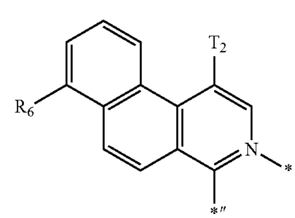

CY54
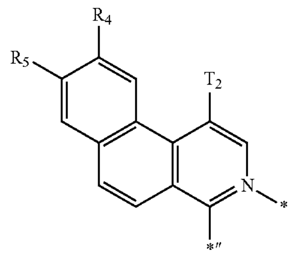
CY55
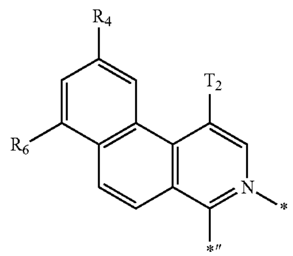
CY56
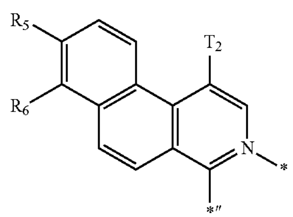
CY57
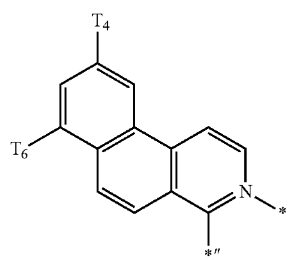
CY58
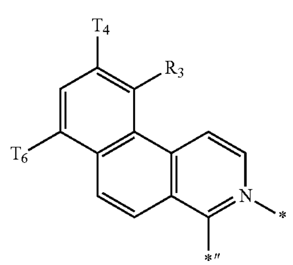
CY59
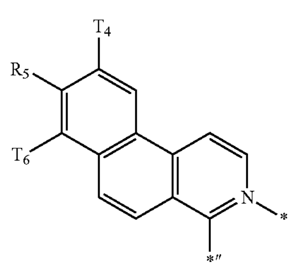
CY60
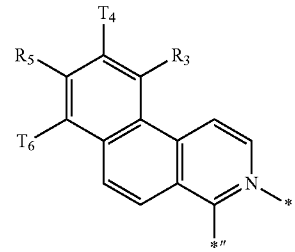
CY61
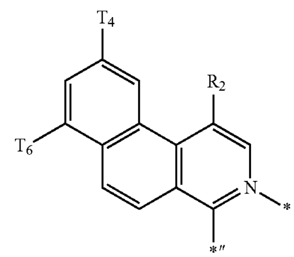
CY62
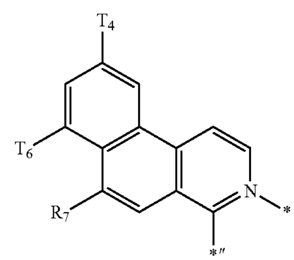
CY63
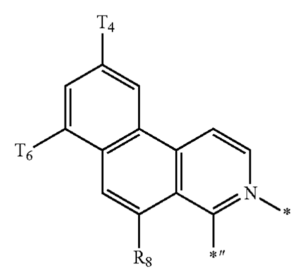
CY64
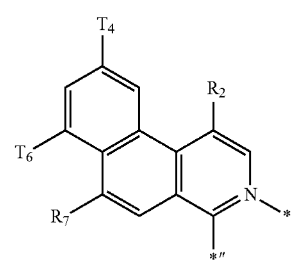
CY65
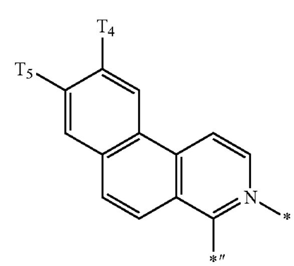

-continued
CY66
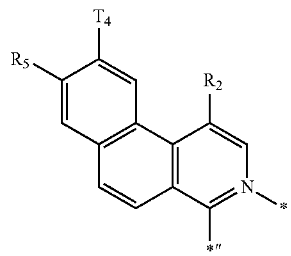
CY67
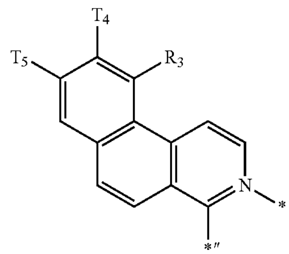
CY68
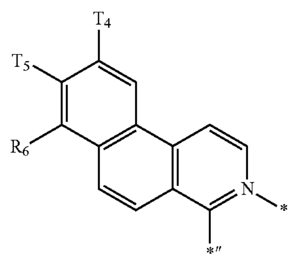
CY69
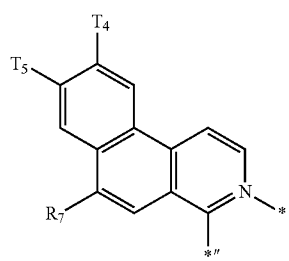
CY70
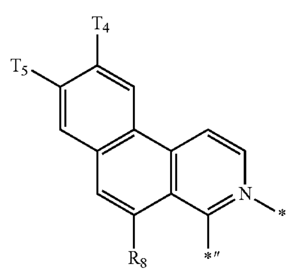
CY71
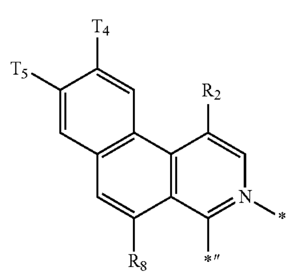
-continued
CY72
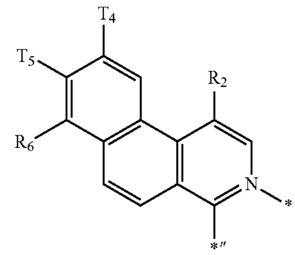
CY73
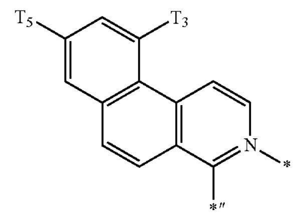
CY74
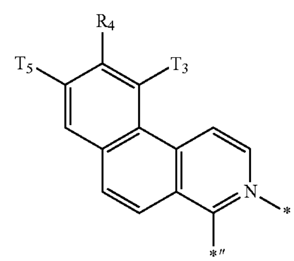
CY75
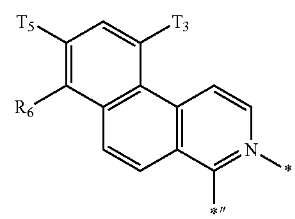
CY76
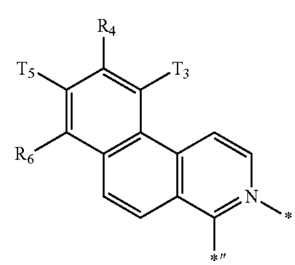
CY77
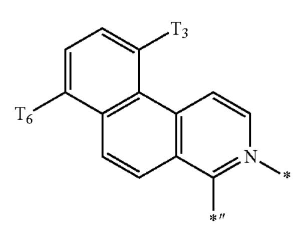

-continued
CY78
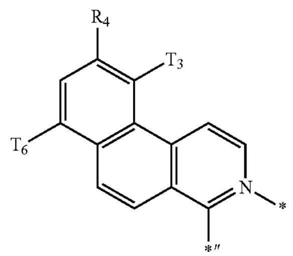
CY79
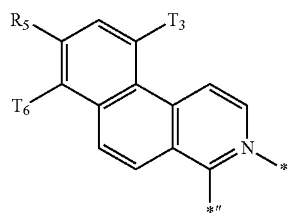
CY80
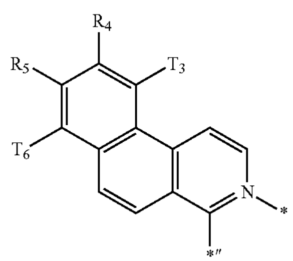
CY81
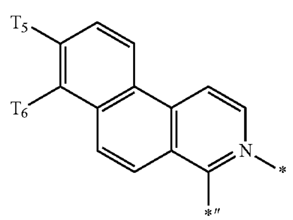
CY82
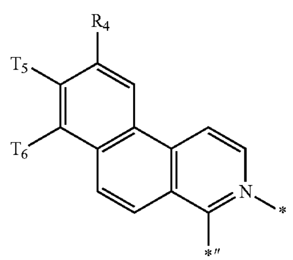
CY83
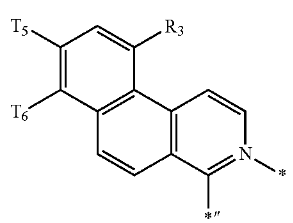
-continued
CY84
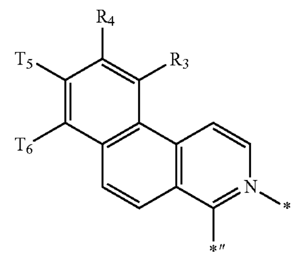
CY85
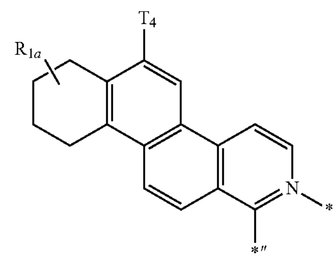
CY86
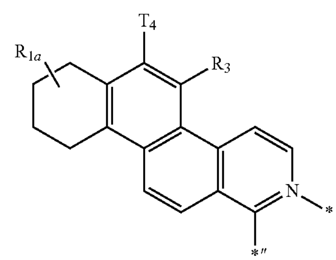
CY87
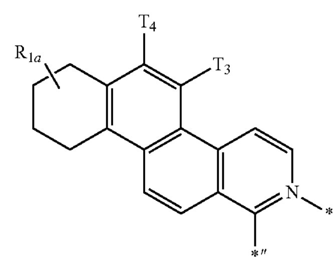
CY88
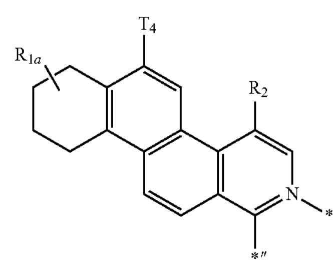
CY89
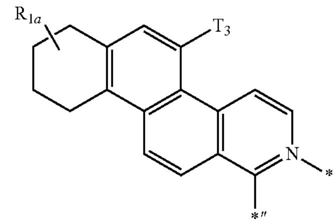

-continued
CY90
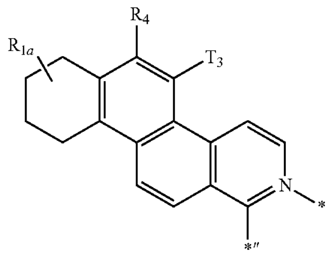
CY91
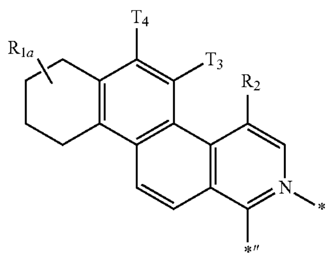
CY92
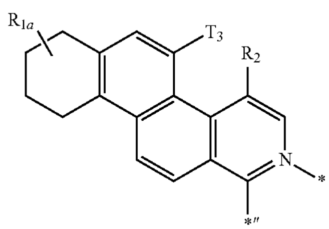
CY93
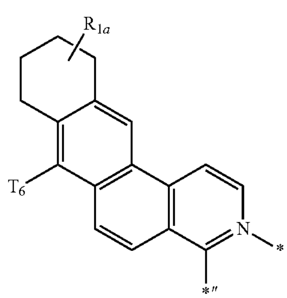
CY94
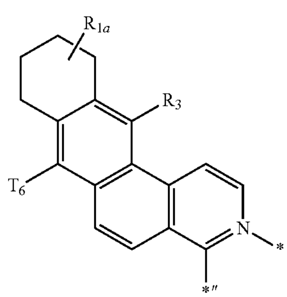
CY95
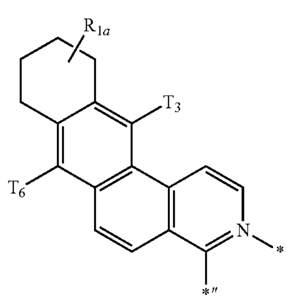
-continued
CY96
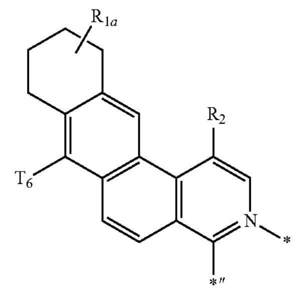
CY97
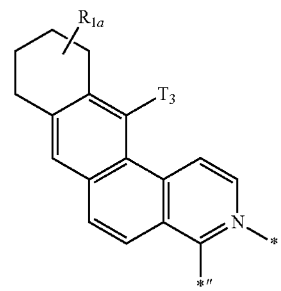
CY98
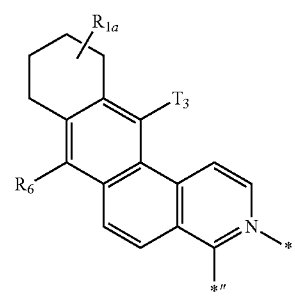
CY99
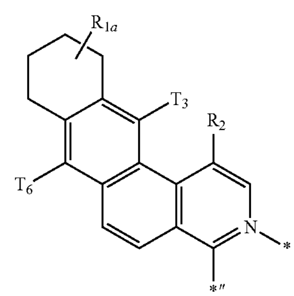
CY100
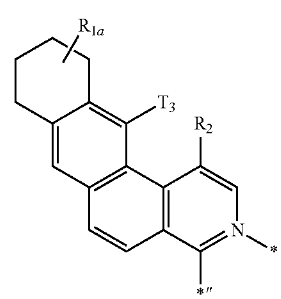

-continued

CY101

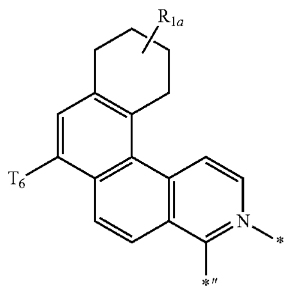

CY102

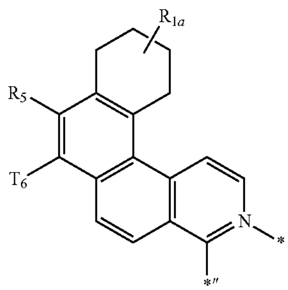

CY103

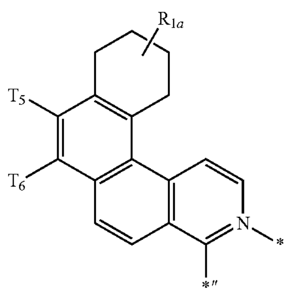

CY104

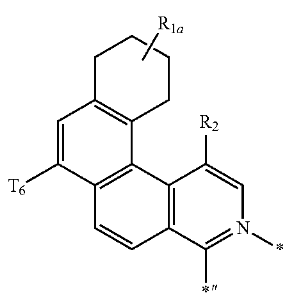

CY105

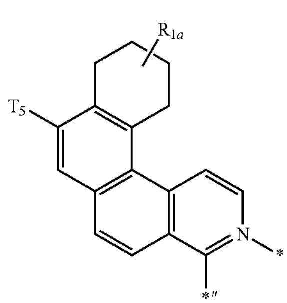

-continued

CY106

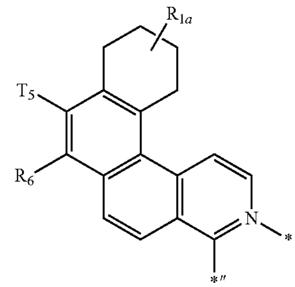

CY107

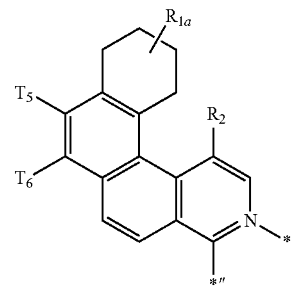

CY108

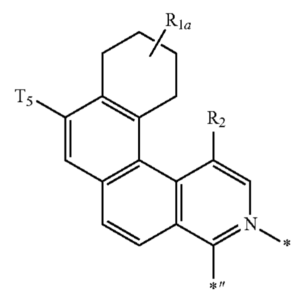

wherein, in Formulae CY1 to CY108, $T_2$ to $T_8$ are each a fluoro group (—F), each of $R_2$ to $R_8$ and $R_{1a}$ are the same as described in claim 1, provided that $R_2$ to $R_8$ are not hydrogen, indicates a binding site to Ir in Formula 1, and

*" indicates a binding site to a neighboring atom in Formula 1.

6. The composition of claim 1, wherein $Ar_1$, $Ar_2$, and $Ar_{11}$ in Formulae 2 and 3 are each independently a group derived from i) a first ring unsubstituted or substituted with at least one $R_{61}$, ii) a second ring unsubstituted or substituted with at least one $R_{61}$, iii) a condensed cyclic group in which two or more first rings are condensed with each other, unsubstituted or substituted with at least one $R_{61}$, iv) a condensed cyclic group in which two or more second rings are condensed with each other, unsubstituted or substituted with at least one $R_{61}$, or v) a condensed cyclic group in which at least one first ring and at least one second ring are condensed with each other, unsubstituted or substituted with at least one $R_{61}$, $Ar_5$ and $Ar_{12}$ in Formulae 2 and 3 are each independently a single bond or a group derived from i) a first ring unsubstituted or substituted with at least one $R_{65}$, ii) a second ring unsubstituted or substituted with at least one $R_{65}$, iii) a condensed cyclic group in which two or more first rings are condensed with each other, unsubstituted or substituted with at least one $R_{65}$, iv) a condensed cyclic group in which two or more second rings are condensed with each other, unsubstituted or substituted with at least one $R_{65}$, or v) a condensed cyclic group in which at least one first ring and at least one second ring are condensed with each other, unsubstituted or substituted with at least one $R_{65}$, or does not exist, ring $CY_2$ and ring $CY_3$ in Formula 2 are each independently i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring and at least one second ring are condensed with each other, Het1 in Formula 3 is a group derived from i) a first ring, ii) a condensed cyclic group in which two or more first rings are condensed with each other, or iii) a condensed cyclic group in which at least one first ring and at least one second ring are condensed with each other, the first ring is an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group, and the second ring is a benzene group, a cyclopentadiene group, a pyrrole group, a furan group, a thiophene group, or a silole group.

7. The composition of claim 1, wherein $Ar_1$, $Ar_2$, and $Ar_{11}$ in Formulae 2 and 3 are each independently a π electron-rich $C_3$-$C_{60}$ cyclic group unsubstituted or substituted with at least one $R_6$i, $Ar_5$ and $Ar_{12}$ in Formulae 2 and 3 are each independently a single bond or a R electron-rich $C_3$-$C_{60}$ cyclic group unsubstituted or substituted with at least one $R_{65}$, or do not exist, and ring $CY_2$ and ring $CY_3$ in Formula 2 are each independently a πelectron-rich $C_3$-$C_{60}$ cyclic group.

8. The composition of claim 1, wherein a group represented by

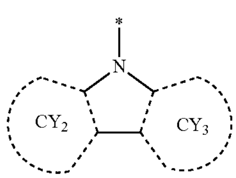

in Formula 2 is represented by one of Formulae 2-1 to 2-93:

2-1

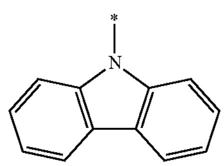

2-2

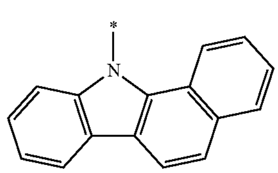

-continued 2-3

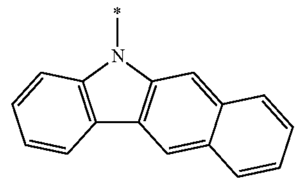

2-4

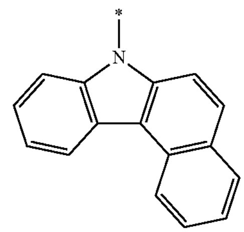

2-5

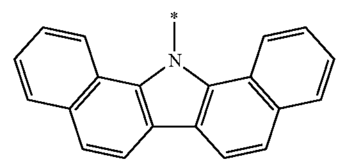

2-6

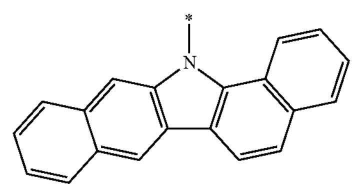

2-7

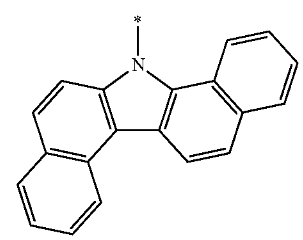

2-8

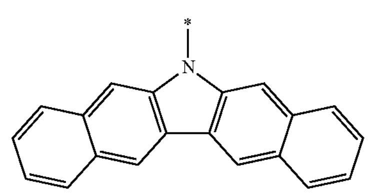

2-9

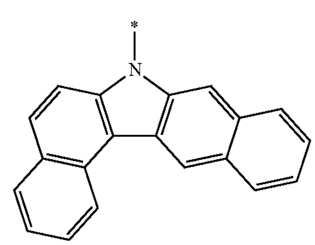

-continued
2-10
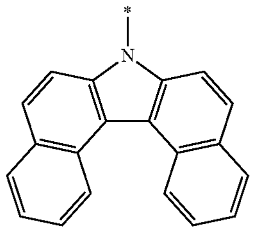
2-11
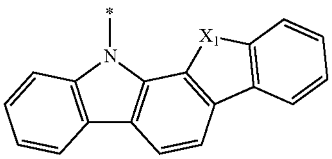
2-12
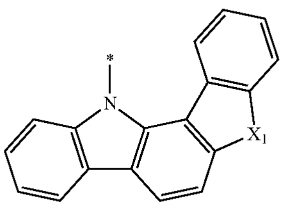
2-13
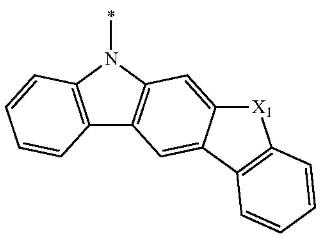
2-14
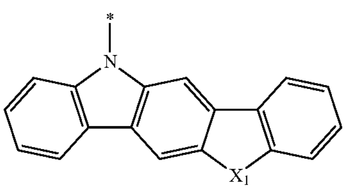
2-15
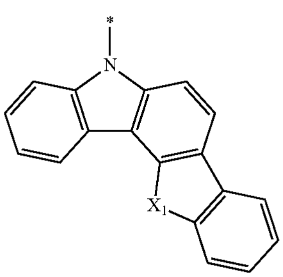
2-16
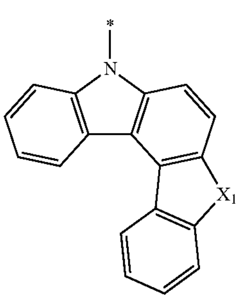
-continued
2-17
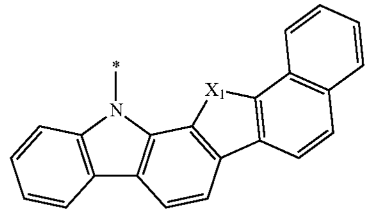
2-18
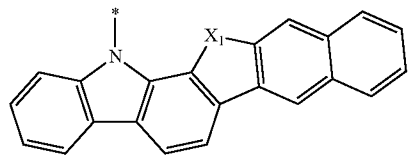
2-19
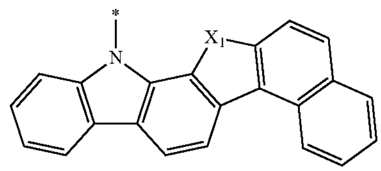
2-20
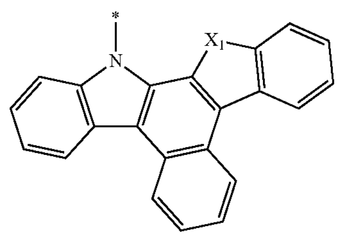
2-21
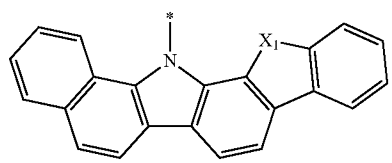
2-22
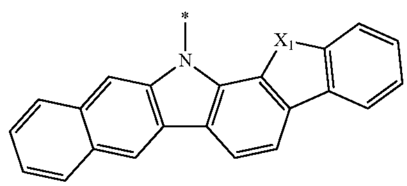
2-23
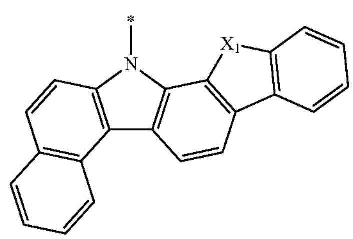
2-24
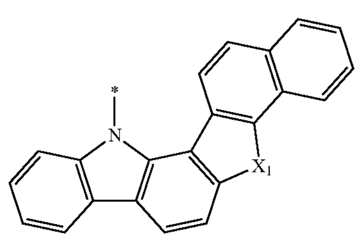

-continued
2-25
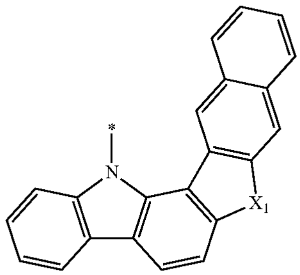
2-26
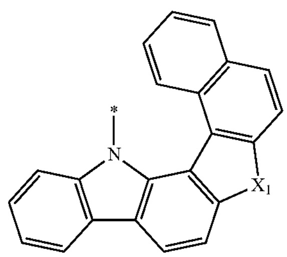
2-27
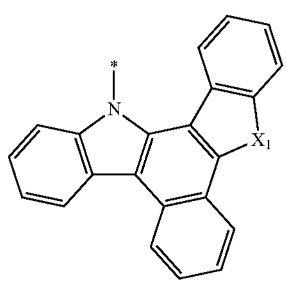
2-28
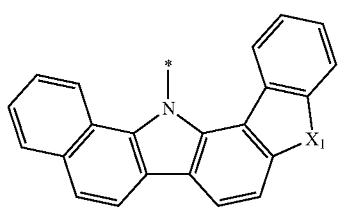
2-29
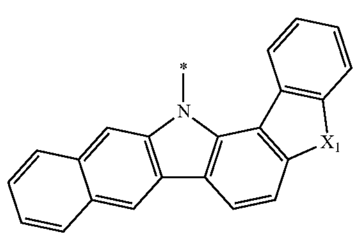
2-30
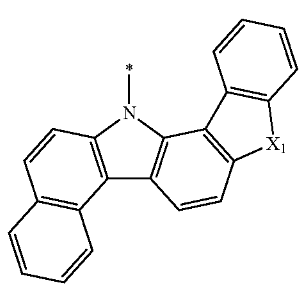
-continued
2-31
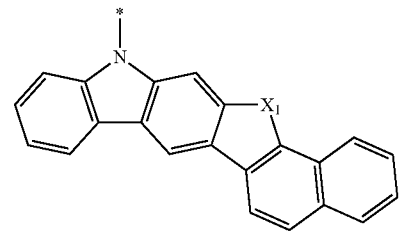
2-32
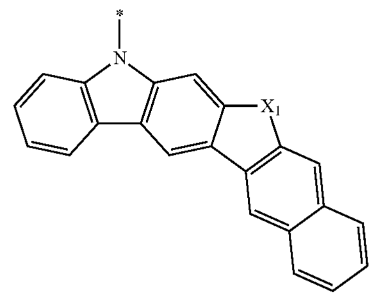
2-33
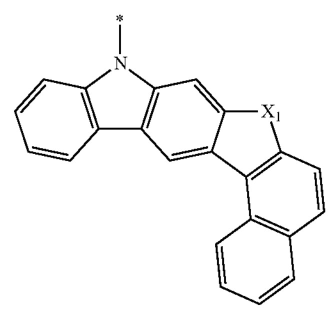
2-34
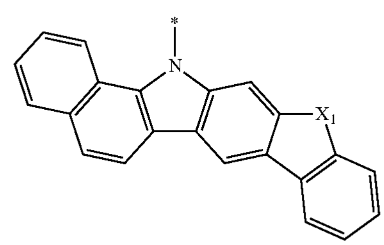
2-35
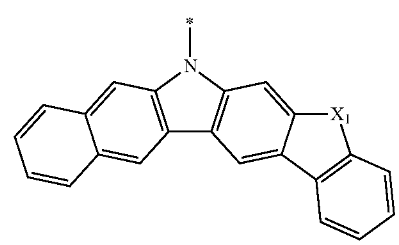
2-36
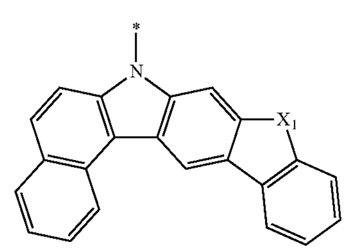

-continued
2-37
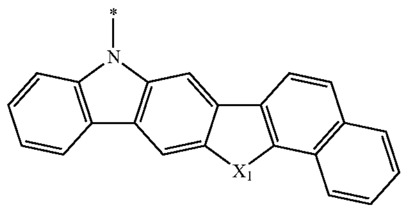
2-38
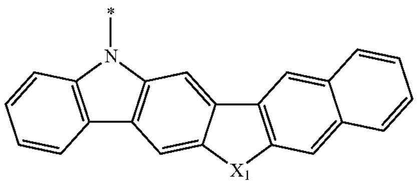
2-39
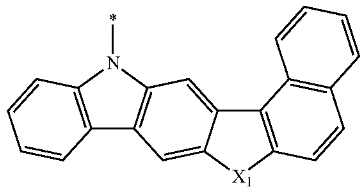
2-40
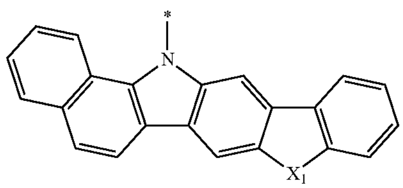
2-41
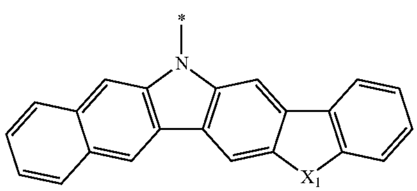
2-42
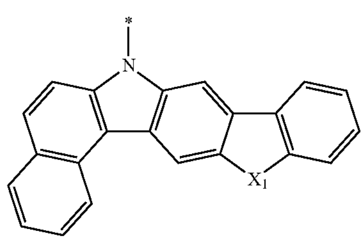
2-43
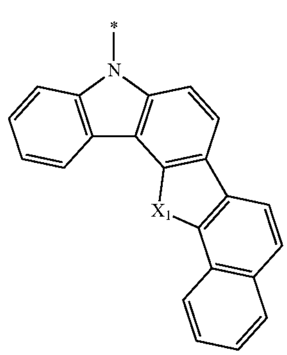
-continued
2-44
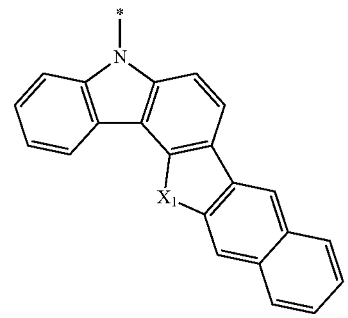
2-45
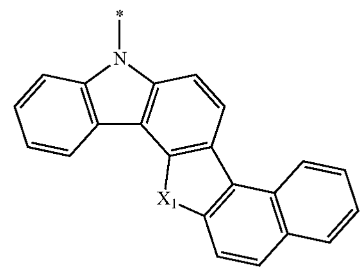
2-46
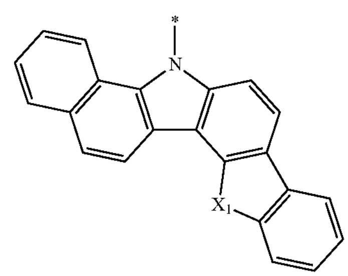
2-47
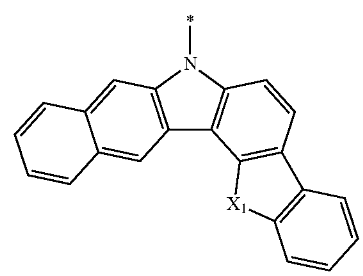
2-48
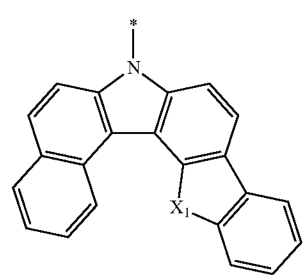

-continued
2-49
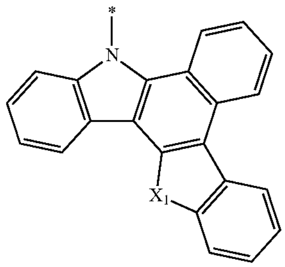
2-50
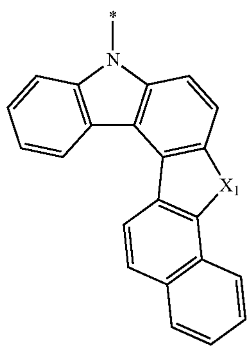
2-51
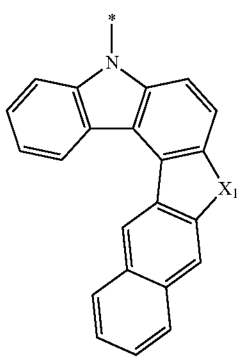
2-52
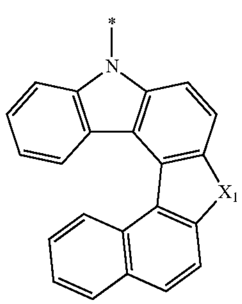
2-53
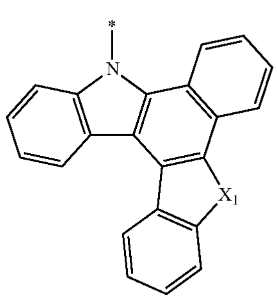
-continued
2-54
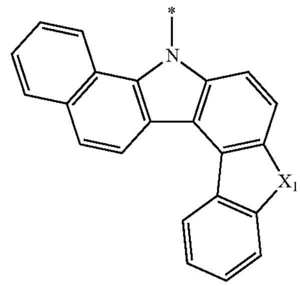
2-55
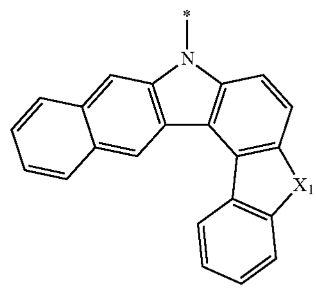
2-56
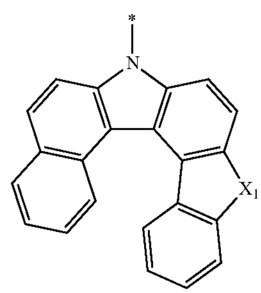
2-57
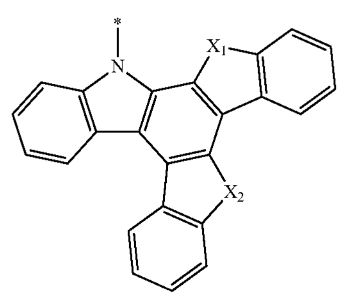
2-58
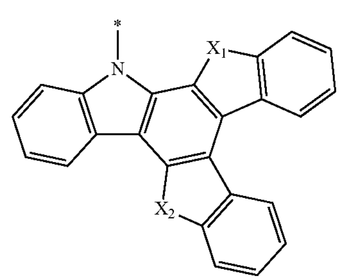

-continued
2-59
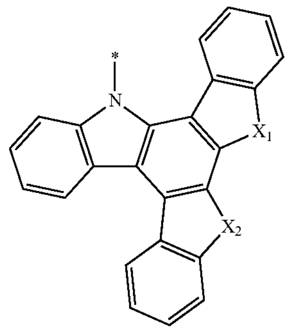
2-60
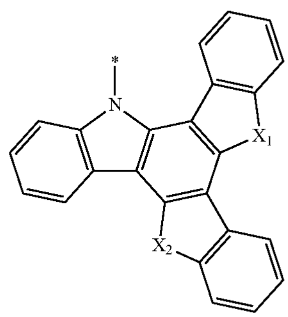
2-61
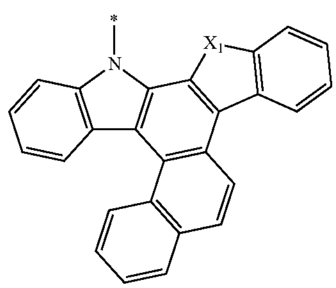
2-62
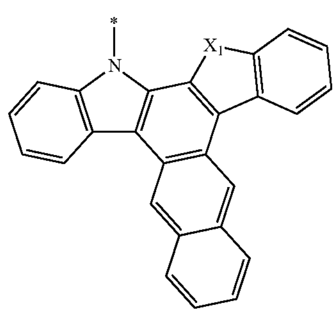
2-63
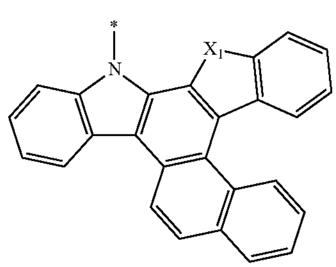
-continued
2-64
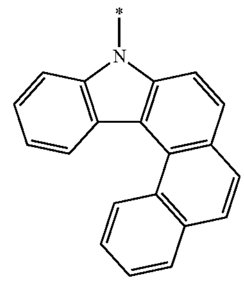
2-65
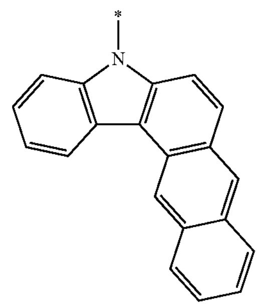
2-66
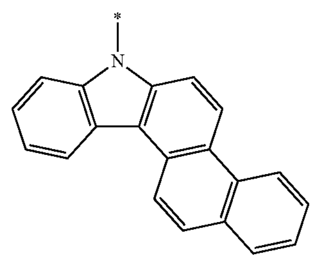
2-67
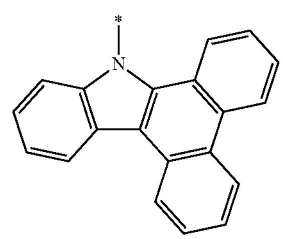
2-68
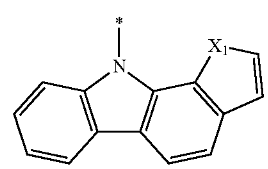
2-69
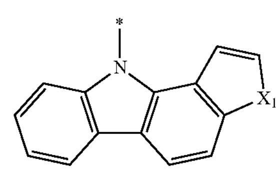
2-70
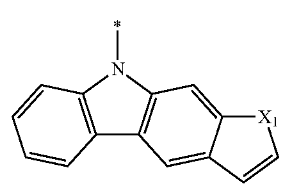

-continued
2-71
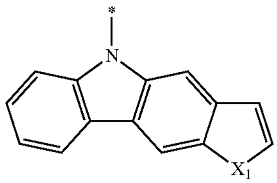
2-72
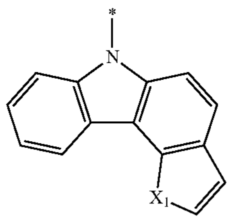
2-73
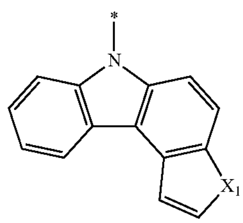
2-74
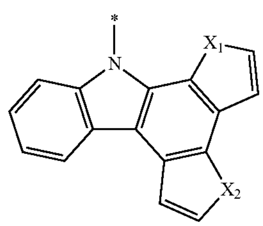
2-75
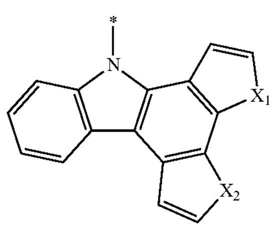
2-76
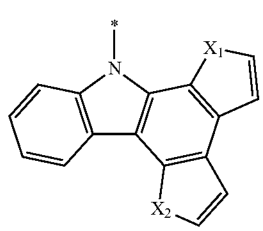
2-77
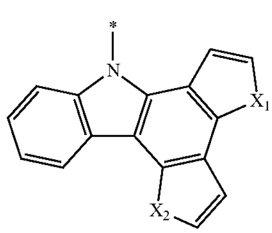
-continued
2-78
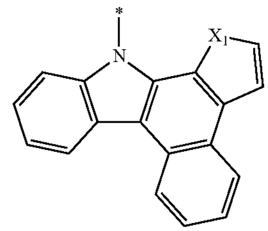
2-79
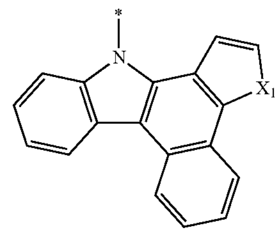
2-80
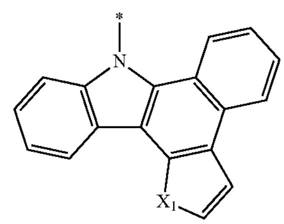
2-81
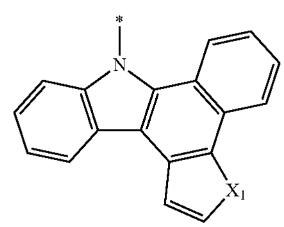
2-82
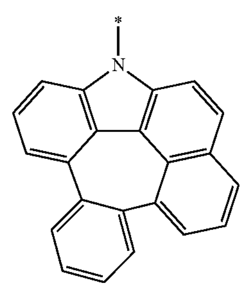
2-83
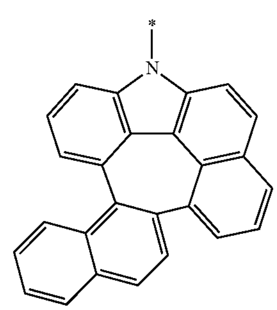

-continued
2-84
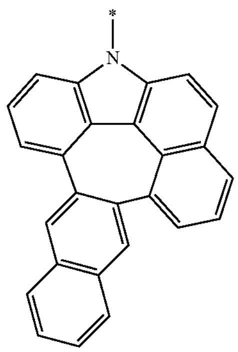
2-85
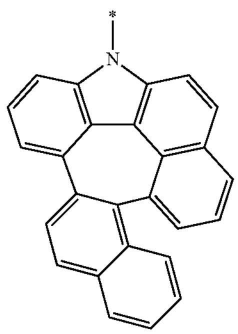
2-86
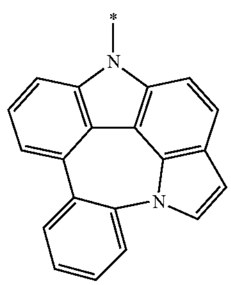
2-87
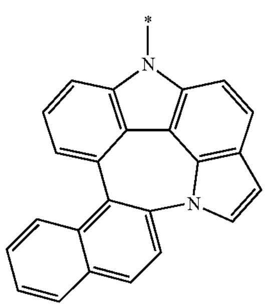
2-88
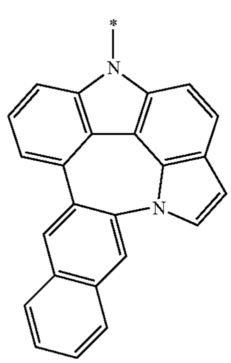
-continued
2-89
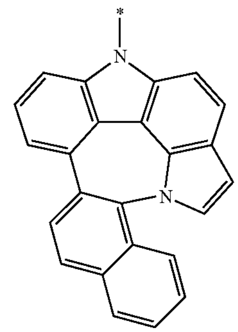
2-90
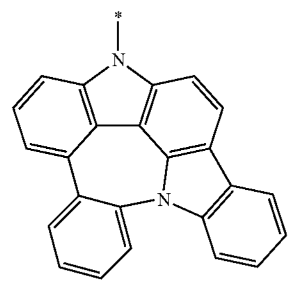
2-91
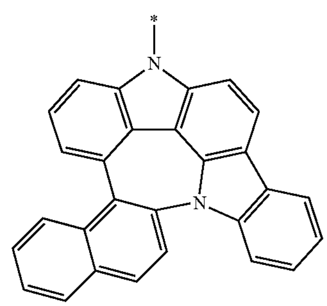
2-92
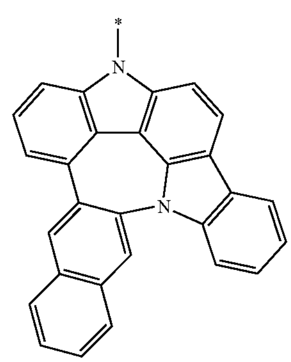

-continued
2-93
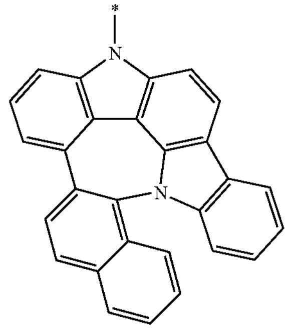
wherein, in Formulae 2-1 to 2-93,
$X_1$ is O, S, $N(R_{31})$, $C(R_{31})(R_{32}>$, or $Si(R_{31})(R_{32})$,
$X_2$ is O, S, $N(R_{33})$, $C(R_{33})(R_{34})$, or $Si(R_{33})(R_{34})$,
$R_{31}$ to $R_{34}$ are the same as described in connection with $R_{30}$ in claim 1, and
indicates a binding site to $Ar_1$ or $Ar_2$ in Formula 2.
9. The composition of claim 1, wherein
Het1 in Formula 3 is a group derived from one of Formulae 3-1 to 3-40:
3-1
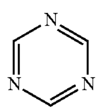
3-2
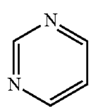
3-3
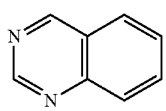
3-4
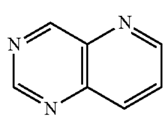
3-5
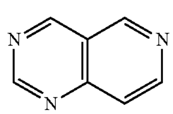
3-6
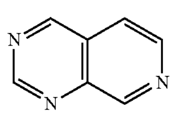
3-7
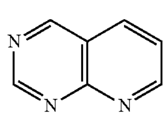
3-8
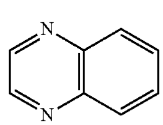
-continued
3-9
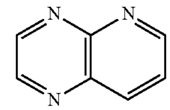
3-10
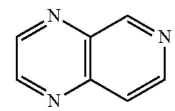
3-11
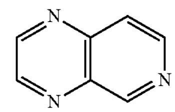
3-12
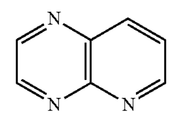
3-13
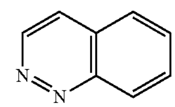
3-14
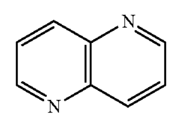
3-15
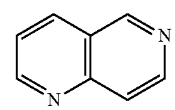
3-16
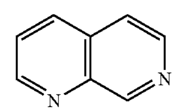
3-17
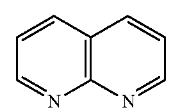
3-18
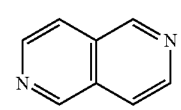
3-19
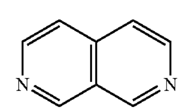
3-20
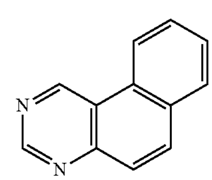
3-21
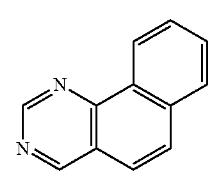

-continued
3-22
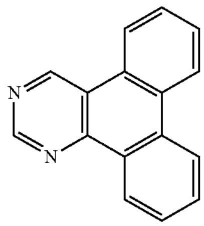
3-23
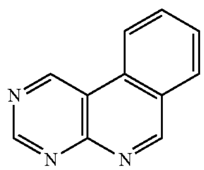
3-24
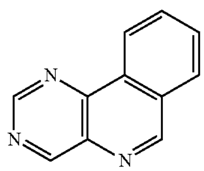
3-25
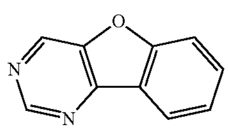
3-26
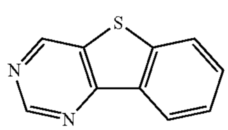
3-27
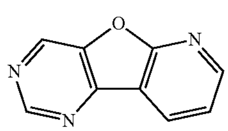
3-28
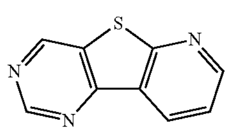
3-29
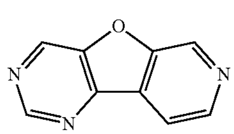
3-30
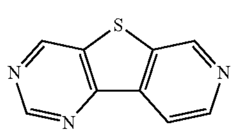
3-31
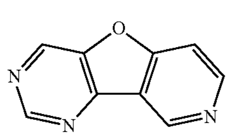
-continued
3-32
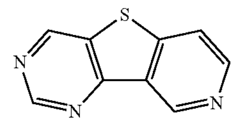
3-33
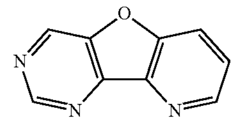
3-34
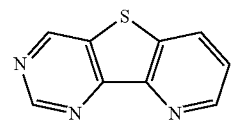
3-35
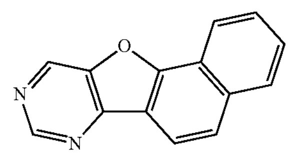
3-36
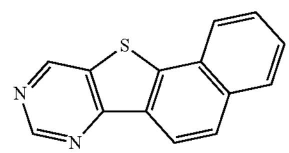
3-37
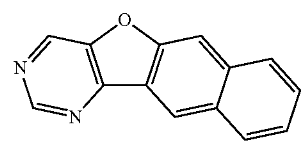
3-38
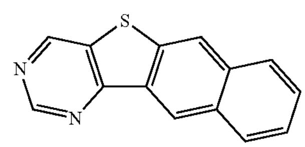
3-39
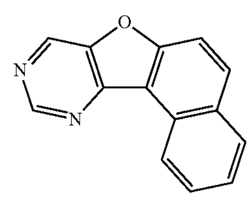
3-40
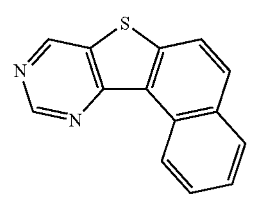
10. The composition of claim 1, wherein
a11 and m in Formula 3 are each independently an integer from 1to 3.
11. The composition of claim 1, wherein
$R_{20}$, $R_{30}$, $R_{61}$, $R_{65}$, $R_{66}$, $R_{70}$ and $R_{80}$ in Formulae 2 and 3 are each independently:
hydrogen or deuterium;
a $C_1$-$C_{20}$ alkyl group or a $C_1$-$C_{20}$ alkoxy group, each unsubstituted or substituted with deuterium, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, -N($Q_{31}$)($Q_{32}$), or any combination thereof, a π electron-rich $C_3$-$C_{60}$ cyclic group, unsubstituted or substituted with deuterium, a $C_1$-$C_{20}$ alkyl group, a $C_1$-$C_{20}$ alkoxy group, a phenyl group, a naphthyl group, an anthracenyl group, a phenanthrenyl group, a triphenylenyl group, a fluorenyl group, a di($C_1$-$C_{10}$ alkyl)fluorenyl group, a di($C_6$-$C_{60}$ aryl)fluorenyl group, a dibenzosilolyl group, a di($C_1$-$C_{10}$ alkyl)dibenzosilolyl group, a di($C_6$-$C_{60}$ aryl)dibenzosilolyl group, a carbazolyl group, a ($C_1$-$C_{10}$ alkyl)carbazolyl group, a ($C_6$-$C_{60}$ aryl)carbazolyl group, a dibenzofuranyl group, a dibenzothiophenyl group, a biphenyl group, a terphenyl group, -N($Q_{31}$)($Q_{32}$), or any combination thereof, or

N($Q_1$)($Q_2$).

12. The composition of claim 1, wherein the second compound comprises at least one of Compounds H1-1 to H1-72, and the third compound comprises at least one of Compounds H2-1 to H2-61:

H1-1

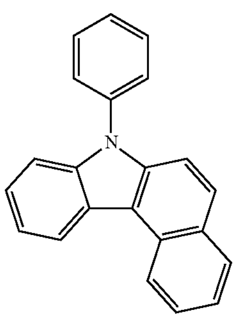

H1-2

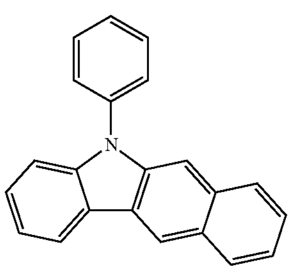

H1-3

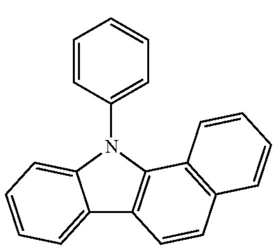

-continued

H1-4

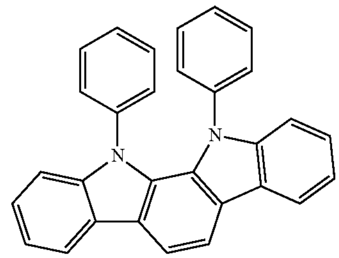

H1-5

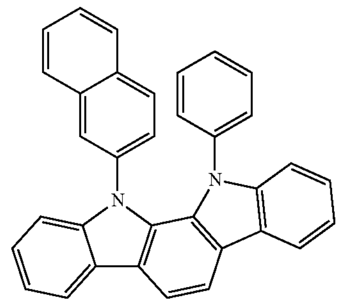

H1-6

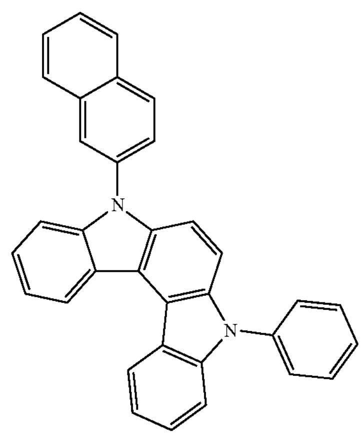

H1-7

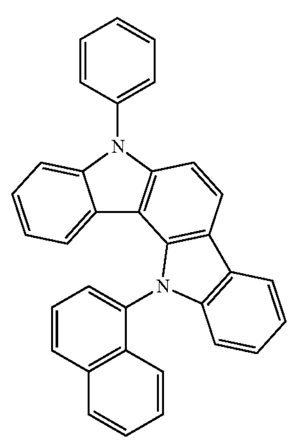

H1-8
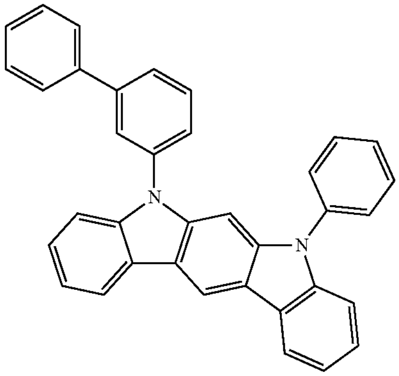
H1-9
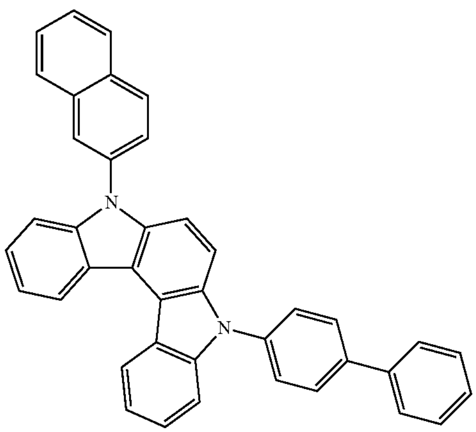
H1-10
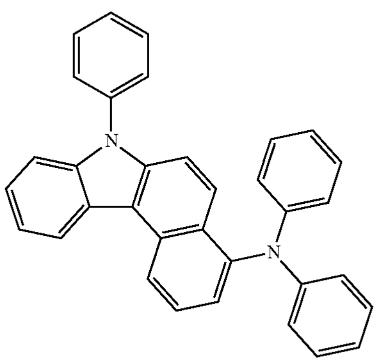
H1-11
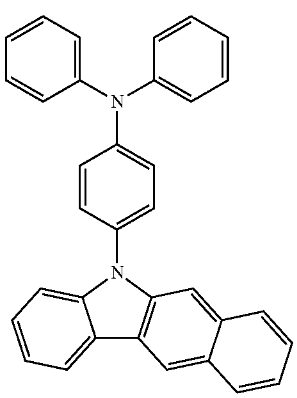
H1-12
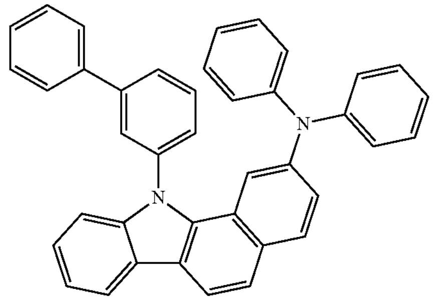
H1-13
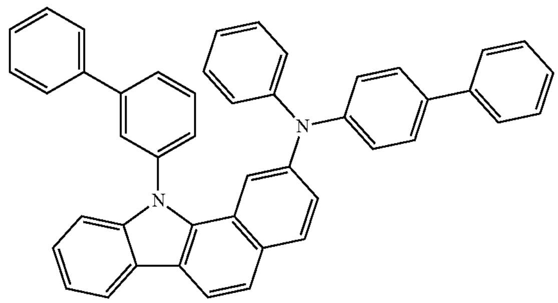
H1-14
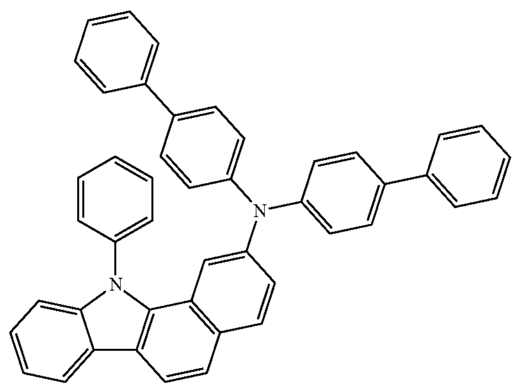
H1-15
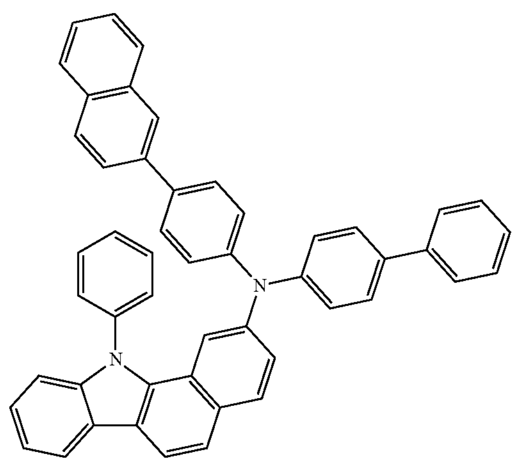

H1-16
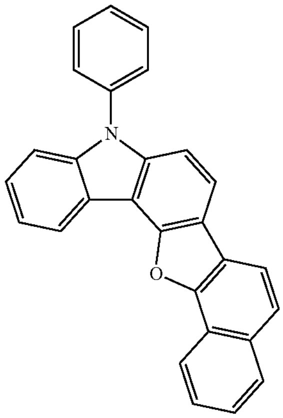
H1-17
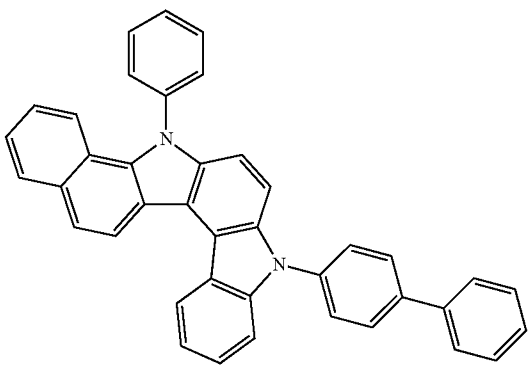
H1-18
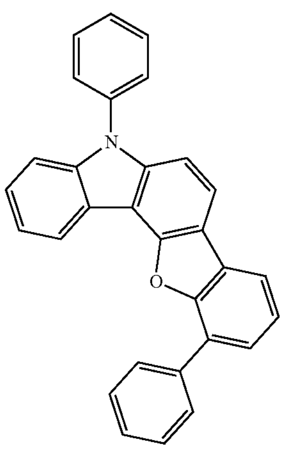
H1-19
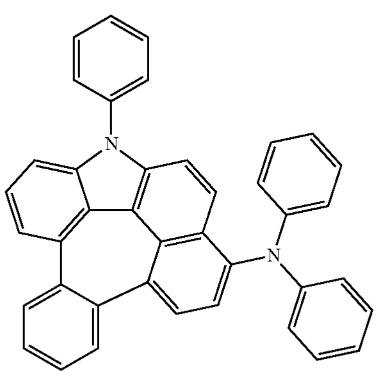
H1-20
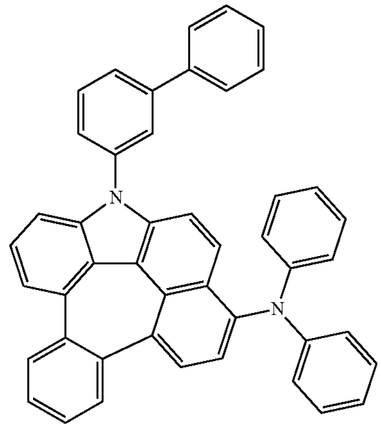
H1-21
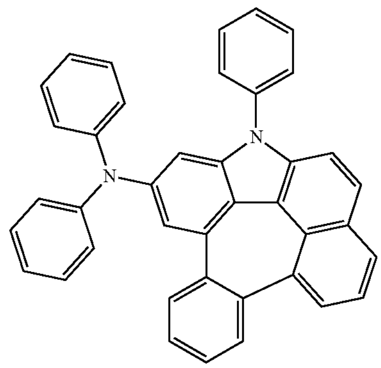
H1-22
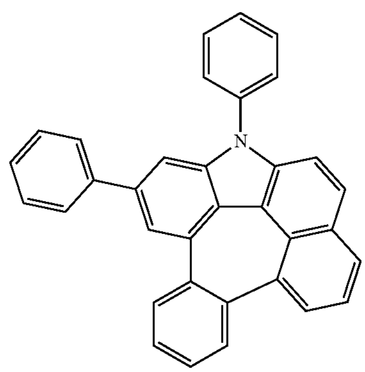
H1-23
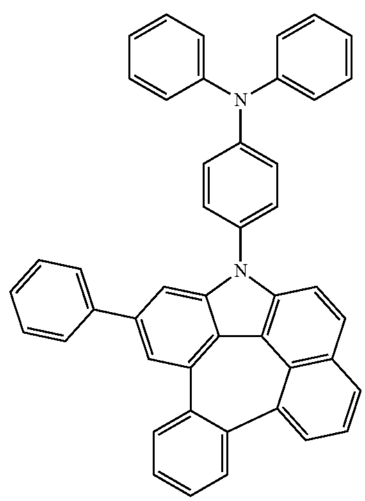

-continued
H1-24
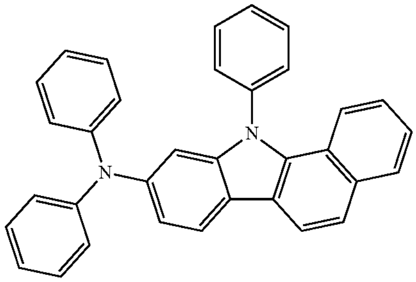
H1-25
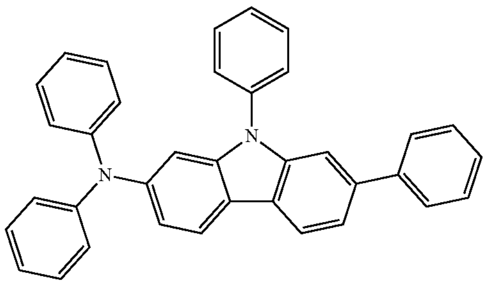
H1-26
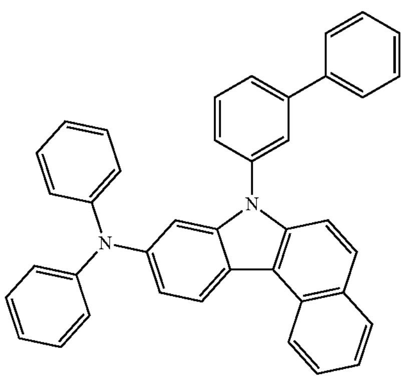
H1-27
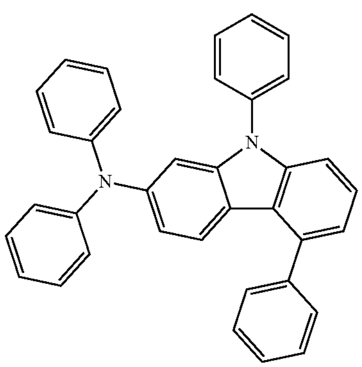
-continued
H1-28
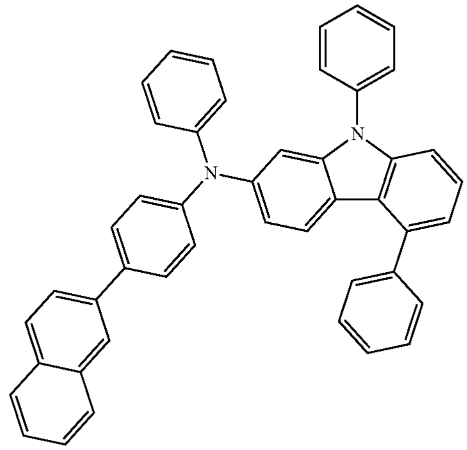
H1-29
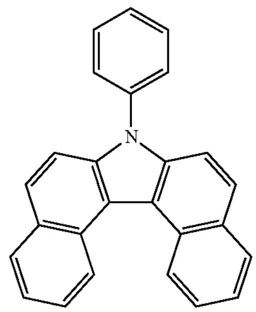
H1-30
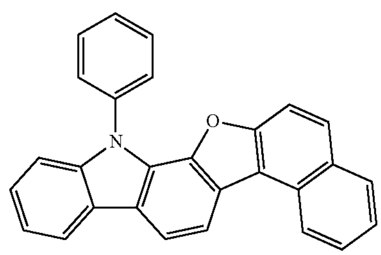
H1-31
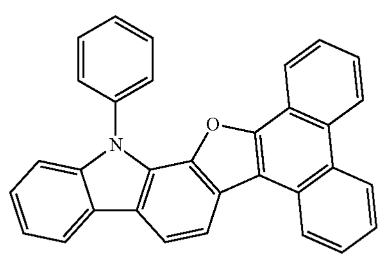

-continued
H1-32
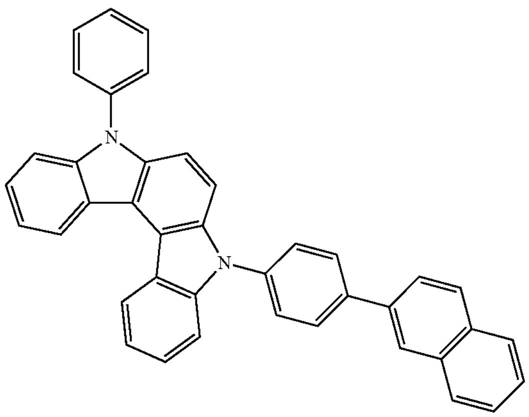
H1-33
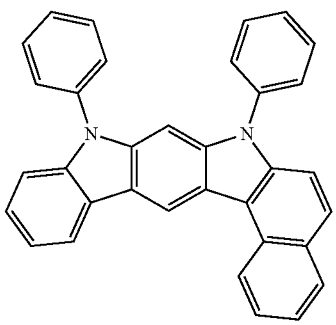
H1-34
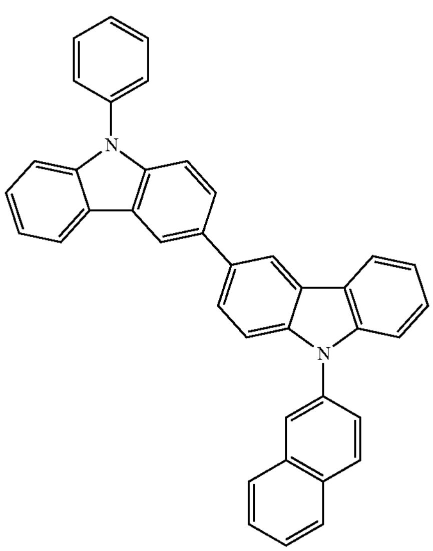
-continued
H1-35
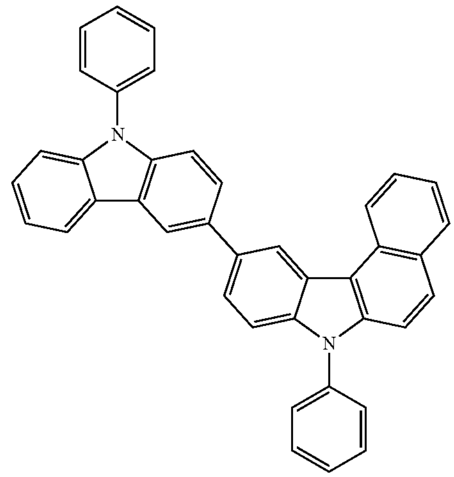
H1-36
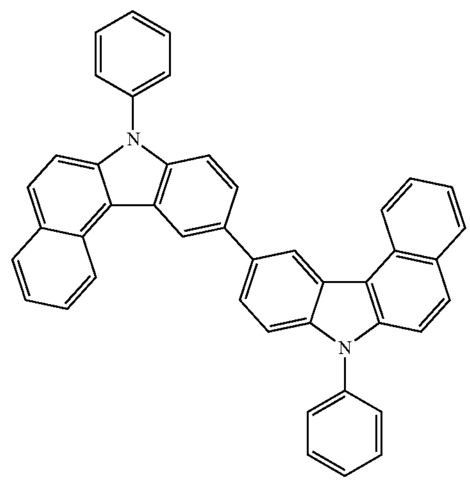
H1-37
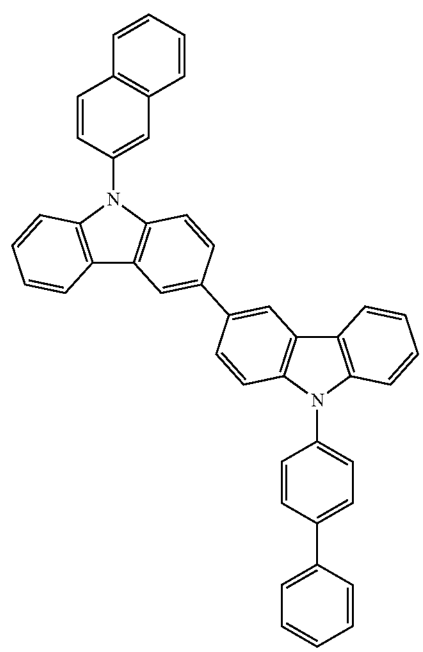

-continued
H1-38
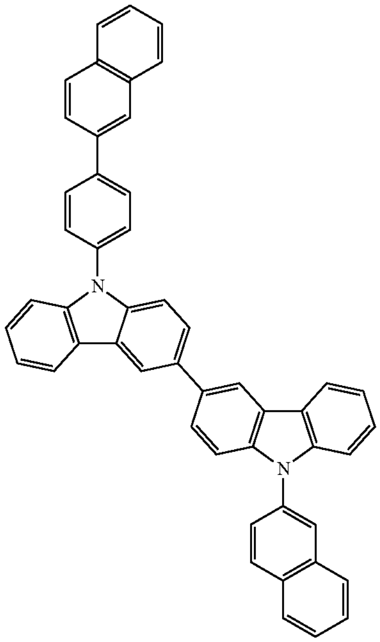
H1-39
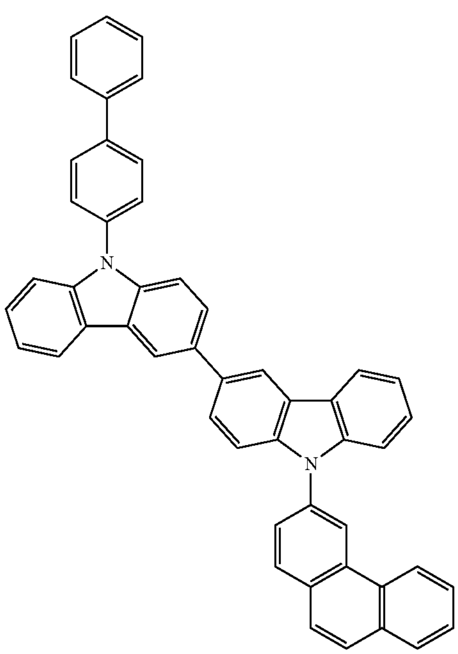
-continued
H1-40
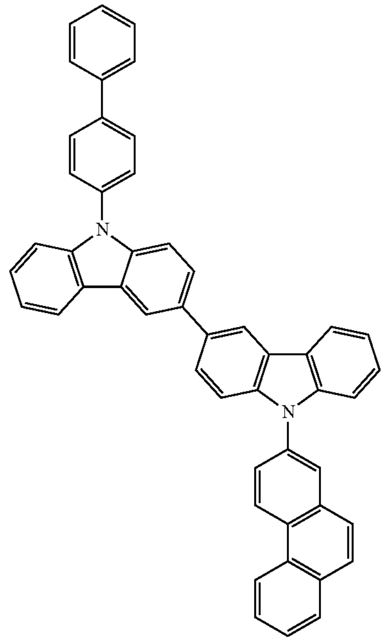
H1-41
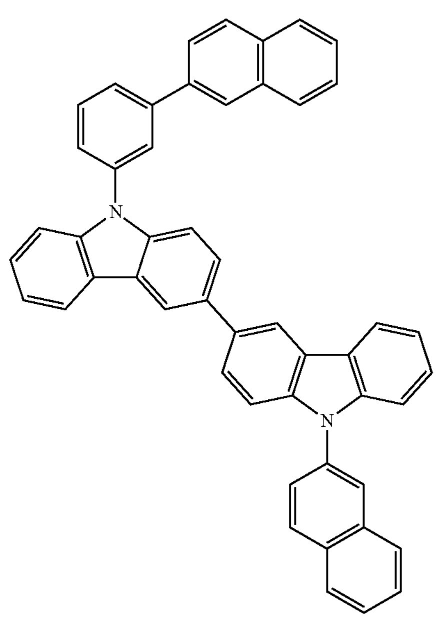

-continued
H1-42
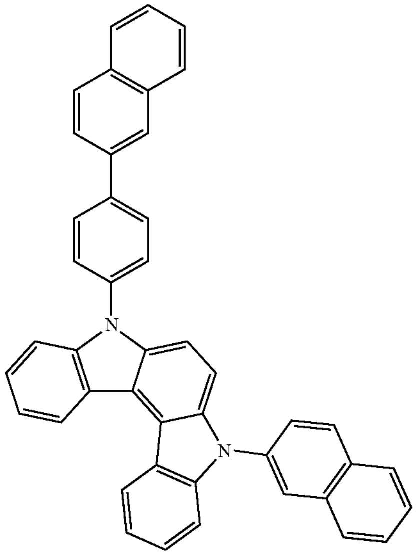
H1-43
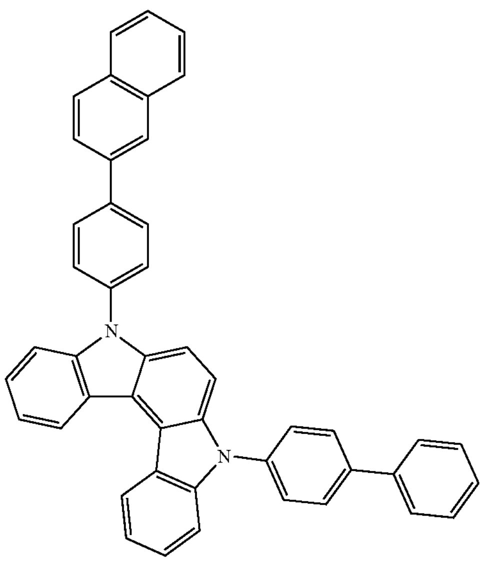
H1-44
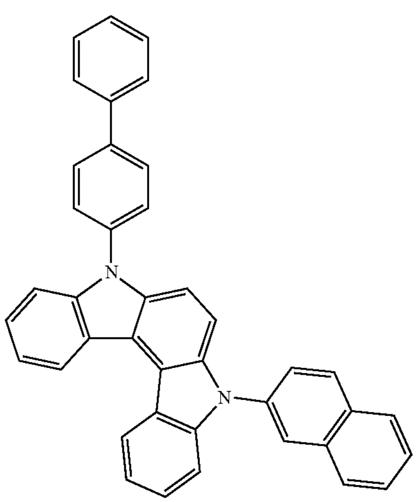
-continued
H1-45
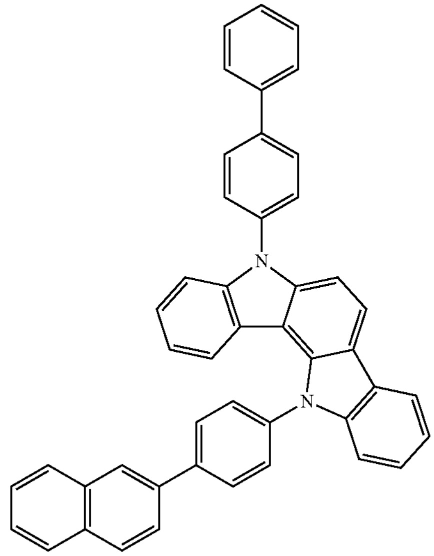
H1-46
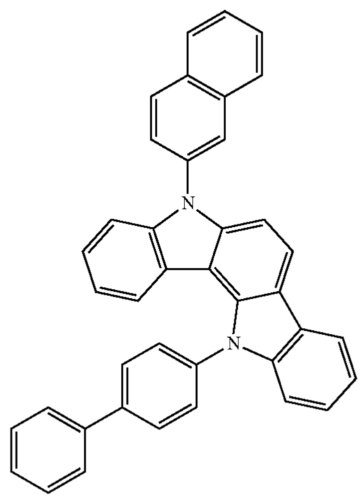
H1-47
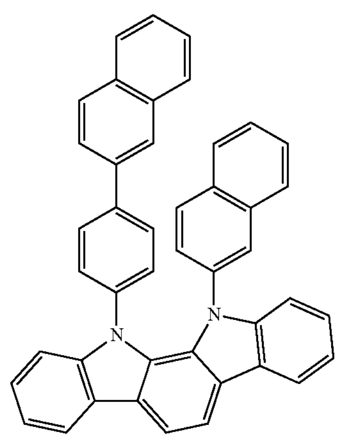

-continued
H1-48
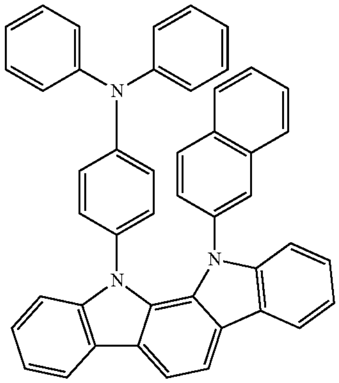
H1-49
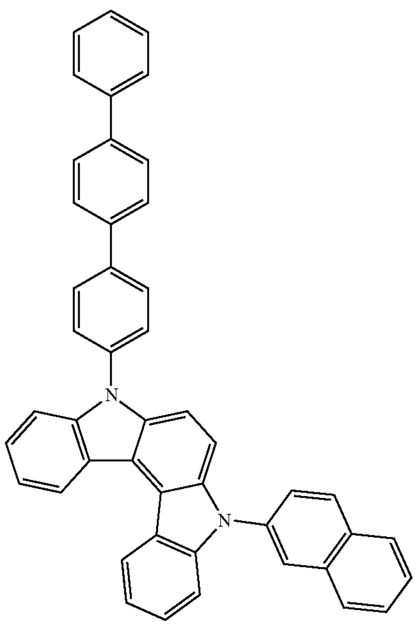
H1-50
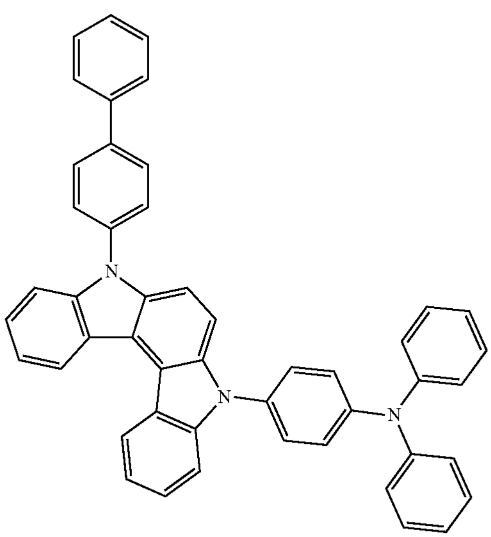
-continued
H1-51
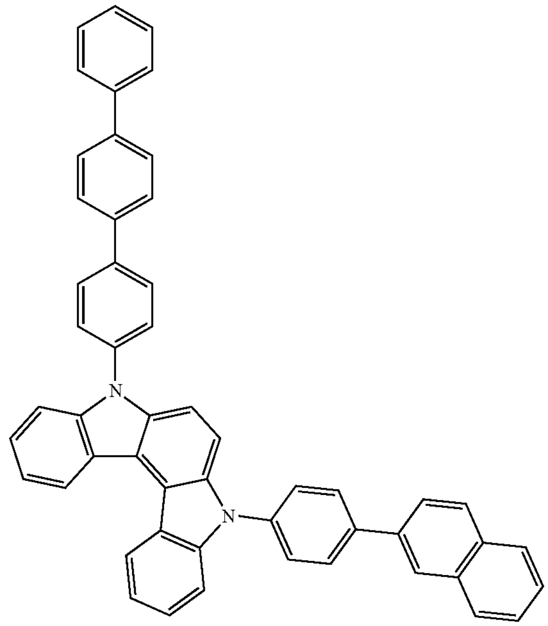
H1-52
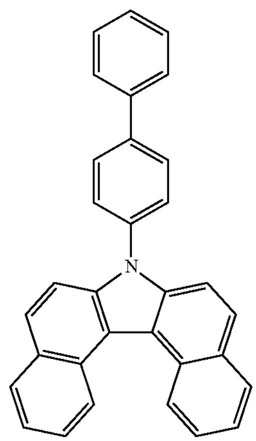
H1-53
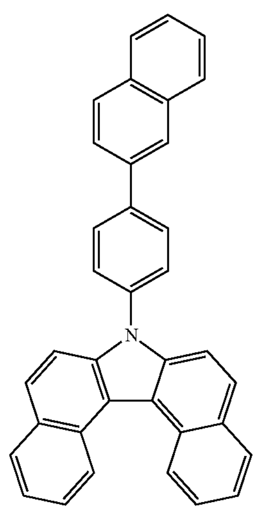

H1-54
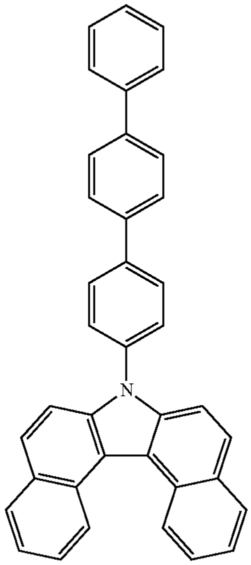
H1-55
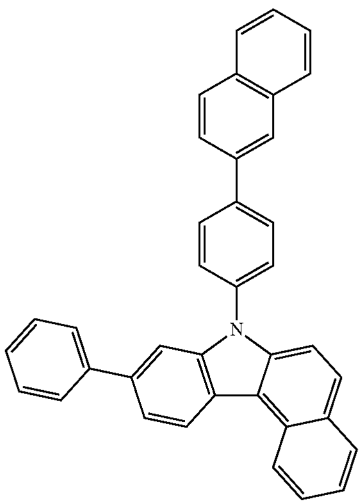
H1-56
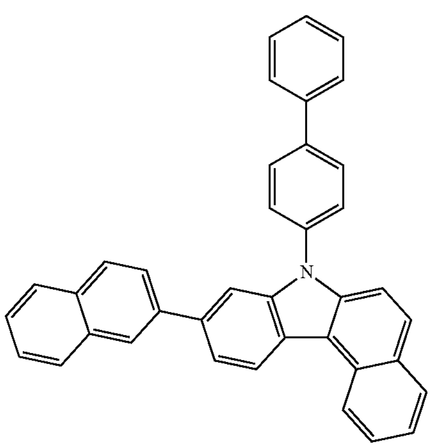
H1-57
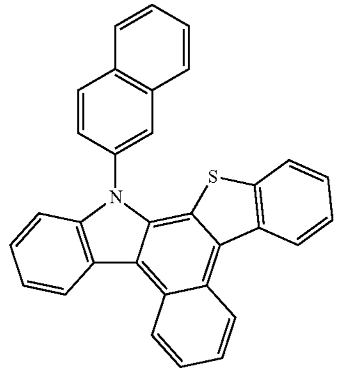
H1-58
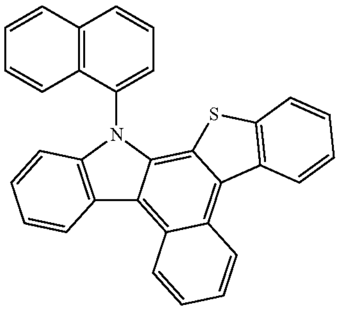
H1-59
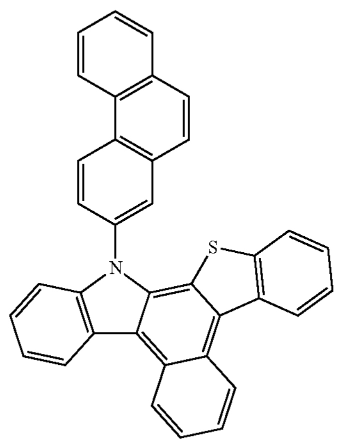
H1-60
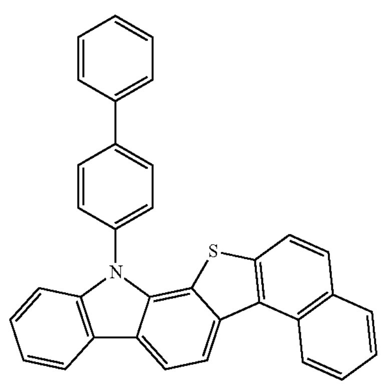

H1-61
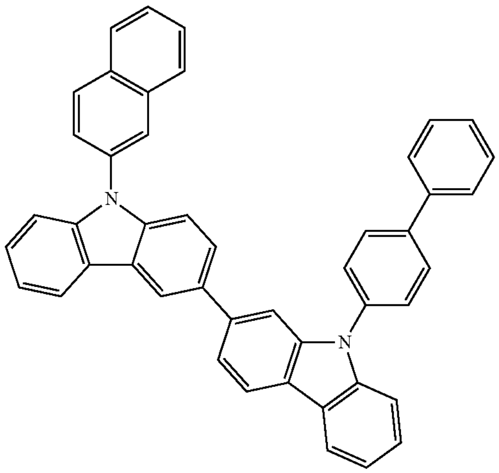
H1-62
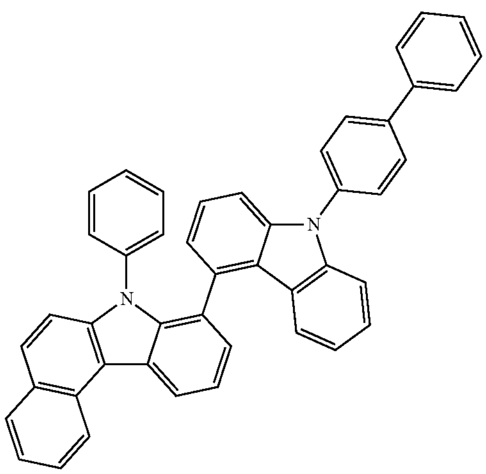
H1-63
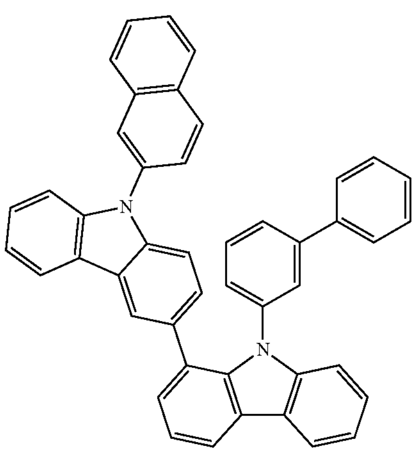
H1-64
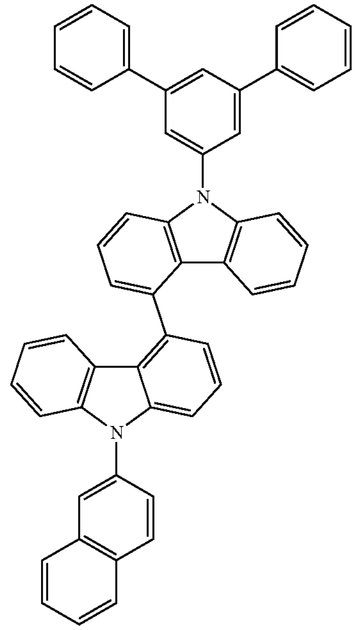
H1-65
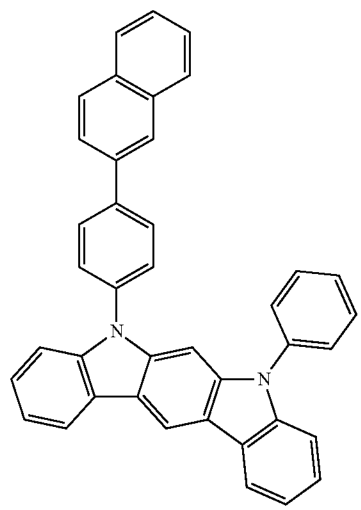
H1-66
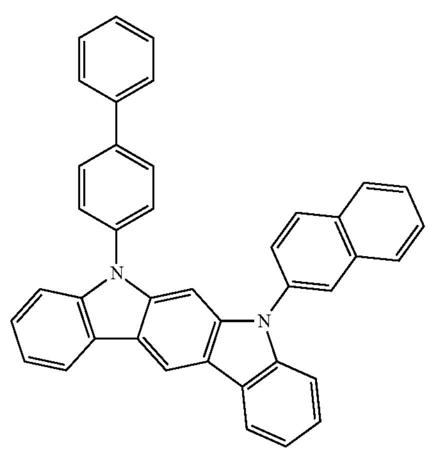

-continued
H1-67
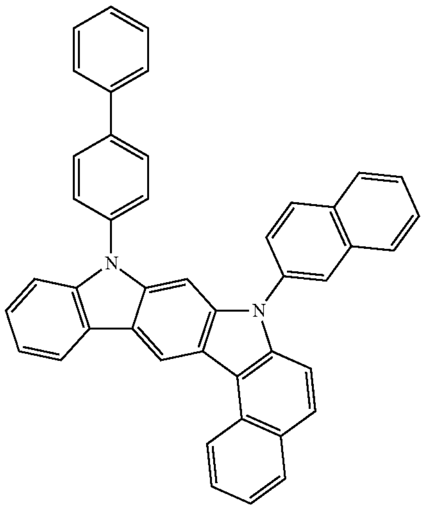
H1-68
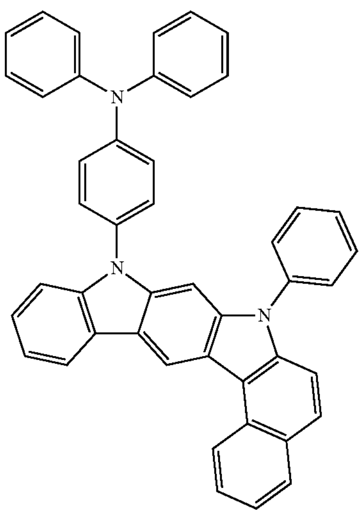
H1-69
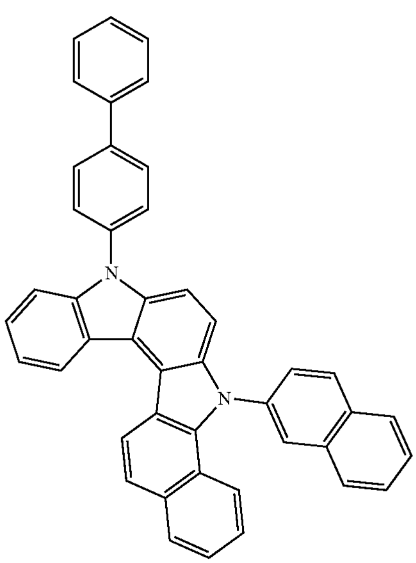
-continued
H1-70
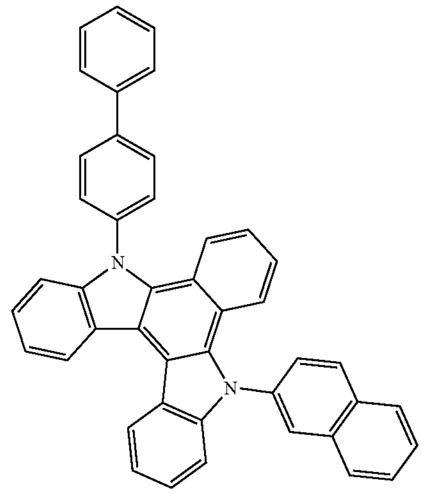
H1-71
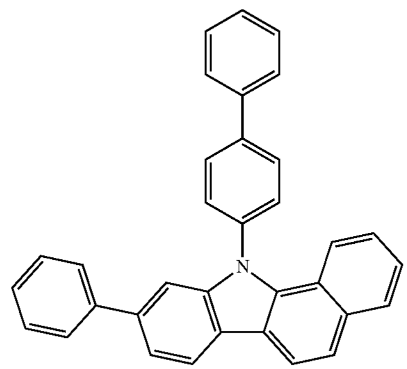
H1-72
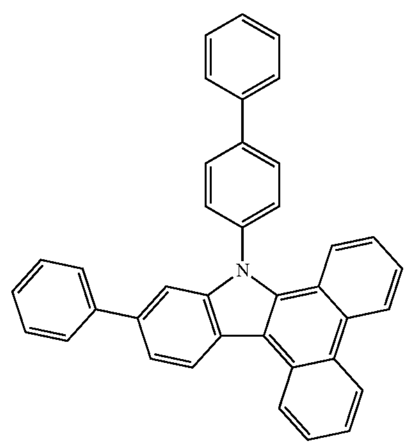
H2-1
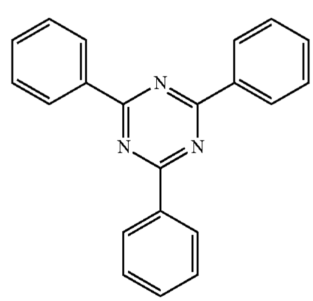

-continued
H2-2
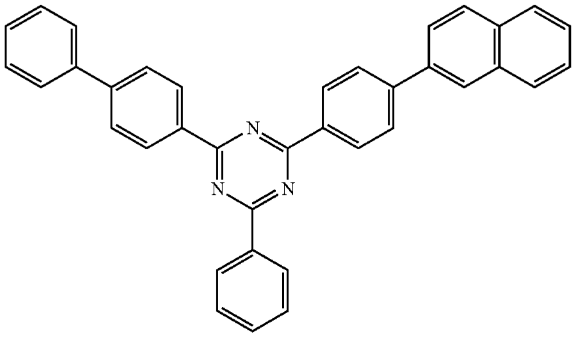
H2-3
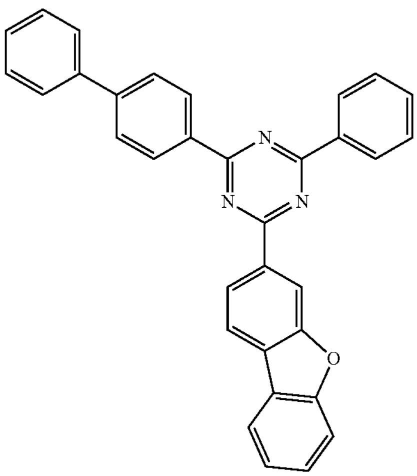
H2-4
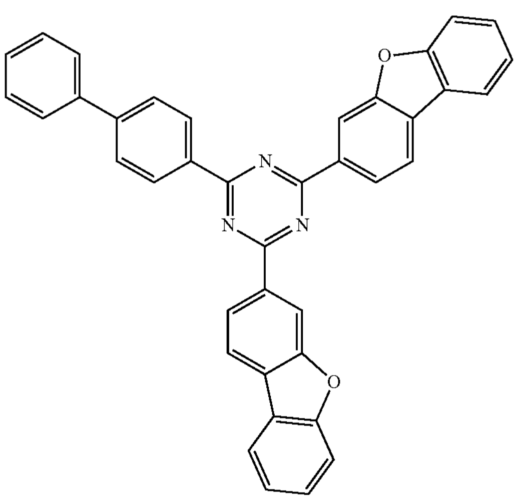
-continued
H2-5
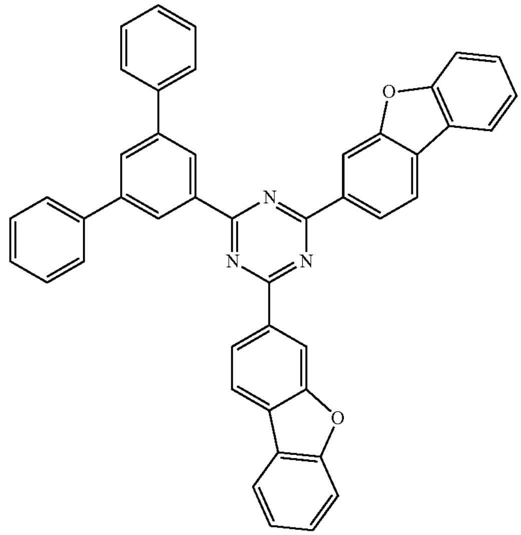
H2-6
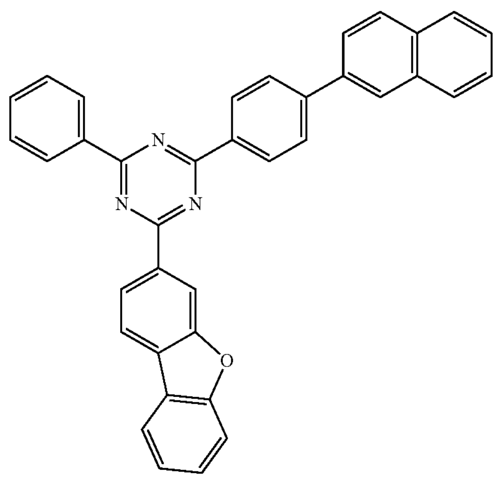
H2-7
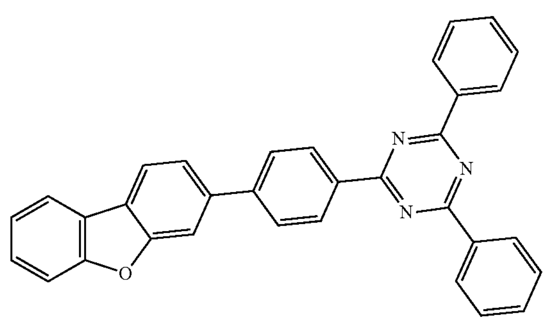

-continued
H2-8
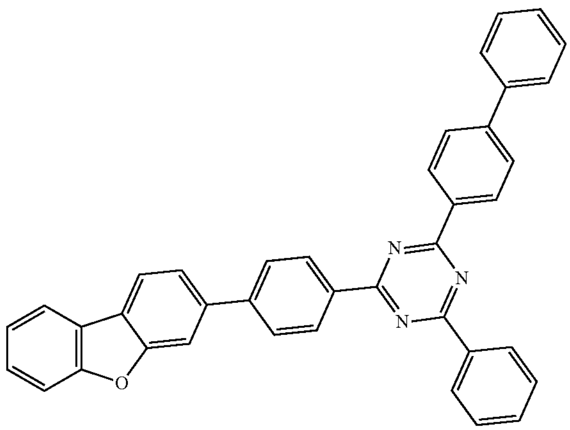
H2-9
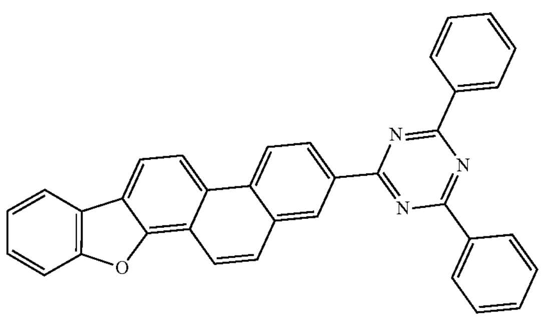
H2-10
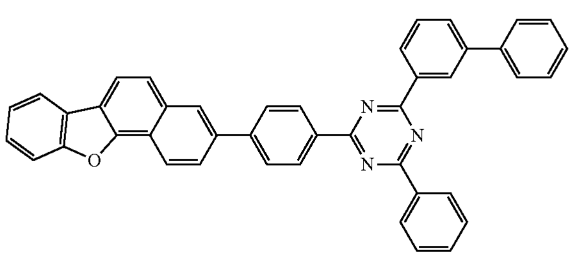
H2-11
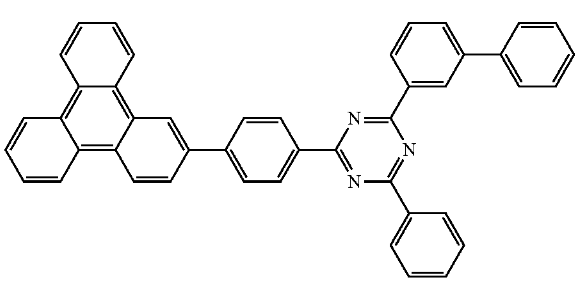
-continued
H2-12
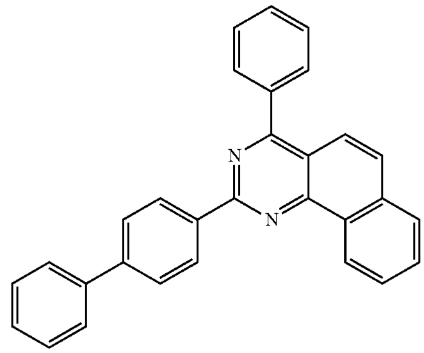
H2-13
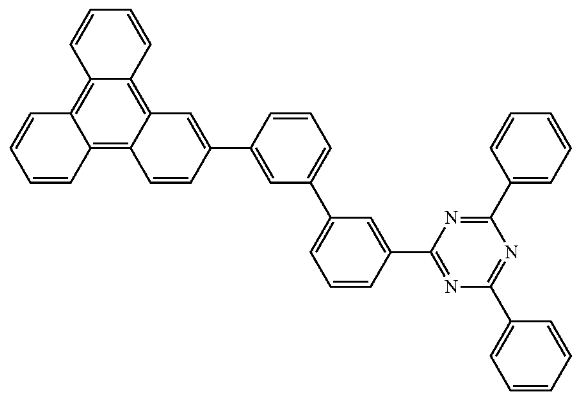
H2-14
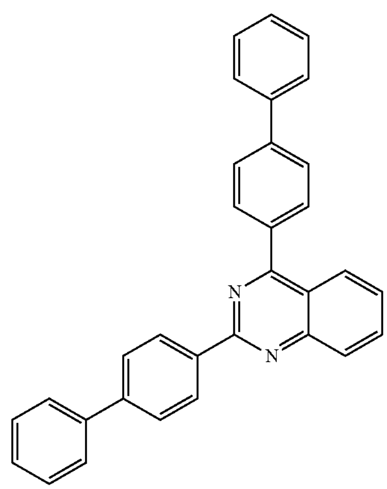
H2-15
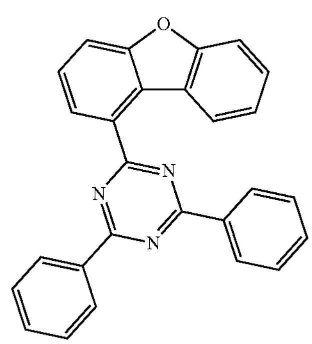

-continued
H2-16
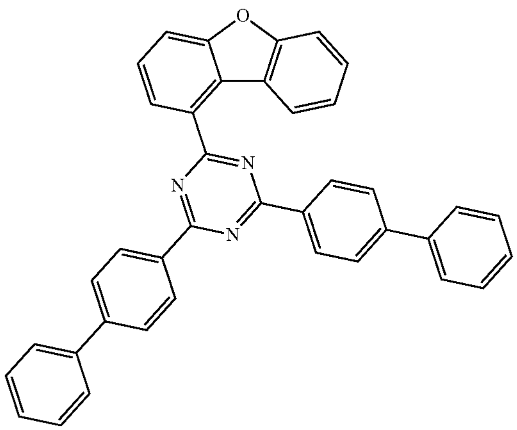
H2-17
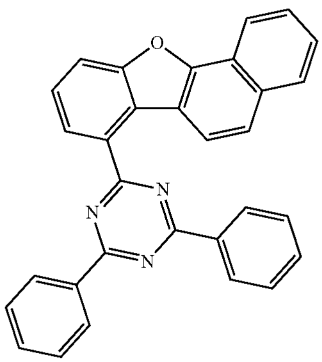
H2-18
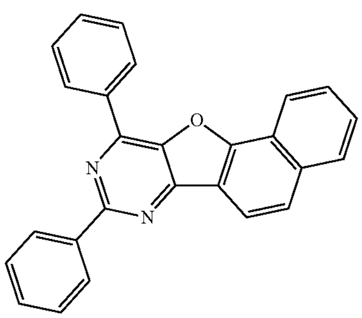
H2-19
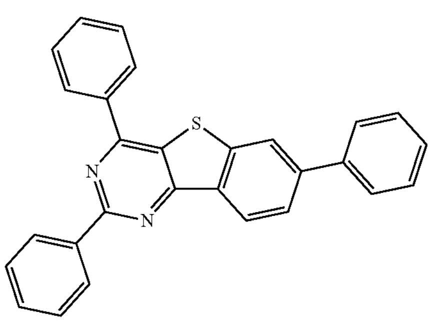
-continued
H2-20
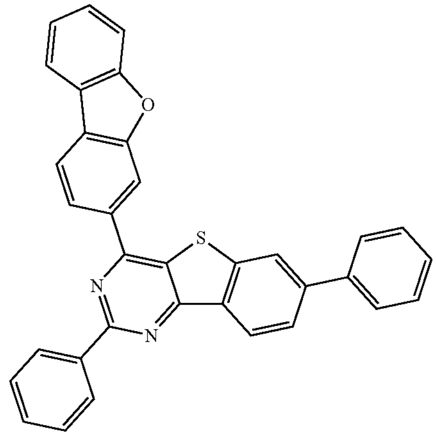
H2-21
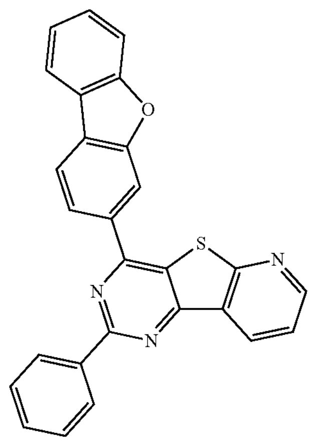
H2-22
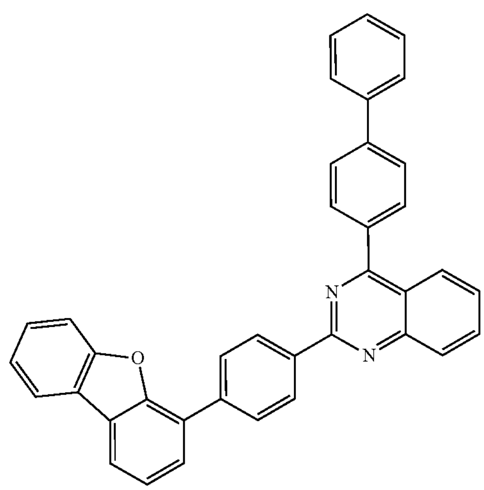

H2-23
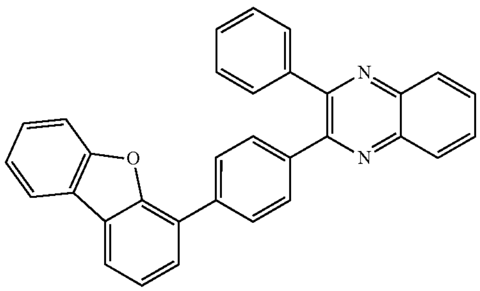
H2-24
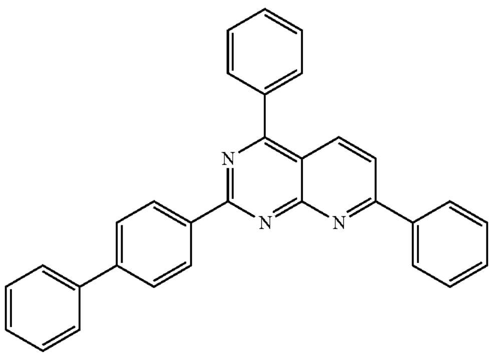
H2-25
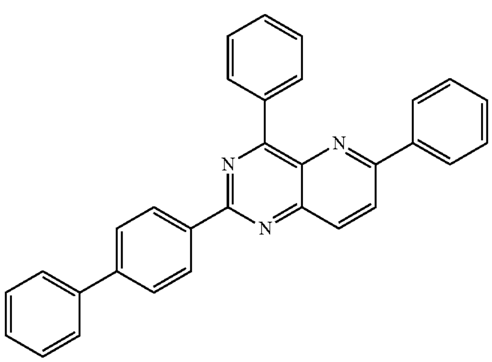
H2-26
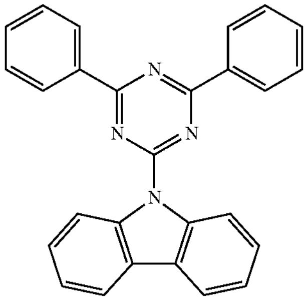
H2-27
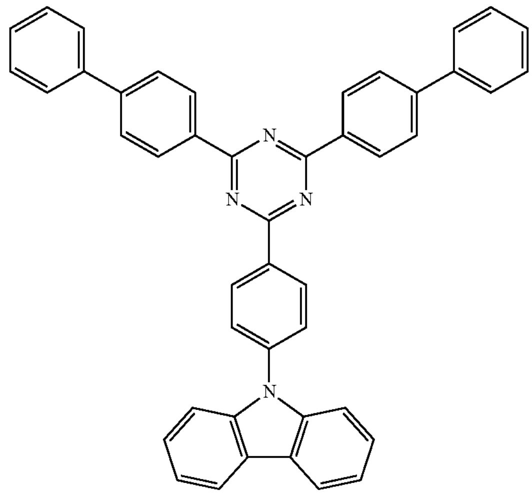
H2-28
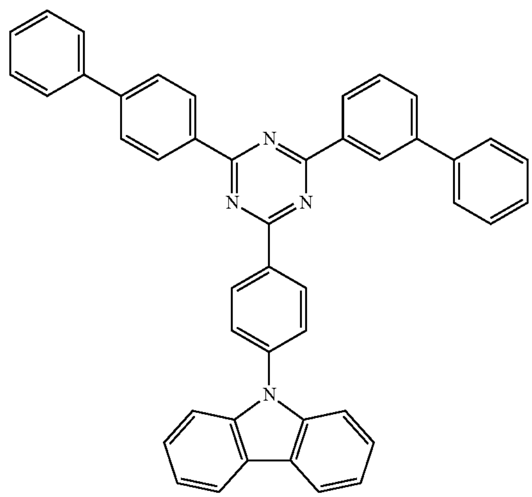
H2-29
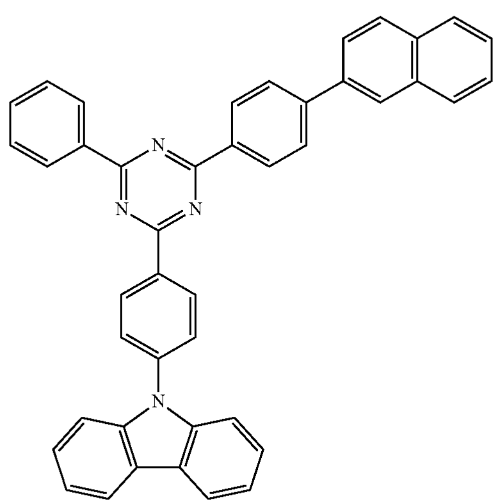

-continued
H2-30
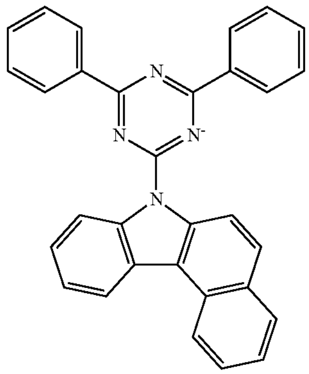
H2-31
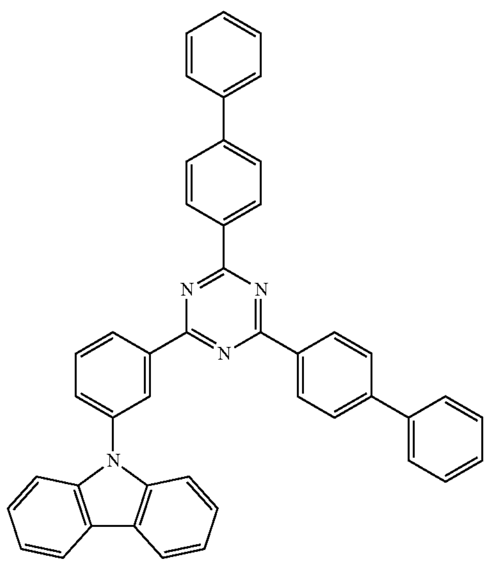
H2-32
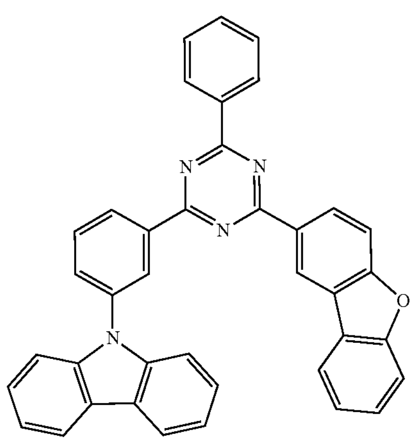
-continued
H2-33
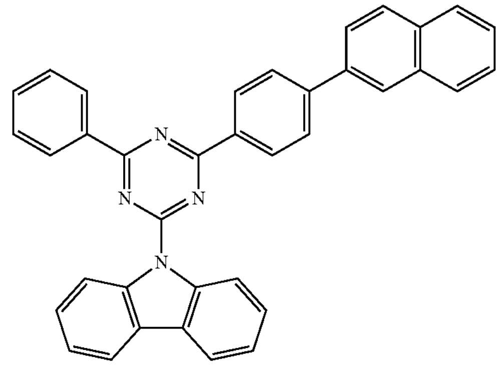
H2-34
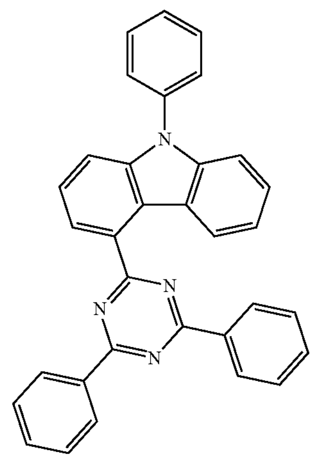
H2-35
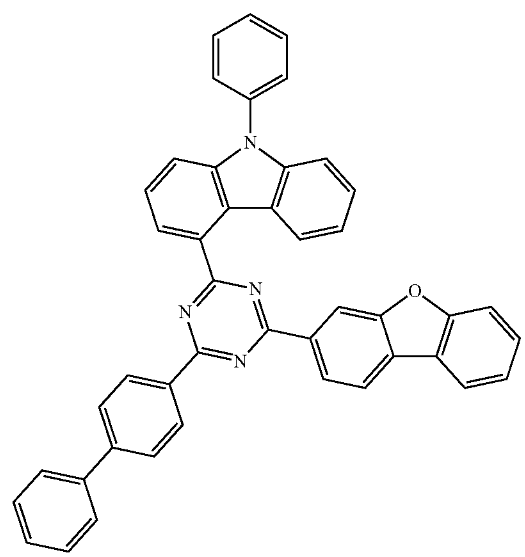

-continued
H2-36
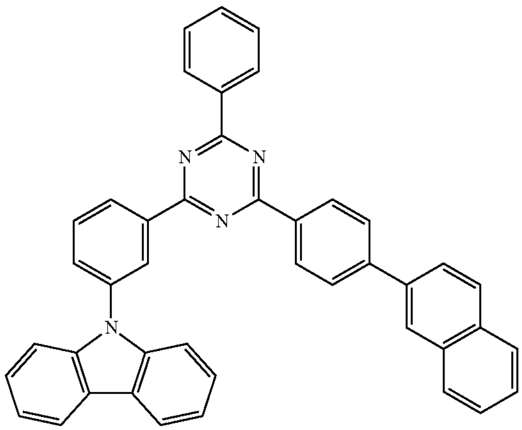
H2-37
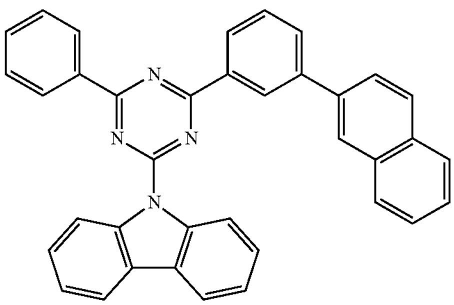
H2-38
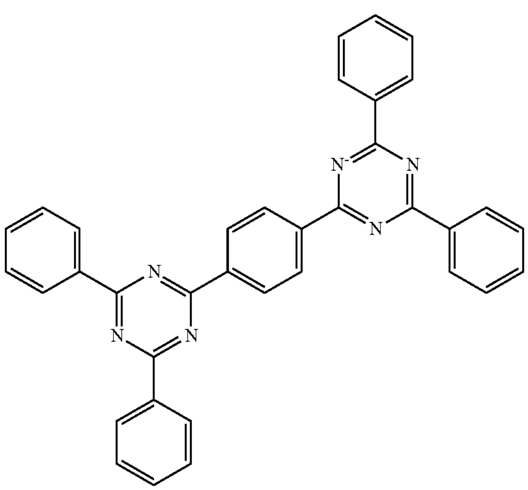
H2-39
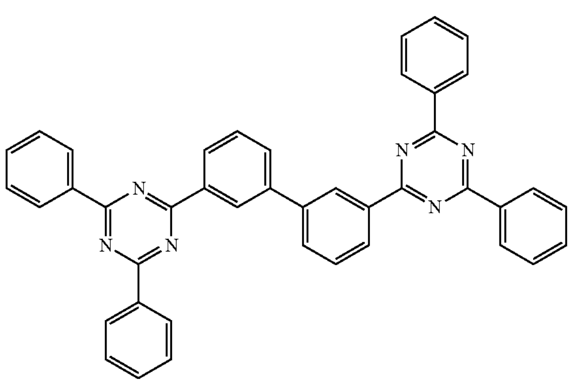
-continued
H2-40
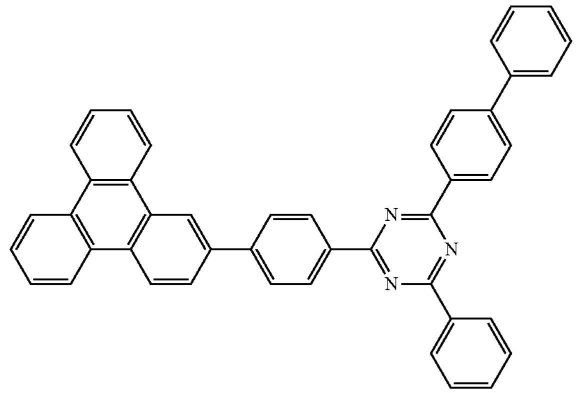
H2-41
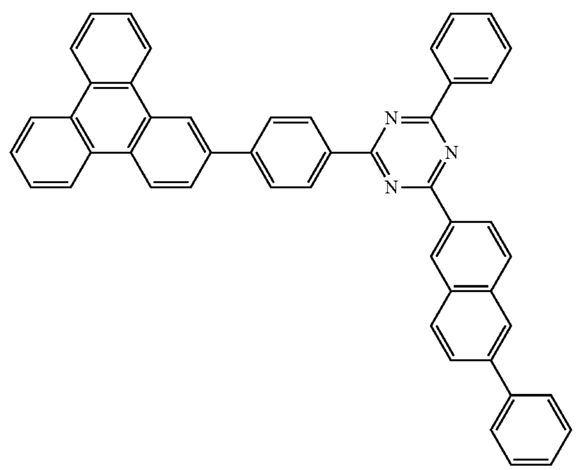
H2-42
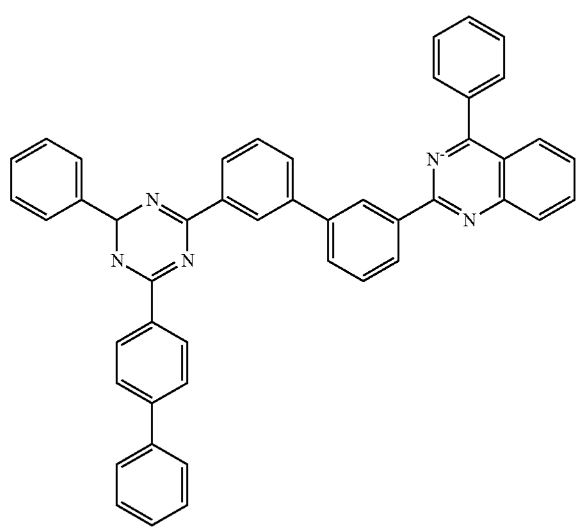

-continued
H2-43
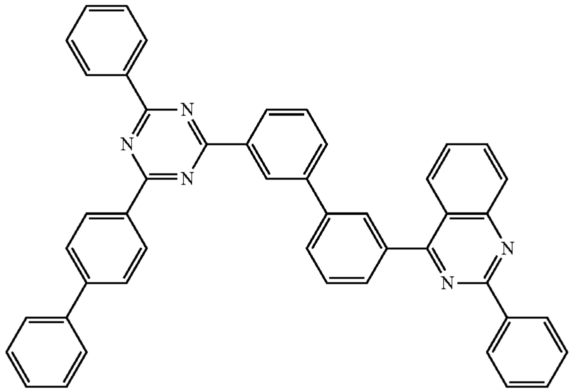
H2-44
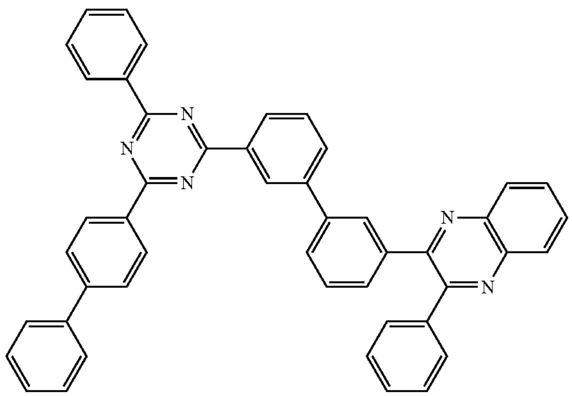
H2-45
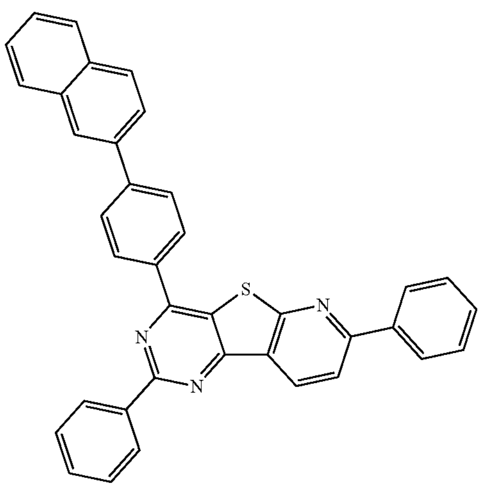
H2-46
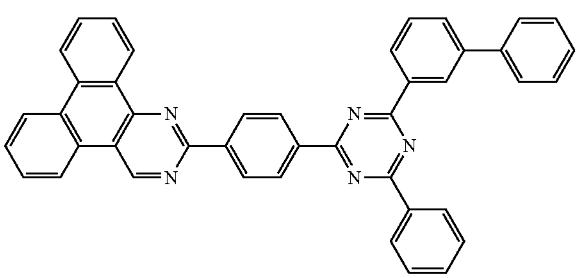
-continued
H2-47
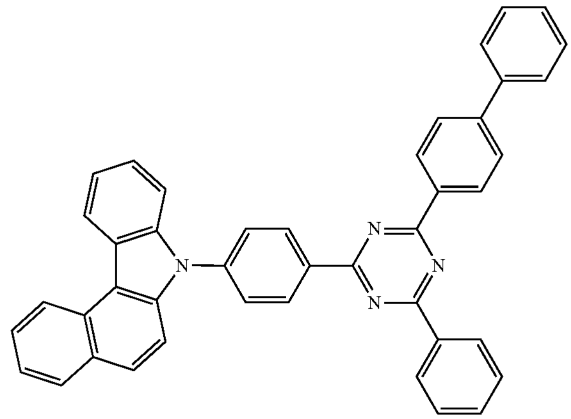
H2-48
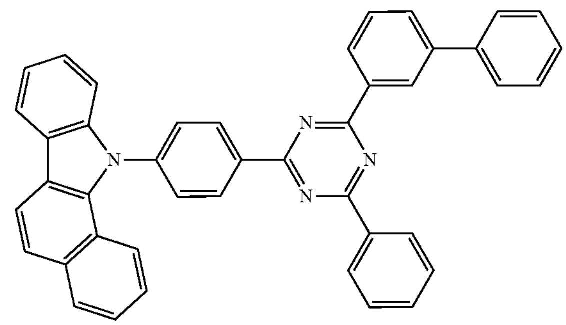
H2-49
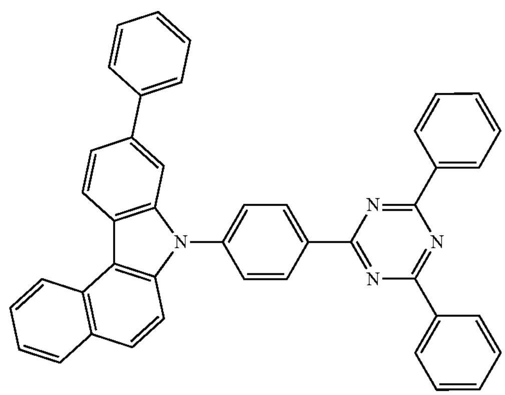
H2-50
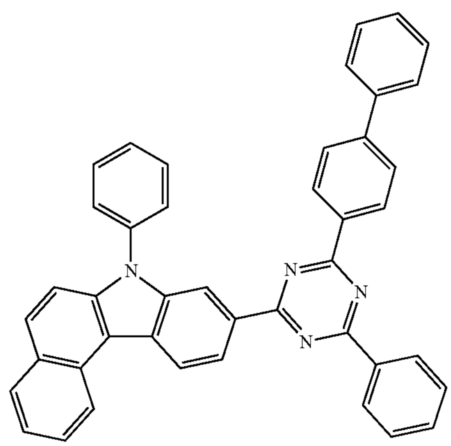

-continued
H2-51
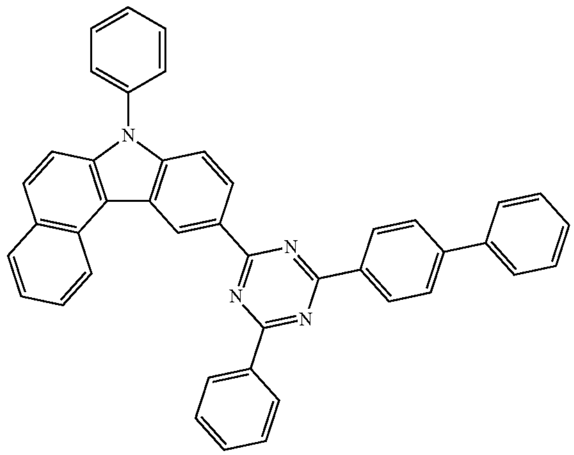
H2-52
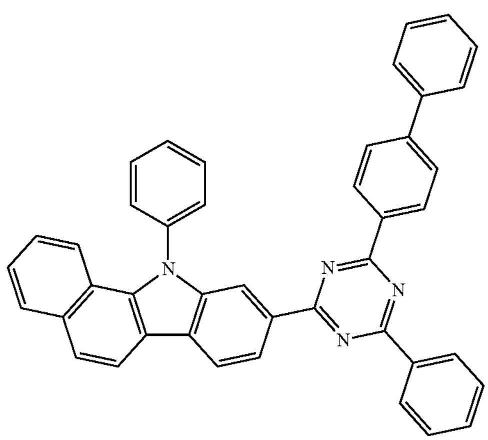
H2-53
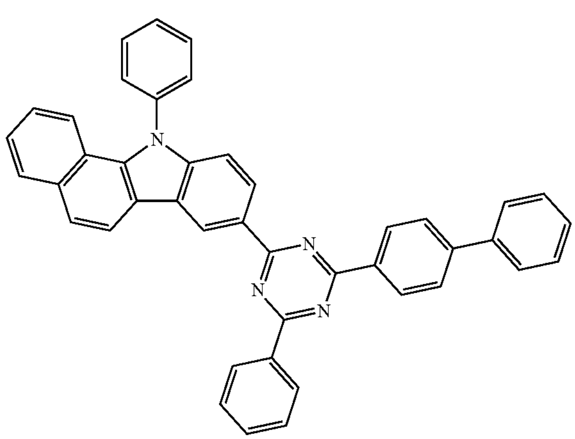
-continued
H2-54
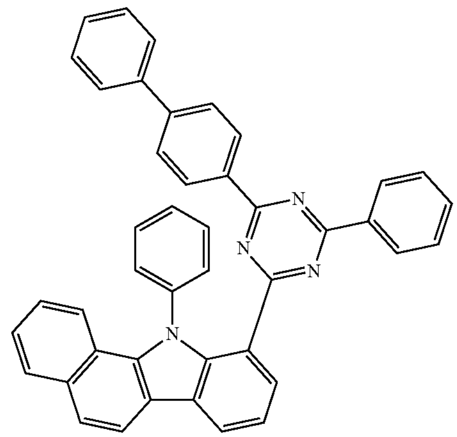
H2-55
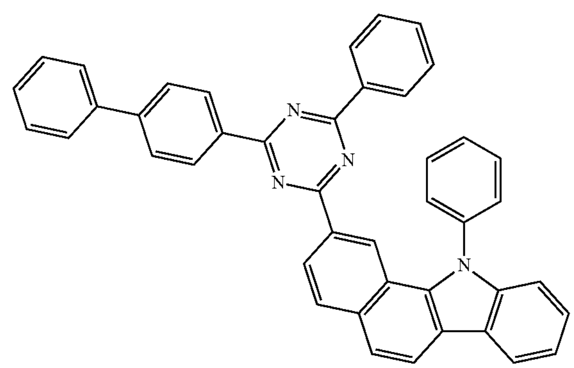
H2-56
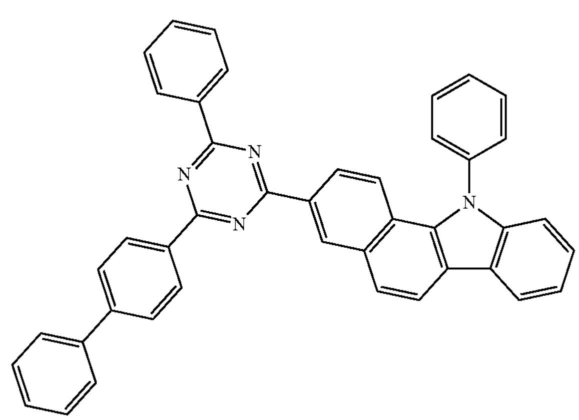

-continued
H2-57
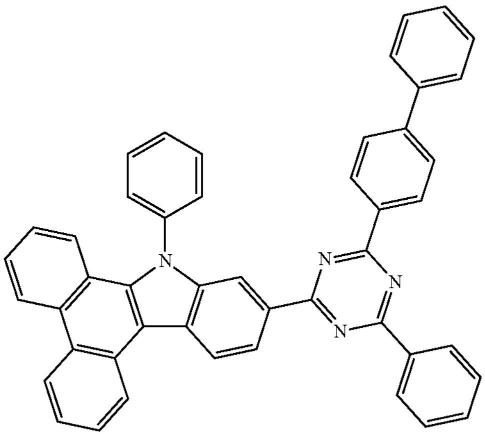
H2-58
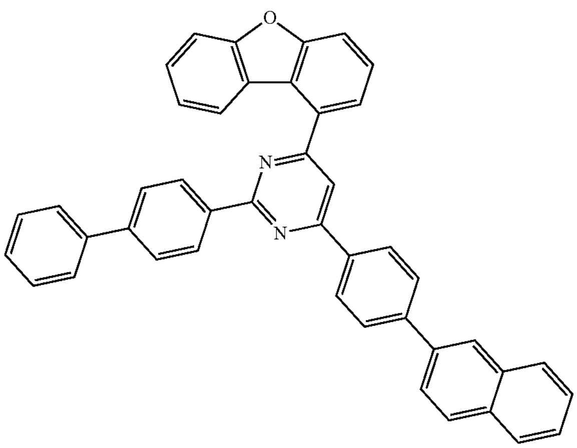
H2-59
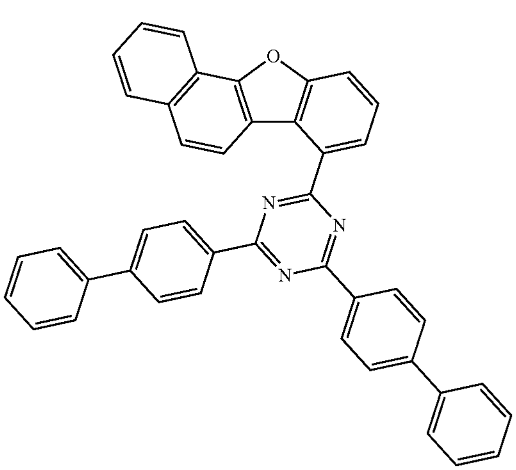
-continued
H2-60
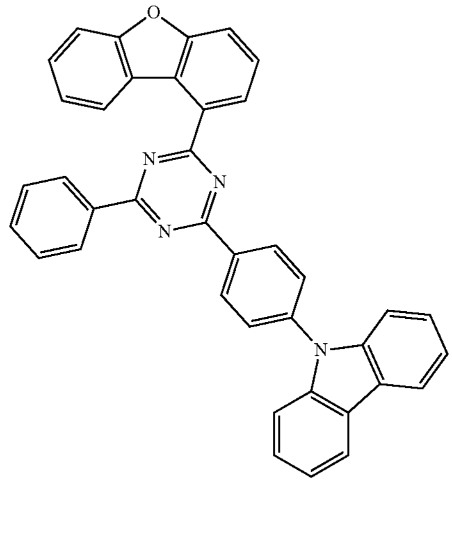
H2-61
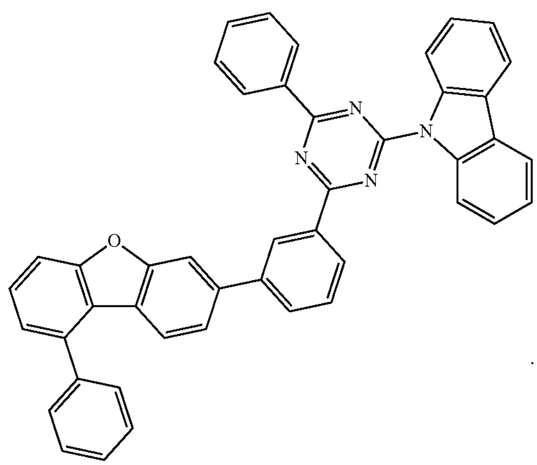
13. The composition of claim 1, wherein the first compound comprises at least one of Compounds 1, 5, 8, 9, 13, 14, 25 to 29, 33 to 43, and 48 to 52:
1
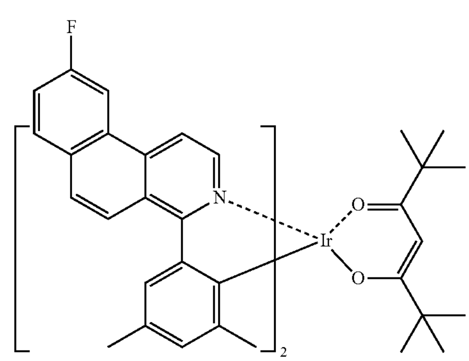

2
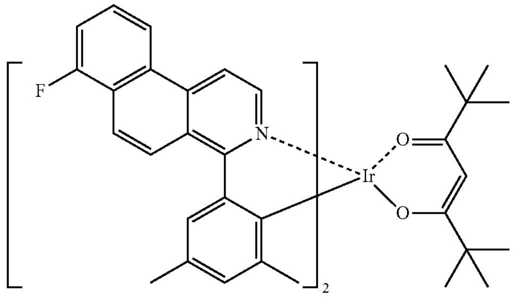
3
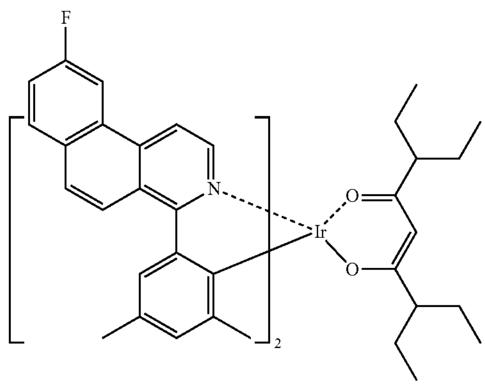
4
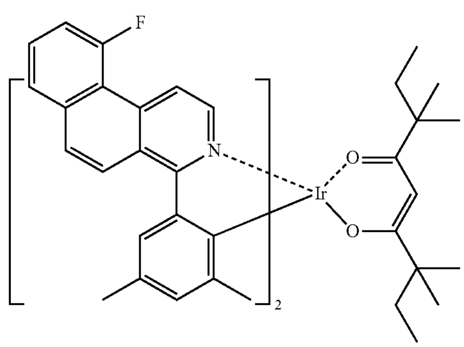
5
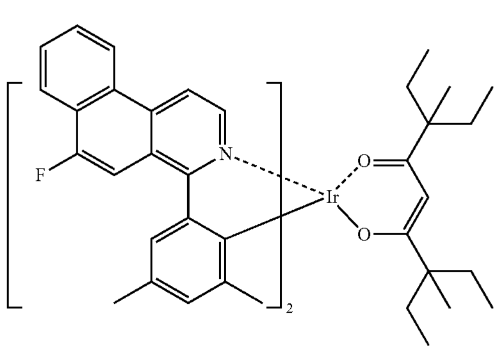
8
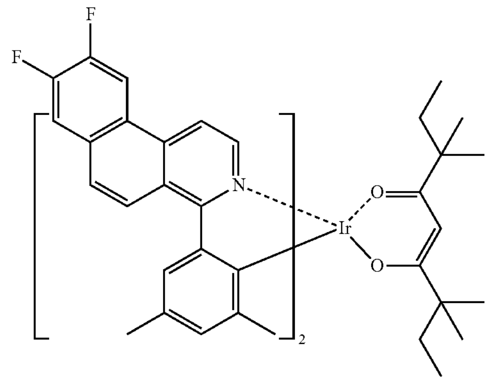
9
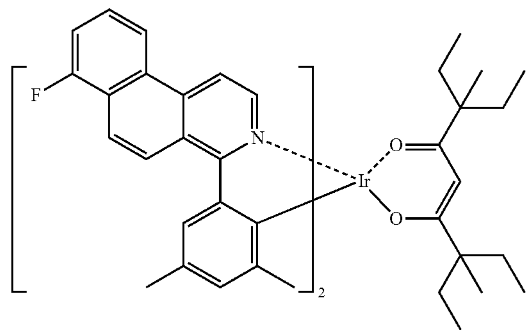
25
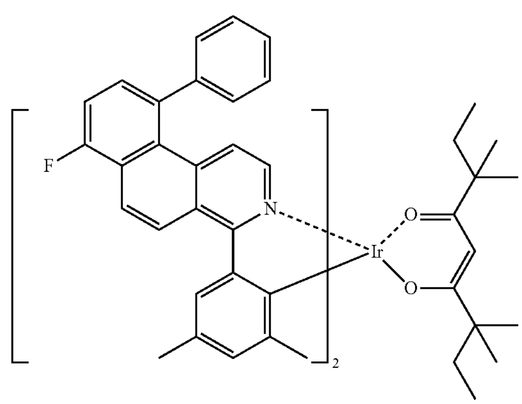
26
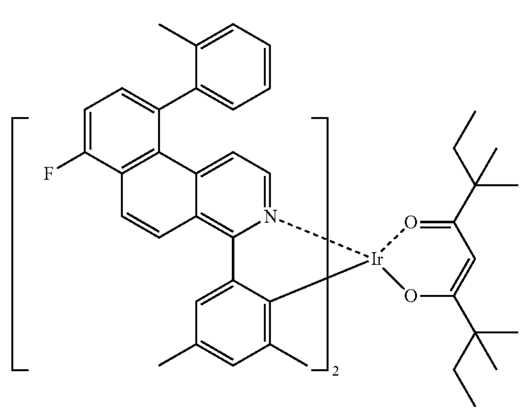

27
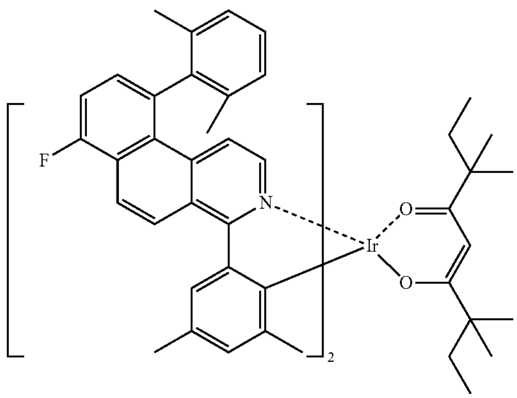
28
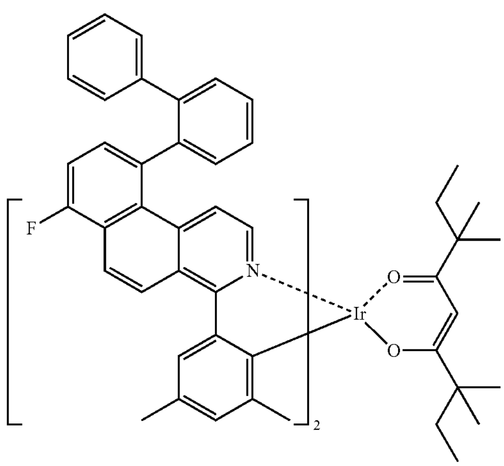
29
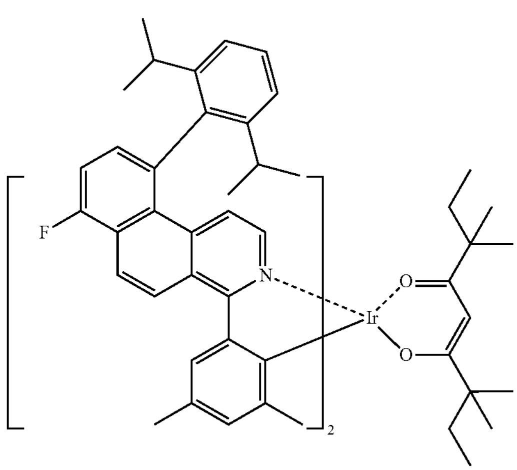
33
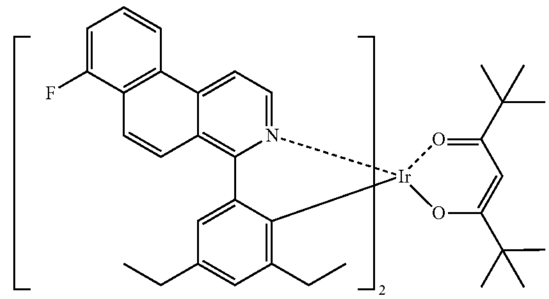
34
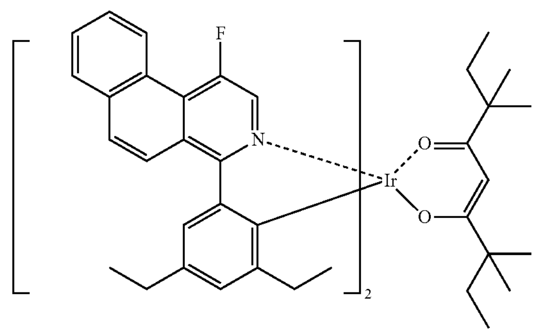
35
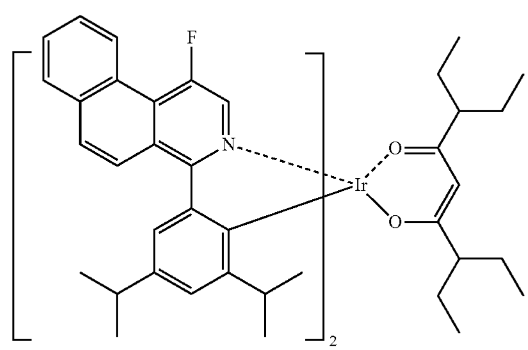
36
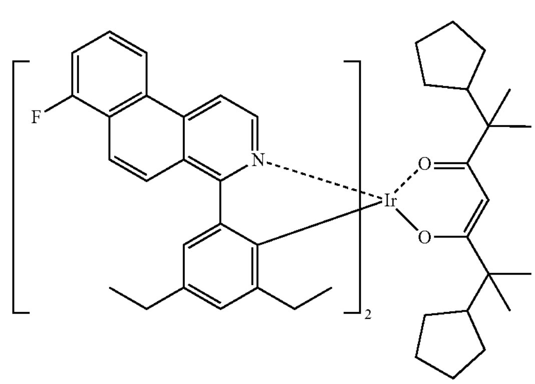

-continued
37
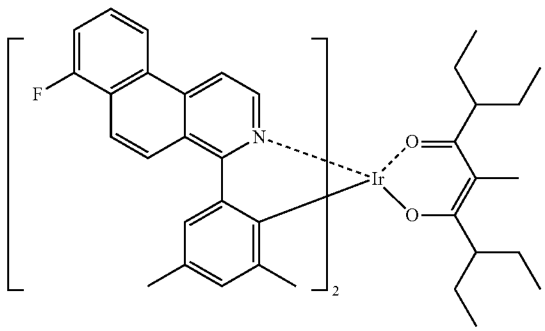
38
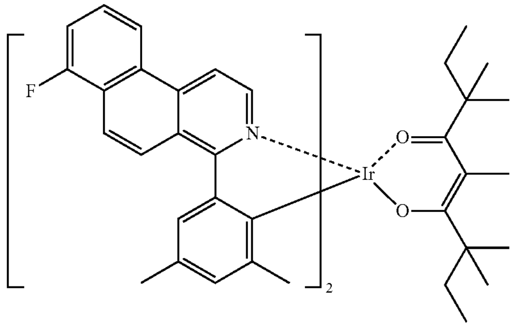
39
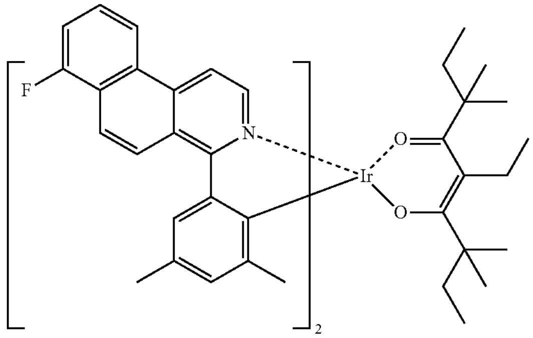
40
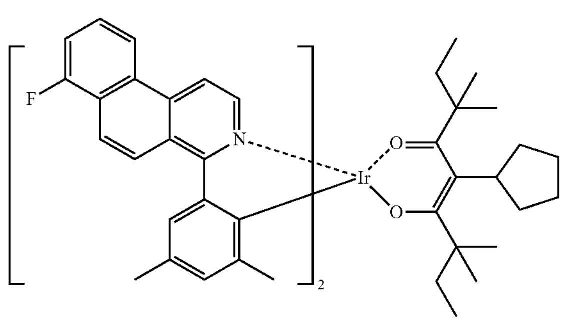
-continued
41
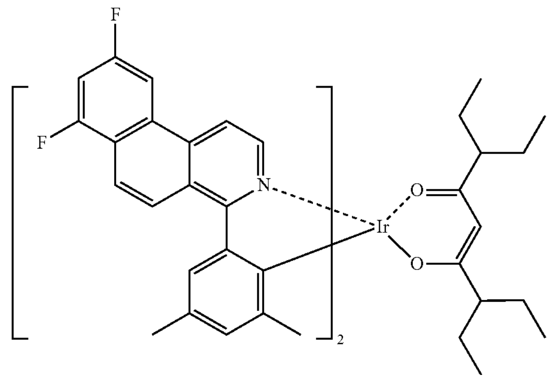
42
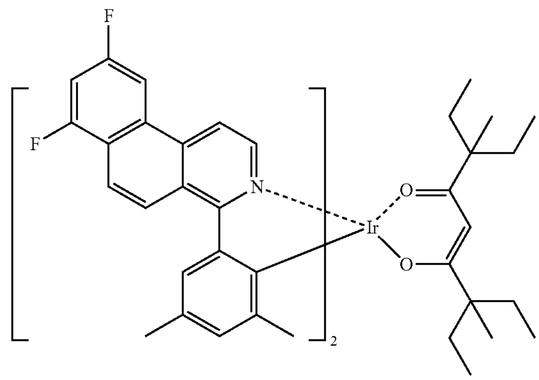
43
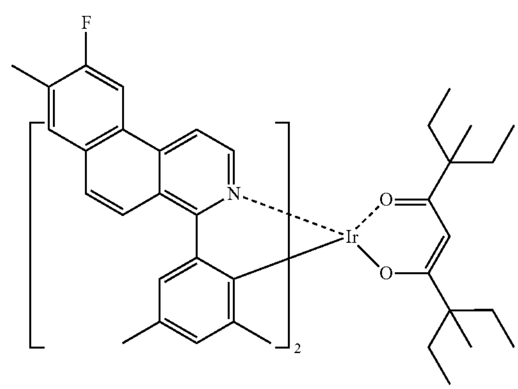
48
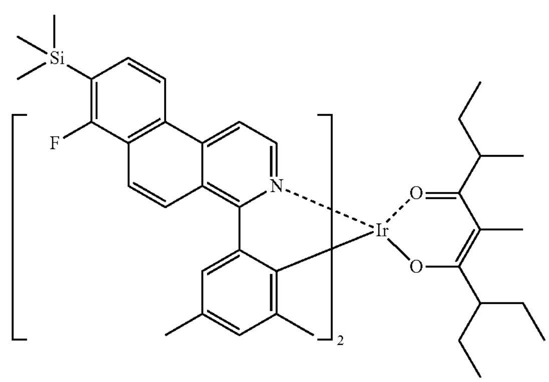

-continued

49

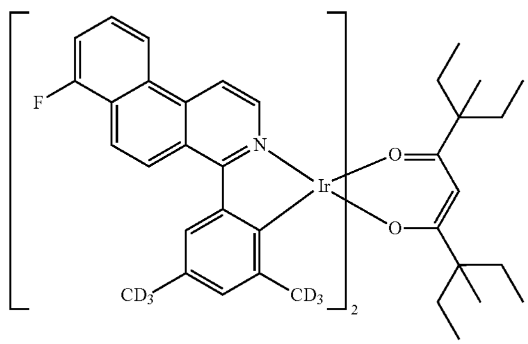

50

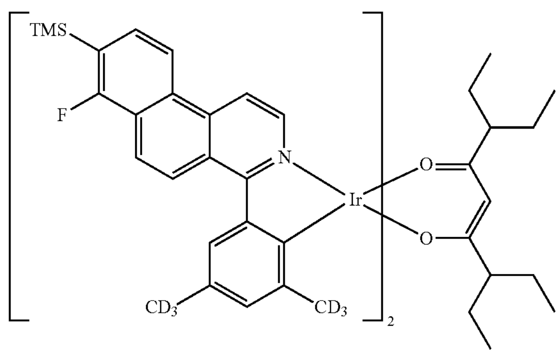

51

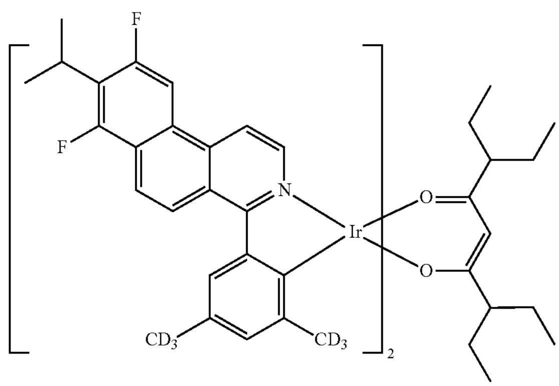

-continued

52

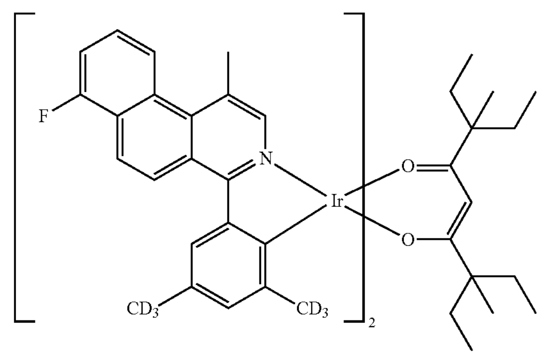

14. An organic light-emitting device comprising:

a first electrode;

a second electrode; and an organic layer disposed between the first electrode and the second electrode and comprising an emission layer, wherein the organic layer comprises the composition of claim 1.

15. The organic light-emitting device of claim 14, wherein the first electrode is an anode, the second electrode is a cathode, the organic layer further comprises a hole transport region between the first electrode and the emission layer and an electron transport region between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

16. The organic light-emitting device of claim 14, wherein the emission layer comprises the composition.

17. The organic light-emitting device of claim 14, wherein the emission layer emits red light.

* * * * *